(12) United States Patent
Sugiyama et al.

(10) Patent No.: US 8,632,938 B2
(45) Date of Patent: Jan. 21, 2014

(54) ACTINIC-RAY- OR RADIATION-SENSITIVE RESIN COMPOSITION AND METHOD OF FORMING PATTERN USING THE COMPOSITION

(75) Inventors: Shinichi Sugiyama, Shizuoka (JP); Shinji Tarutani, Shizuoka (JP); Takayuki Kato, Shizuoka (JP); Kaoru Iwato, Shizuoka (JP); Hiroshi Saegusa, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 156 days.

(21) Appl. No.: 12/750,369

(22) Filed: Mar. 30, 2010

(65) Prior Publication Data
US 2010/0248136 A1    Sep. 30, 2010

(30) Foreign Application Priority Data

Mar. 31, 2009    (JP) ................. 2009-088485

(51) Int. Cl.
G03F 7/004    (2006.01)
G03F 7/028    (2006.01)
G03F 7/039    (2006.01)
G03F 7/26     (2006.01)

(52) U.S. Cl.
USPC ..................... 430/270.1; 430/326

(58) Field of Classification Search
USPC ..................... 430/270.1, 326, 910
See application file for complete search history.

(56) References Cited

U.S. PATENT DOCUMENTS

| | | | |
|---|---|---|---|
| 4,480,910 A | 11/1984 | Takanashi et al. | |
| 6,784,312 B2* | 8/2004 | Miyazawa et al. | 560/205 |
| 6,849,381 B2* | 2/2005 | Barclay et al. | 430/270.1 |
| 7,101,654 B2* | 9/2006 | Wu et al. | 430/270.1 |
| 7,122,292 B2* | 10/2006 | Sumida et al. | 430/270.1 |
| 7,202,015 B2* | 4/2007 | Kanna et al. | 430/270.1 |
| 2005/0014090 A1 | 1/2005 | Hirayama et al. | |
| 2006/0051702 A1 | 3/2006 | Endo et al. | |
| 2006/0194148 A1* | 8/2006 | Tsubaki et al. | 430/270.1 |
| 2006/0246373 A1 | 11/2006 | Wang | |
| 2007/0128555 A1 | 6/2007 | Harada et al. | |
| 2007/0134589 A1 | 6/2007 | Yamamoto et al. | |
| 2007/0134590 A1 | 6/2007 | Fukuhara et al. | |
| 2007/0172769 A1* | 7/2007 | Kanna et al. | 430/311 |
| 2007/0224539 A1 | 9/2007 | Mizutani et al. | |
| 2008/0081290 A1* | 4/2008 | Wada et al. | 430/286.1 |
| 2008/0305432 A1 | 12/2008 | Kanna | |
| 2009/0081588 A1 | 3/2009 | Hatakeyama et al. | |
| 2009/0104563 A1* | 4/2009 | Ishiduka et al. | 430/285.1 |
| 2009/0117489 A1 | 5/2009 | Wang et al. | |
| 2009/0280434 A1 | 11/2009 | Harada et al. | |
| 2010/0196823 A1 | 8/2010 | Sasaki | |
| 2010/0233617 A1 | 9/2010 | Wada | |
| 2013/0065178 A1 | 3/2013 | Wang et al. | |

FOREIGN PATENT DOCUMENTS

| | | |
|---|---|---|
| JP | 57-153433 A | 9/1982 |
| JP | 07-220990 A | 8/1995 |
| JP | 2004-240387 A | 8/2004 |
| JP | 2005-320516 A | 11/2005 |
| JP | 2006-071889 A | 3/2006 |
| JP | 2006-309245 A | 11/2006 |
| JP | 2007-153982 A | 6/2007 |
| JP | 2007-192876 A | 8/2007 |
| JP | 2007-212990 A | 8/2007 |
| JP | 2007-219144 A | 8/2007 |
| JP | 2007-279663 A | 10/2007 |
| JP | 2007-279664 A | 10/2007 |
| JP | 2007-334278 A | 12/2007 |
| JP | 2008-065296 A | 3/2008 |
| JP | 2008-107806 A | 5/2008 |
| JP | 2008-145667 A | 6/2008 |
| JP | 2008-242271 A | 10/2008 |
| JP | 2009-093137 A | 4/2009 |
| JP | 2009-098638 A | 5/2009 |
| JP | 2009-199058 A | 9/2009 |
| JP | 2009-276363 A | 11/2009 |
| JP | 2010-106118 A | 5/2010 |
| KR | 2009-0049204 A | 5/2009 |
| WO | 2004/068242 A1 | 8/2004 |

OTHER PUBLICATIONS

B.J. Lin, "Semiconductor Foundry, Lithography, and Partners", Proc. SPIE, 2002, pp. 11-22, vol. 4688.
Hiroshi Ito, "Dissolution/swelling behavior of cycloolefin polymers in aqueous base", Proc. SPIE, 2000, pp. 2-12, vol. 3999.
Japanese Office Action issued in corresponding application No. 2010-072839 dated Sep. 10, 2013.

\* cited by examiner

*Primary Examiner* — Anca Eoff
(74) *Attorney, Agent, or Firm* — Sughrue Mion, PLLC

(57) ABSTRACT

According to one embodiment, an actinic-ray- or radiation-sensitive resin composition comprises a hydrophobic resin (HR) containing a fluorine atom, wherein the hydrophobic resin (HR) comprises any of repeating units (a) of general formula (I) or (II) below:

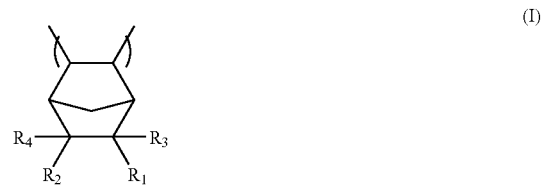

(I)

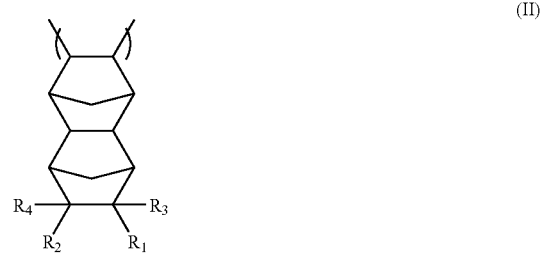

(II)

12 Claims, 1 Drawing Sheet

ACTINIC-RAY- OR RADIATION-SENSITIVE RESIN COMPOSITION AND METHOD OF FORMING PATTERN USING THE COMPOSITION

CROSS-REFERENCE TO RELATED APPLICATIONS

This application is based upon and claims the benefit of priority from prior Japanese Patent Application No. 2009-088485, filed Mar. 31, 2009, the entire contents of which are incorporated herein by reference.

BACKGROUND OF THE INVENTION

1. Field of the Invention

The present invention relates to an actinic-ray- or radiation-sensitive resin composition employed in a semiconductor production process for an IC or the like, a circuit board production process for a liquid crystal, a thermal head or the like and other photoapplication lithography processes, and also relates to a method of forming a pattern with the use of the composition. More particularly, the present invention relates to an actinic-ray- or radiation-sensitive resin composition that is suitable for exposure by means of a liquid-immersion projection exposure unit using far-ultraviolet rays of wavelength 300 nm or shorter as a light source, and also relates to a method of forming a pattern with the use of the composition.

In the present invention, the terms "actinic rays" and "radiation" mean, for example, a mercury lamp bright line spectrum, far-ultraviolet rays represented by an excimer laser, extreme ultraviolet rays, X-rays, electron beams and the like. In the present invention, the term "light" means actinic rays or radiation.

2. Description of the Related Art

In accordance with the miniaturization of semiconductor elements, the wavelength shortening of the exposure light source and the realization of high numerical apertures (high NA) for projector lenses have been advanced. At present, an exposure machine of 0.84 NA using an ArF excimer laser of wavelength 193 nm as a light source has been developed. As is commonly known, the following formulae can be established therefor.

(Resolving power)=$k_1 \cdot (\lambda/\text{NA})$ (Focal depth)=$\pm k_2 \cdot \lambda/\text{NA}^2$ In the formulae, $\lambda$ is the wavelength of the exposure light source; NA is the numerical aperture of the projector lens; and $k_1$ and $k_2$ are factors relating to the process.

As a technology for enhancing the resolving power of an optical microscope in order to attain a further resolving power enhancement by wavelength shortening, it is heretofore known to employ a liquid immersion technique, that is, a method in which a space between a projector lens and a sample is filled with a liquid of high refractive index (hereinafter also referred to as a "liquid for liquid immersion").

The "effect of the liquid immersion" is as follows. Taking $\lambda_0$ as the wavelength of exposure light in air, n as the refractive index of the liquid for liquid immersion to air and $\theta$ as the convergent half angle of the light beam, where $\text{NA}_0=\sin\theta$, the above-mentioned resolving power and focal depth in the event of liquid immersion can be expressed by the following formulae.

(Resolving power)=$k_1 \cdot (\lambda_0/n)/\text{NA}_0$ (Focal depth)=$\pm k_2 \cdot (\lambda_0/n)/\text{NA}_0^2$ That is, the effect of the liquid immersion is equivalent to the use of an exposure wavelength of 1/n. In other words, in projection optic systems of identical NA, the liquid immersion would enable the focal depth to be n-fold. This is effective in all pattern configurations. Further, this can be combined with a super-resolution technology, such as a phase shift method or a modified illumination method, now under study.

Examples of the apparatuses utilizing this effect in the transfer of the microscopic image pattern of a semiconductor element are introduced in patent references 1, 2, etc.

The recent progress of the liquid immersion exposure technology is reported in non-patent references 1, 2, etc. In the use of an ArF excimer laser as a light source, it is presumed that pure water (refractive index at 193 nm: 1.44) can offer most promising prospects as the liquid for liquid immersion from the viewpoint of handling safety as well as 193-nm transmission and refractive index.

Since the emergence of the resist for a KrF excimer laser (248 nm), an image forming method through chemical amplification has been employed as a resist image forming method in order to compensate for any sensitivity deterioration caused by light absorption. Brief description of an image forming method through positive chemical amplification is given below by way of example. Upon exposure, an acid generator will be decomposed at exposed areas to thereby generate an acid. In baking after the exposure (post-exposure bake [PEB]), the generated acid is used as a reaction catalyst so that an alkali-insoluble group is converted to an alkali-soluble group. Thereafter, alkali development is carried out to thereby remove the exposed areas. Thus, the relevant image forming method is provided.

With respect to the transfer of a pattern, when the pattern is microscopic, the width of the line obtained by development may vary due to the coverage of an exposure mask even if the pattern size of the exposure mask is unchanged. The possible impact thereof on productivity is a matter of concern (see patent reference 7 below).

The resist for an ArF excimer laser (193 nm) utilizing this chemical amplification mechanism is now mainstream. However, it is pointed out that when such chemical amplification resist is applied to liquid immersion exposure, as the resist layer is brought into contact with the liquid for liquid immersion during the exposure, not only would the resist layer suffer a property alteration but also components having an unfavorable influence on the liquid for liquid immersion would leach from the resist layer. Patent reference 3 describes an instance of resist performance alteration caused by immersing the resist for ArF exposure in water before and after the exposure, and in the reference this is noted as being a problem in the liquid immersion exposure. Patent reference 4 describes an instance of suppressing the above-mentioned leaching by the addition of a siliconized or fluorinated resin.

Moreover with respect to the liquid immersion exposure process, in the event of exposure using a scan type liquid immersion exposure machine, when the liquid for liquid immersion fails to move while tracking a moving lens, the exposure scan speed must be lowered. This negatively affects productivity. When the liquid for liquid immersion is water, it is preferred for the resist film to be hydrophobic from the viewpoint of superiority in water tracking properties.

In recent years, increasing the exposure scan speed of an exposure machine is attempted in view of the production efficiency. Accordingly, hydrophobizing the resist film to a higher degree is needed. When the water tracking property is unsatisfactory, water drops remain on the resist film upon the exposure scan and thus would remain as defects after development (watermark defects) to thereby cause a yield decrease. In contrast, it is known that when the hydrophobicity of the resist film is extremely high, air trapping occurs along the scanning direction, which leads to a change of refractive index, causing image formation to be unsuccessful and defects generally known as bubble defects to occur, a further factor of decreased yield. With respect to techniques for enhancing the water tracking property, patent reference 5 and patent reference 6 describe resins having a norbornane skeleton.

Apart from the defects peculiar to the liquid immersion operation, it is known that hydrophobizing the resist film lowers the water wettability during the rinse operation after development, thereby increasing the amount of development residue, another factor leading to decreased yield.

PRIOR ART LITERATURE

Patent Reference

[Patent reference 1] Jpn. Pat. Appln. KOKAI Publication No. (hereinafter referred to as JP-A-) 57-153433,
[Patent reference 2] JP-A-7-220990,
[Patent reference 3] International Publication WO/2004/068242, and
[Patent reference 4] JP-A-2006-309245,
[Patent reference 5] JP-A-2007-279663,
[Patent reference 6] JP-A-2007-279664, and
[Patent reference 7] JP-A-2004-240387.

Non-Patent Reference

[Non-patent reference 1] Proc. SPIE, 2002, Vol. 4688, page 11,
[Non-patent reference 2] Proc. SPIE, 2000, Vol. 3999, page 2.

BRIEF SUMMARY OF THE INVENTION

It is an object of the present invention to provide an actinic-ray- or radiation-sensitive resin composition that excels in the conformability to a liquid for liquid immersion during liquid immersion exposure to thereby form a pattern reduced in the occurrence of watermark defects, bubble defects and development defects, and improved in coverage dependence. It is another object of the present invention to provide a method of forming a pattern with the use of the actinic-ray- or radiation-sensitive resin composition.

The inventor has conducted extensive and intensive studies with a view toward attaining the above objects, and has arrived at the following present invention.

(1) An actinic-ray- or radiation-sensitive resin composition comprising a hydrophobic resin (HR) containing a fluorine atom, wherein the hydrophobic resin (HR) comprises any of repeating units (a) of general formula (I) or (II) below:

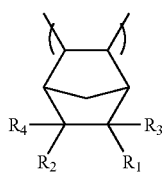
(I)

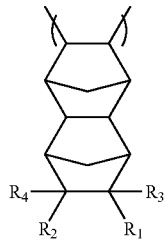
(II)

In general formulae (I) and (II), each of $R_1$, $R_2$, $R_3$ and $R_4$ independently represents a hydrogen atom, a fluorine atom, a chlorine atom, a carboxyl group, an alkyl group, a cycloalkyl group, an alkyloxy group, an alkylcarbonyl group, an arylcarbonyl group, an alkylcarbonyloxy group, an arylcarbonyloxy group, an alkyloxycarbonyl group, an aryloxycarbonyl group, an alkyl ether group, an aryl ether group, a hydroxyl group, an alkyl amido group, an aryl amido group, an aryl group, a cyano group, an acid decomposable group or an alkali decomposable group, provided that the hydrogen atoms of the alkyl group, cycloalkyl group, alkyloxy group, alkylcarbonyl group, arylcarbonyl group, alkylcarbonyloxy group, arylcarbonyloxy group, alkyloxycarbonyl group, aryloxycarbonyl group, alkyl ether group, aryl ether group, alkyl amido group, aryl amido group, aryl group, acid decomposable group and alkali decomposable group may be partially or wholly replaced by fluorine atoms, and provided that any two of the $R_1$, $R_2$, $R_3$ and $R_4$ may be bonded to each other to thereby form a ring.

(2) The actinic-ray- or radiation-sensitive resin composition according to item (1) above, wherein the hydrophobic resin (HR) further comprises a repeating unit with a lactone structure.

(3) The actinic-ray- or radiation-sensitive resin composition according to item (1) or (2) above, which further comprises:

(A) a resin that when acted on by an acid is decomposed to thereby exhibit an increased solubility in an alkali developer,
(B) a compound that when exposed to actinic rays or radiation, generates an acid, and
(C) a solvent.

(4) The actinic-ray- or radiation-sensitive resin composition according to item (2) or (3) above, wherein the repeating unit with a lactone structure introduced in the hydrophobic resin (HR) is any of those of general formula (HI) below:

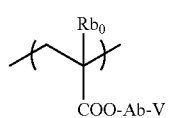
(HI)

In general formula (HI), $Rb_0$ represents a hydrogen atom, a halogen atom, an optionally substituted alkyl group, a halogenated alkyl group or a cyano group.

Ab represents a single bond, an alkylene group, a bivalent connecting group with an alicyclic hydrocarbon structure of a single ring or multiple rings, an ether group, an ester group, a carbonyl group, or a bivalent connecting group resulting from a combination thereof.

V represents a monovalent organic group with a lactone structure.

(5) The actinic-ray- or radiation-sensitive resin composition according to item (4) above, wherein in the general formula (HI), $Rb_0$ represents a halogenated alkyl group or a cyano group.

(6) The actinic-ray- or radiation-sensitive resin composition according to item (4) above, wherein in the general formula (HI), $Rb_0$ represents a $CF_3$ group.

(7) The actinic-ray- or radiation-sensitive resin composition according to any of items (3) to (6) above, wherein the resin (A) has a repeating unit with an acid-decomposable group containing a monocyclic or polycyclic structure.

(8) The actinic-ray- or radiation-sensitive resin composition according to any of items (3) to (7) above, wherein the resin (A) has a repeating unit containing a lactone structure.

(9) The actinic-ray- or radiation-sensitive resin composition according to item (8) above, wherein the repeating unit containing a lactone structure introduced in the resin (A) is any of those of general formula (3) below:

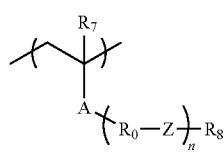

(3)

In the general formula (3),

A represents an ester bond (—COO—) or an amido bond (—CONH—).

$R_0$ or each of $R_0$s independently represents an alkylene group, a cycloalkylene group or a combination thereof.

Z or each of Zs independently represents an ether bond, an ester bond, an amido bond, a urethane bond or a urea bond.

$R_8$ represents a monovalent organic group with a lactone structure.

n represents the number of repetitions and is an integer of 1 to 5.

$R_7$ represents a hydrogen atom, a halogen atom or an optionally substituted alkyl group.

(10) The actinic-ray- or radiation-sensitive resin composition according to any of items (1) to (9) above, wherein the content ratio of hydrophobic resin (HR) is in the range of 0.01 to 10 mass % based on the total solids of the actinic-ray- or radiation-sensitive resin composition.

(11) The actinic-ray- or radiation-sensitive resin composition according to any of items (1) to (10) above, which further comprises a basic compound (D).

(12) The actinic-ray- or radiation-sensitive resin composition according to any of items (1) to (11) above, which further comprises a surfactant (E).

(13) A method of forming a pattern, comprising forming the actinic-ray- or radiation-sensitive resin composition according to any of items (1) to (12) above into a film, exposing the film and developing the exposed film.

(14) The method of forming a pattern according to item (13) above, wherein the film is exposed through a liquid for liquid immersion.

The present invention has made it feasible to provide an actinic-ray- or radiation-sensitive resin composition that excels in the conformability to a liquid for liquid immersion during liquid immersion exposure to thereby form a pattern reduced in the occurrence of watermark defects, bubble defects and development defects.

DETAILED DESCRIPTION OF THE INVENTION

Figure 1:
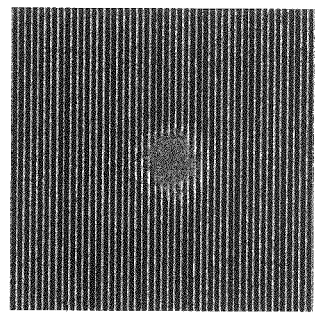
FIG. 1 is an SEM micrograph showing a watermark defect.

The present invention will be described in detail below.

With respect to the expression of a group (atomic group) used in this specification, the expression even when there is no mention of "substituted and unsubstituted" encompasses groups not only having no substituent but also having substituents. For example, the expression "alkyl groups" encompasses not only alkyls having no substituent (unsubstituted alkyls) but also alkyls having substituents (substituted alkyls).

[1] Hydrophobic Resin (HR)

The hydrophobic resin (HR) contained in the actinic-ray- or radiation-sensitive resin composition of the present invention contains a fluorine atom.

In the hydrophobic resin (HR), the fluorine atom may be introduced in the principal chain of the resin or may be introduced in a side chain of the resin by substitution. Further, the fluorine atom may be introduced as any of partial structures shown below, or may be contained in any of the repeating units (a) to be described hereinafter. Still further, the fluorine atom may be contained in other repeating units introduced by copolymerization.

According to one embodiment, the hydrophobic resin (HR) may be a resin having an alkyl group containing a fluorine atom, a cycloalkyl group containing a fluorine atom or an aryl group containing a fluorine atom as a partial structure containing a fluorine atom.

The alkyl group containing a fluorine atom (preferably having 1 to 10 carbon atoms, more preferably 1 to 4 carbon atoms) is a linear or branched alkyl group having at least one hydrogen atom thereof substituted with a fluorine atom. Further, other substituents may be possessed.

The cycloalkyl group containing a fluorine atom is a cycloalkyl group of a single ring or multiple rings having at least one hydrogen atom thereof substituted with a fluorine atom. Further, other substituents may be contained.

As the aryl group containing a fluorine atom, there can be mentioned one having at least one hydrogen atom of an aryl group, such as a phenyl or naphthyl group, substituted with a fluorine atom. Further, other substituents may be contained.

As preferred alkyl groups containing a fluorine atom, cycloalkyl groups containing a fluorine atom and aryl groups containing a fluorine atom, there can be mentioned groups of the following general formulae (F2) to (F4), which however in no way limit the scope of the present invention.

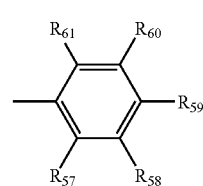

(F2)

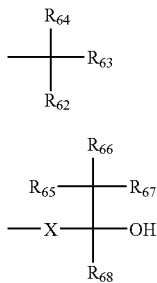

(F3)

(F4)

In the general formulae (F2) to (F4), each of $R_{57}$ to $R_{68}$ independently represents a hydrogen atom, a fluorine atom or an alkyl group, provided that at least one of each of $R_{57}$-$R_{61}$, $R_{62}$-$R_{64}$ and $R_{65}$-$R_{68}$ represents a fluorine atom or an alkyl group (preferably having 1 to 4 carbon atoms) having at least one hydrogen atom thereof substituted with a fluorine atom. It is preferred that all of $R_{57}$-$R_{61}$ and $R_{65}$-$R_{67}$ represent fluorine atoms. Each of $R_{62}$, $R_{63}$ and $R_{68}$ preferably represents an alkyl group (especially having 1 to 4 carbon atoms) having at least one hydrogen atom thereof substituted with a fluorine atom, more preferably a perfluoroalkyl group having 1 to 4 carbon atoms. $R_{62}$ and $R_{63}$ may be bonded with each other to thereby form a ring.

X represents a single bond or an alkylene group. As preferred alkylene groups, there can be mentioned a linear or branched alkylene group having 1 to 4 carbon atoms. A methylene group is more preferred.

Specific examples of the groups of the general formula (F2) include a p-fluorophenyl group, a pentafluorophenyl group, a 3,5-di(trifluoromethyl)phenyl group and the like.

Specific examples of the groups of the general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, a perfluorocyclohexyl group and the like. Of these, a hexafluoroisopropyl group, a heptafluoroisopropyl group, a hexafluoro(2-methyl)isopropyl group, an octafluoroisobutyl group, a nonafluoro-t-butyl group and a perfluoroisopentyl group are preferred. A hexafluoroisopropyl group and a heptafluoroisopropyl group are more preferred.

Specific examples of the groups of the general formula (F4) include —C(CF$_3$)$_2$OH, —C(C$_2$F$_5$)$_2$OH, —C(CF$_3$)(CH$_3$)OH, —CH(CF$_3$)OH, —CH$_2$—(CF$_3$)$_2$OH and the like. —C(CF$_3$)$_2$OH is preferred.

The hydrophobic resin (HR) comprises a repeating unit represented by general formula (I) or (II) below.

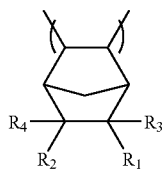

(I)

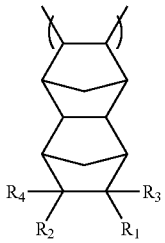

(II)

In general formulae (I) and (II), each of $R_1$, $R_2$, $R_3$ and $R_4$ independently represents a hydrogen atom, a fluorine atom, a chlorine atom, a carboxyl group, an alkyl group, a cycloalkyl group, an alkyloxy group, an alkylcarbonyl group, an arylcarbonyl group, an alkylcarbonyloxy group, an arylcarbonyloxy group, an alkyloxycarbonyl group, an aryloxycarbonyl group, an alkyl ether group, an aryl ether group, a hydroxyl group, an alkyl amido group, an aryl amido group, an aryl group, a cyano group, an acid decomposable group or an alkali decomposable group, provided that the hydrogen atoms of the alkyl group, cycloalkyl group, alkyloxy group, alkylcarbonyl group, arylcarbonyl group, alkylcarbonyloxy group, arylcarbonyloxy group, alkyloxycarbonyl group, aryloxycarbonyl group, alkyl ether group, aryl ether group, alkyl amido group, aryl amido group, aryl group, acid decomposable group and alkali decomposable group may be partially or wholly replaced by fluorine atoms, and provided that any two of the $R_1$, $R_2$, $R_3$ and $R_4$ may be bonded to each other to thereby form a ring.

Each of the alkyl groups represented by $R_1$ to $R_4$ may have a substituent and may be linear or branched.

Each of the linear alkyl groups preferably has 1 to 30 carbon atoms, more preferably 1 to 20 carbon atoms. As such, there can be mentioned, for example, a methyl group, an ethyl group, an n-propyl group, an n-butyl group, a sec-butyl group, a t-butyl group, an n-pentyl group, an n-hexyl group, an n-heptyl group, an n-octyl group, an n-nonyl group, an n-decanyl group and the like. Each of the branched alkyl groups preferably has 3 to 30 carbon atoms, more preferably 3 to 20 carbon atoms. As such, there can be mentioned, for example, an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nonyl group, a t-decanyl group and the like. As preferred substituents that can be introduced, there can be mentioned an alkoxy group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, a heterocyclic residue such as a pyrrolidone residue and the like.

The hydrogen atoms of these alkyl groups may be partially or wholly replaced by fluorine atoms.

Each of the aryl groups represented by $R_1$ to $R_4$ preferably has 6 to 10 carbon atoms. As such, there can be mentioned, for example, a phenyl group, a naphthyl group, an anthryl group and the like. The aryl groups may have substituents. As the substituents, there can be mentioned the same groups that can be introduced in the alkyl groups as mentioned above, alkyl groups and the like. The hydrogen atoms of these aryl groups may be partially or wholly replaced by fluorine atoms.

Each of the cycloalkyl groups represented by $R_1$ to $R_4$ may be monocyclic or polycyclic. Each of the cycloalkyl groups with a single ring preferably has 3 to 8 carbon atoms. As such, there can be mentioned, for example, a cyclopropyl group, a cyclobutyl group, a cyclopentyl group, a cyclohexyl group, a cyclooctyl group and the like. Each of the cycloalkyl groups with multiple rings preferably has 6 to 20 carbon atoms. As such, there can be mentioned, for example, an adamantyl group, a norbornyl group, an isobornyl group, a camphonyl group, a dicyclopentyl group, an α-pinel group, a tricyclodecanyl group, a tetracyclododecyl group, an androstanyl group and the like. The carbon atoms of these cycloalkyl groups may be partially substituted with heteroatoms, such as an oxygen atom. The cycloalkyl groups may have substituents. As the substituents, there can be mentioned the same groups that can be introduced in the alkyl groups as mentioned above, alkyl groups and the like. The hydrogen atoms of these cycloalkyl groups may be partially or wholly replaced by fluorine atoms.

As the alkyloxy group represented by $R_1$ to $R_4$, there can be mentioned a methoxy group, an ethoxy group, an isopropoxy group, a t-butoxy group, a benzyloxy group and the like. The hydrogen atoms of these alkyloxy groups may be partially or wholly replaced by fluorine atoms.

The alkyl groups of the alkyloxycarbonyl groups represented by $R_1$ to $R_4$ are as mentioned above.

The aryl groups of the aryloxycarbonyl groups represented by $R_1$ to $R_4$ are as mentioned above.

The alkyl groups of the alkylcarbonyl groups represented by $R_1$ to $R_4$ are as mentioned above.

The aryl groups of the arylcarbonyl groups represented by $R_1$ to $R_4$ are as mentioned above.

The alkyl groups of the alkylcarbonyloxy groups represented by $R_1$ to $R_4$ are as mentioned above.

The aryl groups of the arylcarbonyloxy groups represented by $R_1$ to $R_4$ are as mentioned above.

The alkyl groups of the alkyl ether groups represented by $R_1$ to $R_4$ are as mentioned above.

The aryl groups of the aryl ether groups represented by $R_1$ to $R_4$ are as mentioned above.

The alkyl groups of the alkyl amido groups represented by $R_1$ to $R_4$ are as mentioned above.

The aryl groups of the aryl amido groups represented by $R_1$ to $R_4$ are as mentioned above.

The acid decomposable group represented by $R_1$ to $R_4$ means a group that is decomposed by the action of an acid to thereby generate an alkali soluble group. As the acid decomposable group, there can be mentioned the same groups as contained in the resin (A) to be described hereinafter. As typical examples, there can be mentioned groups represented by formula -T-COO—$C(R_{X1})(R_{X2})(R_{X3})$ contained in general formula (AI) to be described hereinafter.

The alkali decomposable group represented by $R_1$ to $R_4$ means a group that is decomposed by the action of an alkali developer, resulting in an increase of solubility in the alkali developer. As the alkali decomposable group, there can be mentioned, for example, a group having a lactone structure, an acid anhydride group, an acid imide group or the like. A group having a lactone structure is preferred. As the alkali decomposable group, there can be mentioned the same groups having a lactone structure as contained in the resin (A) to be described hereinafter. As specific examples, there can be mentioned groups represented by formula —COO-Ab-V contained in general formula (AII) to be mentioned hereinafter.

The ring formed by mutual bonding of any two of $R_1$ to $R_4$ may be monocyclic or polycyclic. The monocyclic structure is preferably a cycloalkane structure having 3 to 8 carbon atoms. As such, there can be mentioned, for example, a cyclopropane structure, a cyclobutane structure, a cyclopentane structure, a cyclohexane structure, a cycloheptane structure, a cyclooctane structure or the like. The polycyclic structure is preferably a cycloalkane structure having 6 to 20 carbon atoms. As such, there can be mentioned, for example, an adamantane structure, a norbornane structure, a dicyclopentane structure, a tricyclodecane structure, a tetracyclododecane structure or the like. With respect to these, the carbon atoms of each of the cycloalkane structures may be partially substituted with a heteroatom, such as an oxygen atom.

Specific examples of the repeating units (a) of the above general formulae (I) and (II) will be shown below, which however in no way limit the scope of the present invention.

When an alkyl group, a cycloalkyl group or an aryl group represented by $R_1$ to $R_4$ is substituted with a fluorine atom, the preferred structures thereof are represented by general formulae (F2) to (F4) above.

Specific examples of the repeating unit (a) of general formula (I) or (II) are shown below.

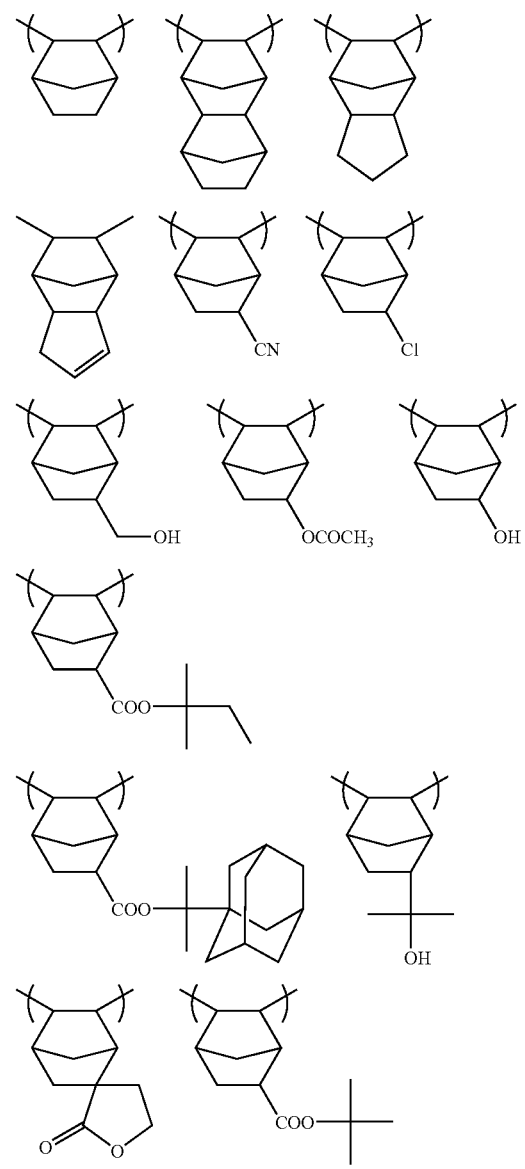

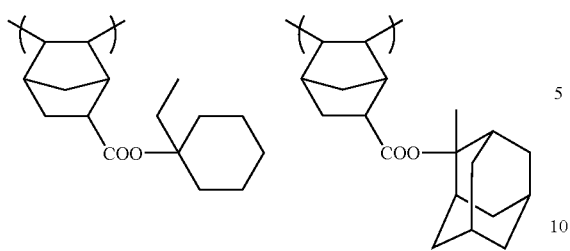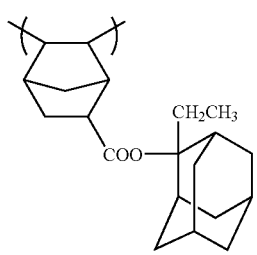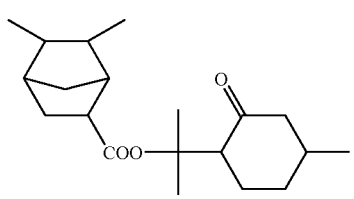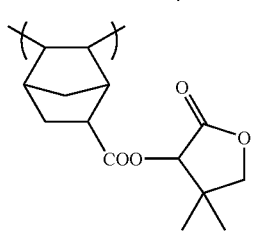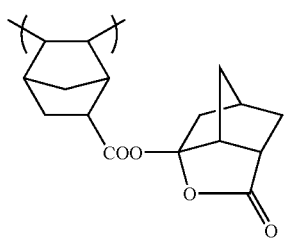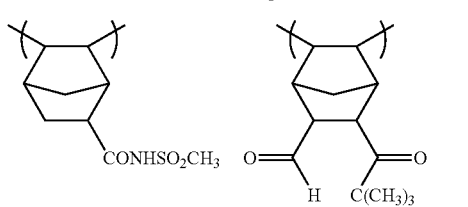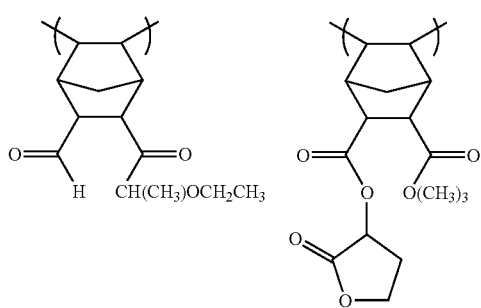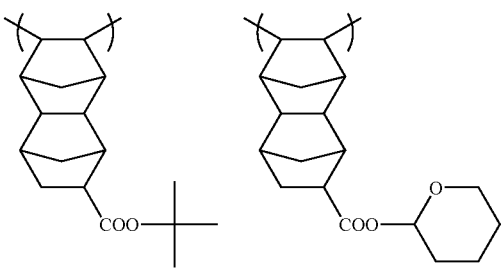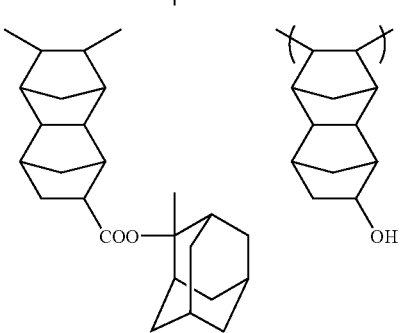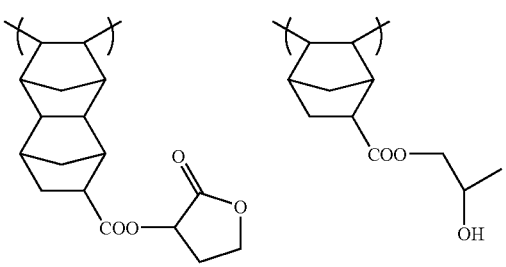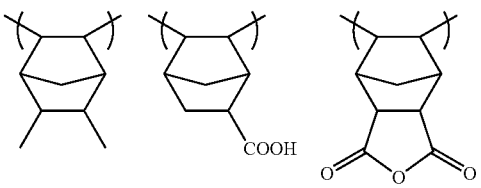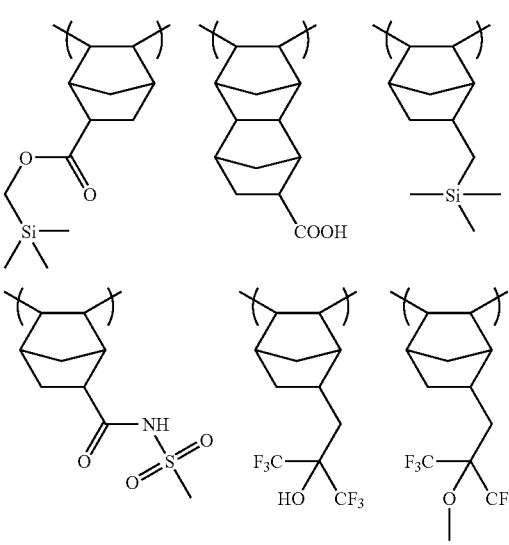

-continued

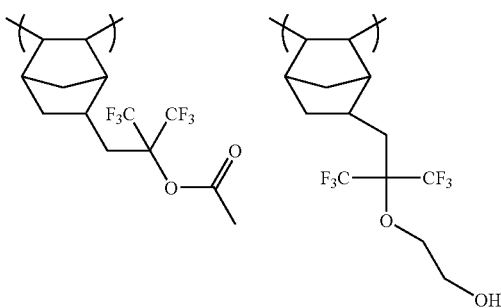
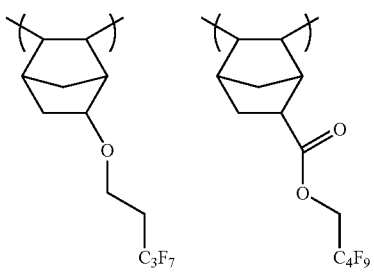
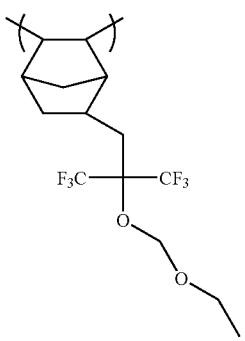
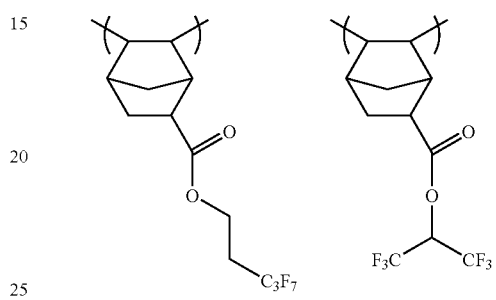
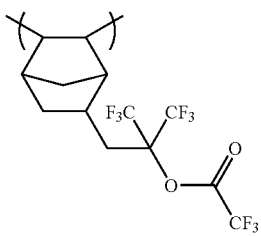
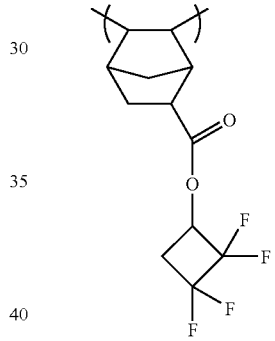
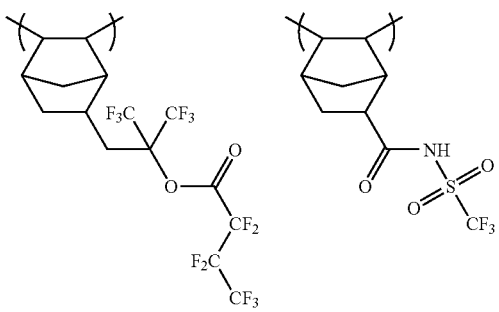
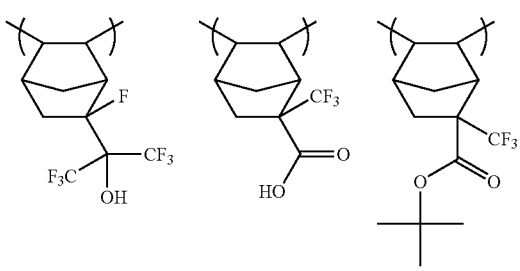
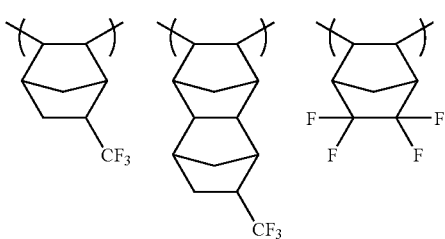

The content ratio of repeating unit (a) is preferably in the range of 5 to 50 mol %, more preferably 30 to 50 mol % based on all the repeating units of the resin (HR). It is more preferred for the resin (HR) to comprise a repeating unit with a lactone structure.

Any lactone groups can be employed as long as a lactone structure is possessed therein. However, lactone structures of a 5 to 7-membered ring are preferred, and in particular, those resulting from condensation of lactone structures of a 5 to 7-membered ring with other cyclic structures effected in a fashion to form a bicyclo structure or spiro structure are preferred. The possession of repeating units having the lactone structure represented by any of general formulae (LC1-1) to (LC1-17) that may be contained in the resin (A) to be described hereinafter is more preferred. The lactone structures may be directly bonded to the principal chain of the resin. Preferred lactone structures are those of the formulae (LC1-1), (LC1-4), (LC1-5), (LC1-6), (LC1-13), (LC1-14) and (LC1-17). The use of these specified lactone structures would ensure improvement in the LWR and development defect.

In particular, it is preferred for the resin (HR) to contain the repeating units represented by general formula (HI) below.

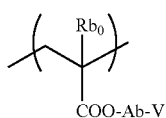

(HI)

In general formula (HI), $Rb_0$ represents a hydrogen atom, a halogen atom, an optionally substituted alkyl group or a cyano group. As a preferred substituent optionally contained in the alkyl group represented by $Rb_0$, there can be mentioned a hydroxyl group or a halogen atom. As the halogen atom represented by $Rb_0$, there can be mentioned a fluorine atom, a chlorine atom, a bromine atom or an iodine atom. The $Rb_0$ is preferably a halogen atom, an alkyl halide or a cyano group. A cyano group and a trifluoromethyl group are especially preferred.

Ab represents a single bond, an alkylene group, a bivalent connecting group with an alicyclic hydrocarbon structure of a single ring or multiple rings, an ether group, an ester group, a carbonyl group, or a bivalent connecting group resulting from combination thereof. A single bond and a bivalent connecting group of the formula $-Ab_1-CO_2-$ are preferred.

$Ab_1$ is a linear or branched alkylene group or a cycloalkylene group of a single ring or multiple rings, being preferably a methylene group, an ethylene group, a cyclohexylene group, an adamantylene group or a norbornylene group.

V represents a monovalent organic group with a lactone structure. In particular, V represents a group with a structure represented by any of the general formulae (LC1-1) to (LC1-17).

Examples of the repeating units having a lactone group will now be shown, which however in no way limit the scope of the present invention. In the formulae, Rx represents H, $CH_3$ or CN.

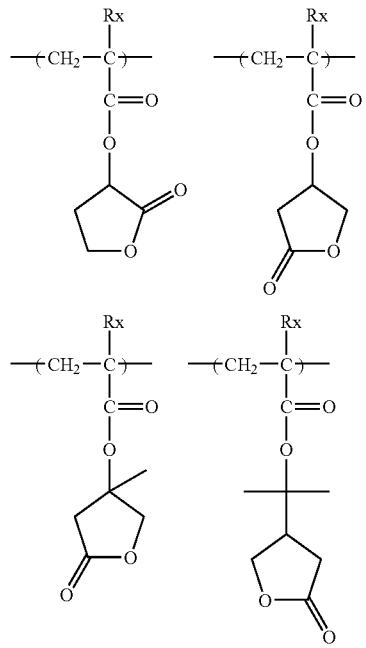

-continued

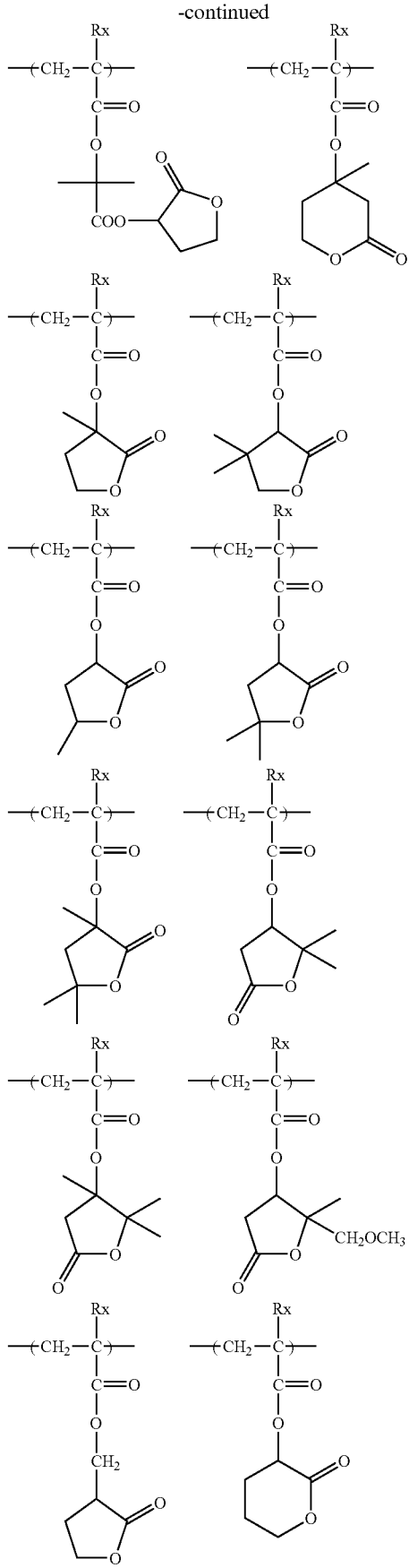

-continued
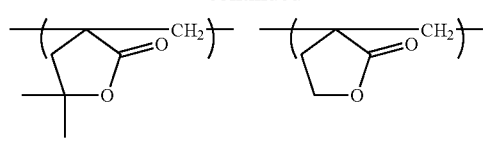
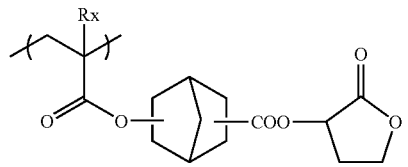
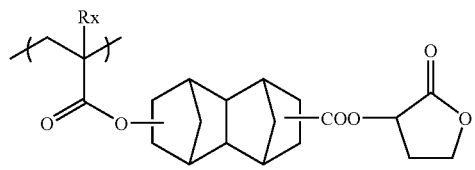
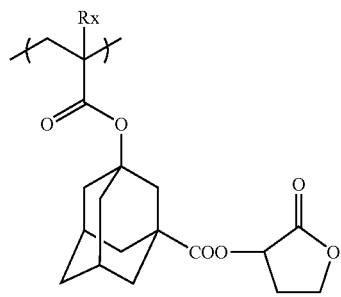
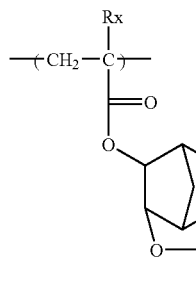
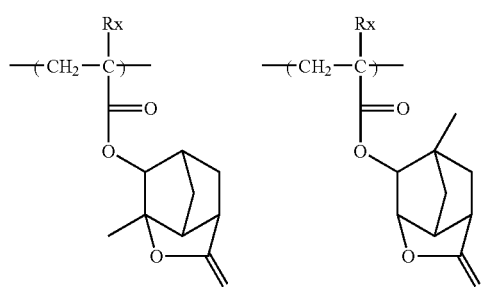
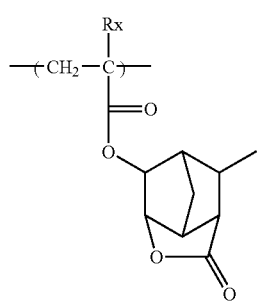
-continued
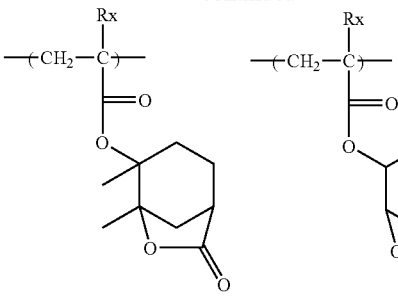
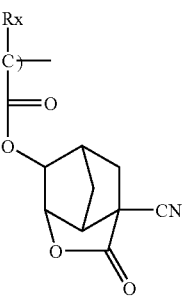
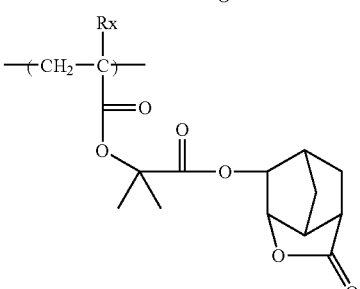
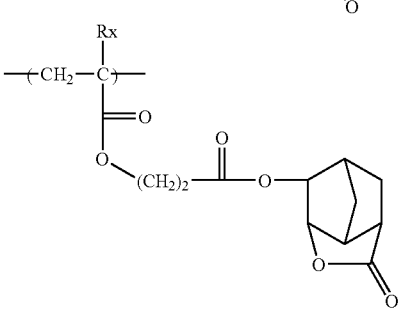
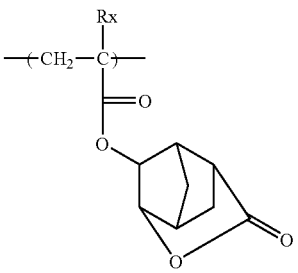
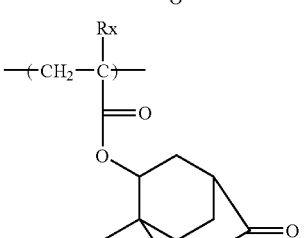
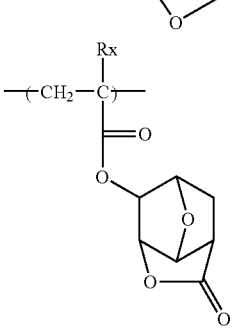

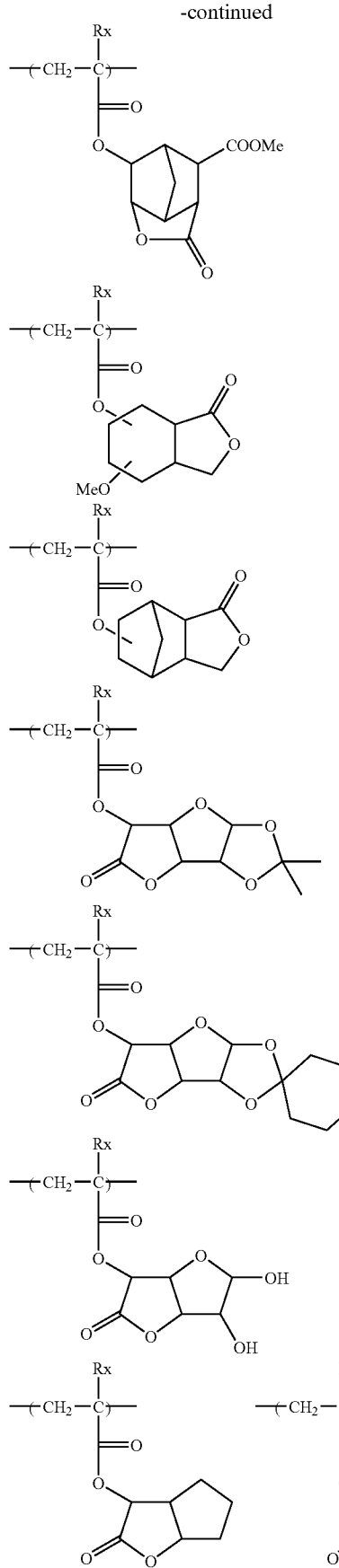
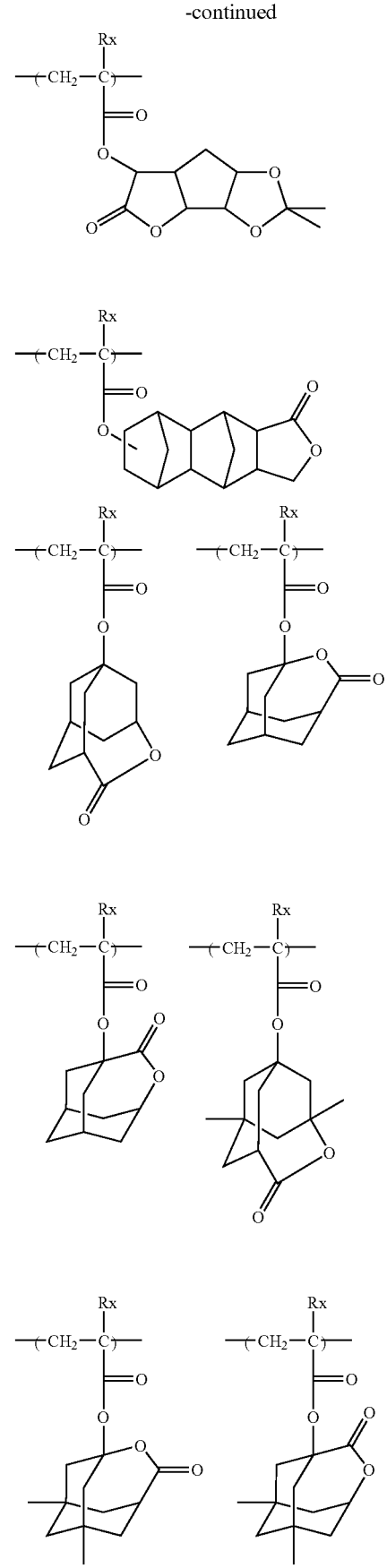

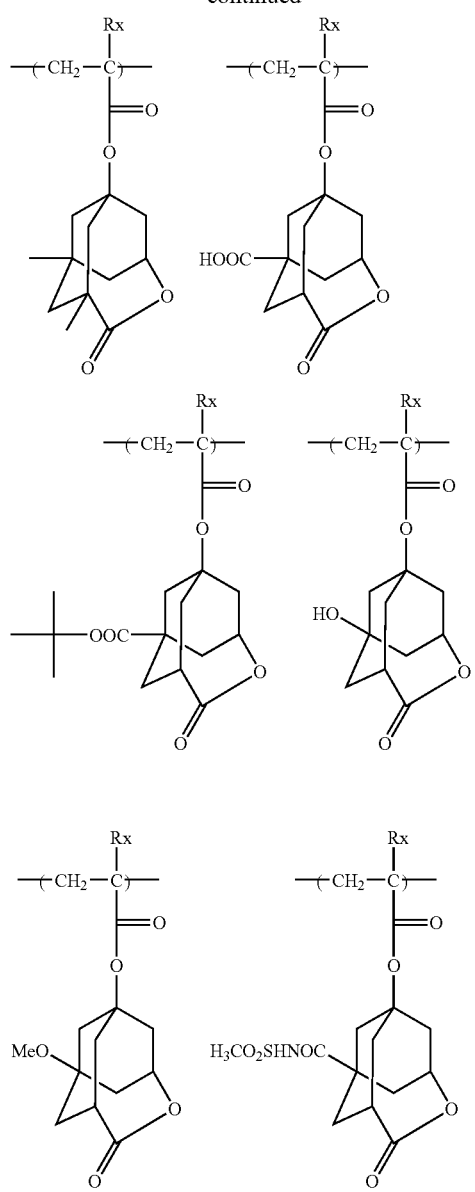
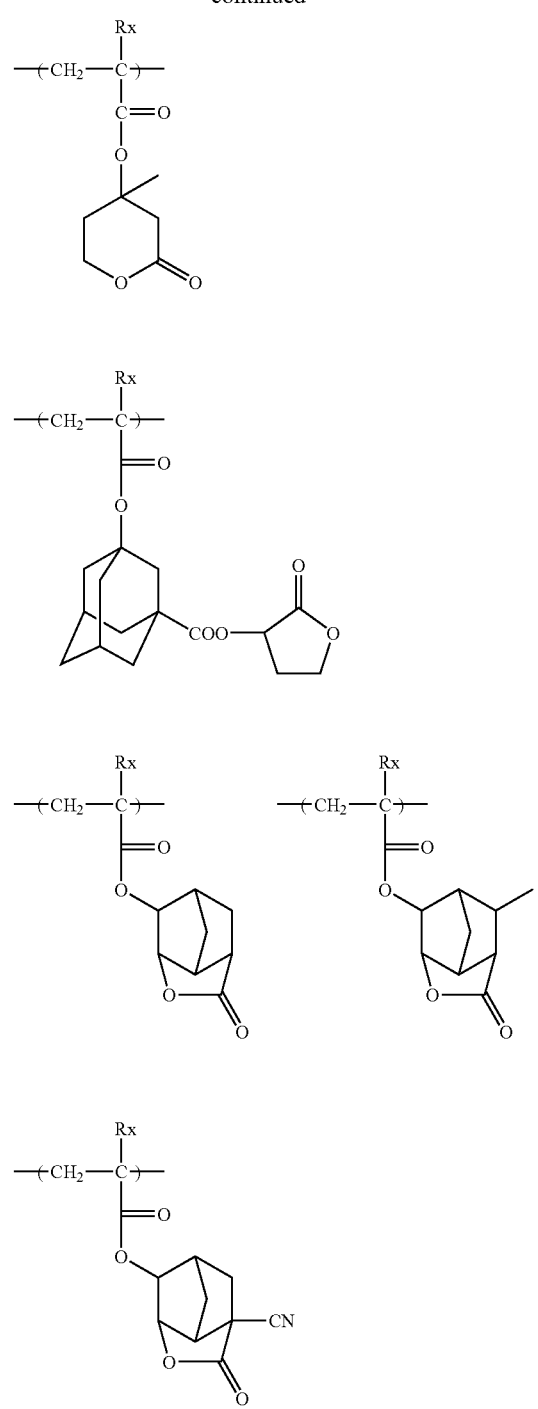
The especially preferred repeating units having a lactone group will be shown below. An improvement in pattern profile and coverage dependence can be attained by selection of the most appropriate lactone group. In the formulae, Rx represents H, $CH_3$, $CF_3$ or CN.
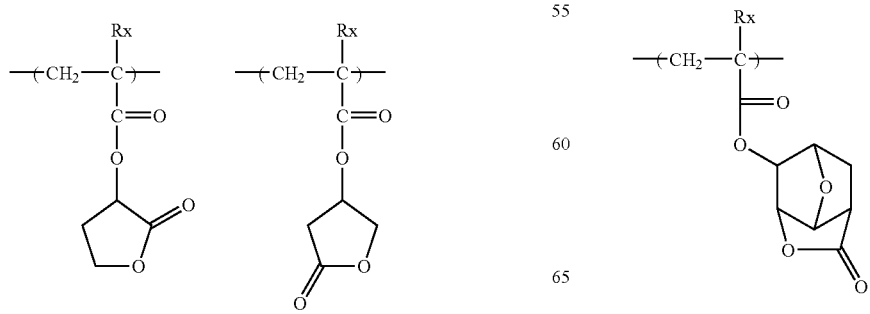

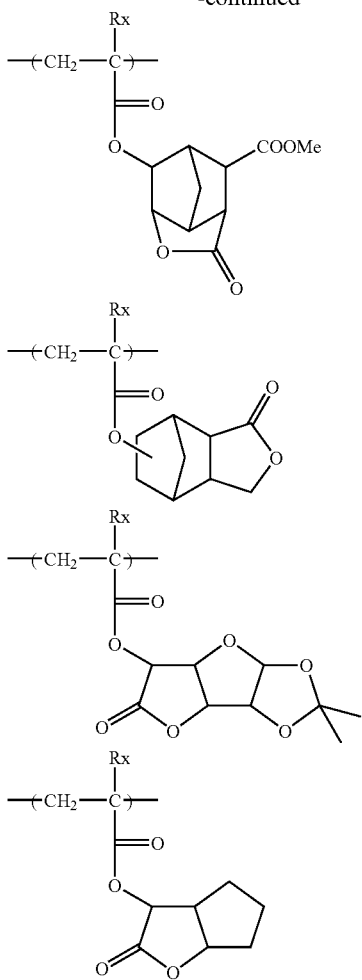

The hydrophobic resin (HR) may have any of the repeating units with a lactone structure of general formula (HII) below.

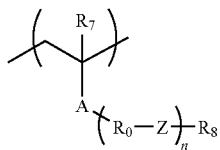

(HII)

In general formula (HII),

A represents an ester bond (—COO—) or an amido bond (—CONH—).

$R_0$ or each of $R_0$s independently represents an alkylene group, a cycloalkylene group or a combination thereof.

Z or each of Zs independently represents an ether bond, an ester bond, an amido bond, a urethane bond or a urea bond.

$R_8$ represents a monovalent organic group with a lactone structure.

In the general formula (HII), n is an integer of 1 to 5, preferably 1 or 2.

$R_7$ represents a hydrogen atom, a halogen atom, an optionally substituted alkyl group or a cyano group. As preferred substituents that may be introduced in the alkyl group represented by $R_7$, there can be mentioned a hydroxyl group and a halogen atom. As the halogen atom represented by $R_7$, there can be mentioned a fluorine atom, a chlorine atom, a bromine atom or an iodine atom. $R_7$ is preferably a halogen atom, a halogenated alkyl group or a cyano group. A cyano group and a trifluoromethyl group are especially preferred.

The alkylene group and cycloalkylene group represented by $R_0$ may have substituents.

Z is preferably an ether bond or an ester bond. An ester bond is especially preferred.

$R_0$ is preferably a chain alkylene group, which preferably has 1 to 10 carbon atoms, more preferably 1 to 5 carbon atoms. As such, there can be mentioned, for example, a methylene group, an ethylene group, a propylene group or the like. The cycloalkylene group is preferably a cycloalkylene group having 3 to 20 carbon atoms. As such, there can be mentioned, for example, cyclohexylene, cyclopentylene, norbornylene, adamantylene or the like. The chain alkylene groups are more advantageous from the viewpoint of the exertion of the effect of the present invention.

The monovalent organic group with a lactone structure represented by $R_8$ is not particularly limited as long as a lactone structure is contained. As specific examples thereof, there can be mentioned the lactone structures of general formulae (LC1-1) to (LC1-17) below. Of these, the structure of general formula (LC1-4) is especially preferred. In the general formulae (LC1-1) to (LC1-17), $n_2$ is more preferably 2 or less.

$R_8$ is preferably a monovalent organic group with an unsubstituted lactone structure or a monovalent organic group with a lactone structure having a methyl group, a cyano group or an alkoxycarbonyl group as a substituent. $R_8$ is more preferably a monovalent organic group with a lactone structure having a cyano group as a substituent (cyanolactone).

Specific examples of the repeating units each having a group with a lactone structure expressed by the general formula (HII) will be shown below, which however in no way limit the scope of the present invention. In the formulae, R represents H, $CH_3$, $CF_3$ or CN.

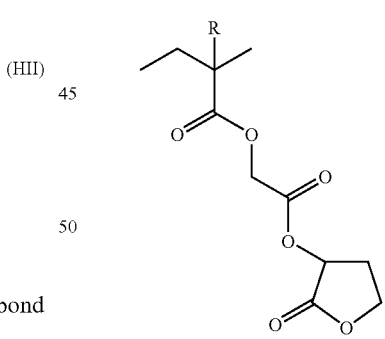

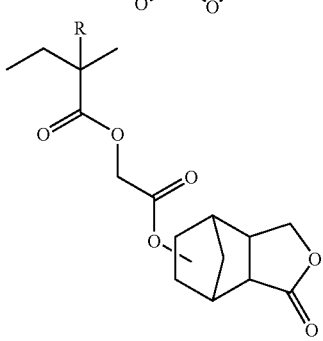

-continued

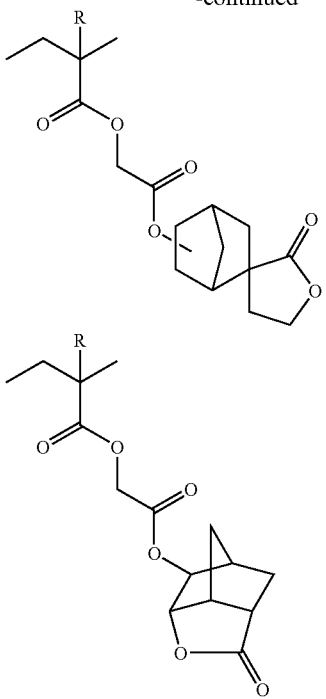

The repeating units with a lactone structure are preferably those of general formula (HIII) below.

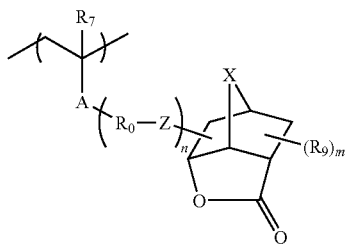

(HIII)

In general formula (HIII), $R_7$, A, $R_0$, Z and n are as defined above with respect to general formula (HII).

$R_9$, each independently in the presence of two or more groups, represents an alkyl group, a cycloalkyl group, an alkoxycarbonyl group, a cyano group, a hydroxyl group or an alkoxy group. In the presence of two or more groups, two $R_9$s may be bonded with each other to thereby form a ring.

X represents an alkylene group, an oxygen atom or a sulfur atom, and m is the number of substituents and is an integer of 0 to 5. m is preferably 0 to 2.

The alkyl group represented by $R_9$ is preferably an alkyl group having 1 to 4 carbon atoms, more preferably a methyl group or an ethyl group and most preferably a methyl group. As the cycloalkyl group, there can be mentioned a cyclopropyl group, a cyclobutyl group, a cyclopentyl group or a cyclohexyl group. As the alkoxycarbonyl group, there can be mentioned a methoxycarbonyl group, an ethoxycarbonyl group, an n-butoxycarbonyl group, a t-butoxycarbonyl group or the like. As the alkoxy group, there can be mentioned a methoxy group, an ethoxy group, an isopropoxy group, a t-butoxy group or a benzyloxy group or the like. The alkyl group, cycloalkyl group, alkoxycarbonyl group and alkoxy group may have a substituent. As the substituent therefor, there can be mentioned a hydroxyl group, an alkoxy group such as a methoxy group or an ethoxy group, a cyano group, or a halogen atom such as a fluorine atom. $R_9$ is more preferably a methylene group, a cyano group or an alkoxycarbonyl group.

As the alkylene group represented by X, there can be mentioned a methylene group, an ethylene group or the like. X is preferably an oxygen atom or a methylene group, more preferably a methylene group.

When m is 1 or greater, the substitution site of at least one $R_9$ is preferably the α-position or β-position of the carbonyl group of the lactone. The substitution at the α-position is especially preferred.

Specific examples of the repeating units having groups with a lactone structure expressed by general formula (HIII) will be shown below, which however in no way limit the scope of the present invention.

In the formulae, R represents H, $CH_3$, $CF_3$ or CN.

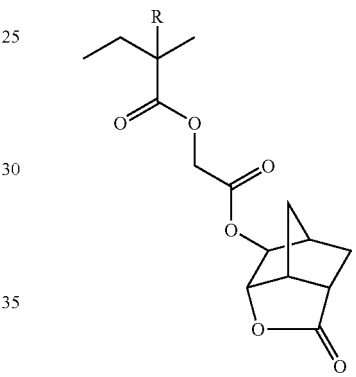

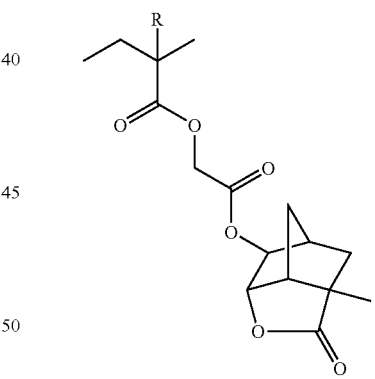

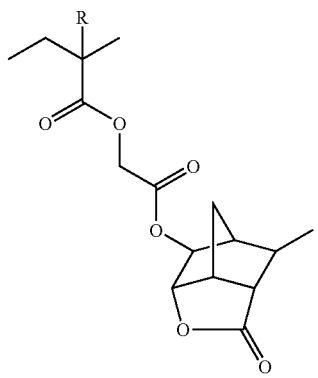

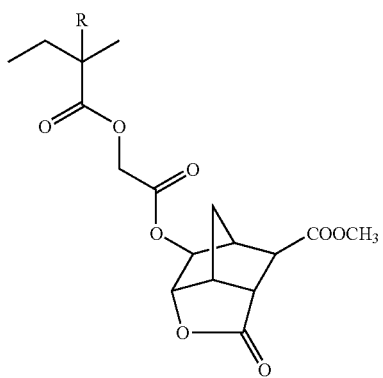
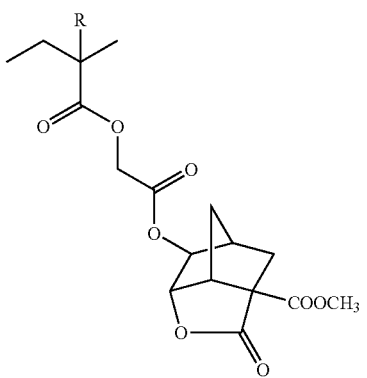
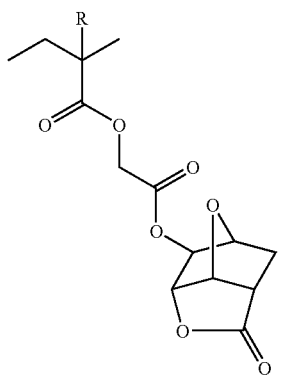
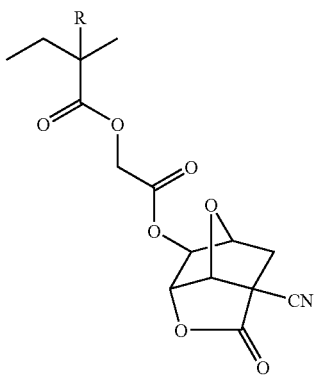
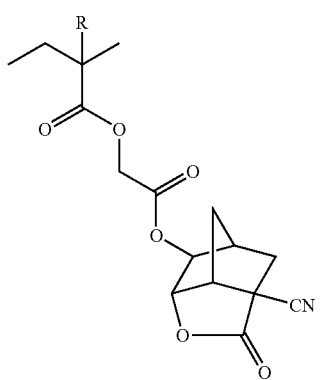
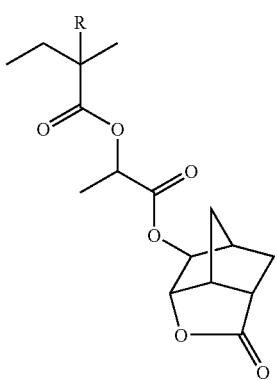
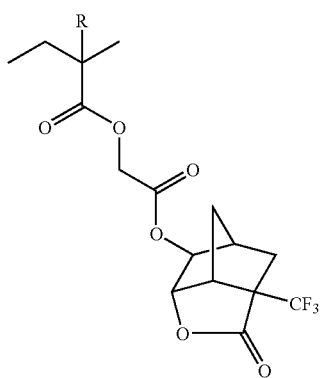
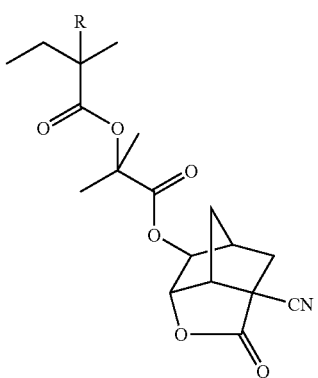

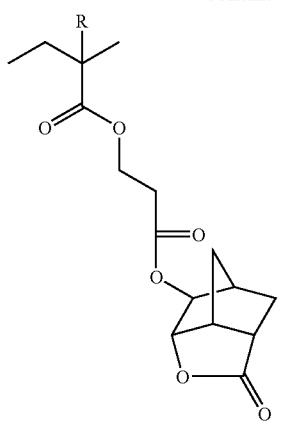
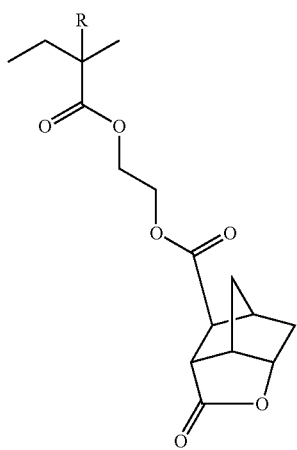
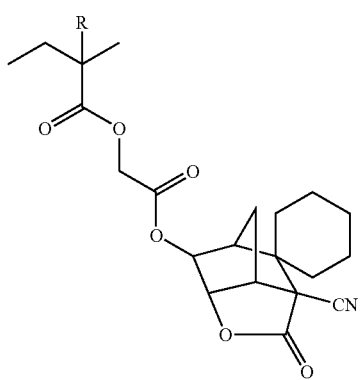
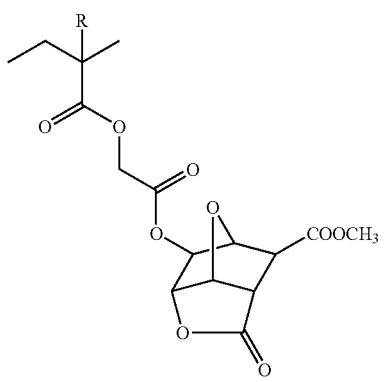
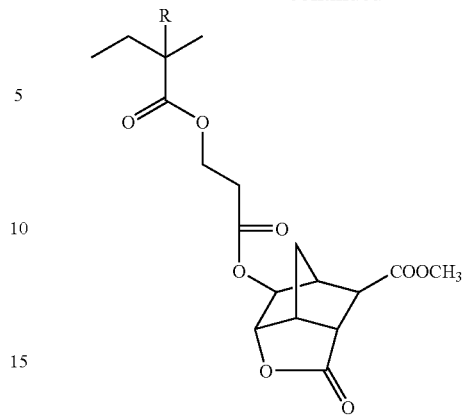
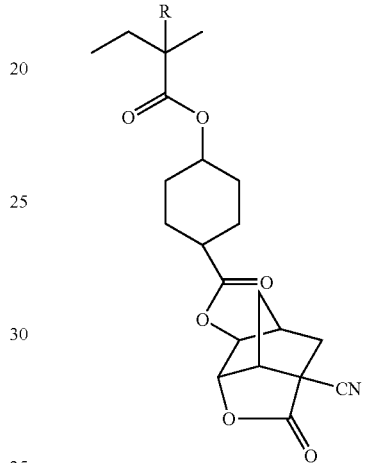
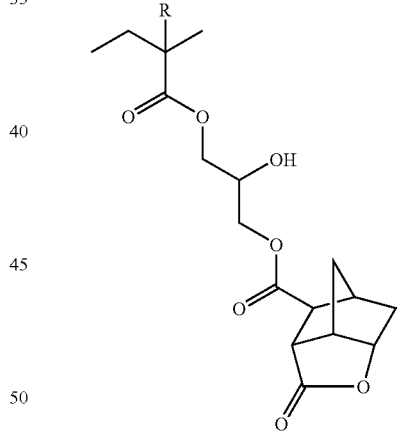
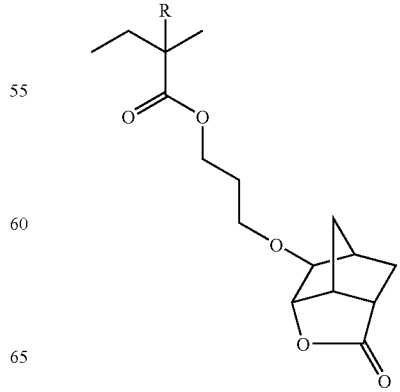

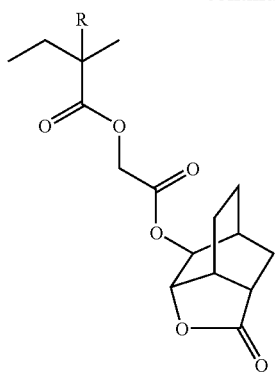
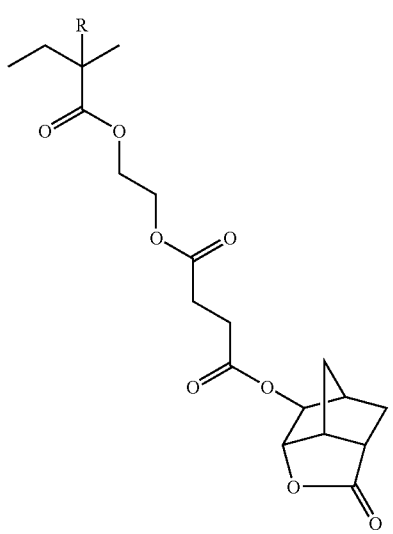
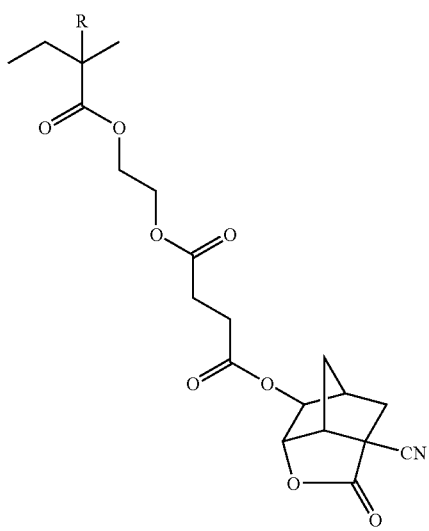

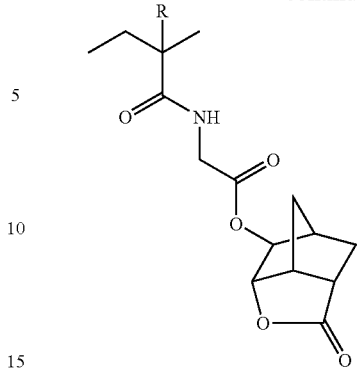
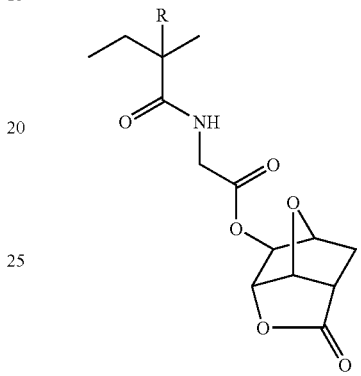
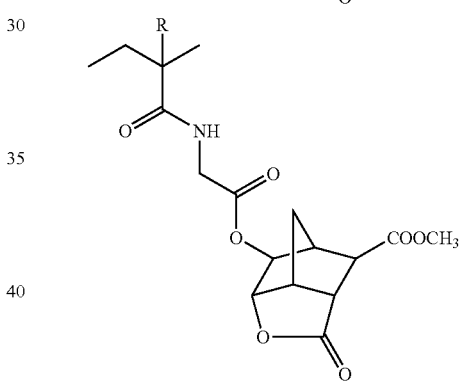

The repeating unit having a lactone group is generally present in the form of optical isomers. Any of the optical isomers may be used. It is both appropriate to use a single type of optical isomer alone and to use a plurality of optical isomers in the form of a mixture. When a single type of optical isomer is mainly used, the optical purity (ee) thereof is preferably 90 or higher, more preferably 95 or higher.

The content ratio of the repeating unit having a lactone group based on all the repeating units of the resin (HR) is preferably in the range of 5 to 50 mol %, more preferably 20 to 50 mol % and still more preferably 30 to 50 mol %.

The hydrophobic resin (HR) may have a partial structure having a silicon atom.

The hydrophobic resin (HR) is preferably a resin having an alkylsilyl structure (preferably a trialkylsilyl group) or a cyclosiloxane structure as the partial structure having a silicon atom.

As the alkylsilyl structure or cyclosiloxane structure, there can be mentioned, for example, any of the groups of the following general formulae (CS-1) to (CS-3) or the like.

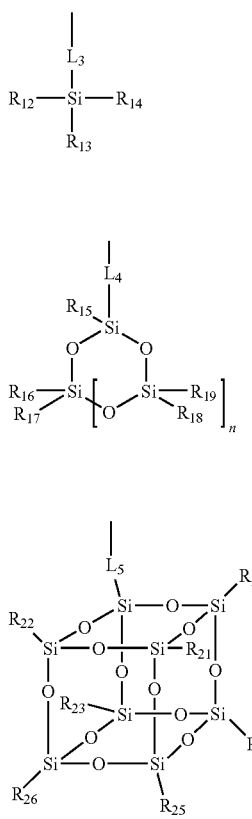

(CS-1)

(CS-2)

(CS-3)

In the general formulae (CS-1) to (CS-3), each of $R_{12}$ to $R_{26}$ independently represents a linear or branched alkyl group (preferably having 1 to 20 carbon atoms) or a cycloalkyl group (preferably having 3 to 20 carbon atoms).

Each of $L_3$ to $L_5$ represents a single bond or a bivalent connecting group. As the bivalent connecting group, there can be mentioned any one or a combination of two or more groups selected from the group consisting of an alkylene group, a phenylene group, an ether group, a thioether group, a carbonyl group, an ester group, an amido group, a urethane group and a urea group.

In the formulae, n is an integer of 1 to 5.

Specific examples of the repeating units having the groups of the general formulae (CS-1) to (CS-3) will be shown below, which however in no way limit the scope of the present invention.

In the specific examples, $X_1$ represents a hydrogen atom, —$CH_3$, —$CF_3$ or CN.

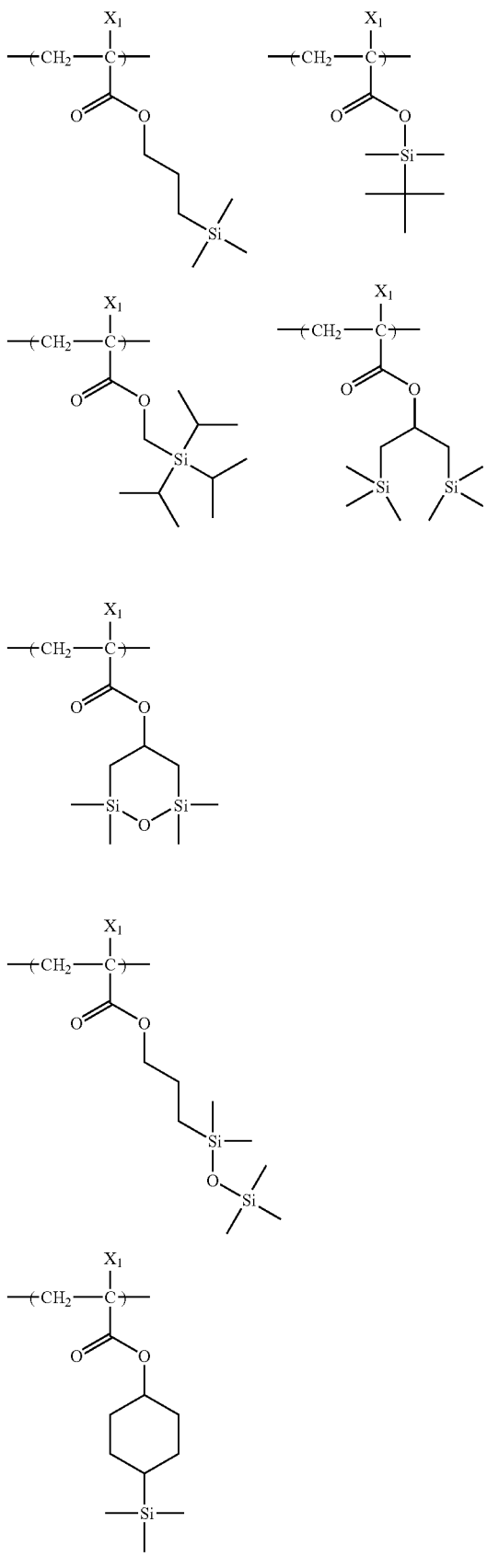

-continued

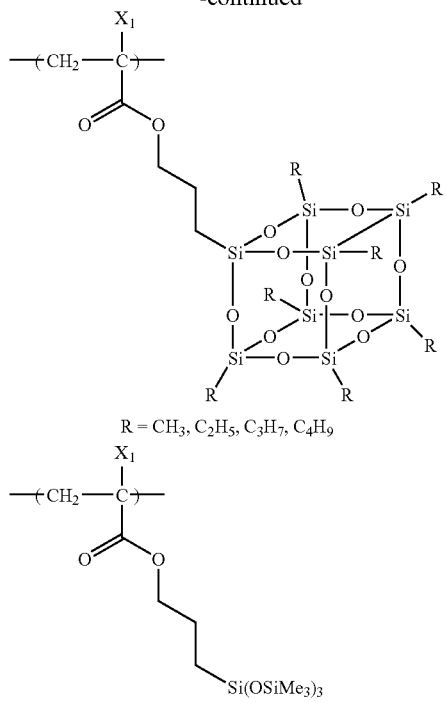

R = CH$_3$, C$_2$H$_5$, C$_3$H$_7$, C$_4$H$_9$

Moreover, the hydrophobic resin (HR) may have at least one group selected from among the following groups (x) and (z):

(x) an alkali soluble group, and (z) a group that is decomposed by the action of an acid.

As the alkali soluble group (x), there can be mentioned a phenolic hydroxyl group, a carboxylate group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis (alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris (alkylsulfonyl)methylene group or the like.

As preferred alkali soluble groups, there can be mentioned a fluoroalcohol group (preferably hexafluoroisopropanol), a sulfonimido group and a bis(carbonyl)methylene group.

As the repeating unit having an alkali soluble group (x), preferred use is made of any of a repeating unit resulting from direct bonding of an alkali soluble group to the principal chain of a resin like a repeating unit of acrylic acid or methacrylic acid, a repeating unit resulting from bonding, via a connecting group, of an alkali soluble group to the principal chain of a resin and a repeating unit resulting from polymerization with the use of a chain transfer agent or polymerization initiator having an alkali soluble group to thereby introduce the same in a polymer chain terminal.

The content ratio of repeating units having an alkali soluble group (x) is preferably in the range of 1 to 50 mol %, more preferably 1 to 35 mol % and still more preferably 1 to 20 mol % based on all the repeating units of the polymer.

Specific examples of the repeating units having an alkali soluble group (x) will be shown below, which however in no way limit the scope of the present invention.

In the formulae, Rx represents H, CH$_3$, CF$_3$ or CN.

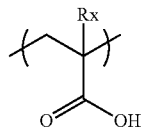
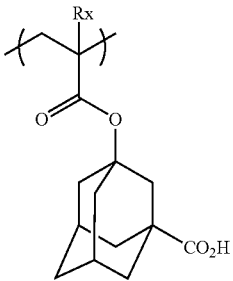
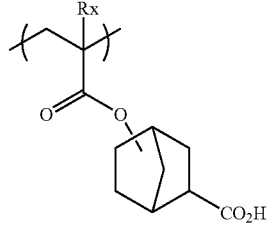
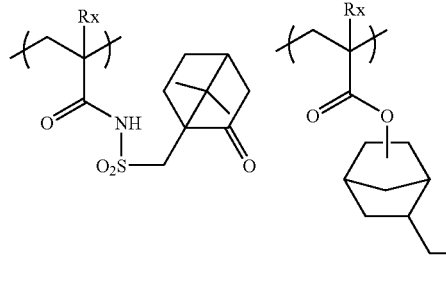
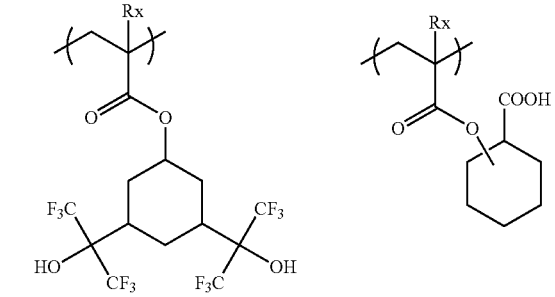
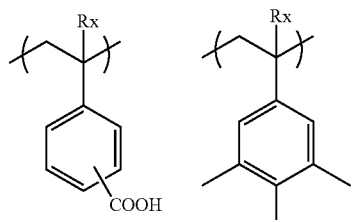
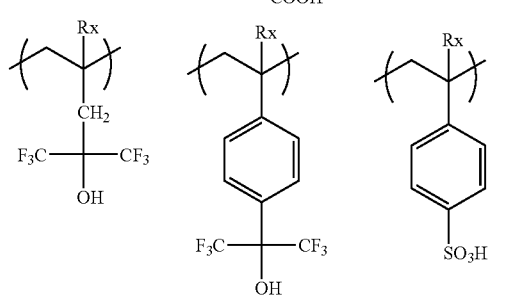

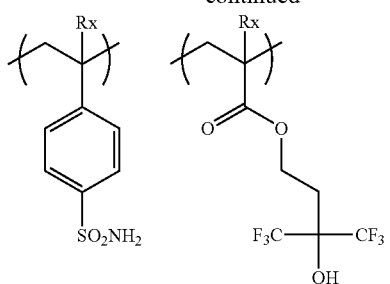
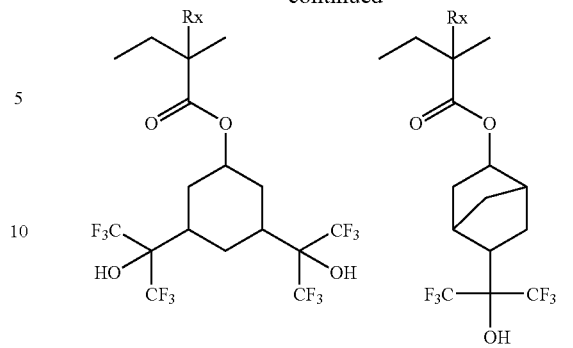

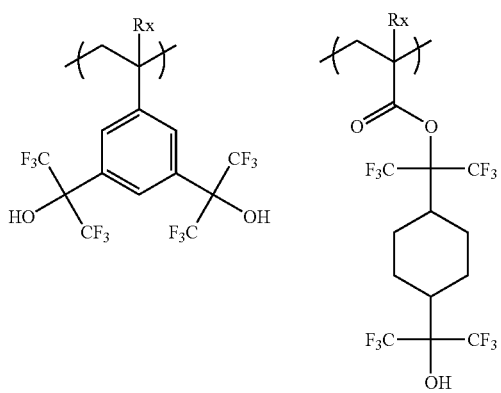
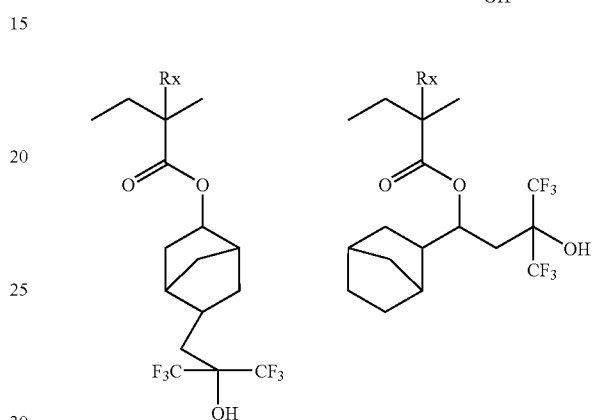

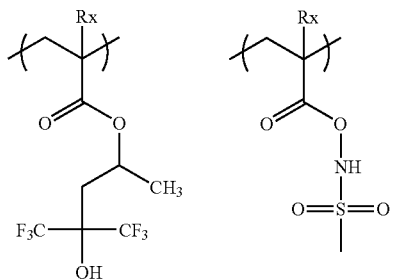

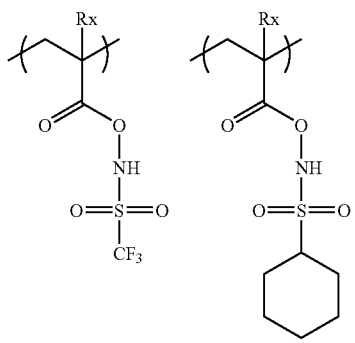

As the repeating unit having a group (z) decomposable by the action of an acid contained in the hydrophobic resin (HR), there can be mentioned not only the following specific examples but also the same repeating units with an acid-decomposable group as contained in the component (A) resin to be described hereinafter. The content ratio of repeating units each having a group (z) decomposable by the action of an acid in the hydrophobic resin (HR) is preferably in the range of 1 to 80 mol %, more preferably 10 to 80 mol % and further more preferably 20 to 60 mol % based on all the repeating units of the polymer.

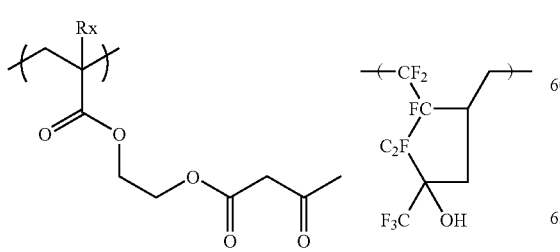
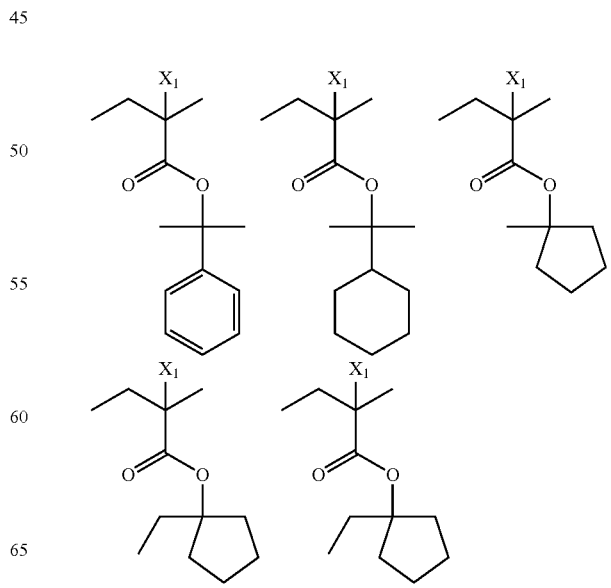

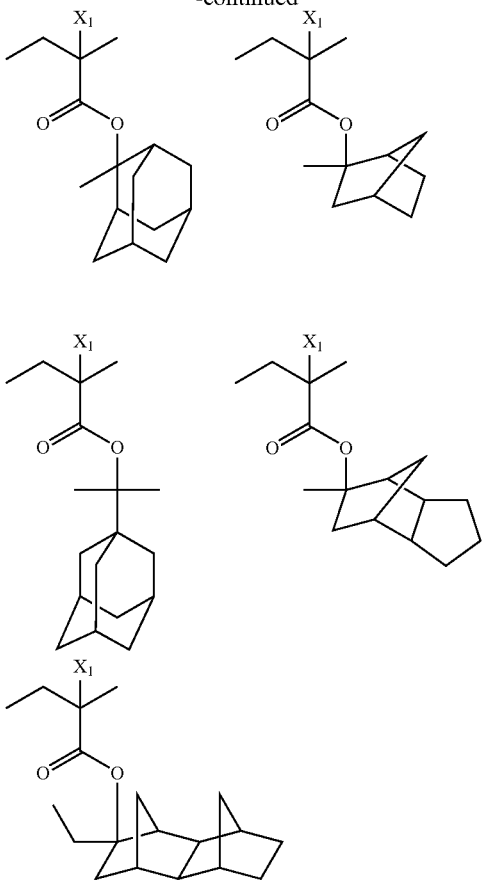

The hydrophobic resin (HR) may further have other repeating units. Preferred forms of the other repeating units are as follows:

(cy1) repeating unit that contains a fluorine atom and/or a silicon atom, being stable in an acid and insoluble in an alkali developer, (cy2) repeating unit that contains neither a fluorine atom nor a silicon atom, being stable in an acid and insoluble in an alkali developer, (cy3) repeating unit that contains a fluorine atom and/or a silicon atom, having a polar group other than the aforementioned groups (x) and (z), and (cy4) repeating unit that contains neither a fluorine atom nor a silicon atom, having a polar group other than the aforementioned groups (x) and (z).

The expression "insoluble in an alkali developer" with respect to the repeating units (cy1) and (cy2) means that the repeating units (cy1) and (cy2) contain neither an alkali-soluble group nor a group that produces an alkali-soluble group by the action of an acid or an alkali developer (for example, an acid-decomposable group or a polarity converting group).

It is preferred for the repeating units (cy1) and (cy2) to have an alicyclic hydrocarbon structure having no polar group.

Preferred forms of the repeating units (cy1) to (cy4) will be shown below.

The repeating units (cy1) and (cy2) are preferably those of general formula (CIII) below.

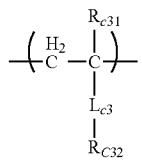

(CIII)

In general formula (CIII), $R_{c31}$ represents a hydrogen atom, an alkyl group, an alkyl group substituted with a fluorine atom, a cyano group or —$CH_2$—O—$Rac_2$ group, wherein $Rac_2$ represents a hydrogen atom, an alkyl group or an acyl group. $R_{c31}$ is preferably a hydrogen atom, a methyl group, a hydroxymethyl group, a trifluoromethyl group or a cyano group, especially preferably a cyano group or a trifluoromethyl group.

$R_{c32}$ represents a group having any of an alkyl group, a cycloalkyl group, an alkenyl group and a cycloalkenyl group. These groups may optionally be substituted with a fluorine atom or a silicon atom.

$L_{c3}$ represents a single bond or a bivalent connecting group.

In general formula (CIII), the alkyl group represented by $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

Preferably, $R_{c32}$ represents an unsubstituted alkyl group or an alkyl group substituted with a fluorine atom.

The bivalent connecting group represented by $L_{c3}$ is preferably an ester group, an alkylene group (preferably having 1 to 5 carbon atoms), an oxy group or a phenylene group.

The repeating units (cy1) and (cy2) are preferably those of general formula (C4) or (C5) below.

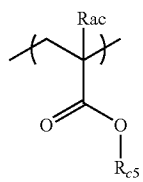

(C4)

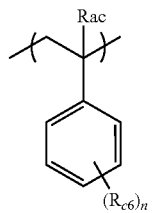

(C5)

In general formula (C4), $R_{c5}$ represents a hydrocarbon group having at least one cyclic structure in which neither a hydroxyl group nor a cyano group is contained.

Rac represents a hydrogen atom, an alkyl group, an alkyl group that may be substituted with a fluorine atom, a cyano group or a group of the formula —$CH_2$—O— $Rac_2$ in which $Rac_2$ represents a hydrogen atom, an alkyl group or an acyl group. Rac is preferably a hydrogen atom, a methyl group, a hydroxymethyl group and a trifluoromethyl group, especially preferably a cyano group and a trifluoromethyl group.

The cyclic structures contained in $R_{c5}$ include a monocyclic hydrocarbon group and a polycyclic hydrocarbon group. As the monocyclic hydrocarbon group, there can be mentioned, for example, a cycloalkyl group having 3 to 12 carbon atoms or a cycloalkenyl group having 3 to 12 carbon atoms. Preferably, the monocyclic hydrocarbon group is a monocyclic hydrocarbon group having 3 to 7 carbon atoms.

The polycyclic hydrocarbon groups include ring-assembly hydrocarbon groups and crosslinked-ring hydrocarbon groups. As the crosslinked-ring hydrocarbon rings, there can be mentioned, for example, bicyclic hydrocarbon rings, tricyclic hydrocarbon rings and tetracyclic hydrocarbon rings. Further, the crosslinked-ring hydrocarbon rings include condensed-ring hydrocarbon rings, for example, condensed rings resulting from condensation of multiple 5- to 8-membered cycloalkane rings. As preferred crosslinked-ring hydrocarbon rings, there can be mentioned, for example, a norbornyl group and an adamantyl group.

These alicyclic hydrocarbon groups may have substituents. As preferred substituents, there can be mentioned, for example, a halogen atom, an alkyl group, a hydroxyl group protected by a protective group and an amino group protected by a protective group. The halogen atom is preferably a bromine, chlorine or fluorine atom, and the alkyl group is preferably a methyl, ethyl, butyl or t-butyl group. The alkyl group may further have a substituent. As the optional further substituent, there can be mentioned a halogen atom, an alkyl group, a hydroxyl group protected by a protective group or an amino group protected by a protective group.

As the protective group, there can be mentioned, for example, an alkyl group, a cycloalkyl group, an aralkyl group, a substituted methyl group, a substituted ethyl group, an alkoxycarbonyl group or an aralkyloxycarbonyl group. The alkyl group is preferably an alkyl group having 1 to 4 carbon atoms. The substituted methyl group is preferably a methoxymethyl, methoxythiomethyl, benzyloxymethyl, t-butoxymethyl or 2-methoxyethoxymethyl group. The substituted ethyl group is preferably a 1-ethoxyethyl or 1-methyl-1-methoxyethyl group. The acyl group is preferably an aliphatic acyl group having 1 to 6 carbon atoms, such as a formyl, acetyl, propionyl, butyryl, isobutyryl, valeryl or pivaloyl group. The alkoxycarbonyl group is, for example, an alkoxycarbonyl group having 1 to 4 carbon atoms.

In the general formula (C5), Rac has the same meaning as in the general formula (C4).

$R_{c6}$ represents an alkyl group, a cycloalkyl group, an alkenyl group, a cycloalkenyl group, an alkoxycarbonyl group or an alkylcarbonyloxy group. These groups may be substituted with a fluorine atom or a silicon atom.

The alkyl group represented by $R_{c6}$ is preferably a linear or branched alkyl group having 1 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The alkoxycarbonyl group is preferably an alkoxycarbonyl group having 2 to 20 carbon atoms.

The alkylcarbonyloxy group is preferably an alkylcarbonyloxy group having 2 to 20 carbon atoms.

In the formula, n is an integer of 0 to 5. When n is 2 or greater, the plurality of $R_{c6}$s may be identical to or different from each other.

It is preferred for $R_{c6}$ to represent an unsubstituted alkyl group or an alkyl group substituted with a fluorine atom. A trifluoromethyl group and a t-butyl group are especially preferred.

Specific examples of the repeating units (cy1) and (cy2) will be shown below, which however in no way limit the scope of the present invention. In the formulae, each of Ra, $X_1$ and $X_2$ represents H, $CH_3$, $CH_2OH$, $CF_3$ or CN.

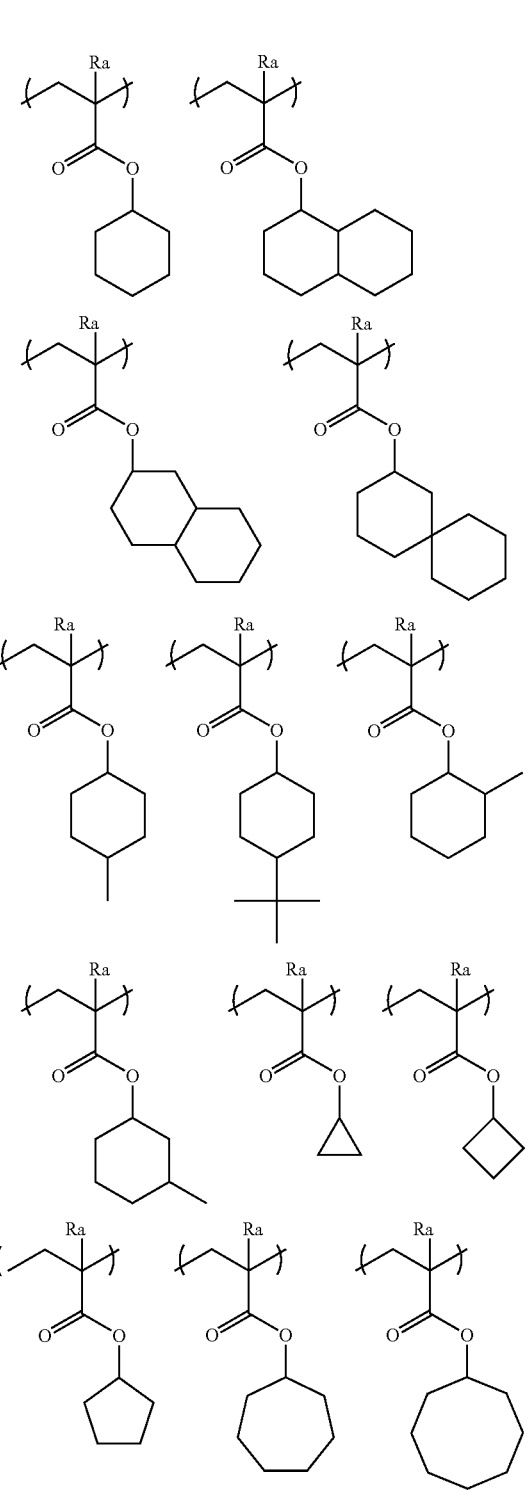

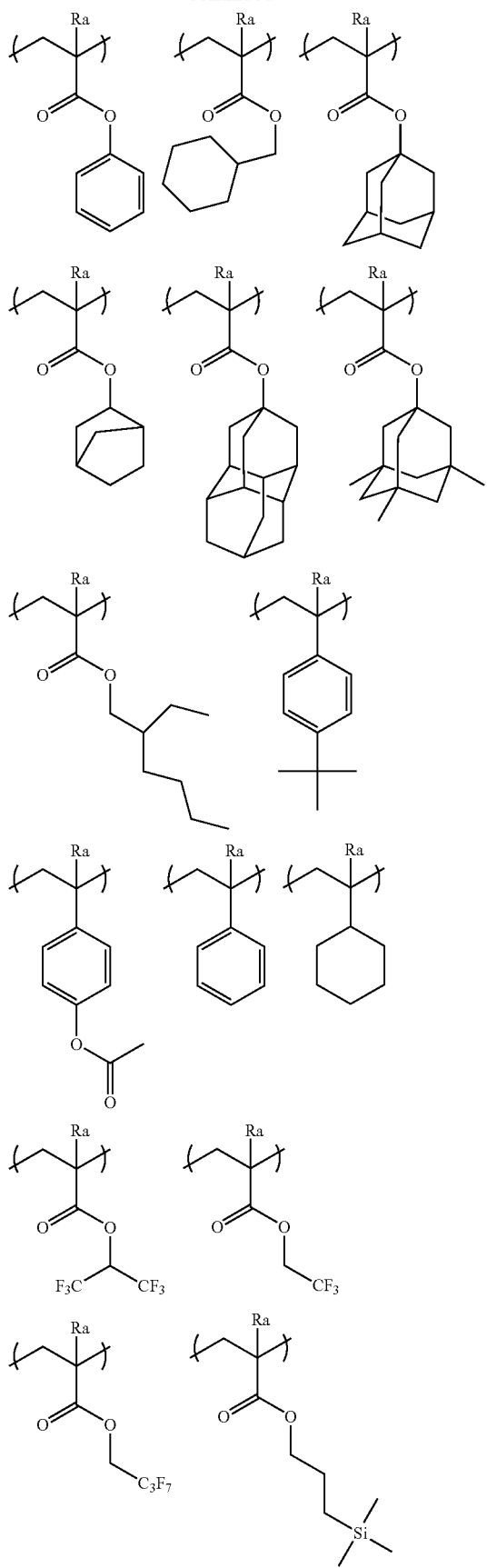
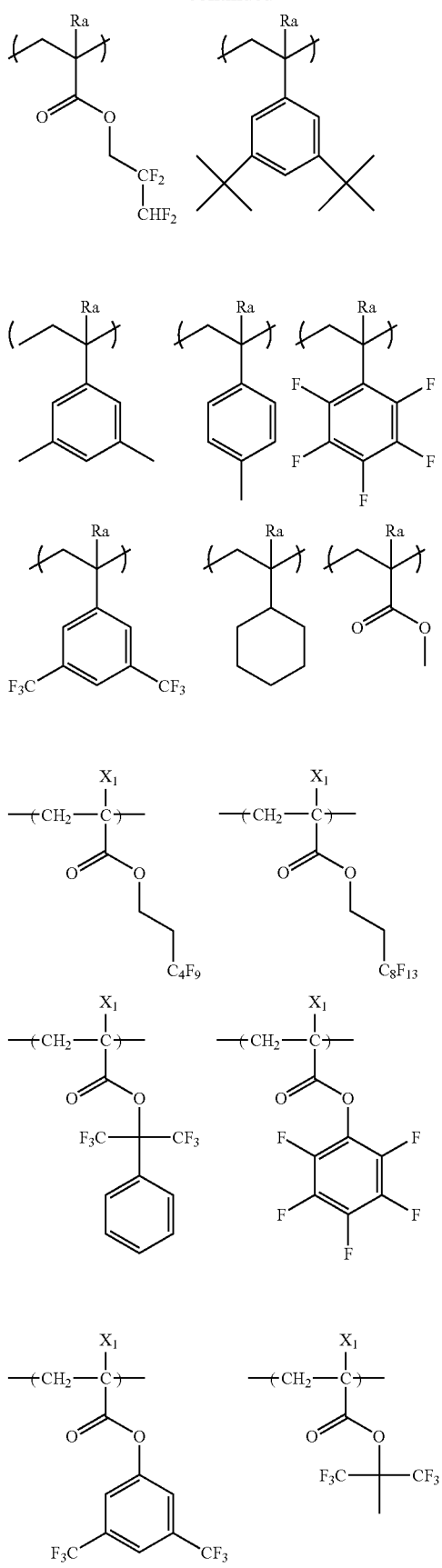

45
-continued
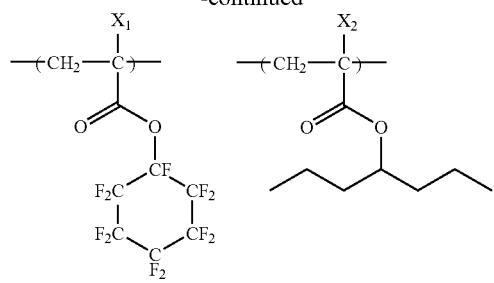
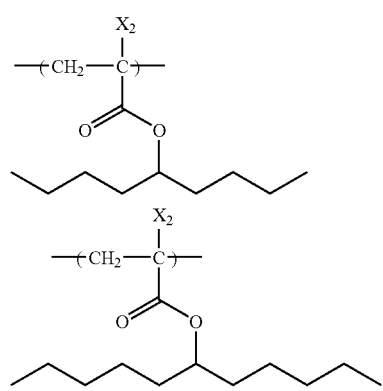
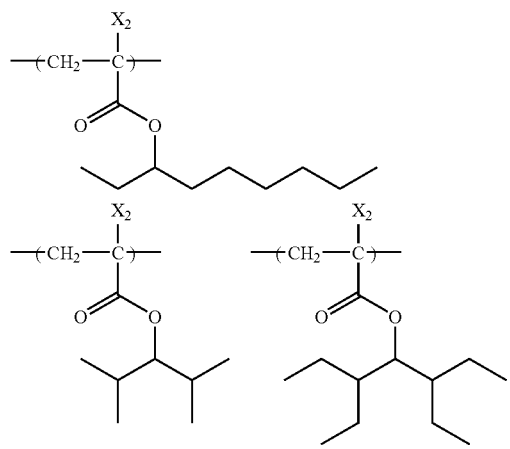
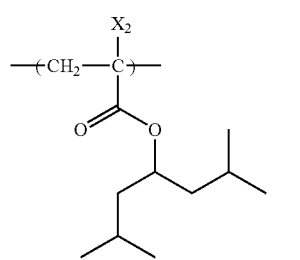
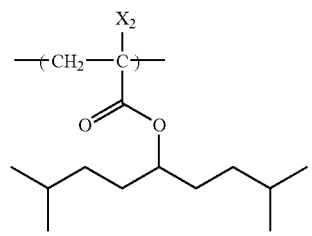
46
-continued
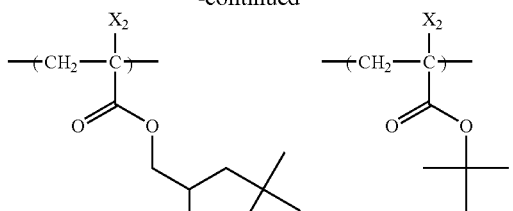
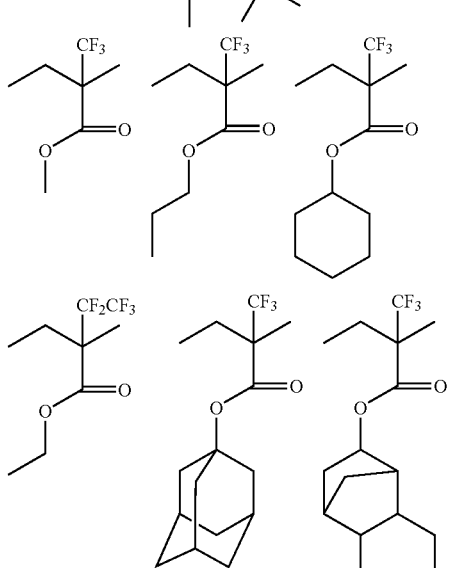

-continued

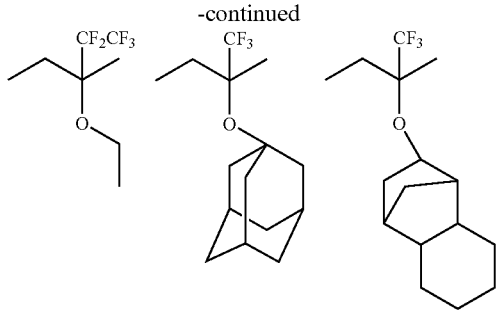
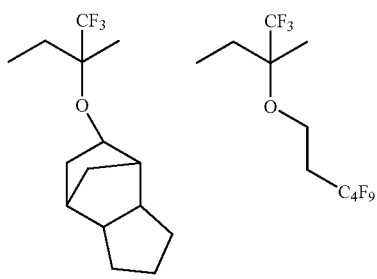
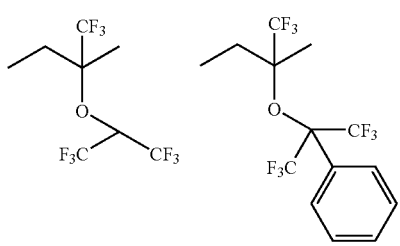
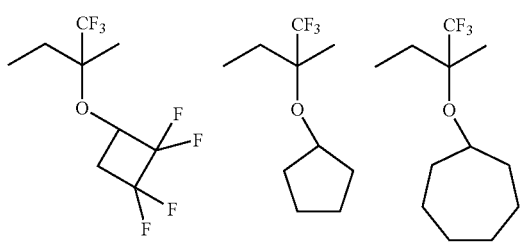
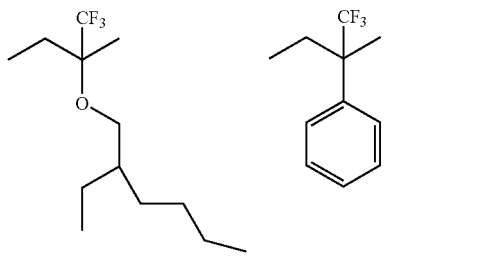
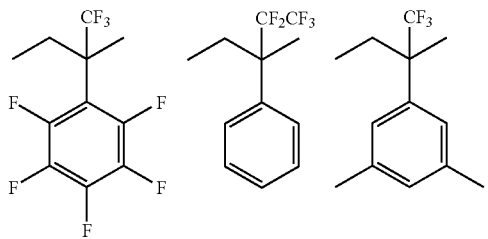

-continued

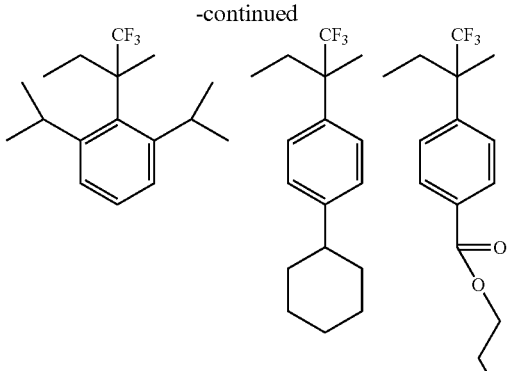
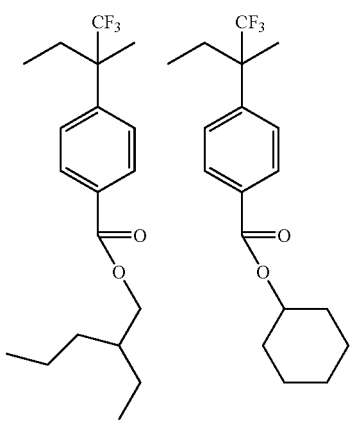

It is preferred for the repeating units (cy3) and (cy4) to be repeating units each having a hydroxyl group or a cyano group as a polar group. This increases the affinity to developers. The repeating units each having a hydroxyl group or a cyano group are preferably repeating units with an alicyclic hydrocarbon structure substituted with a hydroxyl group or a cyano group. The alicyclic hydrocarbon structure of the alicyclic hydrocarbon structure substituted with a hydroxyl group or a cyano group is preferably an adamantyl group, a diadamantyl group or a norbornyl group. As preferred alicyclic hydrocarbon structures substituted with a hydroxyl group or a cyano group, there can be mentioned a monohydroxyadamantyl group, a dihydroxyadamantyl group, a monohydroxydiadamantyl group, a dihydroxydiadamantyl group, a cyanated norbornyl group and the like.

As the repeating units with the above atomic groups, there can be mentioned those of general formulae (CAIIa) to (CAIId) below.

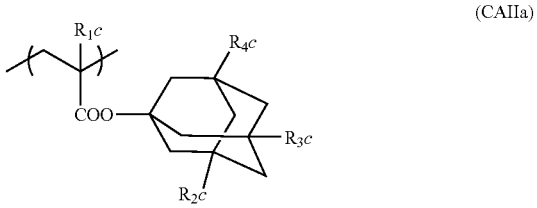

(CAIIa)

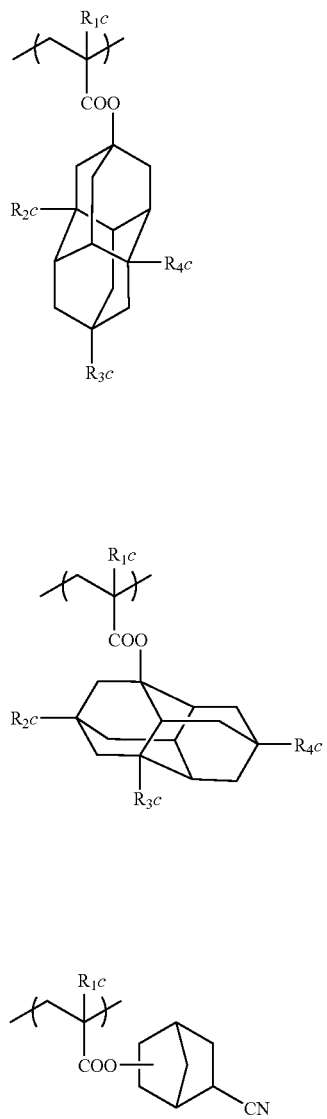

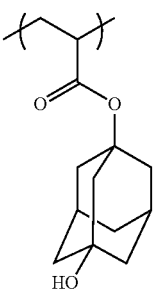 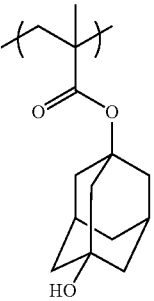 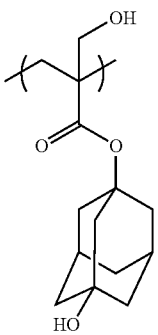

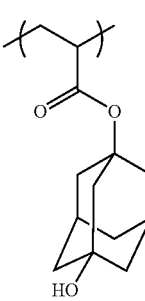 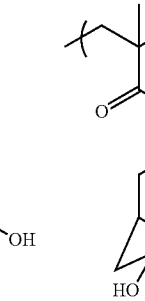

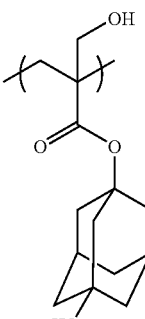 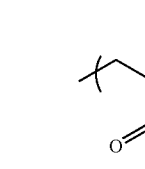

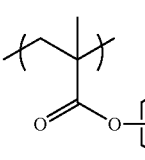

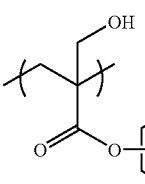

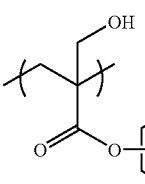

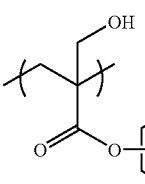

In general formulae (CAIIa) to (CAIId),

R$_1$c represents a hydrogen atom, a methyl group, a trifluoromethyl group or a hydroxymethyl group.

Each of R$_2$c to R$_4$c independently represents a hydrogen atom, a hydroxyl group or a cyano group, providing that at least one of the R$_2$c to R$_4$c represents a hydroxyl group or a cyano group. Preferably, one or two of the R$_2$c to R$_4$c are hydroxyl groups and the remainder is a hydrogen atom. In general formulae (CAIIa) to (CAIIc), more preferably, two of the R$_2$c to R$_4$c are hydroxyl groups and the remainder is a hydrogen atom.

The content ratio of the repeating unit having a hydroxyl group or a cyano group, based on all the repeating units of the resin (HR), is preferably in the range of 5 to 40 mol %, more preferably 5 to 30 mol % and still more preferably 10 to 25 mol %.

Specific examples of the repeating units having a hydroxyl group or a cyano group will be shown below, which however in no way limit the scope of the present invention.

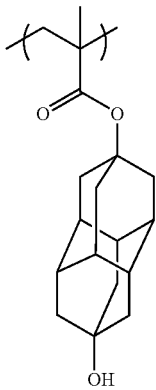
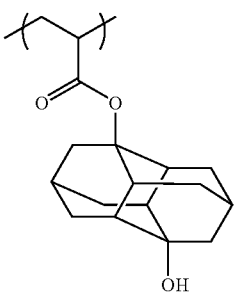

When any of the general formulae (I) and (II) and lactone structure has no fluorine atom, it is preferred for the hydrophobic resin (HR) to have the repeating unit (cy1).

The content ratio of fluorine atom(s) in the resin (HR) is preferably in the range of 5 to 80 mass %, more preferably 10 to 80 mass %, based on the molecular weight of the hydrophobic resin (HR). The repeating unit containing a fluorine atom preferably exists in the hydrophobic resin (HR) in an amount of 10 to 100 mass %, more preferably 30 to 100 mass %, based on all the repeating units of the resin (HR).

When the hydrophobic resin (HR) has a silicon atom, the content ratio of silicon atom(s) is preferably in the range of 2 to 50 mass %, more preferably 2 to 30 mass %, based on the molecular weight of the hydrophobic resin (HR). The repeating unit containing a silicon atom preferably exists in the hydrophobic resin (HR) in an amount of 10 to 50 mass %, more preferably 20 to 50 mass %, based on all the repeating units of the resin (HR).

The weight average molecular weight of the hydrophobic resin (HR) in terms of standard polystyrene molecular weight is preferably in the range of 1000 to 100,000, more preferably 1000 to 50,000 and still more preferably 2000 to 15,000.

The content ratio of hydrophobic resin (HR) in the actinic-ray- or radiation-sensitive resin composition can be appropriately regulated so that the film has a receding contact angle falling within the range to be described hereinafter. The content ratio based on the total solids of the actinic-ray- or radiation-sensitive resin composition is preferably in the range of 0.01 to 10 mass %, more preferably 0.1 to 9 mass % and further more preferably 0.5 to 8 mass %.

Impurities, such as metals, should naturally be of low quantity in the hydrophobic resin (HR), as for the resin as the component (A). The content ratio of residual monomers and oligomer components is preferably 0 to 10 mass %, more preferably 0 to 5 mass % and still more preferably 0 to 1 mass %. Accordingly, there can be obtained a resist being free from a change of in-liquid foreign matter, sensitivity, etc. over time. From the viewpoint of resolving power, resist profile, side wall of resist pattern, roughness, etc., the molecular weight distribution (Mw/Mn, also referred to as the degree of dispersal) thereof is preferably in the range of 1 to 3, more preferably 1 to 2, still more preferably 1 to 1.8 and most preferably 1 to 1.5.

A variety of commercially available products can be used as the hydrophobic resin (HR), and also the resin can be synthesized in accordance with conventional methods (for example, radical polymerization). As general synthesizing methods, there can be mentioned, for example, a batch polymerization method in which a monomer species and an initiator are dissolved in a solvent and heated to thereby carry out polymerization, a dropping polymerization method in which a solution of monomer species and initiator is dropped into a hot solvent over a period of 1 to 10 hours, and the like. The dropping polymerization method is preferred. As a reaction solvent, there can be mentioned, for example, an ether such as tetrahydrofuran, 1,4-dioxane or diisopropyl ether, a ketone such as methyl ethyl ketone or methyl isobutyl ketone, an ester solvent such as ethyl acetate, an amide solvent such as dimethylformamide or dimethylacetamide, or the after-mentioned solvent capable of dissolving the composition of the present invention, such as propylene glycol monomethyl ether acetate (PGMEA), propylene glycol monomethyl ether (PGME) or cyclohexanone. Preferably, the polymerization is carried out with the use of the same solvent as that used in the photosensitive composition of the present invention. This would inhibit any particle generation during storage.

The polymerization reaction is preferably carried out in an atmosphere consisting of an inert gas, such as nitrogen or argon. In the initiation of polymerization, a commercially available radical initiator (azo initiator, peroxide, etc.) is used as the polymerization initiator. Among the radical initiators, an azo initiator is preferred, and azo initiators having an ester group, a cyano group and a carboxyl group are more preferred. As specific preferred initiators, there can be mentioned azobisisobutyronitrile, azobisdimethylvaleronitrile, dimethyl 2,2'-azobis(2-methylpropionate) and the like. The reaction concentration is in the range of 5 to 50 mass %, preferably 30 to 50 mass %. The reaction temperature is generally in the range of 10° to 150° C., preferably 30° to 120° C. and more preferably 60° to 100° C.

After the completion of the reaction, the mixture is allowed to stand still to cool to room temperature and purified. In the purification, use is made of routine methods, such as a liquid-liquid extraction method in which residual monomers and oligomer components are removed by water washing or by the use of a combination of appropriate solvents, a method of purification in solution form such as ultrafiltration capable of extraction removal of only components of a given molecular weight or below, a re-precipitation method in which a resin solution is dropped into a poor solvent to thereby coagulate the resin in the poor solvent and thus remove residual monomers, etc. and a method of purification in solid form such as washing of a resin slurry obtained by filtration with the use of a poor solvent. For example, the reaction solution is brought into contact with a solvent wherein the resin is poorly soluble or insoluble (poor solvent) amounting to 10 or less, preferably 10 to 5 times the volume of the reaction solution to thereby precipitate the resin as a solid.

The solvent for use in the operation of precipitation or re-precipitation from a polymer solution (precipitation or re-precipitation solvent) is not limited as long as the solvent is a poor solvent for the polymer. According to the type of polymer, use can be made of any one appropriately selected from among a hydrocarbon, a halogenated hydrocarbon, a nitro compound, an ether, a ketone, an ester, a carbonate, an alcohol, a carboxylic acid, water, a mixed solvent containing these solvents and the like. Of these, it is preferred to employ a solvent containing at least an alcohol (especially methanol or the like) or water as the precipitation or re-precipitation solvent.

The amount of precipitation or re-precipitation solvent used is generally in the range of 100 to 10,000 parts by mass, preferably 200 to 2000 parts by mass and more preferably 300 to 1000 parts by mass per 100 parts by mass of the polymer solution, according to intended efficiency, yield, etc.

The temperature at which the precipitation or re-precipitation is carried out is generally in the range of about 0° to 50° C., preferably about room temperature (for example, about 20° to 35° C.), according to efficiency and operation easiness. The operation of precipitation or re-precipitation can be carried out by a publicly known method, such as a batch or continuous method, with the use of a common mixing vessel, such as an agitation vessel.

The polymer obtained by the precipitation or re-precipitation is generally subjected to common solid/liquid separation, such as filtration or centrifugal separation, and dried before use. The filtration is carried out with the use of a filter medium ensuring solvent resistance, preferably under pressure. The drying is performed at about 30° to 100° C., preferably about 30° to 50° C. at ordinary pressure or reduced pressure (preferably reduced pressure).

Alternatively, after the resin precipitation and separation, the obtained resin may be once more dissolved in a solvent and brought into contact with a solvent wherein the resin is poorly soluble or insoluble. Specifically, the method may include the steps of, after the completion of the radical polymerization reaction, bringing the polymer into contact with a solvent wherein the polymer is poorly soluble or insoluble to thereby precipitate a resin (step a), separating the resin from the solution (step b), re-dissolving the resin in a solvent to thereby obtain a resin solution (A) (step c), thereafter bringing the resin solution (A) into contact with a solvent wherein the resin is poorly soluble or insoluble amounting to less than 10 times (preferably 5 times or less) the volume of the resin solution (A) to thereby precipitate a resin solid (step d) and separating the precipitated resin (step e).

Specific examples of the hydrophobic resins (HR) will be shown below.

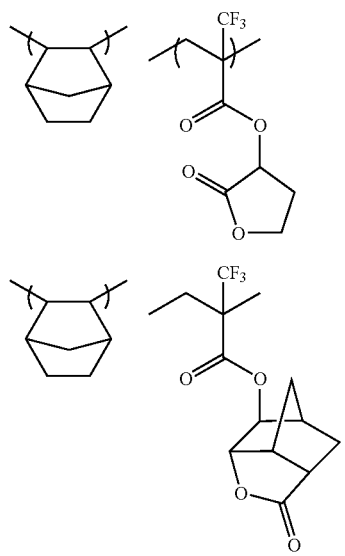

(HR-1)

(HR-2)

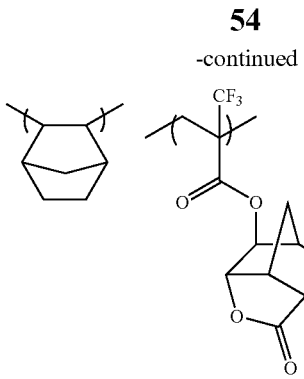

(HR-3)

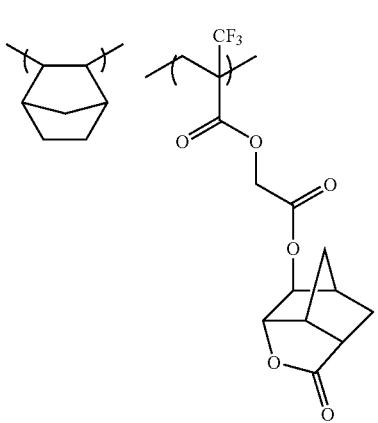

(HR-4)

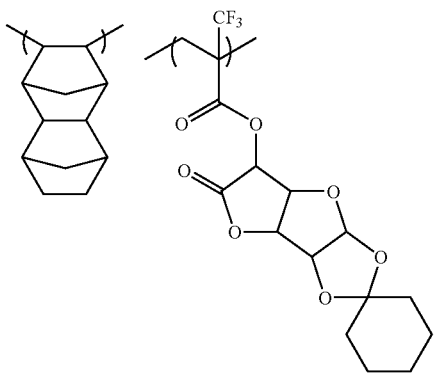

(HR-5)

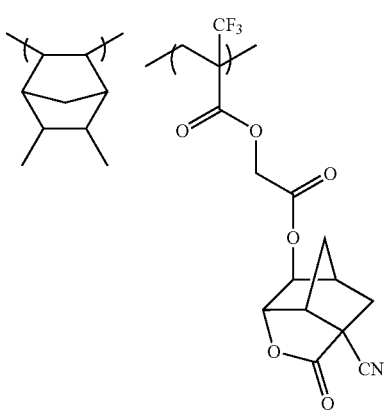

(HR-6)

(HR-7)
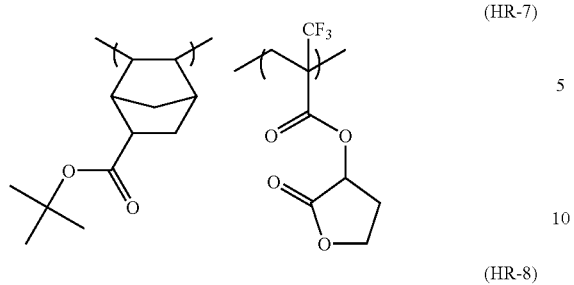
(HR-8)
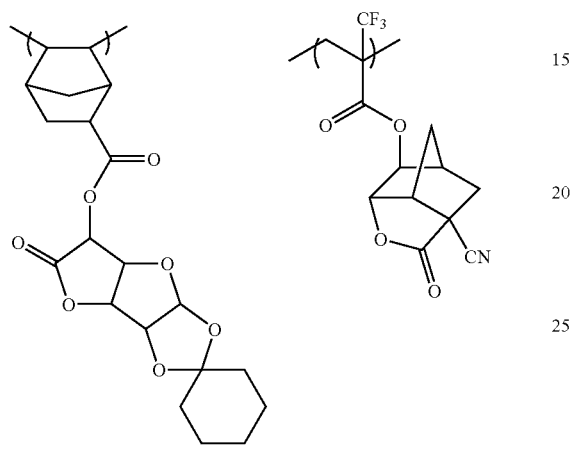
(HR-9)
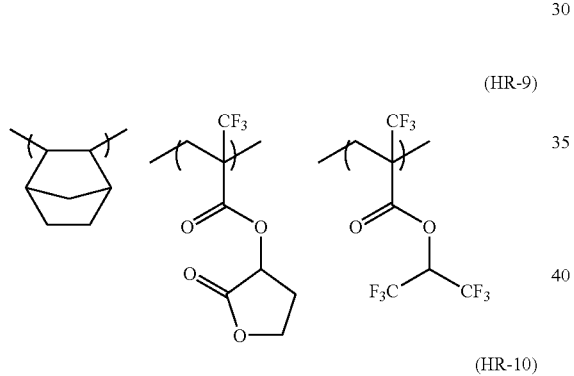
(HR-10)
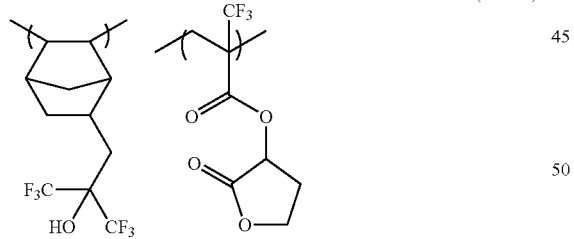
(HR-11)
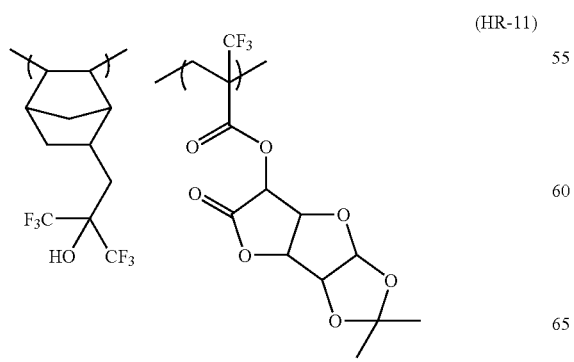
(HR-12)
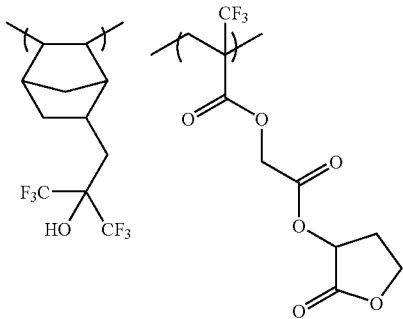
(HR-13)
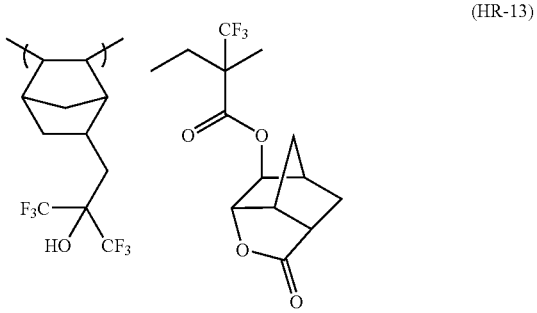
(HR-14)
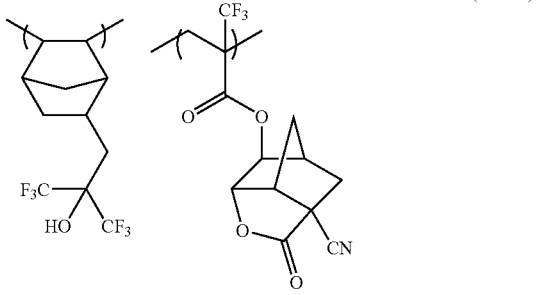
(HR-15)
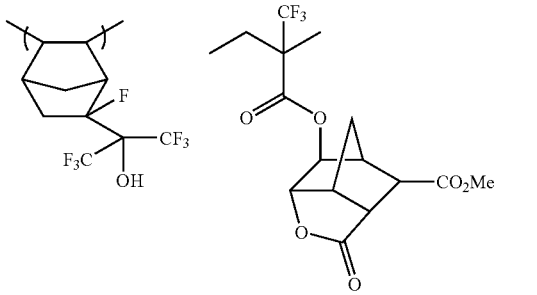
(HR-16)
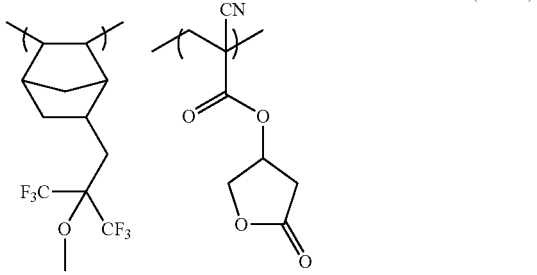

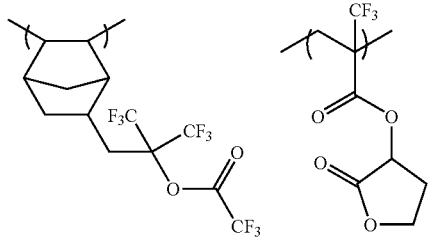
(HR-17)

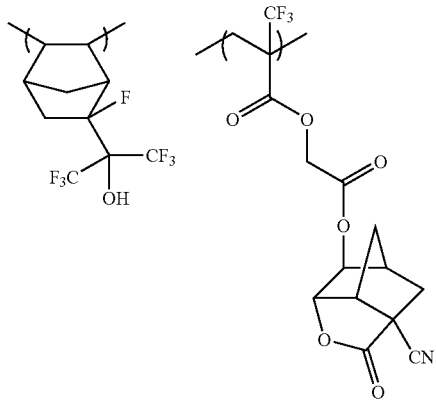
(HR-18)

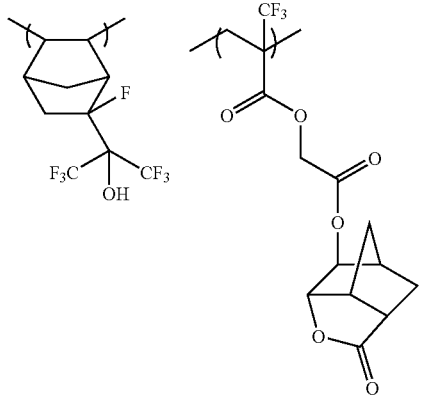
(HR-19)

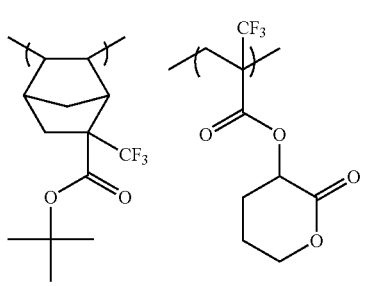
(HR-20)

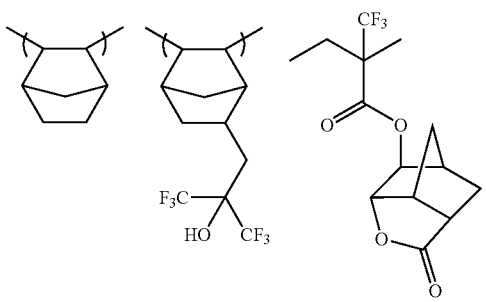
(HR-21)

These hydrophobic resins (HR) may be used alone or in combination.

It is preferred to use any of the hydrophobic resins (HR) in combination with a resin (HRP) having at least either a fluorine atom or a silicon atom other than the hydrophobic resins (HR).

(HRP) Resin having at least either a fluorine atom or a silicon atom

The actinic-ray- or radiation-sensitive resin composition of the present invention may further contain a resin (HRP) having at least either a fluorine atom or a silicon atom other than the hydrophobic resins (HR). When the hydrophobic resin (HR) and resin (HRP) are contained, these are unevenly localized in the surface layer of the film from the actinic-ray- or radiation-sensitive resin composition. Thus, when the liquid immersion medium is water, the receding contact angle on the surface of the resist film with reference to water upon formation of the film can be increased to thereby enhance the liquid immersion water tracking property. The receding contact angle of the film is preferably in the range of 60° to 90°, more preferably 70° or greater. The content ratio of resin (HRP) can be appropriately regulated so that the receding contact angle of the film falls within the mentioned range. The content ratio based on the total solids of the actinic-ray- or radiation-sensitive resin composition is preferably in the range of 0.1 to 10 mass %, more preferably 0.1 to 5 mass %, further more preferably 0.1 to 4 mass % and most preferably 0.1 to 3 mass %. Although the resin (HRP) is unevenly localized at the surface as mentioned above, differing from surfactants, the resin does not necessarily have to have a hydrophilic group in its molecule and does not need to contribute toward uniform mixing of polar/nonpolar substances.

In the resin (HRP) having at least either a fluorine atom or a silicon atom, the fluorine atom and silicon atom may be introduced in the principal chain of the resin or may be introduced in a side chain of the resin by substitution.

It is preferred for the resin (HRP) to be a resin containing, as a partial structure having a fluorine atom, an alkyl group having a fluorine atom, a cycloalkyl group having a fluorine atom or an aryl group having a fluorine atom.

The alkyl group containing a fluorine atom (preferably having 1 to 10 carbon atoms, more preferably 1 to 4 carbon atoms) is a linear or branched alkyl group having at least one hydrogen atom thereof substituted with a fluorine atom. Further, other substituents may be possessed.

The cycloalkyl group containing a fluorine atom is a cycloalkyl group of a single ring or multiple rings having at least one hydrogen atom thereof substituted with a fluorine atom. Further, other substituents may be contained.

As the aryl group containing a fluorine atom, there can be mentioned one having at least one hydrogen atom of an aryl group, such as a phenyl or naphthyl group, substituted with a fluorine atom. Further, other substituents may be contained.

As preferred alkyl groups containing a fluorine atom, cycloalkyl groups containing a fluorine atom and aryl groups containing a fluorine atom, there can be mentioned groups of the aforementioned general formulae (F2) to (F4) as described with respect to resin (HR), which however in no way limit the scope of the present invention.

In the present invention, each of the groups of general formulae (F2) to (F4) is preferably introduced in a (meth) acrylate repeating unit.

It is preferred for the resin (HRP) to be a resin containing, as a partial structure having a silicon atom, an alkylsilyl structure (especially a trialkylsilyl group) or a cyclosiloxane structure.

As the alkylsilyl structure and cyclosiloxane structure, there can be mentioned, for example, any of the groups of general formulae (CS-1) to (CS-3) mentioned above with respect to the hydrophobic resin (HR) or the like.

Moreover, the resin (HRP) may have at least one group selected from among the following groups (x) to (z):

(x) an alkali soluble group, (y) a group that is decomposed by the action of an alkali developer, resulting in an increase of solubility in the alkali developer, and (z) a group that is decomposed by the action of an acid.

As these groups, there can be mentioned, for example, those mentioned above with respect to the hydrophobic resin (HR).

As the repeating units having the groups (x) and (z) contained in the resin (HRP), there can be mentioned the same as those to be mentioned hereinafter with respect to the resin as component (A).

As the group (y) that is decomposed by the action of an alkali developer, resulting in an increase of solubility in the alkali developer, there can be mentioned, for example, a group having a lactone structure, an acid anhydride group, an acid imide group or the like. A group having a lactone structure is preferred. As particular examples of repeating units having the group (y) allowing an increase of solubility in an alkali developer, there can be mentioned the same as those having a lactone structure mentioned with respect to the resin as component (A).

The resin (HRP) may further have any of the repeating units of general formula (HRIII) that may be introduced in the hydrophobic resin (HR) as mentioned above.

With respect to the resin (HRP), the content ratio of repeating units having an alkali soluble group (x) is preferably in the range of 1 to 50 mol %, more preferably 3 to 35 mol % and still more preferably 5 to 20 mol % based on all the repeating units of the resin (HRP).

With respect to the resin (HRP), the content ratio of repeating units having a group (y) that exhibits an increased solubility in an alkali developer is preferably in the range of 1 to 40 mol %, more preferably 3 to 30 mol % and still more preferably 5 to 15 mol % based on all the repeating units of the resin (HRP).

With respect to the resin (HRP), the content ratio of repeating units having a group (z) that is decomposed by the action of an acid is preferably in the range of 1 to 80 mol %, more preferably 10 to 80 mol % and still more preferably 20 to 60 mol % based on all the repeating units of the resin (HRP).

When the resin (HRP) has a fluorine atom, the content ratio of fluorine atom(s) is preferably in the range of 5 to 80 mass %, more preferably 10 to 80 mass %, based on the molecular weight of the resin (HRP). The repeating unit containing a fluorine atom preferably exists in the resin (HRP) in an amount of 10 to 100 mass %, more preferably 30 to 100 mass %, based on all the repeating units of the resin (HRP).

When the resin (HRP) has a silicon atom, the content ratio of silicon atom(s) is preferably in the range of 2 to 50 mass %, more preferably 2 to 30 mass %, based on the molecular weight of the resin (HRP). The repeating unit containing a silicon atom preferably exists in the resin (HRP) in an amount of 10 to 100 mass %, more preferably 20 to 100 mass %, based on all the repeating units of the resin (HRP).

The weight average molecular weight of the resin (HRP) in terms of standard polystyrene molecular weight is preferably in the range of 1000 to 100,000, more preferably 1000 to 50,000 and still more preferably 2000 to 15,000.

Impurities, such as metals, should naturally be of low quantity in the resin (HRP), as for the resin as the component (A). The content ratio of residual monomers and oligomer components is preferably 0 to 10 mass %, more preferably 0 to 5 mass % and still more preferably 0 to 1 mass %. Accordingly, there can be obtained a resist being free from a change of in-liquid foreign matter, sensitivity, etc. over time. From the viewpoint of resolving power, resist profile, side wall of resist pattern, roughness, etc., the molecular weight distribution (Mw/Mn, also referred to as the degree of dispersal) thereof is preferably in the range of 1 to 3, more preferably 1 to 2, still more preferably 1 to 1.8 and most preferably 1 to 1.5.

A variety of commercially available products can be used as the resin (HRP), and also the resin can be synthesized in accordance with conventional methods (for example, radical polymerization).

As the hydrophobic resin (HRP), there can be mentioned, for example, those described in JP-As 2006-48029, 2007-304537, 2007-304545, 2007-279663, 2007-279664, 2007-163606, 2007-65024 and 2008-304773.

At the time of irradiation with actinic rays or radiation, exposure (liquid immersion exposure) may be carried out after filling the interstice between resist film and lens with a liquid (liquid immersion medium, liquid for liquid immersion) of refractive index higher than that of air. This would bring about an enhancement of resolving power. Any liquid with a refractive index higher than that of air can be employed as the liquid immersion medium. Preferably, pure water is employed.

The liquid for liquid immersion for use in the liquid immersion exposure will now be described.

The liquid for liquid immersion preferably consists of a liquid being transparent in exposure wavelength whose temperature coefficient of refractive index is as low as possible so as to ensure minimization of any distortion of optical image projected on the resist film. Especially in the use of an ArF excimer laser (wavelength: 193 nm) as an exposure light source, however, it is more preferred to use water from not only the above viewpoints but also the viewpoints of easy procurement and easy handling.

Further, from the viewpoint of refractive index increase, use can be made of a medium of 1.5 or higher refractive index. Such a medium may be an aqueous solution or an organic solvent.

In the use of water as a liquid for liquid immersion, a slight proportion of additive (liquid) that would not dissolve the resist film on a wafer and would be negligible with respect to its influence on an optical coat for an under surface of lens element may be added in order to not only decrease the surface tension of water but also increase a surface activating power. The additive is preferably an aliphatic alcohol with a refractive index approximately equal to that of water, for example, methyl alcohol, ethyl alcohol, isopropyl alcohol or the like. The addition of an alcohol with a refractive index approximately equal to that of water is advantageous in that even when the alcohol component is evaporated from water to thereby cause a change of content concentration, the change of refractive index of the liquid as a whole can be minimized. On the other hand, when a substance being opaque in 193 nm rays or an impurity whose refractive index is greatly different from that of water is mixed therein, the mixing would invite a distortion of optical image projected on the resist film. Accordingly, it is preferred to use distilled water as the liquid immersion water. Furthermore, use may be made of pure water having been filtered through an ion exchange filter or the like.

Desirably, the electrical resistance of the water is 18.3 MΩcm or higher, and the TOC (organic matter concentration) thereof is 20 ppb or below. Prior deaeration of the water is desired.

Raising the refractive index of the liquid for liquid immersion would enable an enhancement of lithography performance. From this viewpoint, an additive suitable for refractive index increase may be added to the water, or heavy water ($D_2O$) may be used in place of water.

In the film produced from the composition of the present invention, the hydrophobic resin (HR) is unevenly localized in the surface layer of the film. Thus, when the exposure is carried out through a liquid immersion medium and the liquid immersion medium is water, the receding contact angle on the surface of the film with reference to water upon formation of the film can be increased to thereby enhance the liquid immersion water tracking property. The receding contact angle of the film is preferably in the range of 60° to 90°, more preferably 70° or higher. The amount of resin added can be appropriately regulated so that the receding contact angle of the resist film falls within the above range. The addition amount is preferably in the range of 0.1 to 10 mass %, more preferably 0.1 to 5 mass % based on the total solids of the composition of the present invention. Although the hydrophobic resin (HR) is unevenly localized on the interface as aforementioned, differing from the surfactant, the hydrophobic resin does not necessarily have to have a hydrophilic group in its molecule and does not need to contribute toward uniform mixing of polar/nonpolar substances.

The receding contact angle refers to a contact angle determined when the contact line at a droplet-substrate interface draws back. It is generally known that the receding contact angle is useful in the simulation of droplet mobility in a dynamic condition. In a simple definition, the receding contact angle can be defined as the contact angle exhibited at the recession of the droplet interface at the time of, after application of a droplet discharged from a needle tip onto a substrate, re-indrawing the droplet into the needle. Generally, the receding contact angle can be measured according to a method of contact angle measurement known as the dilation/contraction method.

In the operation of liquid immersion exposure, it is needed for the liquid for liquid immersion to move on a wafer while tracking the movement of an exposure head involving high-speed scanning on the wafer and thus forming an exposure pattern. Therefore, the contact angle of the liquid for liquid immersion with respect to the film in dynamic condition is important, and it is required for the actinic-ray- or radiation-sensitive resin composition to be capable of tracking the high-speed scanning of the exposure head without leaving any droplets.

For the prevention of direct contact of a film with a liquid for liquid immersion, a film that is highly insoluble in the liquid for liquid immersion (hereinafter also referred to as a "top coat") may be provided between the film produced from the composition of the present invention and the liquid for liquid immersion. The functions to be fulfilled by the top coat are applicability to an upper layer portion of the resist, transparency in radiation of especially 193 nm and being highly insoluble in the liquid for liquid immersion. Preferably, the top coat does not mix with the resist and is uniformly applicable to an upper layer of the resist.

From the viewpoint of 193 nm transparency, the top coat preferably consists of a polymer not abundantly containing an aromatic moiety. As such, there can be mentioned, for example, a hydrocarbon polymer, an acrylic ester polymer, polymethacrylic acid, polyacrylic acid, polyvinyl ether, a siliconized polymer, a fluoropolymer or the like. The aforementioned hydrophobic resins (HR) also find appropriate application in the top coat. From the viewpoint of contamination of an optical lens by leaching of impurities from the top coat into the liquid for liquid immersion, it is preferred to reduce the amount of residual monomer components of the polymer contained in the top coat.

At the detachment of the top coat, use may be made of a developer, or a separate peeling agent may be used. The peeling agent preferably consists of a solvent having a lower permeation into the film. Detachability by an alkali developer is preferred from the viewpoint of simultaneous attainment of the detachment step with the development processing step for the film. The top coat is preferred to be acidic from the viewpoint of detachment with the use of an alkali developer. However, from the viewpoint of non-intermixability with the film, the top coat may be neutral or alkaline.

The less the difference in refractive index between the top coat and the liquid for liquid immersion, the higher the resolving power. In an ArF excimer laser (wavelength: 193 nm), when water is used as the liquid for liquid immersion, the top coat for ArF liquid immersion exposure preferably has a refractive index close to that of the liquid for liquid immersion. From the viewpoint of approximation of the refractive index to that of the liquid for liquid immersion, it is preferred for the top coat to contain a fluorine atom. From the viewpoint of transparency and refractive index, it is preferred to reduce the thickness of the film.

Preferably, the top coat does not mix with the film and also does not mix with the liquid for liquid immersion. From this viewpoint, when the liquid for liquid immersion is water, it is preferred for the solvent used in the top coat to be highly insoluble in the solvent used in the positive resist composition and be a non-water-soluble medium. When the liquid for liquid immersion is an organic solvent, the top coat may be soluble or insoluble in water.

[2] Resin that when Acted on by an Acid is Decomposed to Thereby Exhibit an Increased Solubility in an Alkali Developer (A)

The actinic-ray- or radiation-sensitive resin composition of the present invention may contain a resin (A) that when acted on by an acid is decomposed to thereby exhibit an increased solubility in an alkali developer.

The resin that when acted on by an acid exhibits an increased solubility in an alkali developer (acid-decomposable resin) has a group that is decomposed by the action of an acid to thereby produce an alkali-soluble group (hereinafter also referred to as "acid-decomposable group") in the principal chain and/or side chain of the resin.

The resin (A) is preferably insoluble or poorly soluble in alkali developers.

It is preferred for the acid-decomposable group to have a structure in which the alkali-soluble group is protected by a group that when acted on by an acid is decomposed and eliminated.

The alkali-soluble group is not particularly limited as long as the group is dissociated in an alkali developer to thereby produce ions. As preferred alkali-soluble groups, there can be mentioned a carboxyl group, a fluoroalcohol group (preferably hexafluoroisopropanol) and a sulfonate group.

The acid-decomposable group is preferably a group as obtained by substituting the hydrogen atom of any of these alkali soluble groups with an acid eliminable group.

As the acid eliminable group, there can be mentioned, for example, $-C(R_{36})(R_{37})(R_{38})$, $-C(R_{36})(R_{37})(OR_{39})$, $-C(R_{01})(R_{02})(OR_{39})$ or the like.

In the formulae, each of $R_{36}$ to $R_{39}$ independently represents an alkyl group, a cycloalkyl group, an aryl group, an aralkyl group or an alkenyl group. $R_{36}$ and $R_{37}$ may be bonded with each other to thereby form a ring structure.

Each of $R_{01}$ to $R_{02}$ independently represents a hydrogen atom, an alkyl group, a cycloalkyl group, an aryl group, an aralkyl group or an alkenyl group.

Preferably, the acid-decomposable group is a cumyl ester group, an enol ester group, an acetal ester group, a tertiary alkyl ester group or the like. A tertiary alkyl ester group is more preferred.

The repeating unit with an acid-decomposable group that may be contained in the resin (A) is preferably any of those of the following general formula (AI).

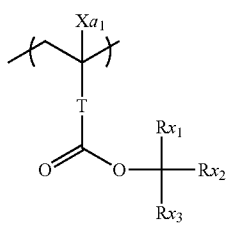

(AI)

In the general formula (AI), $Xa_1$ represents a hydrogen atom, an optionally substituted methyl group or any of the groups of the formula $-CH_2-R_9$. $R_9$ represents a hydroxyl group or a monovalent organic group. The monovalent organic group is, for example, an alkyl group having 5 or less carbon atoms or an acyl group. Preferably, the monovalent organic group is an alkyl group having 3 or less carbon atoms, more preferably a methyl group. $Xa_1$ preferably represents a hydrogen atom, a methyl group, a trifluoromethyl group or a hydroxymethyl group.

T represents a single bond or a bivalent connecting group.

Each of $Rx_1$ to $Rx_3$ independently represents an alkyl group (linear or branched) or a cycloalkyl group (monocyclic or polycyclic).

At least two of $Rx_1$ to $Rx_3$ may be bonded with each other to thereby form a cycloalkyl group (monocyclic or polycyclic).

As the bivalent connecting group represented by T, there can be mentioned an alkylene group, a group of the formula —COO-Rt-, a group of the formula —O-Rt- or the like. In the formulae, Rt represents an alkylene group or a cycloalkylene group.

T is preferably a single bond or a group of the formula —COO-Rt-. Rt is preferably an alkylene group having 1 to 5 carbon atoms, more preferably a $-CH_2-$ group or $-(CH_2)_3-$ group.

The alkyl group represented by each of $Rx_1$ to $Rx_3$ is preferably one having 1 to 4 carbon atoms, such as a methyl group, an ethyl group, an n-propyl group, an isopropyl group, an n-butyl group, an isobutyl group or a t-butyl group.

The cycloalkyl group represented by each of $Rx_1$ to $Rx_3$ is preferably a cycloalkyl group of one ring, such as a cyclopentyl group or a cyclohexyl group, or a cycloalkyl group of multiple rings, such as a norbornyl group, a tetracyclodecanyl group, a tetracyclododecanyl group or an adamantyl group.

The cycloalkyl group formed by bonding of at least two of $Rx_1$ to $Rx_3$ is preferably a cycloalkyl group of one ring, such as a cyclopentyl group or a cyclohexyl group, or a cycloalkyl group of multiple rings, such as a norbornyl group, a tetracyclodecanyl group, a tetracyclododecanyl group or an adamantyl group. A monocyclic alkyl group having 5 to 6 carbon atoms is especially preferred.

In a preferred embodiment, $Rx_1$ is a methyl group or an ethyl group, and $Rx_2$ and $Rx_3$ are bonded with each other to thereby form any of the above-mentioned cycloalkyl groups.

Each of these groups may have a substituent. As the substituent, there can be mentioned, for example, an alkyl group (1 to 4 carbon atoms), a halogen atom, a hydroxyl group, an alkoxy group (1 to 4 carbon atoms), a carboxyl group, an alkoxycarbonyl group (2 to 6 carbon atoms) or the like. The number of carbon atoms of the substituent is preferably 8 or less.

The content ratio of the sum of repeating units having an acid-decomposable group is preferably in the range of 20 to 70 mol %, more preferably 30 to 50 mol %, based on all the repeating units of the resin (A).

Specific examples of the preferred repeating units with acid-decomposable groups will be shown below, which however in no way limit the scope of the present invention.

In the following formulae, each of Rx and $Xa_1$ represents a hydrogen atom, $CH_3$, $CF_3$ or $CH_2OH$. Each of Rxa and Rxb represents an alkyl group having 1 to 4 carbon atoms. Z, each independently in the presence of two or more groups, represents a substituent containing a polar group. p represents 0 or a positive integer.

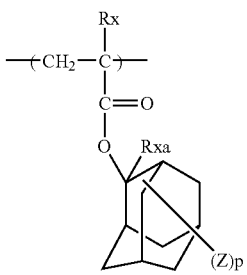

1

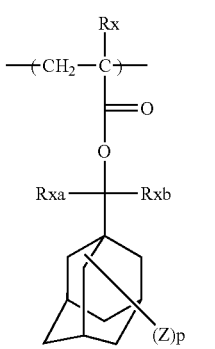

2

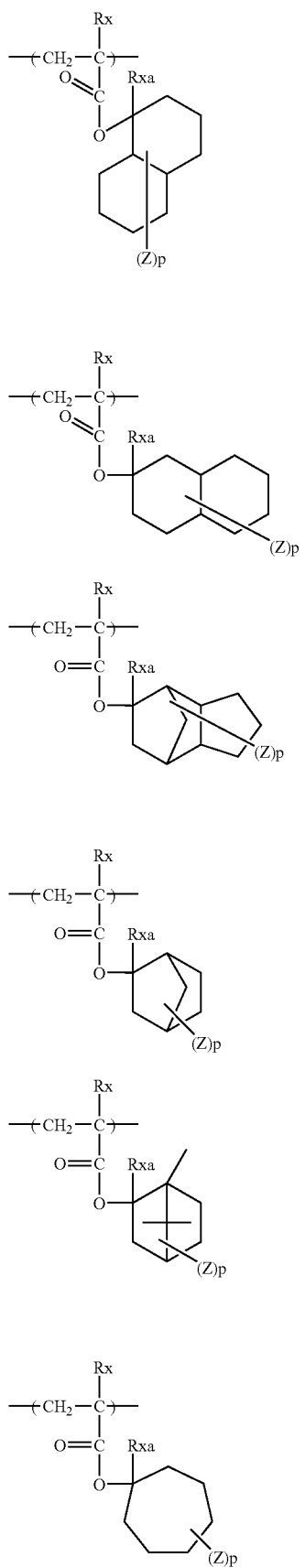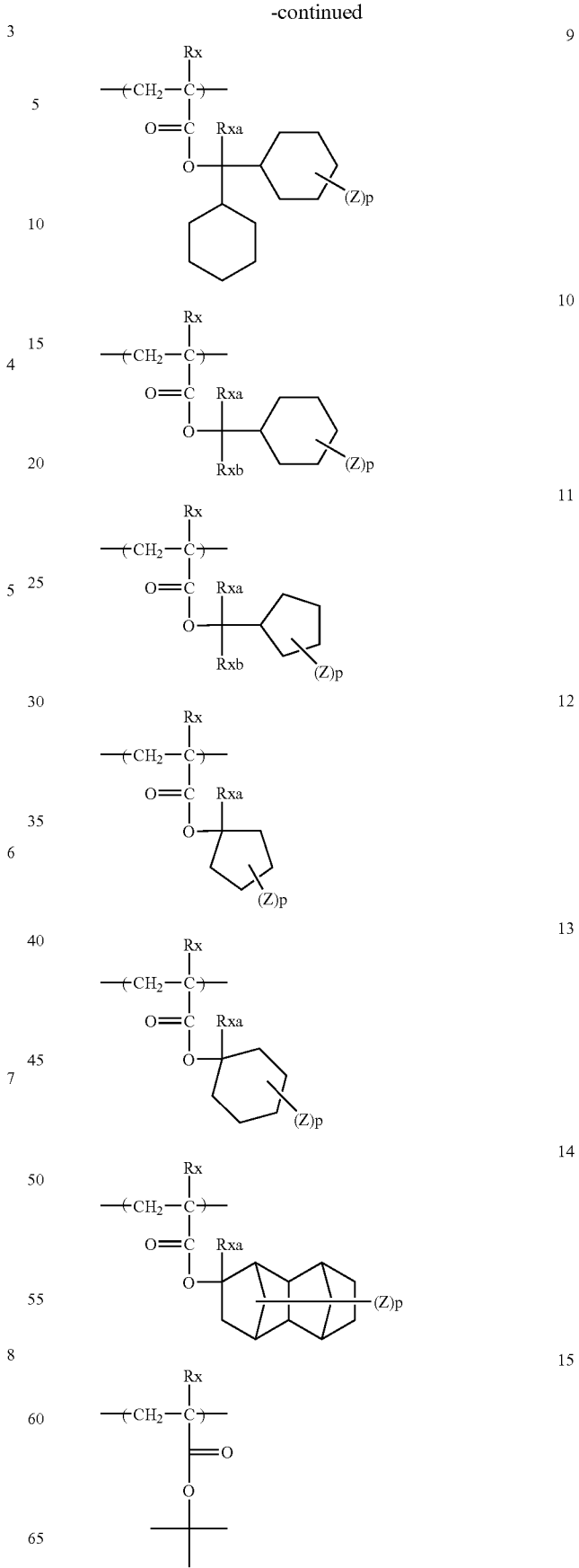

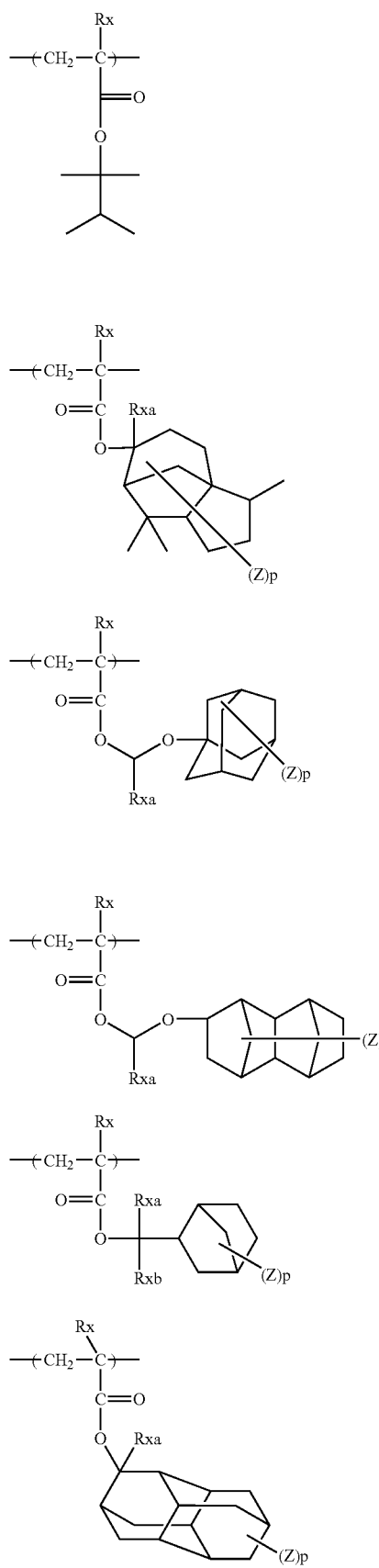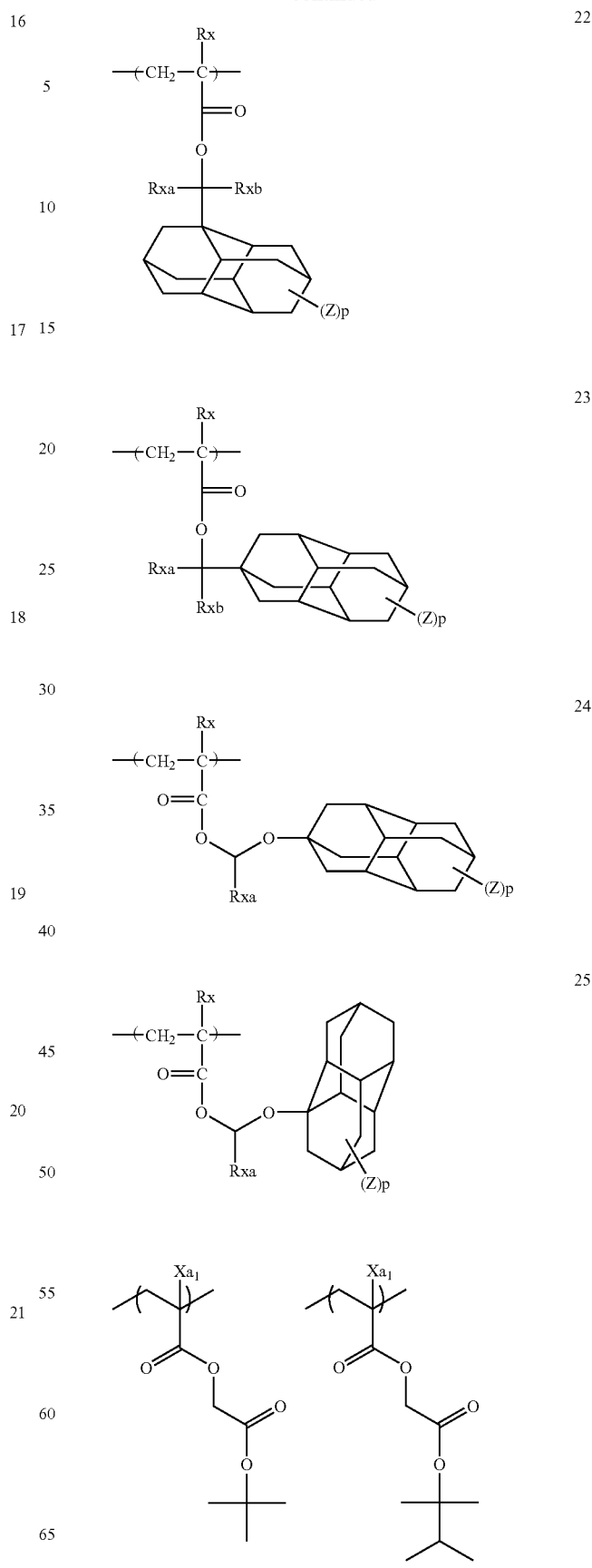

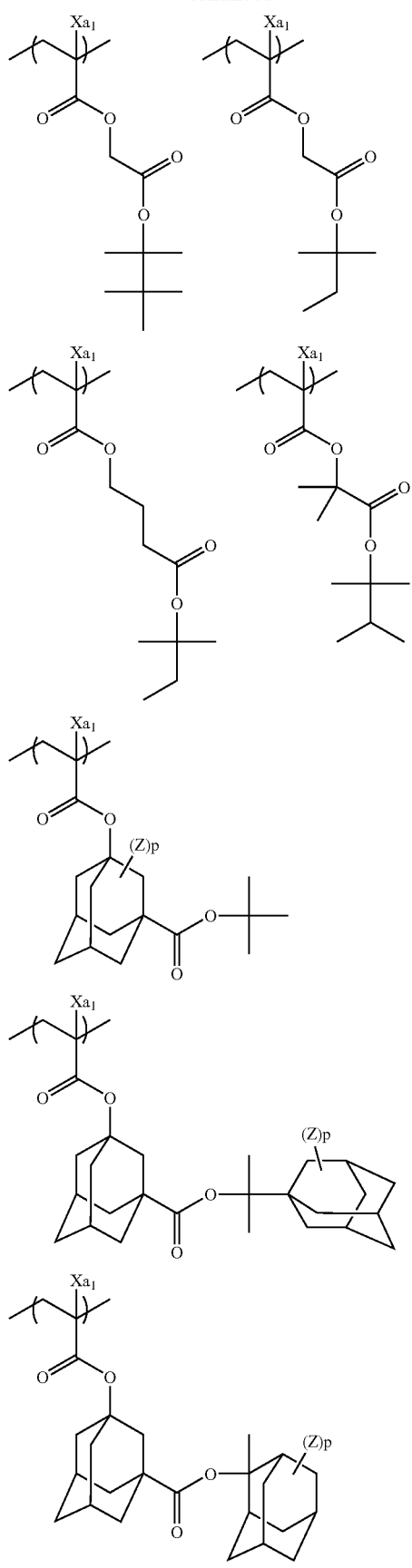
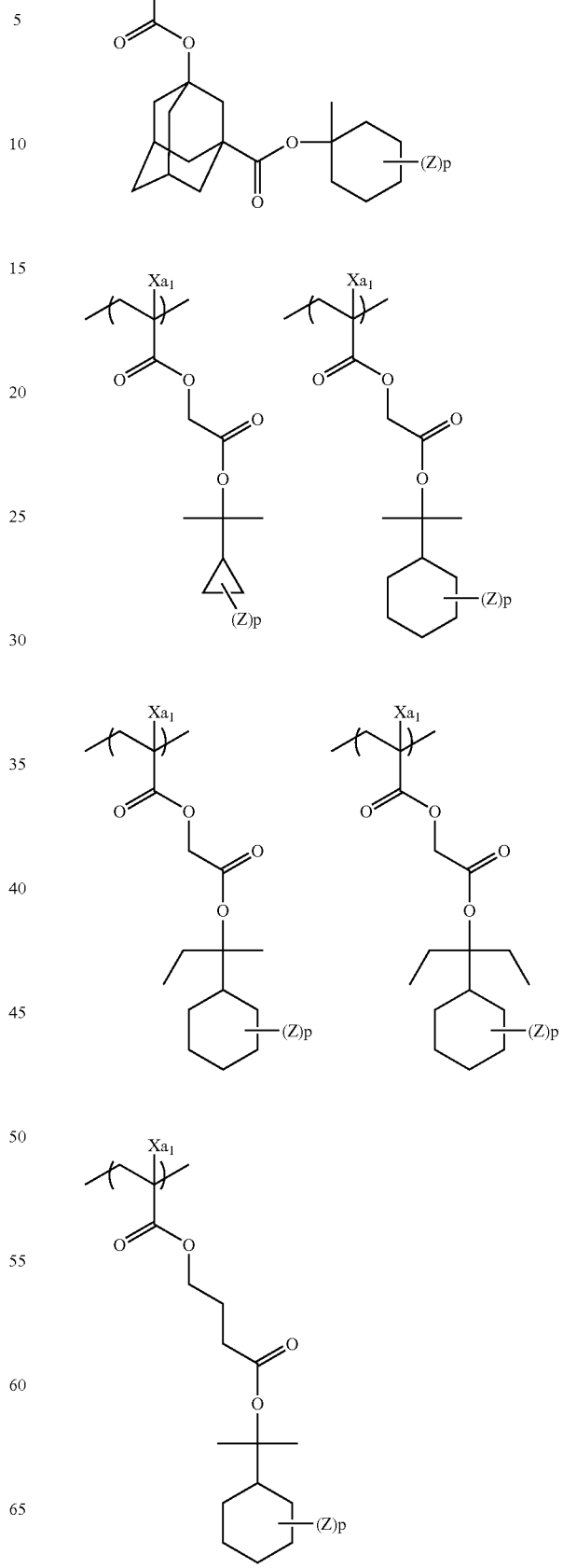

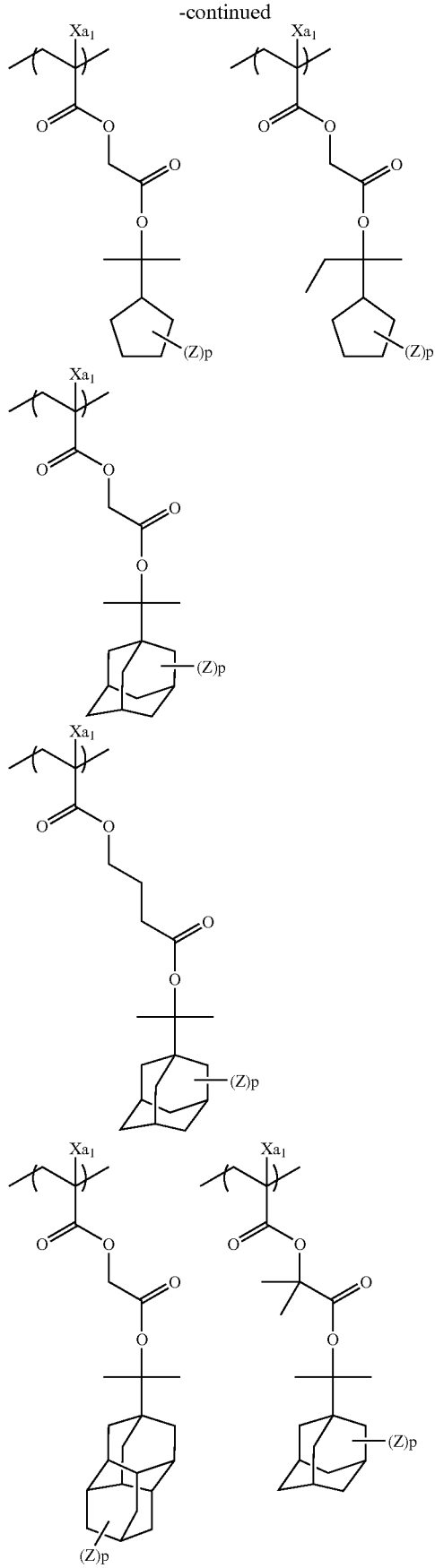
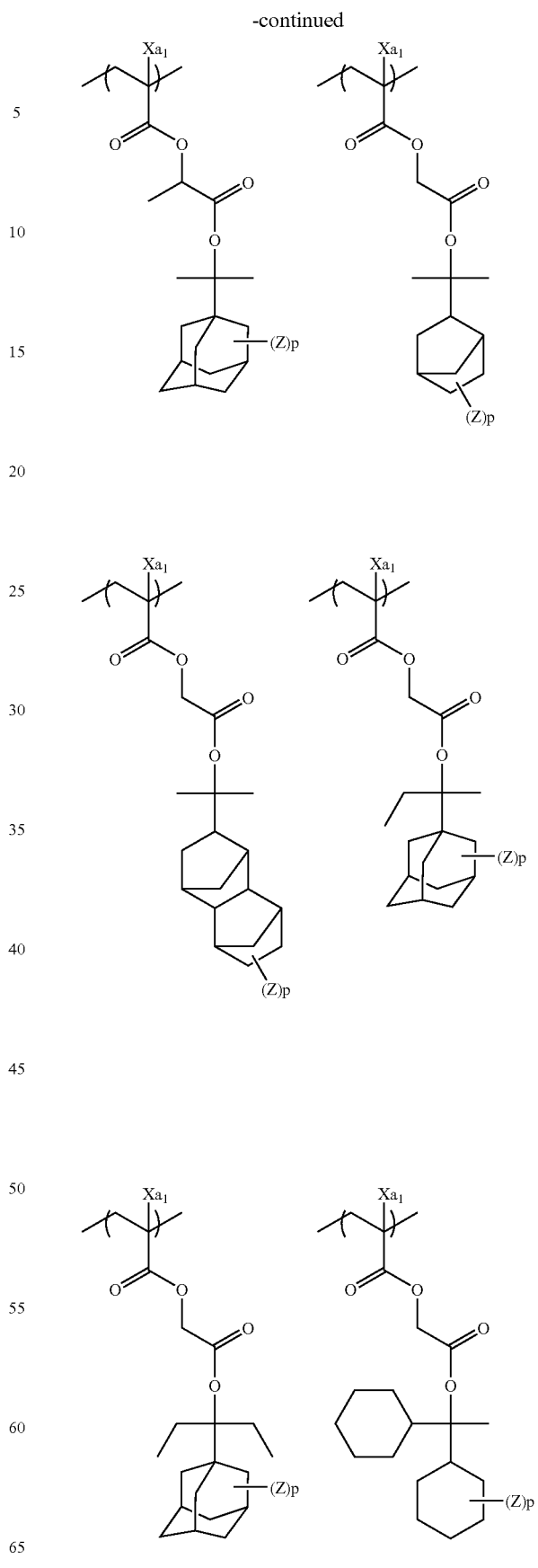

-continued
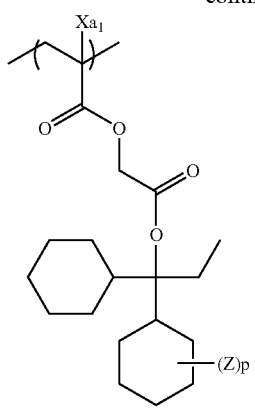
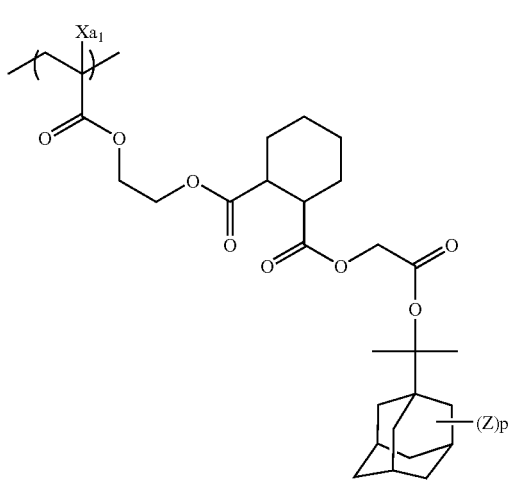
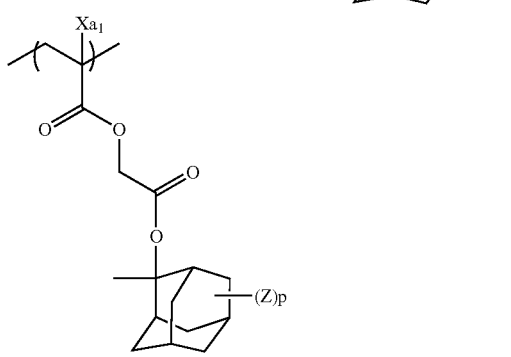
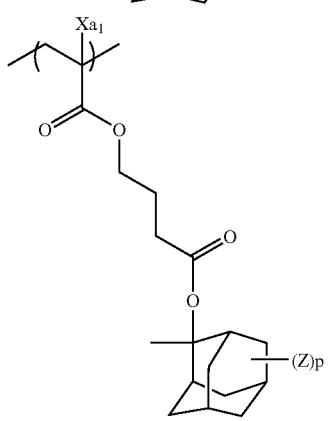
-continued
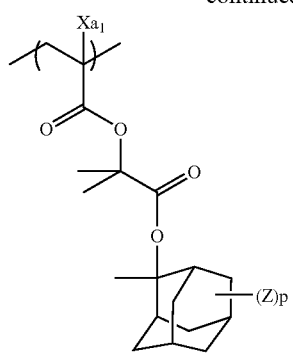
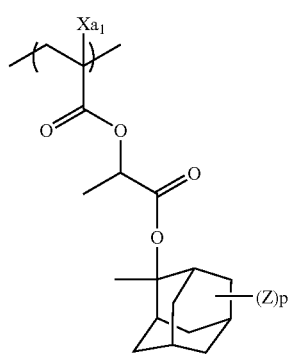
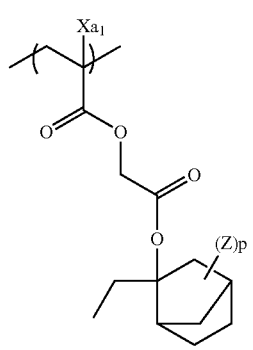
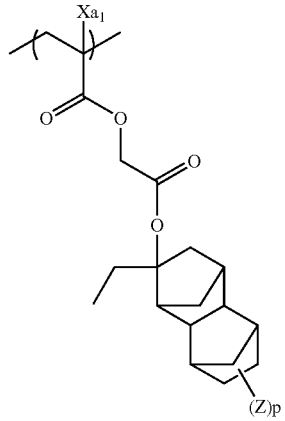

-continued

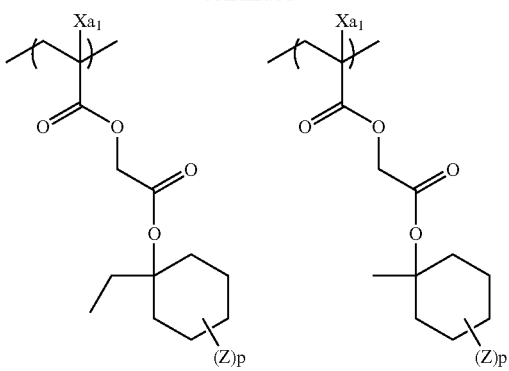

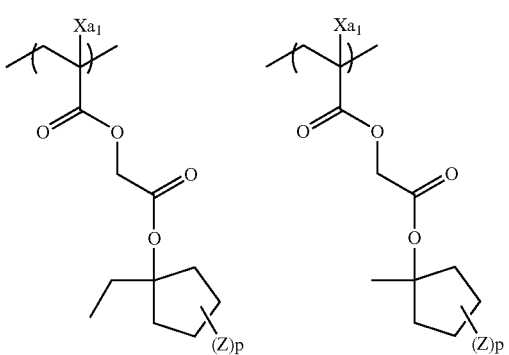

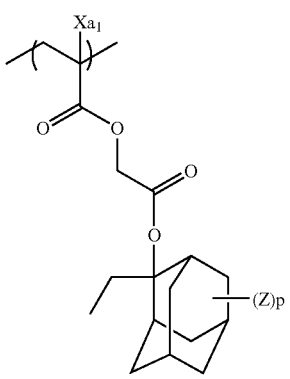

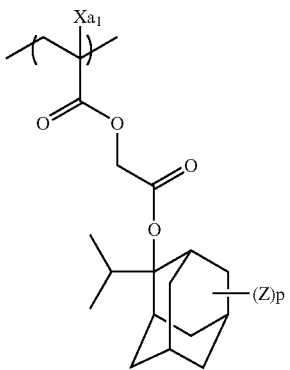

It is more preferred for the resin (A) to be a resin having, as the repeating units of general formula (AI), at least either any of the repeating units of general formula (1) below or any of the repeating units of general formula (2) below.

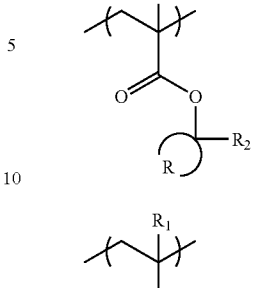

(1)

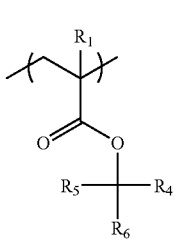

(2)

In the general formulae (1) and (2), each of $R_1$ and $R_3$ independently represents a hydrogen atom, an optionally substituted methyl group or any of the groups of the formula —$CH_2$—$R_9$. $R_9$ represents a hydroxyl group or a monovalent organic group.

Each of $R_2$, $R_4$, $R_5$ and $R_6$ independently represents an alkyl group or a cycloalkyl group.

R represents an atomic group required for forming an alicyclic structure in cooperation with a carbon atom.

$R_1$ preferably represents a hydrogen atom, a methyl group, a trifluoromethyl group or a hydroxymethyl group.

The alkyl group represented by $R_2$ may be linear or branched, and may have a substituent.

The cycloalkyl group represented by $R_2$ may be monocyclic or polycyclic, and may have a substituent.

$R_2$ preferably represents an alkyl group, more preferably an alkyl group having 1 to 10 carbon atoms, especially 1 to 5 carbon atoms. As examples thereof, there can be mentioned a methyl group and an ethyl group.

R represents an atomic group required for forming an alicyclic structure in cooperation with a carbon atom. The thus formed alicyclic structure is preferably an alicyclic structure of a single ring, and preferably has 3 to 7 carbon atoms, more preferably 5 or 6 carbon atoms.

$R_3$ preferably represents a hydrogen atom or a methyl group, more preferably a methyl group.

Each of the alkyl groups represented by $R_4$, $R_5$ and $R_6$ may be linear or branched, and may have a substituent. The alkyl groups preferably are those each having 1 to 4 carbon atoms, such as a methyl group, an ethyl group, an n-propyl group, an isopropyl group, an n-butyl group, an isobutyl group and a t-butyl group.

Each of the cycloalkyl groups represented by $R_4$, $R_5$ and $R_6$ may be monocyclic or polycyclic, and may have a substituent. The cycloalkyl groups are preferably a cycloalkyl group with a single ring, such as a cyclopentyl group or a cyclohexyl group, and a cycloalkyl group with multiple rings, such as a norbornyl group, a tetracyclodecanyl group, a tetracyclododecanyl group or an adamantyl group.

The repeating units of general formula (2) are preferably those of general formula (2-1) below.

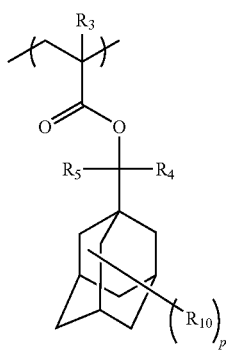

(2-1)

In the general formula (2-1), $R_3$ to $R_5$ have the same meaning as in the general formula (2).

$R_{10}$ represents a substituent containing a polar group. When a plurality of $R_{10}$s exist, they may be identical to or different from each other. As the substituent containing a polar group, there can be mentioned, for example, a linear or branched alkyl group, or cycloalkyl group, having a hydroxyl group, a cyano group, an amino group, an alkylamido group or a sulfonamido group. An alkyl group having a hydroxyl group is preferred. A branched alkyl group having a hydroxyl group is more preferred.

In the formula, p is an integer of 0 to 15, preferably in the range of 0 to 2, and more preferably 0 or 1.

When a plurality of acid-decomposable repeating units are simultaneously used in the resin (A), preferred combinations thereof are shown below.

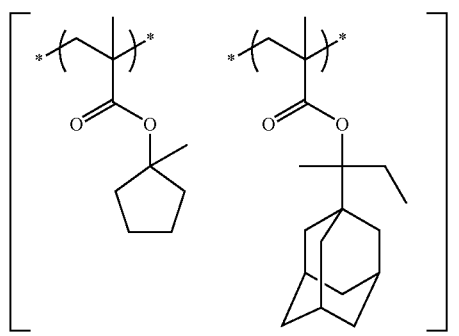

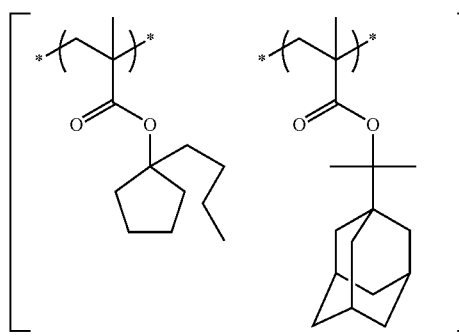

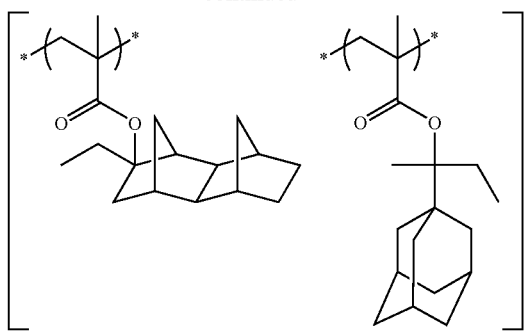

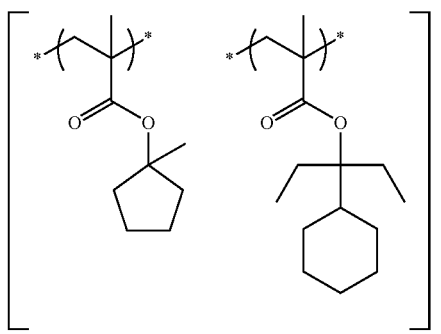

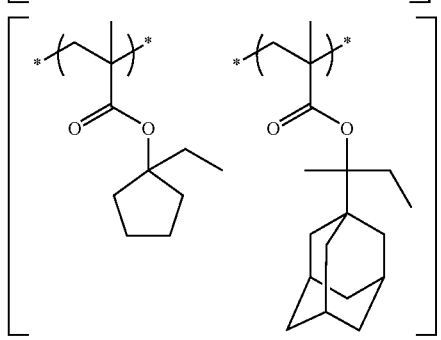

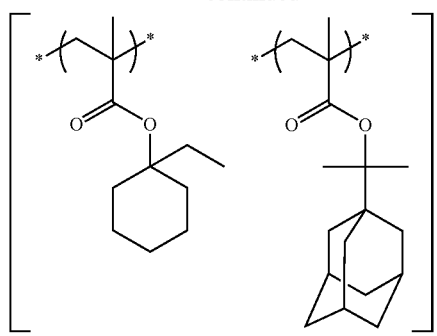
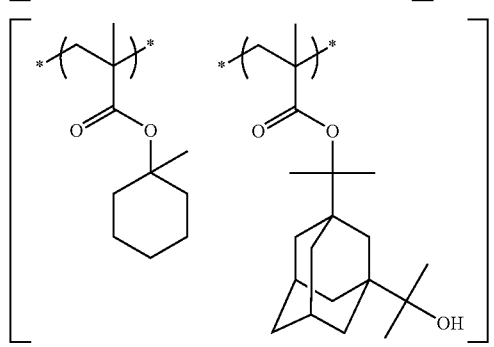
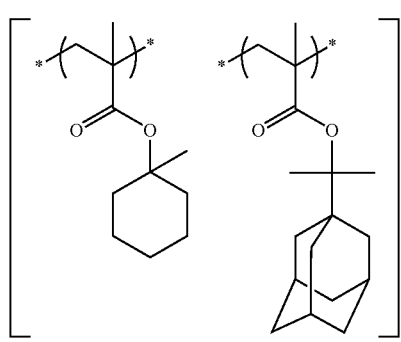
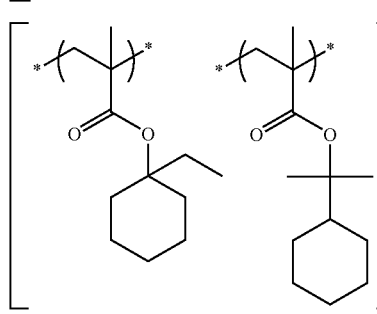
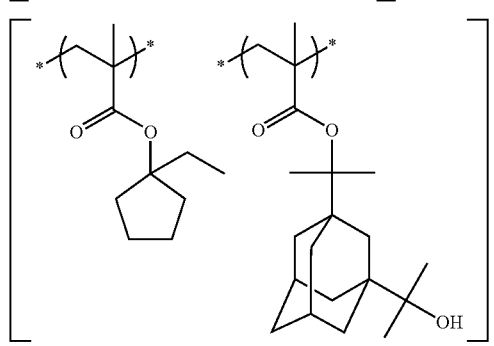
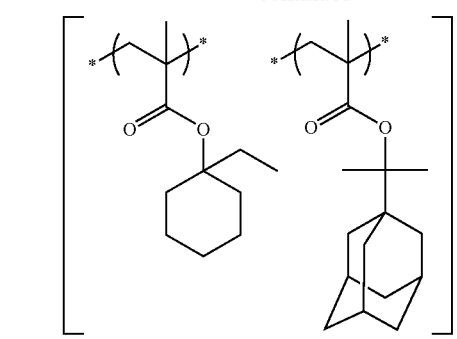
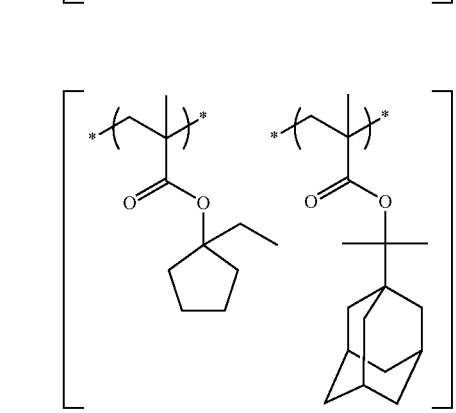
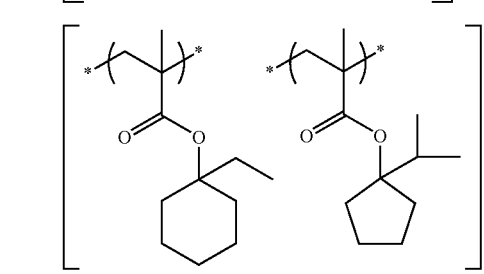
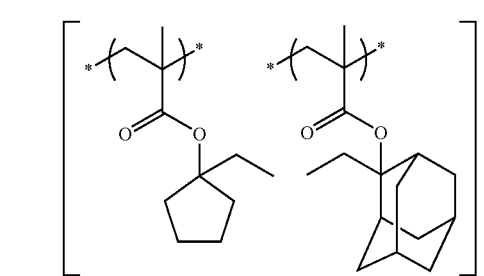
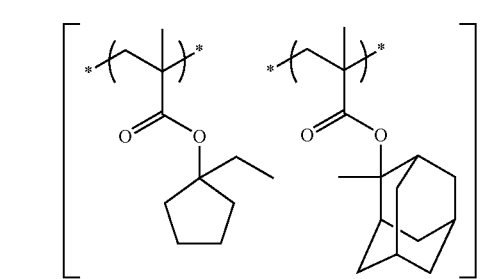

-continued

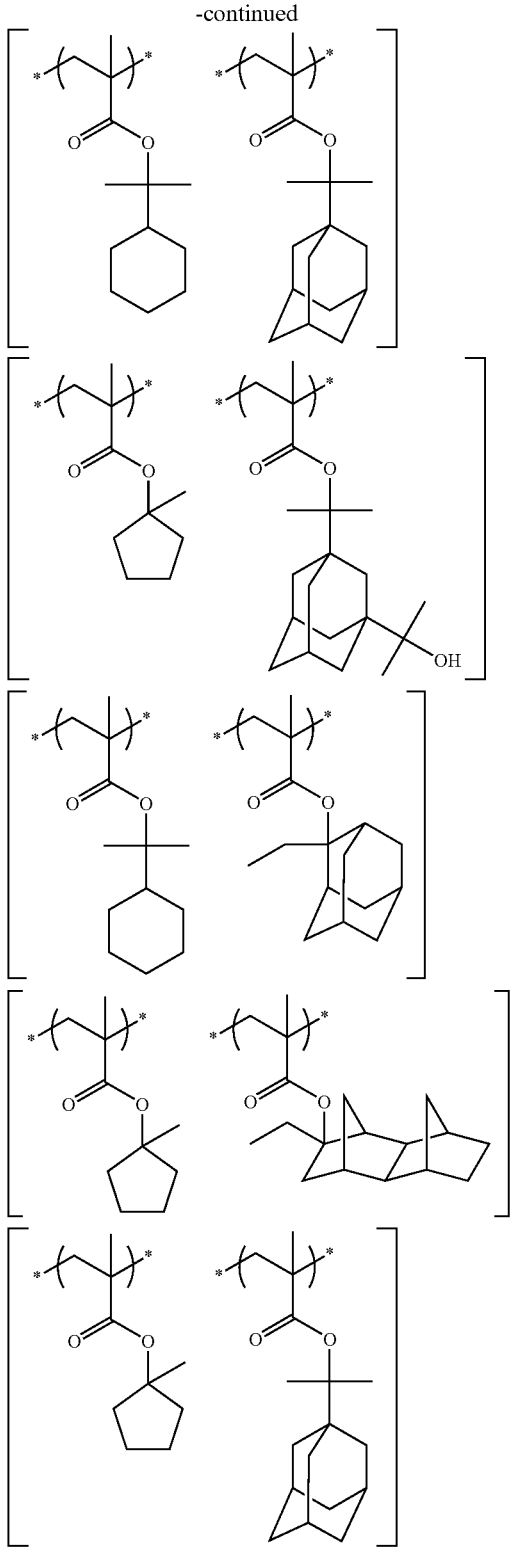

It is preferred for the resin (A) to contain a repeating unit having a lactone structure.

Any lactone groups can be employed as long as a lactone structure is possessed therein. However, lactone structures of a 5 to 7-membered ring are preferred, and in particular, those resulting from condensation of lactone structures of a 5 to 7-membered ring with other cyclic structures effected in a fashion to form a bicyclo structure or Spiro structure are preferred. The possession of repeating units having a lactone structure represented by any of the following general formulae (LC1-1) to (LC1-17) is more preferred. The lactone structures may be directly bonded to the principal chain of the resin. Preferred lactone structures are those of formulae (LC1-1), (LC1-4), (LC1-5), (LC1-6), (LC1-13), (LC1-14) and (LC1-17). The use of these specified lactone structures would ensure improvement in LWR and development defect.

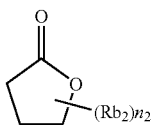

LC1-1

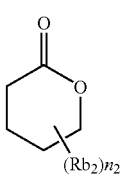

LC1-2

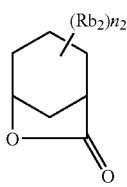

LC1-3

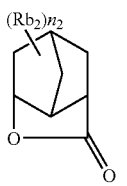

LC1-4

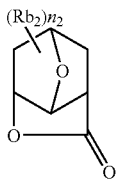

LC1-5

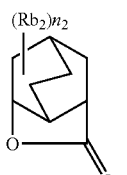

LC1-6

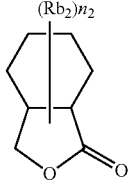

LC1-7

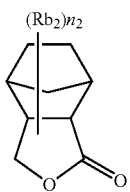
LC1-8

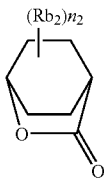
LC1-9

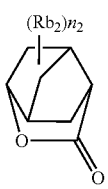
LC1-10

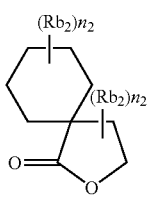
LC1-11

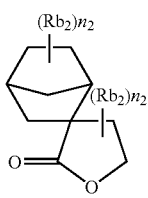
LC1-12

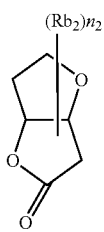
LC1-13

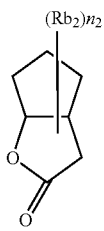
LC1-14

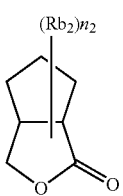
LC1-15

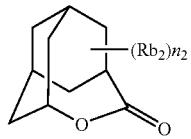
LC1-16

LC1-17
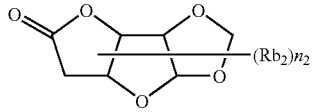

The presence of a substituent ($Rb_2$) on the portion of the lactone structure is optional. As a preferred substituent ($Rb_2$), there can be mentioned an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, an acid-decomposable group or the like. Of these, an alkyl group having 1 to 4 carbon atoms, a cyano group and an acid-decomposable group are more preferred. In the formulae, $n_2$ is an integer of 0 to 4. When $n_2$ is 2 or greater, the plurality of present substituents ($Rb_2$) may be identical to or different from each other. Further, the plurality of present substituents ($Rb_2$) may be bonded to each other to thereby form a ring.

As preferred repeating units with a lactone structure, there can be mentioned the repeating units represented by general formula (AII) below.

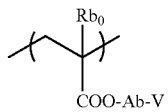
(AII)

In general formula (AII), $Rb_0$ represents a hydrogen atom, a halogen atom or an optionally substituted alkyl group having 1 to 4 carbon atoms. As a preferred substituent optionally contained in the alkyl group represented by $Rb_0$, there can be mentioned a hydroxyl group or a halogen atom. As the halogen atom represented by $Rb_0$, there can be mentioned a fluorine atom, a chlorine atom, a bromine atom or an iodine atom. The $Ab_0$ is preferably a hydrogen atom, a methyl group, a hydroxymethyl group or a trifluoromethyl group. A hydrogen atom and a methyl group are especially preferred.

Ab represents a single bond, an alkylene group, a bivalent connecting group with an alicyclic hydrocarbon structure of a single ring or multiple rings, an ether group, an ester group, a carbonyl group, or a bivalent connecting group resulting from combination thereof. A single bond and a bivalent connecting group of the formula -$Ab_1$-$CO_2$— are preferred.

$Ab_1$ is a linear or branched alkylene group or a monocyclic or polycyclic alkylene group, being preferably a methylene group, an ethylene group, a cyclohexylene group, an adamantylene group or a norbornylene group.

V represents a group having a lactone structure. As specific examples of groups represented by V, there can be mentioned groups having the lactone structure represented by any of general formulae (LC1-1) to (LC1-17).

As the repeating unit having an especially preferred lactone group selected from those represented by general formula (AII) wherein Ab is a single bond, there can be mentioned the repeating units below. In the formulae, Rx represents H, CH₃, CH₂OH or CF₃. An improvement in pattern profile and iso-dense bias can be attained by selection of the most appropriate lactone group.

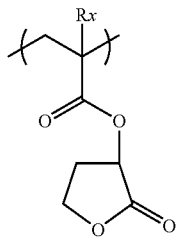
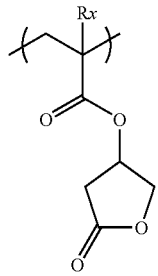
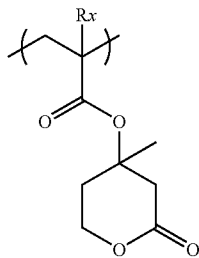
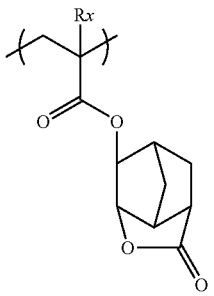
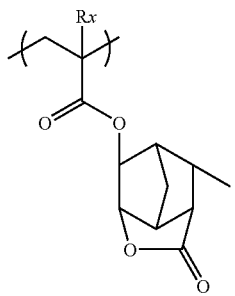
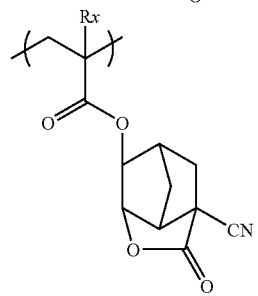
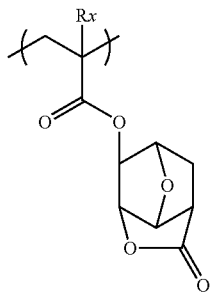
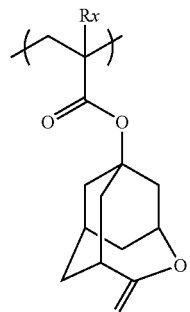
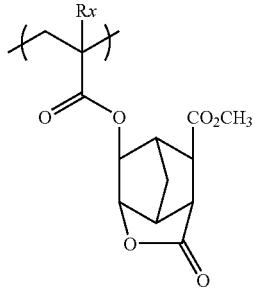
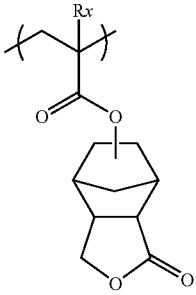
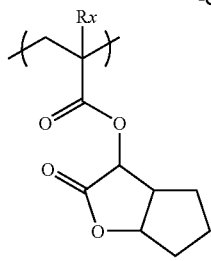
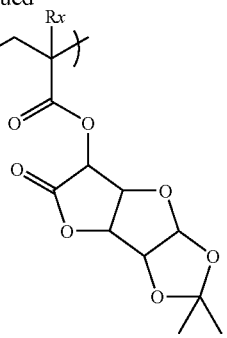
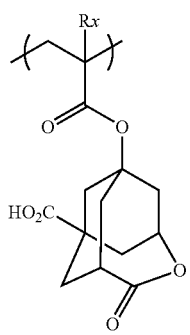
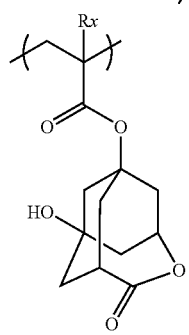

It is preferred for resin (A) to contain any of the repeating units having a lactone structure represented by general formula (3) below.

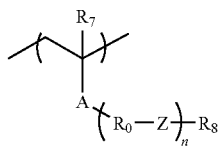

(3)

In formula (3),

A represents an ester bond (—COO—) or an amido bond (—CONH—).

Ro, each independently in the presence of two or more groups, represents an alkylene group, a cycloalkylene group or a combination thereof.

Z, each independently in the presence of two or more groups, represents an ether bond, an ester bond, an amido bond, a urethane bond or a urea bond.

$R_8$ represents a monovalent organic group with a lactone structure.

n represents the number of repetitions and is an integer of 1 to 5.

$R_7$ represents a hydrogen atom, a halogen atom or an optionally substituted alkyl group.

The alkylene group and cycloalkylene group represented by $R_0$ may have a substituent.

Z preferably represents an ether bond or an ester bond, most preferably an ester bond.

The alkyl group represented by $R_7$ is preferably an alkyl group having 1 to 4 carbon atoms, more preferably a methyl group or an ethyl group and most preferably a methyl group. The alkyl group represented by $R_7$ may be substituted. As substituents on $R_7$, there can be mentioned, for example, a halogen atom such as a fluorine atom, a chlorine atom or a bromine atom, a mercapto group, a hydroxyl group, an alkoxy group such as a methoxy group, an ethoxy group, an isopropoxy group, a t-butoxy group or a benzyloxy group, an acyl group such as an acetyl group or a propionyl group, an acetoxy group and the like. $R_7$ preferably represents a hydrogen atom, a methyl group, a trifluoromethyl group or a hydroxymethyl group.

The alkylene group represented by $R_0$ is preferably a chain alkylene group having 1 to 10 carbon atoms, more preferably 1 to 5 carbon atoms, for example, a methylene group, an ethylene group, a propylene group or the like. The cycloalkylene group is preferably a cycloalkylene group having 3 to 20 carbon atoms. As such, there can be mentioned, for example, cyclohexylene, cyclopentylene, norbornylene, adamantylene or the like. The chain alkylene groups are preferred from the viewpoint of the exertion of the effect of the present invention. A methylene group is most preferred.

The substituent with a lactone structure represented by $R_8$ is not limited as long as the lactone structure is contained. As particular examples thereof, there can be mentioned the lactone structures of the above general formulae (LC1-1) to (LC1-17). Of these, the structures of general formula (LC1-4) are most preferred. In general formulae (LC1-1) to (LC1-17), $n_2$ is more preferably 2 or less.

$R_8$ preferably represents a monovalent organic group with an unsubstituted lactone structure or a monovalent organic group with a lactone structure substituted with a methyl group, a cyano group or an alkoxycarbonyl group. More preferably, $R_8$ represents a monovalent organic group with a lactone structure substituted with a cyano group (cyanolactone).

Specific examples of the repeating units having groups with a lactone structure of general formula (3) will be shown below, which however in no way limit the scope of the present invention.

In the following specific examples, R represents a hydrogen atom, an optionally substituted alkyl group or a halogen atom. Preferably, R represents a hydrogen atom, a methyl group, a hydroxymethyl or an acetoxymethyl group.

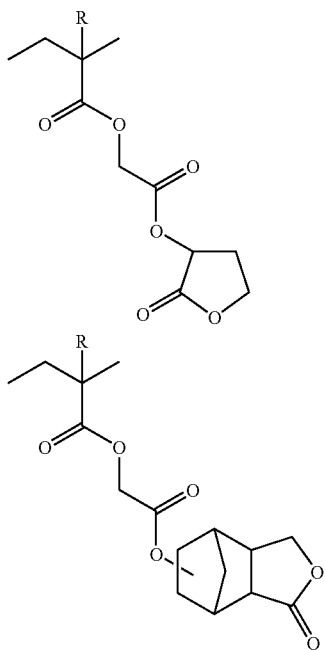

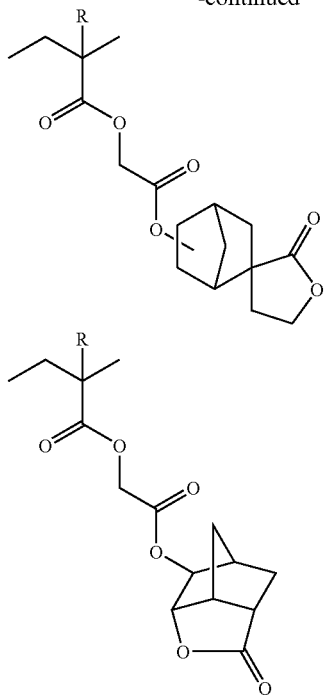

As more preferred repeating units with a lactone structure, there can be mentioned the repeating units of general formula (3-1) below.

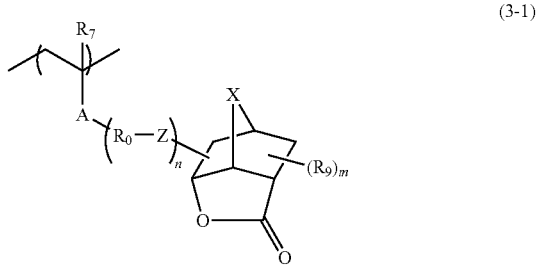

In general formula (3-1), $R_7$, A, $R_0$, Z and n are as defined above with respect to general formula (3).

$R_9$, each independently in the presence of two or more groups, represents an alkyl group, a cycloalkyl group, an alkoxycarbonyl group, a cyano group, a hydroxyl group or an alkoxy group. In the presence of two or more groups, two $R_9$s may be bonded to each other to thereby form a ring.

X represents an alkylene group, an oxygen atom or a sulfur atom, and m is the number of substituents and is an integer of 0 to 5. Preferably, m is 0 or 1.

The alkyl group represented by $R_9$ is preferably an alkyl group having 1 to 4 carbon atoms, more preferably a methyl group or an ethyl group and most preferably a methyl group. As the cycloalkyl group, there can be mentioned a cyclopropyl group, a cyclobutyl group, a cyclopentyl group or a cyclohexyl group. As the ester group, there can be mentioned a methoxycarbonyl group, an ethoxycarbonyl group, an n-butoxycarbonyl group, a t-butoxycarbonyl group or the like. As the substituent therefor, there can be mentioned a hydroxyl group, an alkoxy group such as a methoxy group or an ethoxy group, a cyano group, or a halogen atom such as a fluorine atom.

More preferably, $R_9$ represents a methyl group, a cyano group or an alkoxycarbonyl group, still more preferably a cyano group.

As the alkylene group represented by X, there can be mentioned a methylene group, an ethylene group or the like. Preferably, X represents an oxygen atom or a methylene group, more preferably a methylene group.

When m is 1 or greater, the substitution site of at least one $R_9$ is preferably the α-position or β-position of the carbonyl group of the lactone. The substitution at the α-position is especially preferred.

Specific examples of the repeating units having groups with a lactone structure expressed by general formula (3-1) will be shown below, which however in no way limit the scope of the present invention. In the formulae, R represents a hydrogen atom, an optionally substituted alkyl group or a halogen atom, preferably a hydrogen atom, a methyl group, a hydroxymethyl or an acetoxymethyl group.

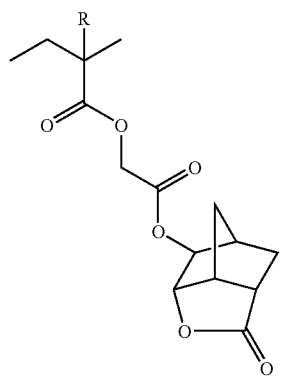

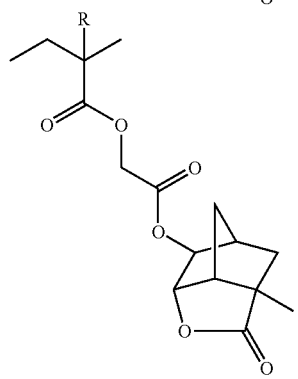

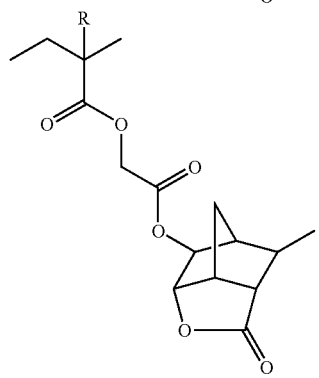

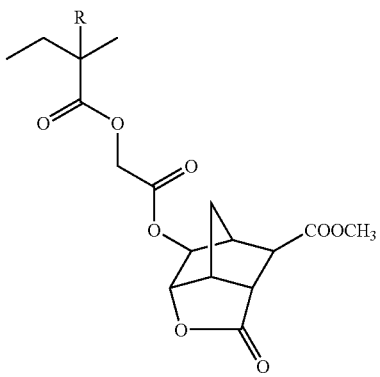

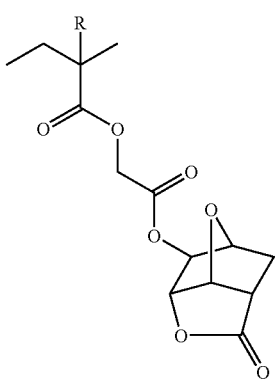

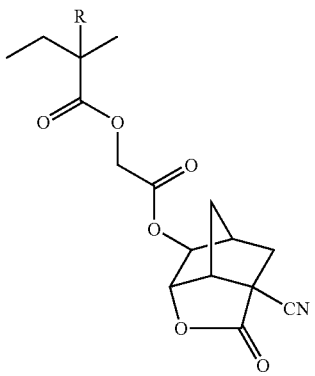

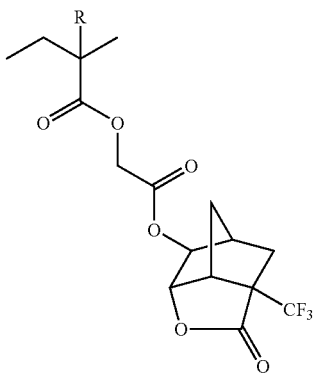

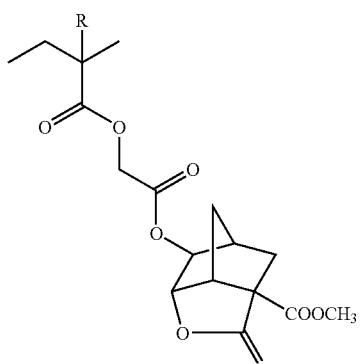
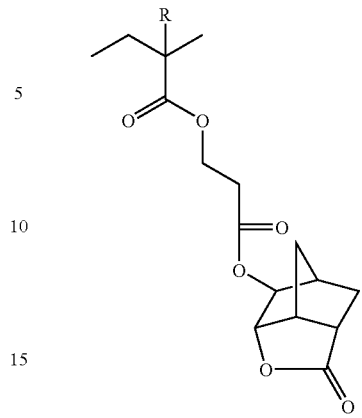
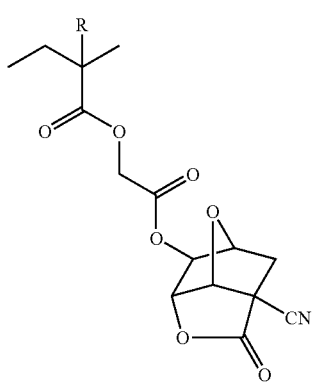
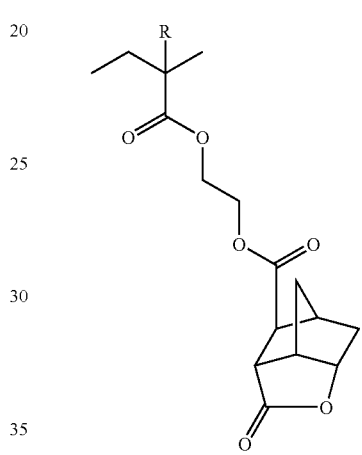
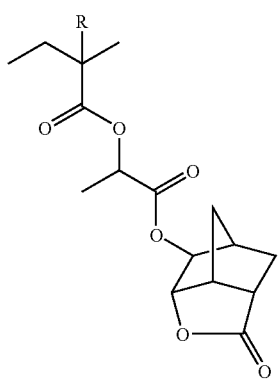
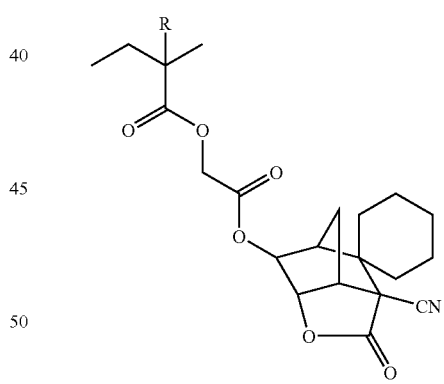
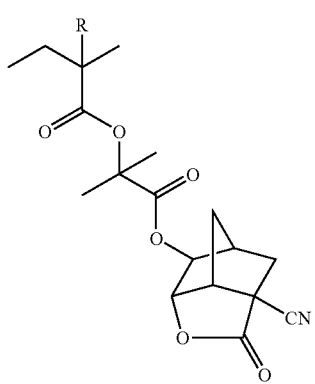
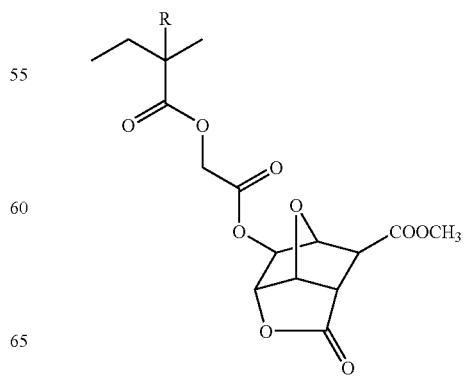

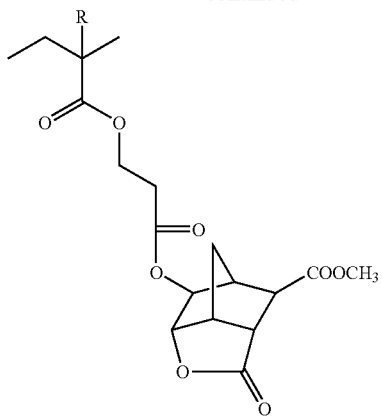

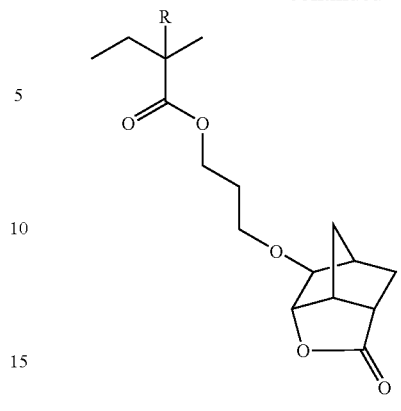

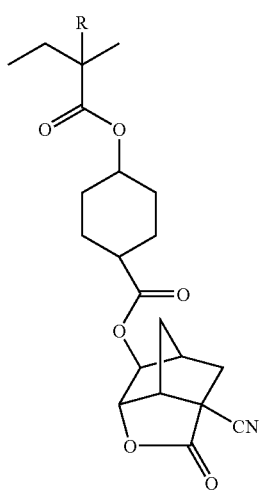

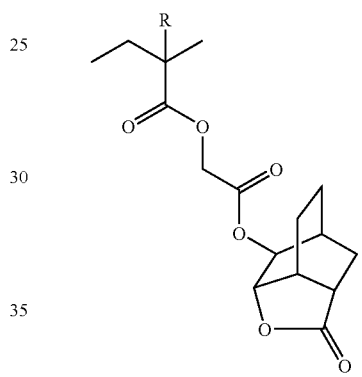

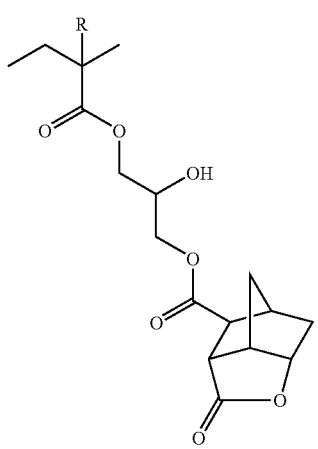

Each of the repeating units having a lactone group is generally present in the form of optical isomers. Any of the optical isomers may be used.

The content ratio of repeating unit having a lactone group based on all the repeating units of resin (A) is preferably in the range of 15 to 60 mol %, more preferably 20 to 50 mol % and still more preferably 30 to 50 mol %.

It is preferred for the resin (A) to contain a repeating unit having a hydroxyl group or a cyano group other than the above repeating units. The containment of this repeating unit would realize enhancements of adhesion to substrates and developer affinity. The repeating unit having a hydroxyl group or a cyano group is preferably a repeating unit having an alicyclic hydrocarbon structure substituted with a hydroxyl group or a cyano group. In the alicyclic hydrocarbon structure substituted with a hydroxyl group or a cyano group, the alicyclic hydrocarbon structure preferably consists of an adamantyl group, a diamantyl group or a norbornyl group. As preferred alicyclic hydrocarbon structures substituted with a hydroxyl group or a cyano group, there can be mentioned a monohydroxyadamantyl group, a dihydroxyadamantyl group, a monohydroxydiadamantyl group, a dihydroxydiadamantyl group, a cyanated norbornyl group and the like.

As repeating units having the above atomic groups, there can be mentioned those of general formulae (AIIa) to (AIId) below.

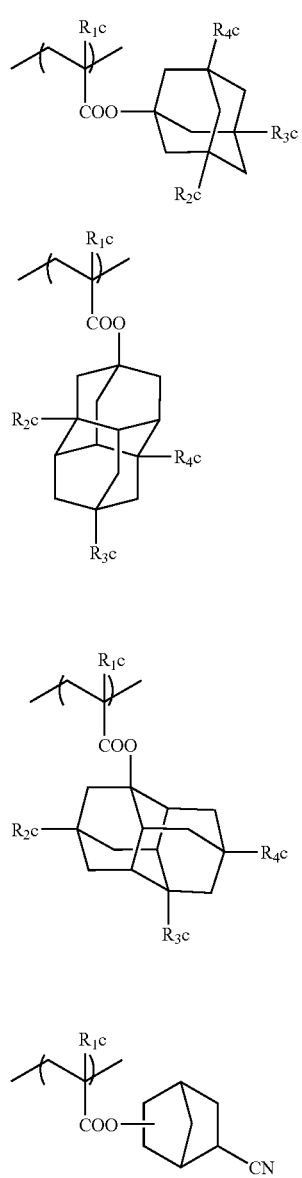

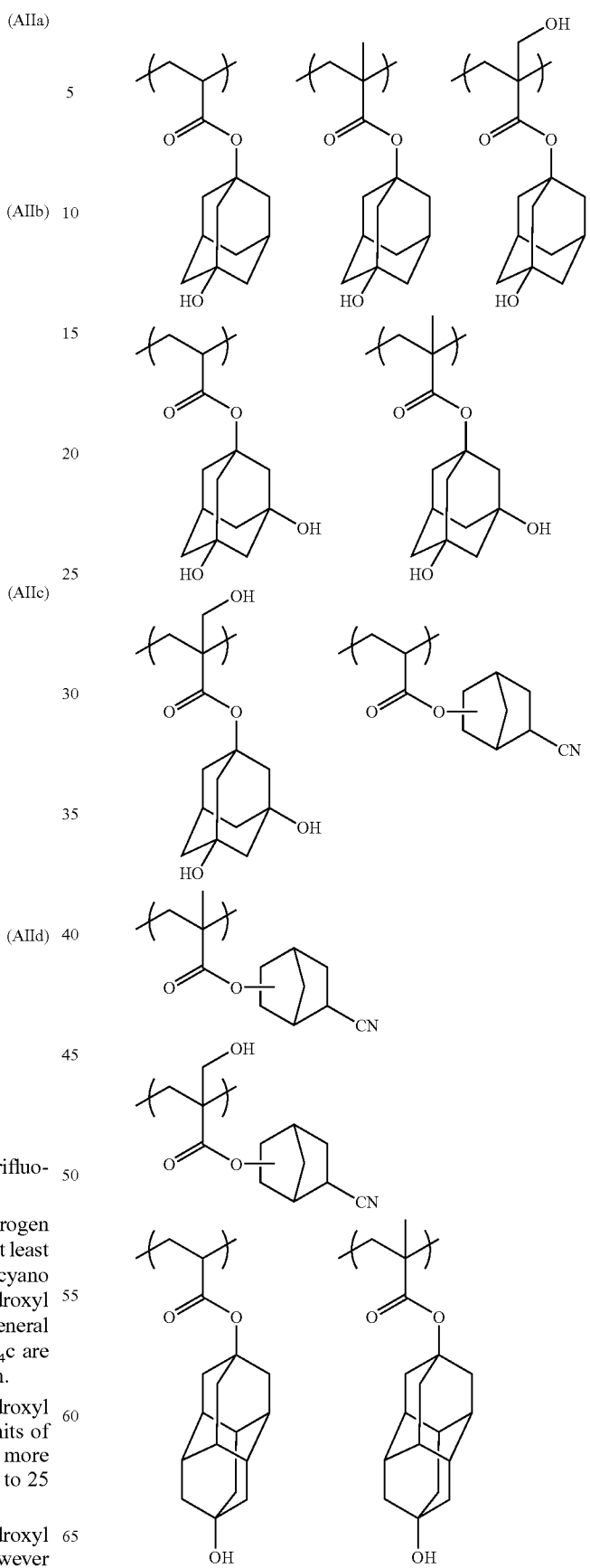

In general formulae (AIIa) to (AIId),

R₁c represents a hydrogen atom, a methyl group, a trifluoromethyl group or a hydroxymethyl group.

Each of R₂c to R₄c independently represents a hydrogen atom, hydroxyl group or a cyano group, providing that at least one of the R₂c to R₄c represents a hydroxyl group or a cyano group. Preferably, one or two of the R₂c to R₄c are hydroxyl groups and the remainder is a hydrogen atom. In general formula (AIIa), more preferably, two of the R₂c to R₄c are hydroxyl groups and the remainder is a hydrogen atom.

The content ratio of the repeating unit having a hydroxyl group or a cyano group, based on all the repeating units of resin (A), is preferably in the range of 5 to 40 mol %, more preferably 5 to 30 mol % and still more preferably 10 to 25 mol %.

Specific examples of the repeating units having a hydroxyl group or a cyano group will be shown below, which however in no way limit the scope of the present invention.

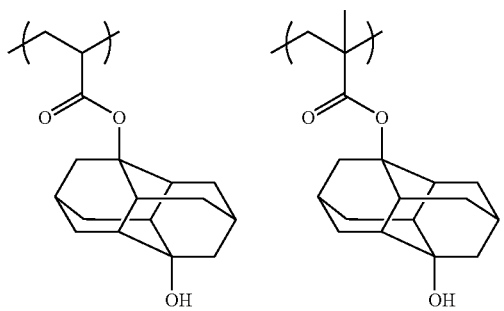

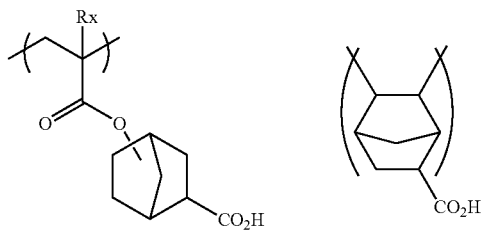

Resin (A) for use in the present invention may contain a repeating unit having an alkali-soluble group. As the alkali-soluble group, there can be mentioned a carboxyl group, a sulfonamido group, a sulfonylimido group, a bisulfonylimido group or an aliphatic alcohol substituted at its α-position with an electron-withdrawing group (for example, a hexafluoroisopropanol group). The possession of a repeating unit having a carboxyl group is more preferred. The incorporation of the repeating unit having an alkali-soluble group would increase the resolving power in contact hole usage. The repeating unit having an alkali-soluble group is preferably any of a repeating unit wherein the alkali-soluble group is directly bonded to the principal chain of a resin such as a repeating unit of acrylic acid or methacrylic acid, a repeating unit wherein the alkali-soluble group is bonded via a connecting group to the principal chain of a resin and a repeating unit wherein the alkali-soluble group is introduced in a terminal of a polymer chain by the use of a chain transfer agent or polymerization initiator having the alkali-soluble group in the stage of polymerization. The connecting group may have a monocyclic or polycyclic hydrocarbon structure. The repeating unit of acrylic acid or methacrylic acid is especially preferred.

The content ratio of the repeating unit having an alkali-soluble group based on all the repeating units of resin (A) is preferably in the range of 0 to 20 mol %, more preferably 3 to 15 mol % and still more preferably 5 to 10 mol %.

Specific examples of the repeating units having an alkali-soluble group will be shown below, which however in no way limit the scope of the present invention.

In the formulae, Rx represents H, $CH_3$, $CF_3$, or $CH_2OH$.

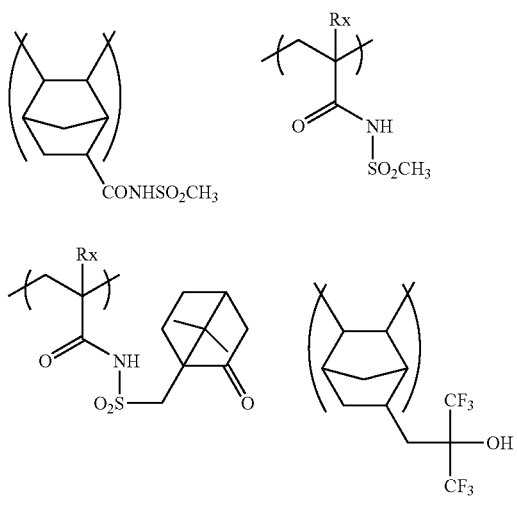

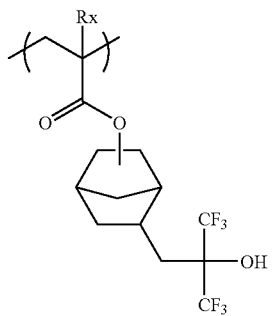

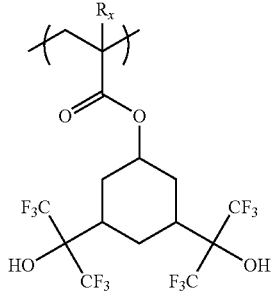

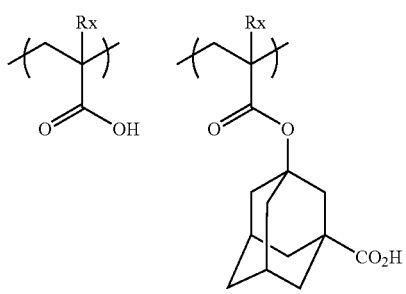

Preferably, the resin (A) for use in the present invention further contains a repeating unit with an alicyclic hydrocarbon structure having no polar group, which repeating unit does not exhibit any acid decomposability. This can reduce the amount of low-molecular components leached from the resist film into a liquid for liquid immersion during liquid immersion exposure. As such a repeating unit, there can be mentioned any of those of general formula (4) below.

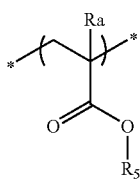
(4)

In general formula (4), $R_5$ represents a hydrocarbon group having at least one cyclic structure in which neither a hydroxyl group nor a cyano group is contained.

Ra represents a hydrogen atom, an optionally substituted alkyl group or a group of the formula —$CH_2$—O—$Ra_2$ in which $Ra_2$ represents a hydrogen atom, an alkyl group or an acyl group. Ra preferably represents a hydrogen atom, a methyl group, a hydroxymethyl group or a trifluoromethyl group, more preferably a hydrogen atom or a methyl group.

The cyclic structures contained in $R_5$ include a monocyclic hydrocarbon group and a polycyclic hydrocarbon group. As the monocyclic hydrocarbon group, there can be mentioned, for example, a cycloalkyl group having 3 to 12 carbon atoms, or a cycloalkenyl group having 3 to 12 carbon atoms. Preferably, the monocyclic hydrocarbon group is a monocyclic hydrocarbon group having 3 to 7 carbon atoms.

The polycyclic hydrocarbon groups include ring-assembly hydrocarbon groups and crosslinked-ring hydrocarbon groups. As the crosslinked-ring hydrocarbon rings, there can be mentioned, for example, bicyclic hydrocarbon rings, tricyclic hydrocarbon rings and tetracyclic hydrocarbon rings. Further, the crosslinked-ring hydrocarbon rings include condensed-ring hydrocarbon rings, for example, condensed rings resulting from condensation of multiple 5- to 8-membered cycloalkane rings. As preferred crosslinked-ring hydrocarbon rings, there can be mentioned, for example, a norbornyl group and an adamantyl group.

These alicyclic hydrocarbon groups may have substituents. As preferred substituents, there can be mentioned, for example, a halogen atom, an alkyl group, a hydroxyl group protected by a protective group and an amino group protected by a protective group. The halogen atom is preferably a bromine, chlorine or fluorine atom, and the alkyl group is preferably a methyl, ethyl, butyl or t-butyl group. The alkyl group may further have a substituent. As the optional further substituent, there can be mentioned a halogen atom, an alkyl group, a hydroxyl group protected by a protective group or an amino group protected by a protective group.

As the protective group, there can be mentioned, for example, an alkyl group, a cycloalkyl group, an aralkyl group, a substituted methyl group, a substituted ethyl group, an alkoxycarbonyl group or an aralkyloxycarbonyl group. The alkyl group is preferably an alkyl group having 1 to 4 carbon atoms. The substituted methyl group is preferably a methoxymethyl, methoxythiomethyl, benzyloxymethyl, t-butoxymethyl or 2-methoxyethoxymethyl group. The substituted ethyl group is preferably a 1-ethoxyethyl or 1-methyl-1-methoxyethyl group. The acyl group is preferably an aliphatic acyl group having 1 to 6 carbon atoms, such as a formyl, acetyl, propionyl, butyryl, isobutyryl, valeryl or pivaloyl group. The alkoxycarbonyl group is, for example, an alkoxycarbonyl group having 1 to 4 carbon atoms.

The content ratio of the repeating unit with an alicyclic hydrocarbon structure having no polar group, which repeating unit does not exhibit any acid decomposability, based on all the repeating units of resin (A), is preferably in the range of 0 to 40 mol %, more preferably 0 to 20 mol %.

Specific examples of the repeating units with an alicyclic hydrocarbon structure having no polar group, which repeating unit does not exhibit any acid, will be shown below, which however in no way limit the scope of the present invention.

In the formulae, Ra represents H, $CH_3$, $CF_3$, or $CH_2OH$.

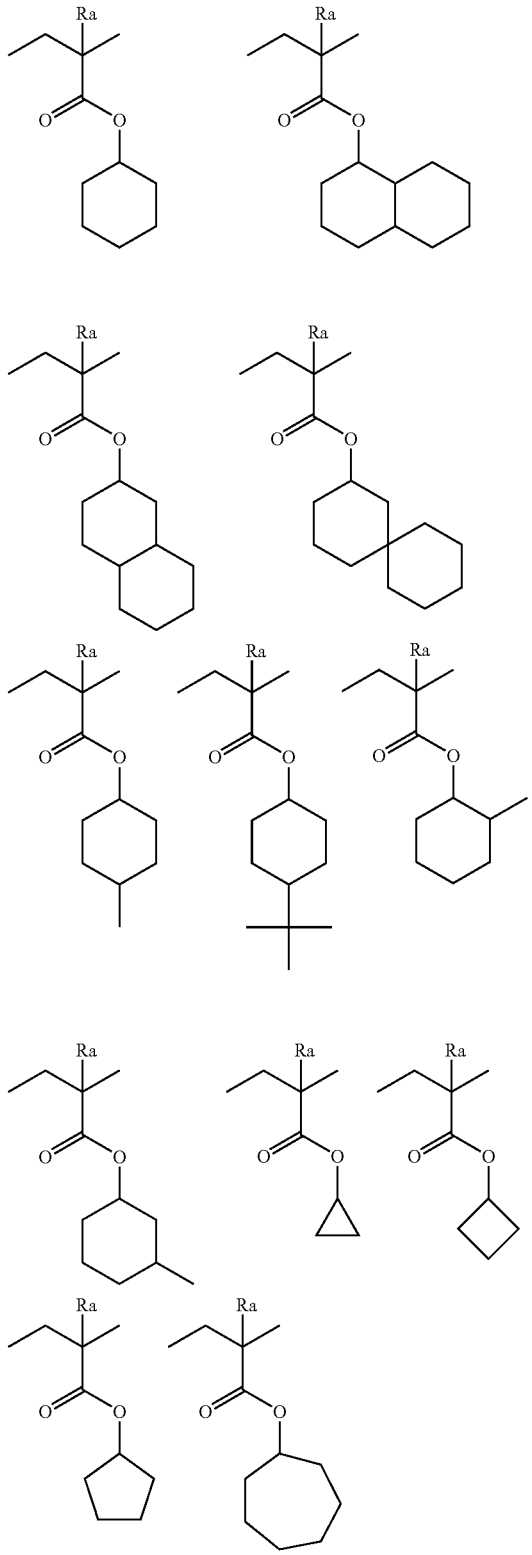

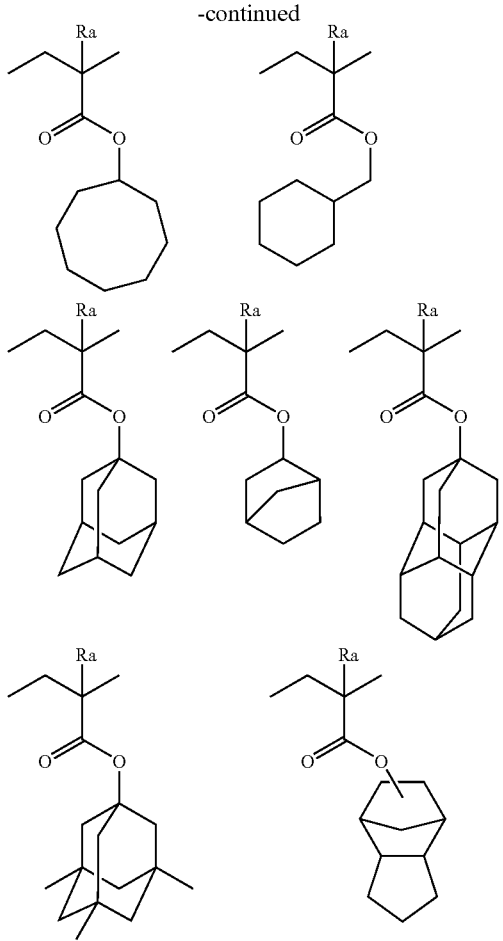

Resin (A) for use in the composition of the present invention may have, in addition to the foregoing repeating structural units, various repeating structural units for the purpose of regulating the dry etching resistance, standard developer adaptability, substrate adhesion, resist profile and generally required properties of the resist such as resolving power, heat resistance and sensitivity.

As such repeating structural units, there can be mentioned those corresponding to the following monomers, which however are nonlimiting.

The use of such repeating structural units would enable fine regulation of the required properties of the resin for use in the composition of the present invention, especially:

(1) solubility in applied solvents,
(2) film forming easiness (glass transition point),
(3) alkali developability,
(4) film thinning (selections of hydrophilicity/hydrophobicity and alkali-soluble group),
(5) adhesion of unexposed area to substrate,
(6) dry etching resistance, etc.

As appropriate monomers, there can be mentioned, for example, a compound having an unsaturated bond capable of addition polymerization, selected from among acrylic esters, methacrylic esters, acrylamides, methacrylamides, allyl compounds, vinyl ethers, vinyl esters and the like.

In addition, any unsaturated compound capable of addition polymerization that is copolymerizable with monomers corresponding to the above various repeating structural units may be copolymerized therewith.

The molar ratios of individual repeating structural units contained in resin (A) are appropriately determined from the viewpoint of regulation of not only the dry etching resistance of the resist but also the standard developer adaptability, substrate adhesion, resist profile and generally required properties of the resist such as the resolving power, heat resistance and sensitivity.

When the composition of the present invention is one for ArF exposure, it is preferred for resin (A) to have no aromatic group from the viewpoint of transparency to ArF beams.

From the viewpoint of the compatibility with the aforementioned resin (HR), it is preferred for resin (A) to contain neither a fluorine atom nor a silicon atom.

In resin (A), preferably, all the repeating units consist of (meth)acrylate repeating units. In that instance, use can be made of any of a resin wherein all the repeating units consist of methacrylate repeating units, a resin wherein all the repeating units consist of acrylate repeating units and a resin wherein all the repeating units consist of methacrylate repeating units and acrylate repeating units. However, it is preferred for the acrylate repeating units to account for 50 mol % or less of all the repeating units. It is more preferred to employ a copolymer containing 20 to 50 mol % of (meth)acrylate repeating units having an acid-decomposable group, 20 to 50 mol % of (meth)acrylate repeating units having a lactone group, 5 to 30 mol % of (meth)acrylate repeating units having an alicyclic hydrocarbon structure substituted with a hydroxyl group or a cyano group and 0 to 20 mol % of other (meth)acrylate repeating units.

Resin (A) of the present invention can be synthesized by conventional techniques (for example, radical polymerization). As general synthetic methods, there can be mentioned, for example, a batch polymerization method in which a monomer species and an initiator are dissolved in a solvent and heated so as to accomplish polymerization and a dropping polymerization method in which a solution of monomer species and initiator is added by dropping to a heated solvent over a period of 1 to 10 hours. The dropping polymerization method is preferred. As a reaction solvent, there can be mentioned, for example, an ether, such as tetrahydrofuran, 1,4-dioxane or diisopropyl ether; a ketone, such as methyl ethyl ketone or methyl isobutyl ketone; an ester solvent, such as ethyl acetate; an amide solvent, such as dimethylformamide or dimethylacetamide; or the solvent capable of dissolving the composition of the present invention, such as propylene glycol monomethyl ether acetate, propylene glycol monomethyl ether or cyclohexanone, to be described hereinafter. It is preferred to perform the polymerization with the use of the same solvent as employed in the composition of the present invention. This would inhibit any particle generation during storage.

The polymerization reaction is preferably carried out in an atmosphere of inert gas, such as nitrogen or argon. The polymerization is initiated by the use of a commercially available radical initiator (azo initiator, peroxide, etc.) as a polymerization initiator. Among the radical initiators, an azo initiator is preferred. An azo initiator having an ester group, a cyano group or a carboxyl group is especially preferred. As preferred initiators, there can be mentioned azobisisobutyronitrile, azobisdimethylvaleronitrile, dimethyl 2,2'-azobis(2-methylpropionate) and the like. According to necessity, a supplementation of initiator or divided addition thereof may be effected. After the completion of the reaction, the reaction mixture is poured into a solvent. The desired polymer is recovered by a method for powder or solid recovery, etc. The concentration during the reaction is in the range of 5 to 50 mass %, preferably 10 to 30 mass %. The reaction temperature is generally in the range of 10° to 150° C., preferably 30° to 120° C. and more preferably 60° to 100° C.

The weight average molecular weight of resin (A) in terms of polystyrene molecular weight as measured by GPC is preferably in the range of 1000 to 200,000, more preferably 2000 to 20,000, still more preferably 3000 to 15,000 and further preferably 3000 to 10,000. The regulation of the weight average molecular weight to 1000 to 200,000 would prevent deteriorations of heat resistance and dry etching resistance and also prevent deterioration of developability and increase of viscosity leading to poor film forming property.

Use is made of the resin whose dispersity (molecular weight distribution) is generally in the range of 1 to 3, preferably 1 to 2.6, more preferably 1 to 2 and most preferably 1.4 to 2.0. The lower the molecular weight distribution, the more excellent the resolving power and resist profile and the smoother the side wall of the resist pattern to thereby attain an excellence in roughness.

In the present invention, the resins (A) may be used either individually or in combination.

The content ratio of resin (A) based on the total solid content of the whole composition is preferably in the range of 50 to 99 mass %, more preferably 60 to 95 mass %.

[3] Compound (B) that when Exposed to Actinic Rays or Radiation, Generates an Acid The actinic-ray- or radiation-sensitive resin composition of the present invention contains a compound that when exposed to actinic rays or radiation, generates an acid (hereinafter also referred to as an "acid generator").

As the acid generator, use can be made of a member appropriately selected from among a photoinitiator for photocationic polymerization, a photoinitiator for photoradical polymerization, a photo-achromatic agent and photo-discoloring agent for dyes, any of publicly known compounds that when exposed to actinic rays or radiation, generate an acid, employed in microresists, etc., and mixtures thereof.

For example, as the acid generator, there can be mentioned a diazonium salt, a phosphonium salt, a sulfonium salt, an iodonium salt, an imide sulfonate, an oxime sulfonate, diazosulfone, disulfone or o-nitrobenzyl sulfonate.

Further, use can be made of compounds obtained by introducing any of the above groups or compounds that when exposed to actinic rays or radiation, generate an acid in a polymer principal chain or side chain, for example, compounds described in U.S. Pat. No. 3,849,137, DE 3914407, JP-As 63-26653, 55-164824, 62-69263, 63-146038, 63-163452, 62-153853, 63-146029, etc.

Furthermore, use can be made of compounds that when exposed to light, generate an acid described in U.S. Pat. No. 3,779,778 and EP 126,712.

As preferred compounds among the acid generators, there can be mentioned those of the following general formulae (ZI), (ZII) and (ZIII).

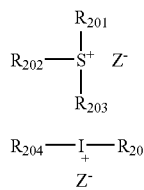

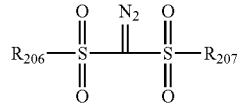

In above general formula (ZI),
each of $R_{201}$, $R_{202}$ and $R_{203}$ independently represents an organic group.

The number of carbon atoms of each of the organic groups represented by $R_{201}$, $R_{202}$ and $R_{203}$ is generally in the range of 1 to 30, preferably 1 to 20.

Two of $R_{201}$ to $R_{203}$ may be bonded to each other to thereby form a ring structure, and the ring within the same may contain an oxygen atom, a sulfur atom, an ester bond, an amido bond or a carbonyl group. As the group formed by bonding of two of $R_{201}$ to $R_{203}$, there can be mentioned an alkylene group (for example, a butylene group or a pentylene group).

$Z^-$ represents a nonnucleophilic anion.

As the nonnucleophilic anion represented by $Z^-$, there can be mentioned, for example, a sulfonate anion, a carboxylate anion, a sulfonylimido anion, a bis(alkylsulfonyl)imido anion, a tris(alkylsulfonyl)methyl anion or the like.

The nonnucleophilic anion means an anion whose capability of inducing a nucleophilic reaction is extremely low and is an anion capable of inhibiting any temporal decomposition by intramolecular nucleophilic reaction. This would realize an enhancement of the temporal stability of the resist.

As the sulfonate anion, there can be mentioned, for example, an aliphatic sulfonate anion, an aromatic sulfonate anion, a camphor sulfonate anion or the like.

As the carboxylate anion, there can be mentioned, for example, an aliphatic carboxylate anion, an aromatic carboxylate anion, an aralkyl carboxylate anion or the like.

The aliphatic moiety of the aliphatic sulfonate anion may be an alkyl group or a cycloalkyl group, being preferably an alkyl group having 1 to 30 carbon atoms or a cycloalkyl group having 3 to 30 carbon atoms. As such, there can be mentioned, for example, a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, a boronyl group or the like.

As a preferred aromatic group of the aromatic sulfonate anion, there can be mentioned an aryl group having 6 to 14 carbon atoms, for example, a phenyl group, a tolyl group, a naphthyl group or the like.

The alkyl group, cycloalkyl group and aryl group of the aliphatic sulfonate anion and aromatic sulfonate anion may have a substituent. As the substituent of the alkyl group, cycloalkyl group and aryl group of the aliphatic sulfonate anion and aromatic sulfonate anion, there can be mentioned, for example, a nitro group, a halogen atom (fluorine atom, chlorine atom, bromine atom or iodine atom), a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), a cycloalkylalkyloxyalkyloxy group (preferably having 8 to 20 carbon atoms) or the like. The aryl group or ring structure of these groups may further have an alkyl group (preferably having 1 to 15 carbon atoms) as its substituent.

As the aliphatic moiety of the aliphatic carboxylate anion, there can be mentioned the same alkyl groups and cycloalkyl groups as mentioned with respect to the aliphatic sulfonate anion.

As the aromatic group of the aromatic carboxylate anion, there can be mentioned the same aryl groups as mentioned with respect to the aromatic sulfonate anion.

As a preferred aralkyl group of the aralkyl carboxylate anion, there can be mentioned an aralkyl group having 6 to 12 carbon atoms, for example, a benzyl group, a phenethyl group, a naphthylmethyl group, a naphthylethyl group, a naphthylbutyl group or the like.

The alkyl group, cycloalkyl group, aryl group and aralkyl group of the aliphatic carboxylate anion, aromatic carboxylate anion and aralkyl carboxylate anion may have a substituent. As the substituent of the alkyl group, cycloalkyl group, aryl group and aralkyl group of the aliphatic carboxylate anion, aromatic carboxylate anion and aralkyl carboxylate anion, there can be mentioned, for example, the same halogen atom, alkyl group, cycloalkyl group, alkoxy group, alkylthio group, etc., as mentioned with respect to the aromatic sulfonate anion.

As the sulfonylimido anion, there can be mentioned, for example, a saccharin anion.

The alkyl group of the bis(alkylsulfonyl)imido anion and tris(alkylsulfonyl)methyl anion is preferably an alkyl group having 1 to 5 carbon atoms. As such, there can be mentioned, for example, a methyl group, an ethyl group, a propyl group, an isopropyl group, an n-butyl group, an isobutyl group, a sec-butyl group, a pentyl group, a neopentyl group or the like. As a substituent of these alkyl groups, there can be mentioned a halogen atom, an alkyl group substituted with a halogen atom, an alkoxy group, an alkylthio group, an alkyloxysulfonyl group, an aryloxysulfonyl group, a cycloalkylaryloxysulfonyl group or the like. An alkyl group substituted with a fluorine atom is preferred.

The two alkyl groups contained in the bis(alkylsulfonyl) imido anion may be identical to or different from each other. Similarly, the alkyl groups contained in the tris(alkylsulfonyl) methide anion may be identical to or different from each other.

In particular, as the bis(alkylsulfonyl)imido anion and tris (alkylsulfonyl)methide anion, there can be mentioned the anions of general formulae (A3) and (A4) below.

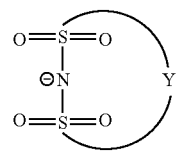
(A3)

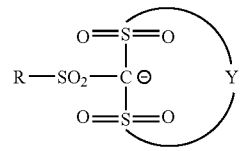
(A4)

In general formulae (A3) and (A4),

Y represents an alkylene group substituted with at least one fluorine atom. The alkylene group preferably has 2 to 4 carbon atoms. An oxygen atom may be contained in the alkylene chain. The alkylene group is more preferably a perfluoroalkylene group having 2 to 4 carbon atoms and most preferably any of a tetrafluoroethylene group, a hexafluoropropylene group and an octafluorobutylene group.

In general formula (A4), R represents an alkyl group or a cycloalkyl group. An oxygen atom may be contained in an alkylene chain of the alkyl group or the cycloalkyl group.

As the compounds having the anions of general formulae (A3) and (A4), there can be mentioned specific examples set forth in JP-A-2005-21721.

As the other nonnucleophilic anions, there can be mentioned, for example, phosphorus fluoride, boron fluoride, antimony fluoride and the like.

The nonnucleophilic anion represented by $Z^-$ is preferably selected from among an aliphatic sulfonate anion substituted at its α-position of sulfonic acid with a fluorine atom, an aromatic sulfonate anion substituted with a fluorine atom or a group having a fluorine atom, a bis(alkylsulfonyl)imido anion whose alkyl group is substituted with a fluorine atom and a tris(alkylsulfonyl)methide anion whose alkyl group is substituted with a fluorine atom. More preferably, the nonnucleophilic anion is a perfluorinated aliphatic sulfonate anion having 4 to 8 carbon atoms or a benzene sulfonate anion having a fluorine atom. Still more preferably, the nonnucleophilic anion is a nonafluorobutane sulfonate anion, a perfluorooctane sulfonate anion, a pentafluorobenzene sulfonate anion or a 3,5-bis(trifluoromethyl)benzene sulfonate anion.

As the organic groups represented by $R_{201}$, $R_{202}$ and $R_{203}$, there can be mentioned, for example, corresponding groups of the following compounds (ZI-1), (ZI-2), (ZI-3) and (ZI-4).

Appropriate use may be made of compounds with two or more of the structures of general formula (ZI). For example, use may be made of compounds having a structure wherein at least one of $R_{201}$ to $R_{203}$ of a compound of general formula (ZI) is bonded to at least one of $R_{201}$ to $R_{203}$ of another compound of general formula (ZI).

As preferred (ZI) components, there can be mentioned the following compounds (ZI-1), (ZI-2), (ZI-3) and (ZI-4).

Compounds (ZI-1) are arylsulfonium compounds of general formula (ZI) wherein at least one of $R_{201}$ to R203 is an aryl group, namely, compounds containing an arylsulfonium as a cation.

In the arylsulfonium compounds, all of the $R_{201}$ to $R_{203}$ may be aryl groups. It is also appropriate that the $R_{201}$ to $R_{203}$ are partially an aryl group and the remainder is an alkyl group or a cycloalkyl group.

As the arylsulfonium compounds, there can be mentioned, for example, a triarylsulfonium compound, a diarylalkylsulfonium compound, an aryldialkylsulfonium compound, a diarylcycloalkylsulfonium compound and an aryldicycloalkylsulfonium compound.

The aryl group of the arylsulfonium compounds is preferably a phenyl group or a naphthyl group, more preferably a phenyl group. The aryl group may be one having a heterocyclic structure containing an oxygen atom, a nitrogen atom, a sulfur atom or the like. As the aryl group having a heterocyclic structure, there can be mentioned, for example, a pyrrole residue (group formed by the loss of one hydrogen atom from pyrrole), a furan residue (group formed by the loss of one hydrogen atom from furan), a thiophene residue (group formed by the loss of one hydrogen atom from thiophene), an indole residue (group formed by the loss of one hydrogen atom from indole), a benzofuran residue (group formed by the loss of one hydrogen atom from benzofuran), a benzothiophene residue (group formed by the loss of one hydrogen atom from benzothiophene) or the like. When the arylsulfonium compound has two or more aryl groups, the two or more aryl groups may be identical to or different from each other.

The alkyl group or cycloalkyl group contained in the arylsulfonium compound according to necessity is preferably a linear or branched alkyl group having 1 to 15 carbon atoms or a cycloalkyl group having 3 to 15 carbon atoms. As such, there can be mentioned, for example, a methyl group, an ethyl group, a propyl group, an n-butyl group, a sec-butyl group, a t-butyl group, a cyclopropyl group, a cyclobutyl group, a cyclohexyl group or the like.

The aryl group, alkyl group or cycloalkyl group represented by $R_{201}$ to $R_{203}$ may have as its substituent an alkyl group (for example, 1 to 15 carbon atoms), a cycloalkyl group (for example, 3 to 15 carbon atoms), an aryl group (for example, 6 to 14 carbon atoms), an alkoxy group (for example, 1 to 15 carbon atoms), a halogen atom, a hydroxyl group or a phenylthio group. Preferred substituents are a linear or branched alkyl group having 1 to 12 carbon atoms, a cycloalkyl group having 3 to 12 carbon atoms and a linear, branched or cyclic alkoxy group having 1 to 12 carbon atoms. More preferred substituents are an alkyl group having 1 to 4 carbon atoms and an alkoxy group having 1 to 4 carbon atoms. The substituents may be contained in any one of the three $R_{201}$ to $R_{203}$, or alternatively may be contained in all three of $R_{201}$ to $R_{203}$. When $R_{201}$ to $R_{203}$ represent an aryl group, the substituent preferably lies at the p-position of the aryl group.

Now, compounds (ZI-2) will be described.

Compounds (ZI-2) are compounds of formula (ZI) wherein each of $R_{201}$ to $R_{203}$ independently represents an organic group having no aromatic ring. The aromatic rings include an aromatic ring having a heteroatom.

The organic group having no aromatic ring represented by $R_{201}$ to $R_{203}$ generally has 1 to 30 carbon atoms, preferably 1 to 20 carbon atoms.

Preferably, each of $R_{201}$ to $R_{203}$ independently represents an alkyl group, a cycloalkyl group, an allyl group or a vinyl group. More preferred groups are a linear or branched 2-oxoalkyl group, a 2-oxocycloalkyl group and an alkoxycarbonylmethyl group. Especially preferred is a linear or branched 2-oxoalkyl group.

As preferred alkyl groups and cycloalkyl groups represented by $R_{201}$ to $R_{203}$, there can be mentioned a linear or branched alkyl group having 1 to 10 carbon atoms (for example, a methyl group, an ethyl group, a propyl group, a butyl group or a pentyl group) and a cycloalkyl group having 3 to 10 carbon atoms (a cyclopentyl group, a cyclohexyl group or a norbornyl group). As more preferred alkyl groups, there can be mentioned a 2-oxoalkyl group and an alkoxycarbonylmethyl group. As more preferred cycloalkyl group, there can be mentioned a 2-oxocycloalkyl group.

The 2-oxoalkyl group may be linear or branched. A group having >C=O at the 2-position of the alkyl group is preferred.

The 2-oxocycloalkyl group is preferably a group having >C=O at the 2-position of the cycloalkyl group.

As preferred alkoxy groups of the alkoxycarbonylmethyl group, there can be mentioned alkoxy groups having 1 to 5 carbon atoms (a methoxy group, an ethoxy group, a propoxy group, a butoxy group and a pentoxy group).

The $R_{201}$ to $R_{203}$ may be further substituted with a halogen atom, an alkoxy group (for example, 1 to 5 carbon atoms), a hydroxyl group, a cyano group or a nitro group.

Now, compounds (ZI-3) will be described.

Compounds (ZI-3) are those represented by the following general formula (ZI-3) which have a phenacylsulfonium salt structure.

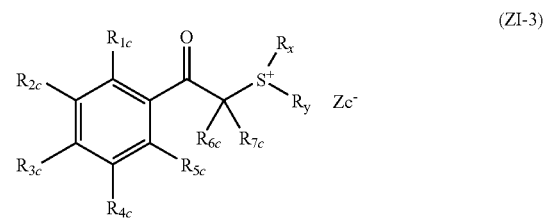

(ZI-3)

In general formula (ZI-3), each of $R_{1c}$ to $R_{5c}$ independently represents a hydrogen atom, an alkyl group, a cycloalkyl group, an alkoxy group, a halogen atom or a phenylthio group.

Each of $R_{6c}$ and $R_{7c}$ independently represents a hydrogen atom, an alkyl group, a cycloalkyl group, a halogen atom, a cyano group or an aryl group.

Each of $R_x$ and $R_y$ independently represents an alkyl group, a cycloalkyl group, a 2-oxoalkyl group, 2-oxocycloalkyl group, an alkoxycarbonylalkyl group, an allyl group or a vinyl group.

Any two or more of $R_{1c}$ to $R_{5c}$, and $R_{6c}$ and $R_{7c}$, and $R_x$ and $R_y$ may be bonded to each other to thereby form a ring structure. This ring structure may contain an oxygen atom, a sulfur atom, an ester bond or an amido bond. As the group formed by bonding of any two or more of $R_{1c}$ to $R_{5c}$, and $R_{6c}$ and $R_{7c}$, and $R_x$ and $R_y$, there can be mentioned a butylene group, a pentylene group or the like.

$Zc^-$ represents a nonnucleophilic anion. There can be mentioned the same nonnucleophilic anions as mentioned with respect to the $Z^-$ of general formula (ZI).

The alkyl group represented by $R_{1c}$ to $R_{7c}$ may be linear or branched. As such, there can be mentioned, for example, an alkyl group having 1 to 20 carbon atoms, preferably a linear or branched alkyl group having 1 to 12 carbon atoms (for example, a methyl group, an ethyl group, a linear or branched propyl group, a linear or branched butyl group or a linear or branched pentyl group). As the cycloalkyl group, there can be mentioned, for example, a cycloalkyl group having 3 to 8 carbon atoms (for example, a cyclopentyl group or a cyclohexyl group).

The alkoxy group represented by $R_{1c}$ to $R_{5c}$ may be linear, or branched, or cyclic. As such, there can be mentioned, for example, an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group, or a linear or branched pentoxy group) and a cycloalkoxy group having 3 to 8 carbon atoms (for example, a cyclopentyloxy group or a cyclohexyloxy group).

Preferably, any one of $R_{1c}$ to $R_{5c}$ is a linear or branched alkyl group, a cycloalkyl group or a linear, branched or cyclic alkoxy group. More preferably, the sum of carbon atoms of $R_{1c}$ to $R_{5c}$ is in the range of 2 to 15. Accordingly, there can be attained an enhancement of solvent solubility and inhibition of particle generation during storage.

Each of the aryl groups represented by $R_{6c}$ and $R_{7c}$ preferably has 5 to 15 carbon atoms. As such, there can be mentioned, for example, a phenyl group or a naphthyl group.

When $R_{6c}$ and $R_{7c}$ are bonded to each other to thereby form a ring, the group formed by the bonding of $R_{6c}$ and $R_{7c}$ is preferably an alkylene group having 2 to 10 carbon atoms. As such, there can be mentioned, for example, an ethylene group, a propylene group, a butylene group, a pentylene group, a hexylene group or the like. Further, the ring formed by the bonding of $R_{6c}$ and $R_{7c}$ may have a heteroatom, such as an oxygen atom, in the ring.

As the alkyl groups and cycloalkyl groups represented by $R_x$ and $R_y$, there can be mentioned the same alkyl groups and cycloalkyl groups as mentioned with respect to $R_{1c}$ to $R_{7c}$.

As the 2-oxoalkyl group and 2-oxocycloalkyl group, there can be mentioned groups having >C=O at the 2-position of the alkyl group and cycloalkyl group represented by $R_{1c}$ to $R_{7c}$.

With respect to the alkoxy group of the alkoxycarbonylalkyl group, there can be mentioned the same alkoxy groups as mentioned above with respect to $R_{1c}$ to $R_{5c}$. As the alkyl group thereof, there can be mentioned, for example, an alkyl group having 1 to 12 carbon atoms, preferably a linear alkyl group having 1 to 5 carbon atoms (e.g., a methyl group or an ethyl group).

The allyl groups are not particularly limited. However, preferred use is made of an unsubstituted allyl group or an allyl group substituted with a cycloalkyl group of a single ring or multiple rings.

The vinyl groups are not particularly limited. However, preferred use is made of an unsubstituted vinyl group or a vinyl group substituted with a cycloalkyl group of a single ring or multiple rings.

As the ring structure that may be formed by the mutual bonding of $R_x$ and $R_y$, there can be mentioned a 5-membered or 6-membered ring, especially preferably a 5-membered ring (namely, a tetrahydrothiophene ring), formed by bivalent $R_x$ and $R_y$ (for example, a methylene group, an ethylene group, a propylene group or the like) in cooperation with the sulfur atom of general formula (ZI-3).

Each of $R_x$ and $R_y$ is preferably an alkyl group or cycloalkyl group having preferably 4 or more carbon atoms. The alkyl group or cycloalkyl group has more preferably 6 or more carbon atoms and still more preferably 8 or more carbon atoms.

Now, compounds (ZI-4) will be described.

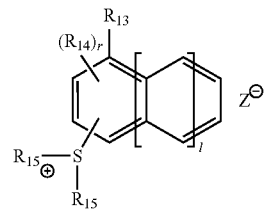

(ZI-4)

$R_{13}$ represents any of a hydrogen atom, a fluorine atom, a hydroxyl group, an alkyl group, a cycloalkyl group, an alkoxy group, an alkoxycarbonyl group and a group with a cycloalkyl skeleton of a single ring or multiple rings. These groups may have substituents.

$R_{14}$, each independently in the instance of $R_{14}$s, represents any of an alkyl group, a cycloalkyl group, an alkoxy group, an alkoxycarbonyl group, an alkylcarbonyl group, an alkylsulfonyl group, a cycloalkylsulfonyl group and a group with a cycloalkyl skeleton of a single ring or multiple rings. These groups may have substituents. These groups may have substituents.

Each of $R_{15}$s independently represents any of an alkyl group, a cycloalkyl group and a naphthyl group, provided that two of the $R_{15}$s may be bonded to each other to thereby form a ring. These groups may have substituents.

In the formula, 1 is an integer of 0 to 2.

r is an integer of 0 to 8.

$Z^-$ represents a nonnucleophilic anion. As such, there can be mentioned any of the same nonnucleophilic anions as mentioned with respect to the $Z^-$ of the general formula (ZI).

In general formula (ZI-4), the alkyl groups represented by $R_{13}$, $R_{14}$ and $R_{15}$ may be linear or branched and preferably each have 1 to 10 carbon atoms. As such, there can be mentioned a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group and the like. Of these alkyl groups, a methyl group, an ethyl group, an n-butyl group, a t-butyl group and the like are preferred.

As the cycloalkyl groups represented by $R_{13}$, $R_{14}$ and $R_{15}$, there can be mentioned cyclopropyl, cyclobutyl, cyclopentyl, cyclohexyl, cycloheptyl, cyclooctyl, cyclododecanyl, cyclopentenyl, cyclohexenyl, cyclooctadienyl, a norbornyl group, a tricyclodecanyl group, a tetracyclodecanyl group, an adamantyl group and the like. Cyclopropyl, cyclopentyl, cyclohexyl and cyclooctyl are especially preferred.

The alkoxy groups represented by $R_{13}$ and $R_{14}$ may be linear or branched and preferably each have 1 to 10 carbon atoms. As such, there can be mentioned, for example, a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group and the like. Of these alkoxy groups, a methoxy group, an ethoxy group, an n-propoxy group, an n-butoxy group and the like are preferred.

The alkoxycarbonyl groups represented by $R_{13}$ and $R_{14}$ may be linear or branched and preferably has 2 to 11 carbon atoms. As such, there can be mentioned, for example, a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, an n-decyloxycarbonyl group and the like. Of these alkoxycarbonyl groups, a methoxycarbonyl group, an ethoxycarbonyl group, an n-butoxycarbonyl group and the like are preferred.

As the groups with a cycloalkyl skeleton of a single ring or multiple rings represented by $R_{13}$ and $R_{14}$, there can be mentioned, for example, a cycloalkyloxy group of a single ring or multiple rings and an alkoxy group with a cycloalkyl group of a single ring or multiple rings. These groups may further have substituents.

With respect to each of the cycloalkyloxy groups of a single ring or multiple rings represented by $R_{13}$ and $R_{14}$, the sum of carbon atoms thereof is preferably 7 or greater, more preferably in the range of 7 to 15. Further, having a cycloalkyl skeleton of a single ring is preferred. The cycloalkyloxy group of a single ring of which the sum of carbon atoms is 7 or greater is one composed of a cycloalkyloxy group, such as a cyclopropyloxy group, a cyclobutyloxy group, a cyclopentyloxy group, a cyclohexyloxy group, a cycloheptyloxy group, a cyclooctyloxy group or a cyclododecanyloxy group, optionally having a substituent selected from among an alkyl group such as methyl, ethyl, propyl, butyl, pentyl, hexyl, heptyl, octyl, dodecyl, 2-ethylhexyl, isopropyl, sec-butyl, t-butyl or isoamyl, a hydroxyl group, a halogen atom (fluorine, chlorine, bromine or iodine), a nitro group, a cyano group, an amido group, a sulfonamido group, an alkoxy group such as methoxy, ethoxy, hydroxyethoxy, propoxy, hydroxypropoxy or butoxy, an alkoxycarbonyl group such as methoxycarbonyl or ethoxycarbonyl, an acyl group such as formyl, acetyl or benzoyl, an acyloxy group such as acetoxy or butyryloxy, a carboxyl group and the like, provided that the sum of carbon atoms thereof including those of any optional substituent introduced in the cycloalkyl group is 7 or greater.

As the cycloalkyloxy group of multiple rings of which the sum of carbon atoms is 7 or greater, there can be mentioned a norbornyloxy group, a tricyclodecanyloxy group, a tetracyclodecanyloxy group, an adamantyloxy group and the like.

With respect to each of the alkyloxy groups having a cycloalkyl skeleton of a single ring or multiple rings represented by $R_{13}$ and $R_{14}$, the sum of carbon atoms thereof is preferably 7 or greater, more preferably in the range of 7 to 15. Further, the alkoxy group having a cycloalkyl skeleton of a single ring is preferred. The alkoxy group having a cycloalkyl skeleton of a single ring of which the sum of carbon atoms is 7 or greater is one composed of an alkoxy group, such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy or isoamyloxy, substituted with the above optionally substituted cycloalkyl group of a single ring, provided that the sum of carbon atoms thereof including those of the substituents is 7 or greater. For example, there can be mentioned a cyclohexylmethoxy group, a cyclopentylethoxy group, a cyclohexylethoxy group or the like. A cyclohexylmethoxy group is preferred.

As the alkoxy group having a cycloalkyl skeleton of multiple rings of which the sum of carbon atoms is 7 or greater, there can be mentioned a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, an adamantylethoxy group and the like. Of these, a norbornylmethoxy group and a norbornylethoxy group are preferred.

With respect to the alkyl group of the alkylcarbonyl group represented by $R_{14}$, there can be mentioned the same specific examples as mentioned above with respect to the alkyl groups represented by $R_{13}$ to $R_{15}$.

The alkylsulfonyl and cycloalkylsulfonyl groups represented by $R_{14}$ may be linear, branched or cyclic and preferably each have 1 to 10 carbon atoms. As such, there can be mentioned, for example, a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group, a cyclohexanesulfonyl group and the like. Of these alkylsulfonyl and cycloalkylsulfonyl groups, a methanesulfonyl group, an ethanesulfonyl group, an n-propanesulfonyl group, an n-butanesulfonyl group, a cyclopentanesulfonyl group, a cyclohexanesulfonyl group and the like are preferred.

In the formula, l is preferably 0 or 1, more preferably 1, and r is preferably 0 to 2.

Each of the $R_{13}$, $R_{14}$ and $R_{15}$ groups may have a substituent. As such a substituent, there can be mentioned, for example, a halogen atom (e.g., a fluorine atom), a hydroxyl group, a carboxyl group, a cyano group, a nitro group, an alkoxy group, an alkoxyalkyl group, an alkoxycarbonyl group, an alkoxycarbonyloxy group or the like.

As the alkoxy group, there can be mentioned, for example, a linear, branched or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group or a cyclohexyloxy group.

As the alkoxyalkyl group, there can be mentioned, for example, a linear, branched or cyclic alkoxyalkyl group having 2 to 21 carbon atoms, such as a methoxymethyl group, an ethoxymethyl group, a 1-methoxyethyl group, a 2-methoxyethyl group, a 1-ethoxyethyl group or a 2-ethoxyethyl group.

As the alkoxycarbonyl group, there can be mentioned, for example, a linear, branched or cyclic alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group or a cyclohexyloxycarbonyl group.

As the alkoxycarbonyloxy group, there can be mentioned, for example, a linear, branched or cyclic alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group or a cyclohexyloxycarbonyloxy group.

As the ring structure that may be formed by the mutual bonding of two $R_{15}$s, there can be mentioned a 5-membered or 6-membered ring, especially preferably a 5-membered ring (namely, a tetrahydrothiophene ring), formed by two bivalent $R_{15}$s in cooperation with the sulfur atom of the general formula (ZI-4). The ring structure may be condensed with an aryl group or a cycloalkyl group. Each of the bivalent $R_{15}$s may have a substituent. As the substituent, there can be mentioned, for example, a hydroxyl group, a carboxyl group, a cyano group, a nitro group, an alkoxy group, an alkoxyalkyl group, an alkoxycarbonyl group, an alkoxycarbonyloxy group and the like. It is especially preferred for the $R_{15}$ of the general formula (ZI-4) to be a methyl group, an ethyl group, the above-mentioned bivalent group allowing two $R_{15}$s to be bonded to each other so as to form a tetrahydrothiophene ring structure in cooperation with the sulfur atom of the general formula (ZI-4), or the like.

The substituent that can be introduced in $R_{13}$ and $R_{14}$ is preferably a hydroxyl group, an alkoxy group, an alkoxycarbonyl group or a halogen atom (especially a fluorine atom).

Specific examples of the cations of the compounds of (ZI-3) and (ZI-4) are shown below.

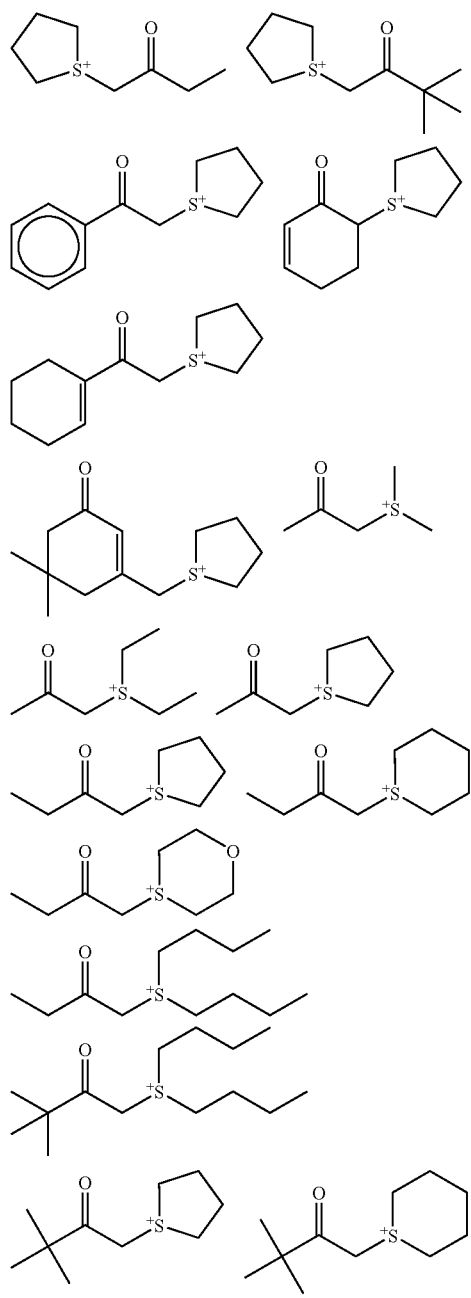

-continued

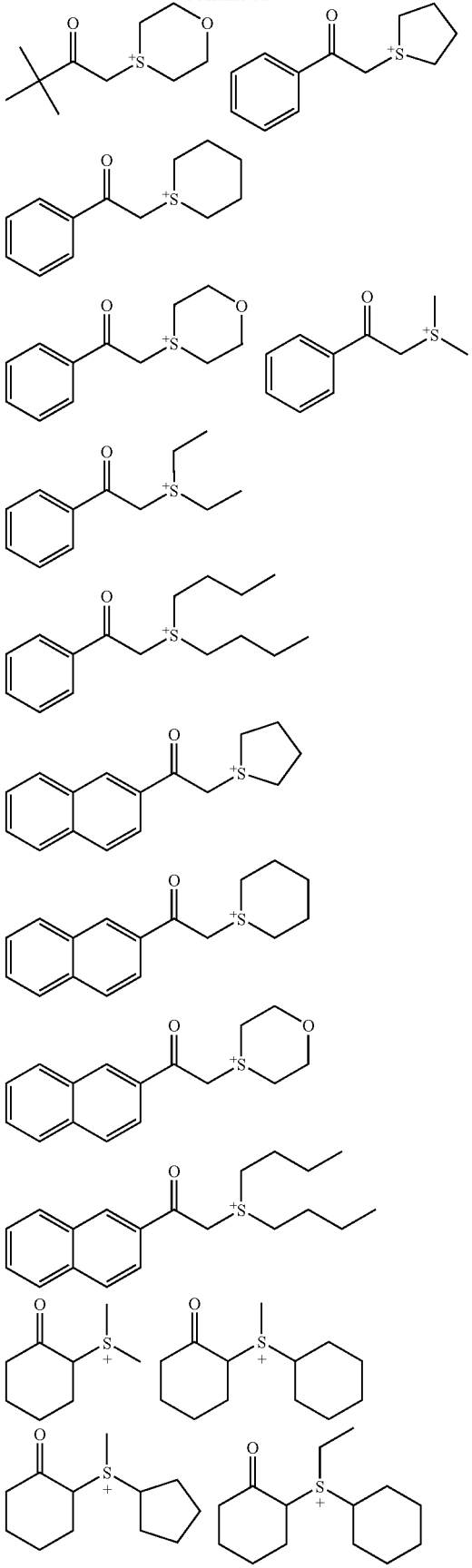

115
-continued
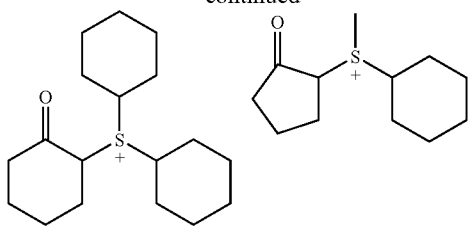
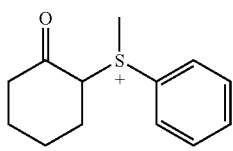
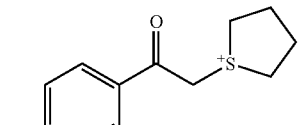
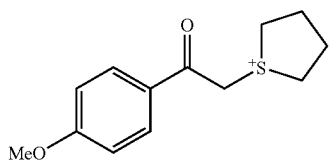
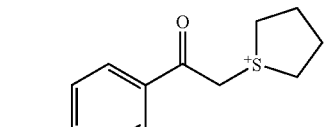
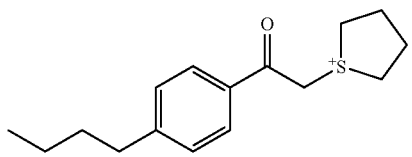
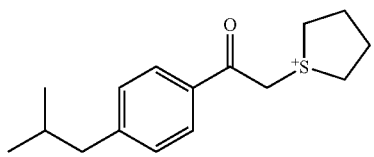
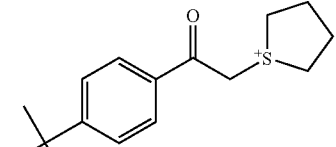
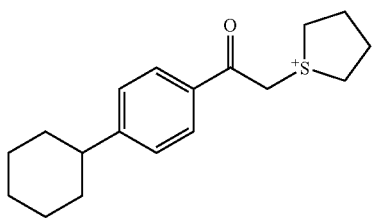
116
-continued
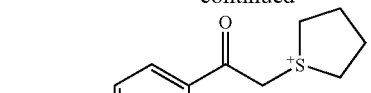
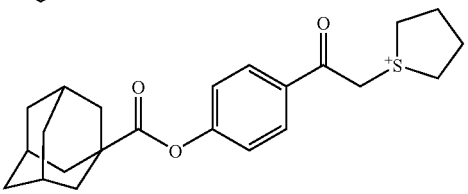
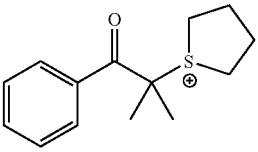
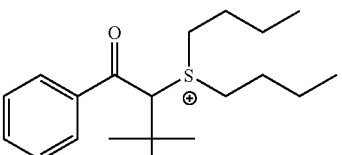
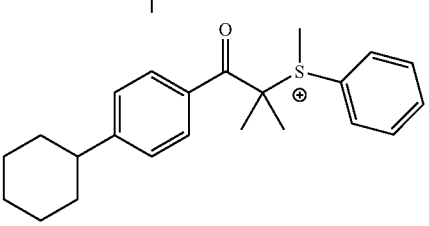
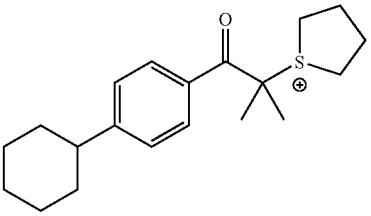
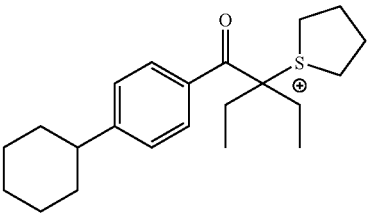
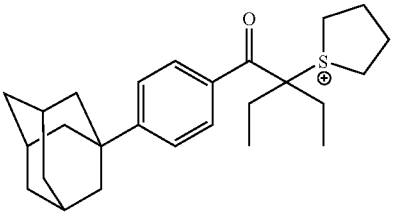
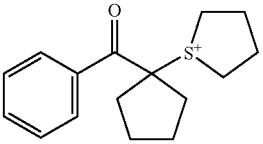

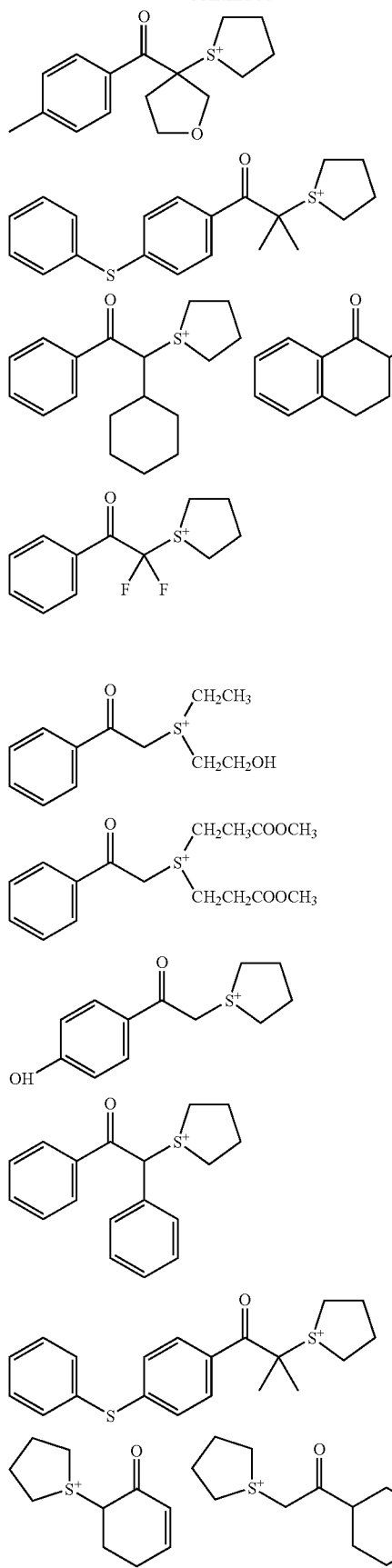
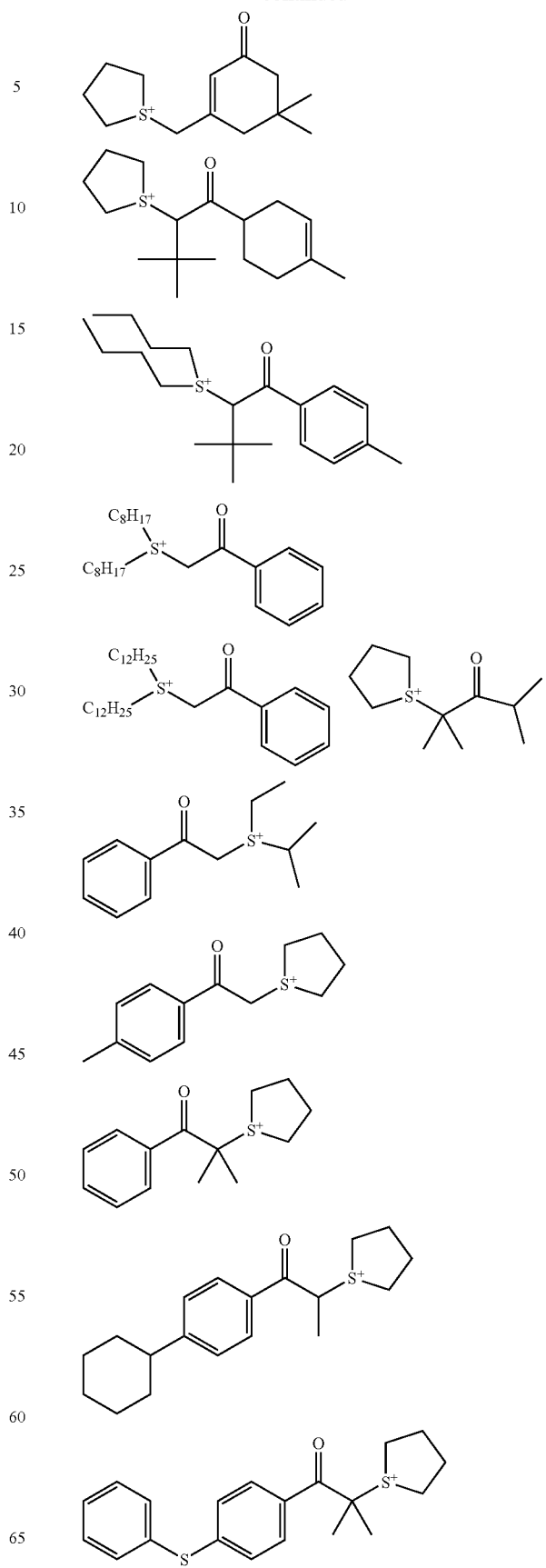

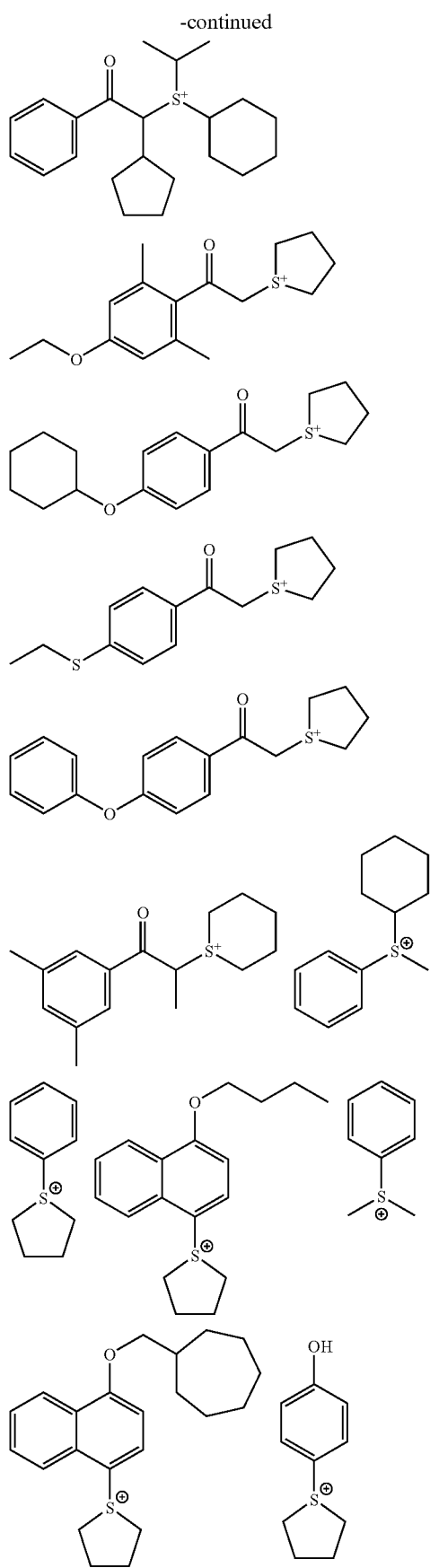
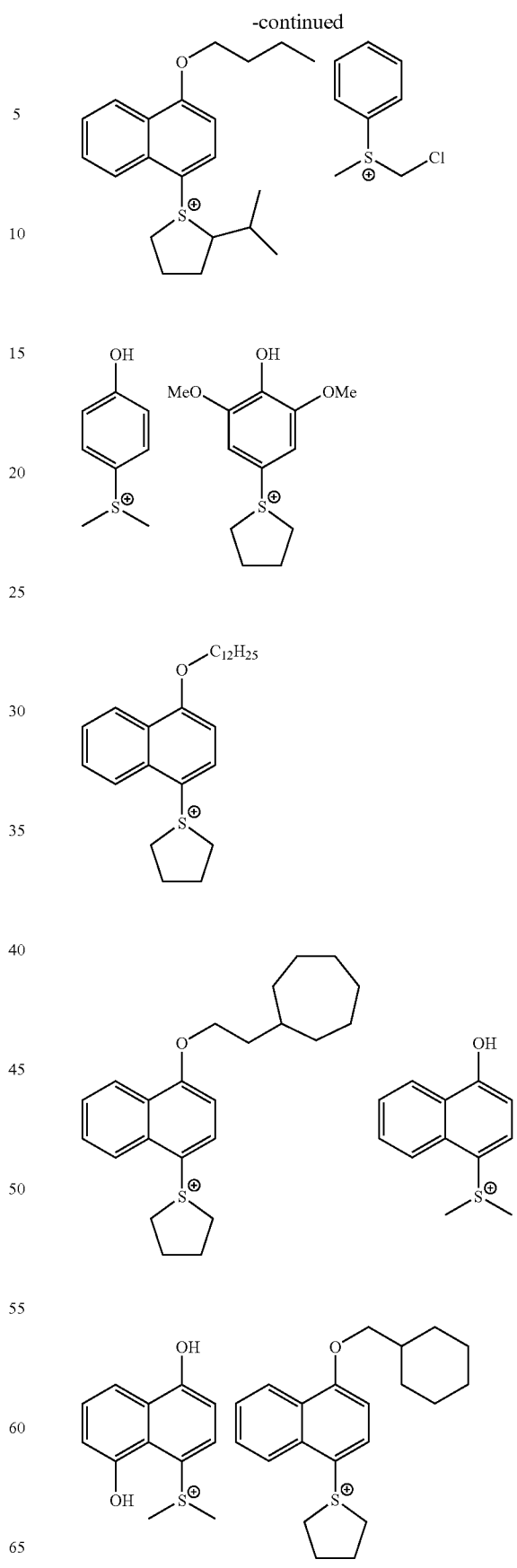

121
-continued
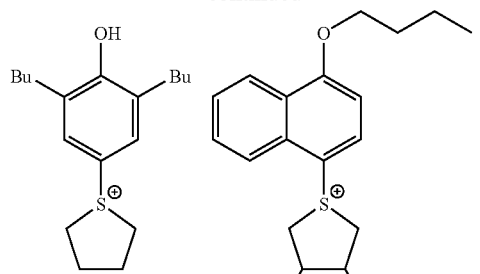
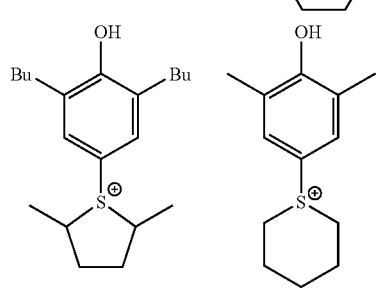
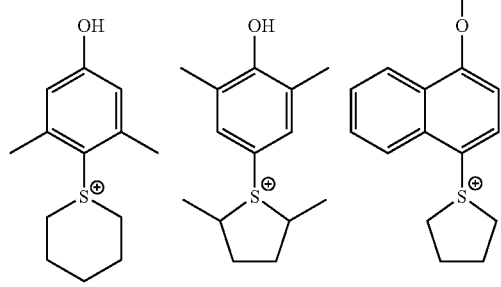
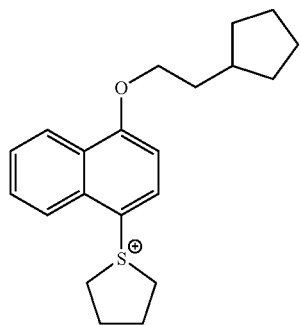
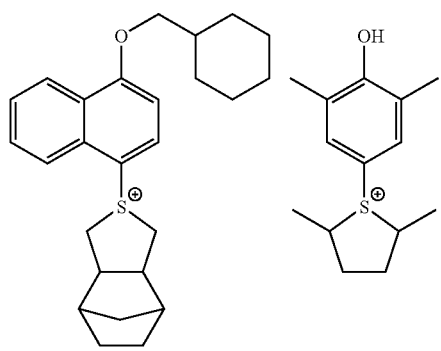
122
-continued
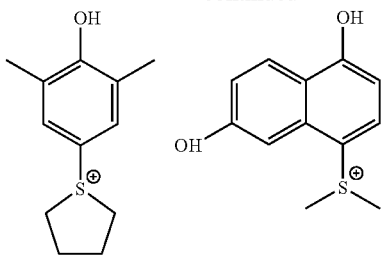
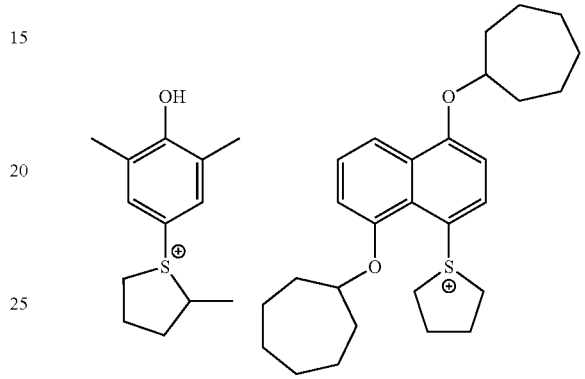
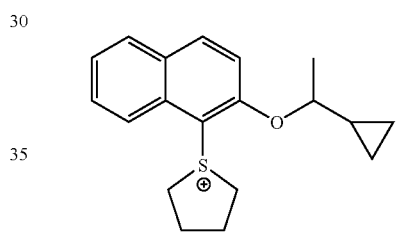
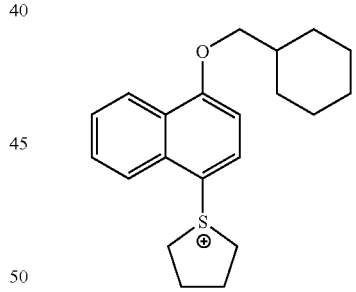
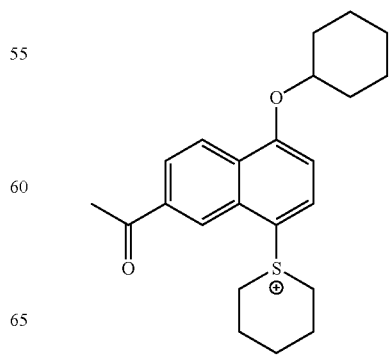

123
-continued
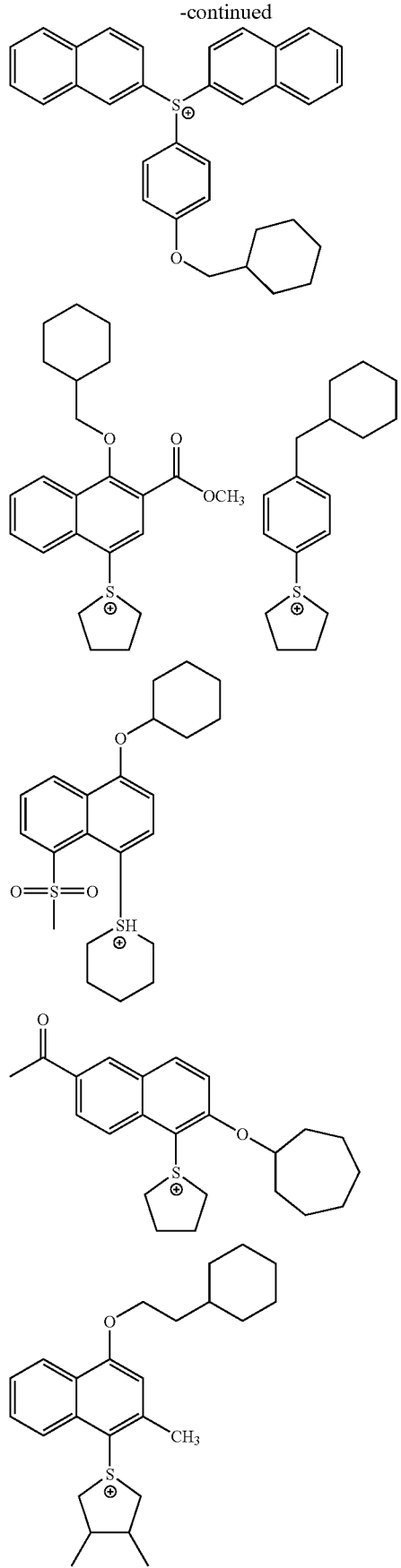
124
-continued
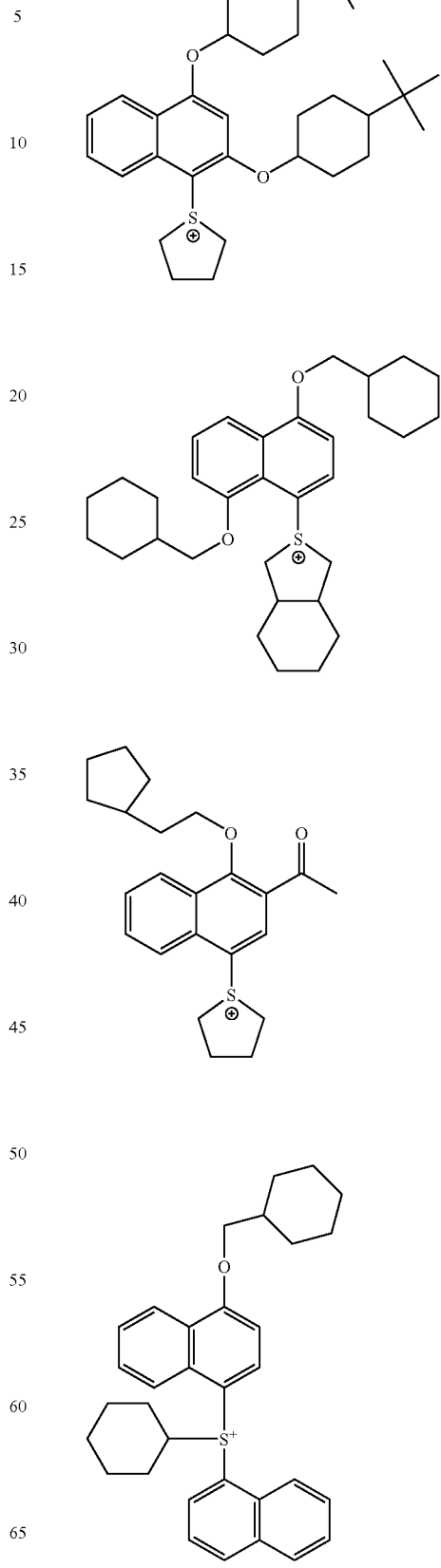

-continued

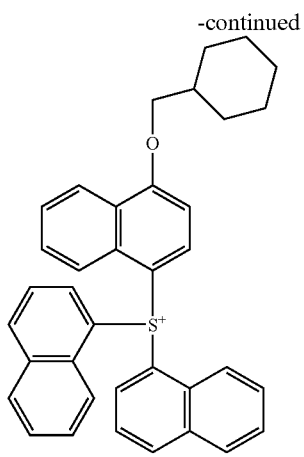

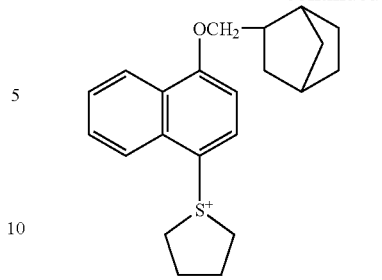

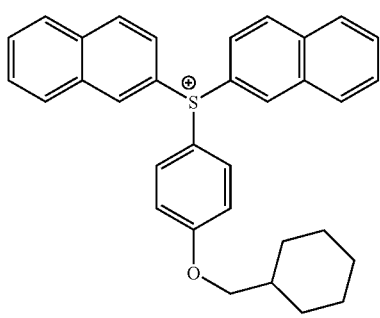

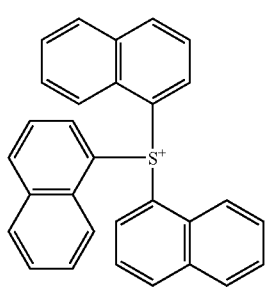

In general formulae (ZII) and (ZIII),
each of $R_{204}$ to $R_{207}$ independently represents an aryl group, an alkyl group or a cycloalkyl group.

The aryl group represented by $R_{204}$ to $R_{207}$ is preferably a phenyl group or a naphthyl group, more preferably a phenyl group. The aryl group represented by $R_{204}$ to $R_{207}$ may be one having a heterocyclic structure containing an oxygen atom, nitrogen atom, sulfur atom or the like. As the aryl group having a heterocyclic structure, there can be mentioned, for example, a pyrrole residue (group formed by the loss of one hydrogen atom from pyrrole), a furan residue (group formed by the loss of one hydrogen atom from furan), a thiophene residue (group formed by the loss of one hydrogen atom from thiophene), an indole residue (group formed by the loss of one hydrogen atom from indole), a benzofuran residue (group formed by the loss of one hydrogen atom from benzofuran), a benzothiophene residue (group formed by the loss of one hydrogen atom from benzothiophene) or the like.

As preferred alkyl groups and cycloalkyl groups represented by $R_{204}$ to $R_{207}$, there can be mentioned a linear or branched alkyl group having 1 to 10 carbon atoms (for example, a methyl group, an ethyl group, a propyl group, a butyl group or a pentyl group) and a cycloalkyl group having 3 to 10 carbon atoms (a cyclopentyl group, a cyclohexyl group or a norbornyl group).

The aryl group, alkyl group and cycloalkyl group represented by $R_{204}$ to $R_{207}$ may have a substituent. As a possible substituent on the aryl group, alkyl group and cycloalkyl group represented by $R_{204}$ to $R_{207}$, there can be mentioned, for example, an alkyl group (for example, 1 to 15 carbon atoms), a cycloalkyl group (for example, 3 to 15 carbon atoms), an aryl group (for example, 6 to 15 carbon atoms), an alkoxy group (for example, 1 to 15 carbon atoms), a halogen atom, a hydroxyl group, a phenylthio group or the like.

$Z^-$ represents a nonnucleophilic anion. As such, there can be mentioned the same nonnucleophilic anions as mentioned with respect to the $Z^-$ of general formula (ZI).

In some aspects, the acid generators (B) used for the composition of the present invention is any of those of general formula (V).

(V)

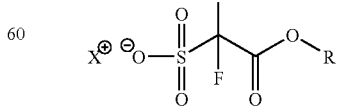

In general formula (V),
$X^+$ represents an organic counter ion, and R represents a hydrogen atom or an organic group.

R is preferably an organic group having 1 to 40 carbon atoms, more preferably an organic group having 3 to 20 carbon atoms and most preferably any of the organic groups of formula (VI) below.

The organic group represented by R is not particularly limited as long as one or more carbon atoms are contained. Preferably, a carbon atom of the organic group is bonded to the oxygen atom of the ester bond in the general formula (V). As the organic group, there can be mentioned, for example, an alkyl group, a cycloalkyl group, an aryl group, an aralkyl group or a group with a lactone structure. The organic group may have a heteroatom, such as an oxygen atom or a sulfur atom, in its chain. The organic groups may be introduced into each other as substituents. The organic group may have a substituent, such as a hydroxyl group, an acyl group, an acyloxy group, an oxy group (=O) or a halogen atom.

(VI)

In formula (VI),

Rc represents a monocyclic or polycyclic organic group having 3 to 30 carbon atoms that may contain a cyclic ether, cyclic thioether, cyclic ketone, cyclic carbonate ester, lactone or lactam structure.

Y represents a hydroxyl group, a halogen atom, a cyano group, a carboxyl group, a hydrocarbon group having 1 to 10 carbon atoms, a hydroxyalkyl group having 1 to 10 carbon atoms, an alkoxy group having 1 to 10 carbon atoms, an acyl group having 1 to 10 carbon atoms, an alkoxycarbonyl group having 2 to 10 carbon atoms, an acyloxy group having 2 to 10 carbon atoms, an alkoxyalkyl group having 2 to 10 carbon atoms or a halogenated alkyl group having 1 to 8 carbon atoms.

In the formula, m is an integer of 0 to 6. In the event of multiple Ys, they may be identical to or different from each other. Further, n is an integer of 0 to 10.

The sum of carbon atoms constructing each of the groups R expressed by the formula (VI) is 40 or less.

In the formula, n=0-3 is preferred, and Rc is preferably a monocyclic or polycyclic organic group having 7 to 16 carbon atoms.

The molecular weight of each of the compounds of general formula (V) is generally in the range of 300 to 1000, preferably 400 to 800 and more preferably 500 to 700.

As the organic counter ion represented by $X^+$, there can be mentioned, for example, a sulfonium cation or an iodonium cation.

As preferred forms of the compounds of general formula (V), there can be mentioned those of general formulae $(Z_{SC1})$ and $(Z_{IC1})$.

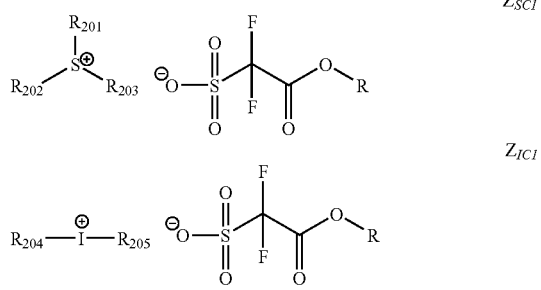

In general formula $(Z_{SC1})$, the definition of R and preferred scope thereof are the same as in general formula (V).

Each of $R_{201}$, $R_{202}$ and $R_{203}$ independently represents an organic group.

Specific examples and preferred forms of the organic groups represented by $R_{201}$, $R_{202}$ and $R_{203}$ are the same as mentioned with respect to general formula (ZI) above.

The acid generator (B) may be a compound with two or more of the structures of general formula $(Z_{SC1})$. For example, use may be made of a compound having a structure wherein at least one of $R_{201}$ to $R_{203}$ of a compound of the general formula $(Z_{SC1})$ is bonded with at least one of $R_{201}$ to $R_{203}$ of another compound of the general formula $(Z_{SC1})$.

In general formula $(Z_{IC1})$, the definition of R and preferred scope thereof are the same as in general formula (V).

Each of $R_{204}$ and $R_{205}$ independently represents an aryl group, an alkyl group and a cycloalkyl group.

Specific examples and preferred forms of the aryl groups, alkyl groups and cycloalkyl groups represented by $R_{204}$ and $R_{205}$ are the same as mentioned with respect to general formula (ZII) above.

In other aspects, the acid generator (B) is any of those of general formula (LD1) below.

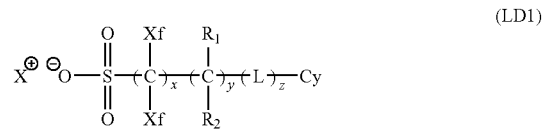
(LD1)

In the formula, each of Xfs independently represents a fluorine atom or an alkyl group substituted with at least one fluorine atom.

Each of $R_1$ and $R_2$ independently represents a member selected from a hydrogen atom, a fluorine atom, an alkyl group and an alkyl group substituted with at least one fluorine atom.

Each of Ls independently represents a single bond or a bivalent connecting group.

Cy represents a group with a cyclic structure.

x is an integer of 1 to 20.

y is an integer of 0 to 10.

z is an integer of 0 to 10.

Xf represents a fluorine atom or an alkyl group substituted with at least one fluorine atom. The alkyl group preferably has 1 to 10 carbon atoms, more preferably 1 to 4 carbon atoms. The alkyl group substituted with at least one fluorine atom is preferably a perfluoroalkyl group.

Xf is preferably a fluorine atom or a perfluoroalkyl group having 1 to 4 carbon atoms. In particular, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2CH_2C_3F_7$, $CH_2C_4F_9$ or $CH_2CH_2C_4F_9$.

Each of $R_1$ and $R_2$ independently represents a member selected from a hydrogen atom, a fluorine atom, an alkyl group and an alkyl group substituted with at least one fluorine atom. Each of the alkyl group and the alkyl group of the alkyl group substituted with at least one fluorine atom preferably has 1 to 4 carbon atoms. Further preferably, each of the alkyl groups is a perfluoroalkyl group having 1 to 4 carbon atoms. In particular, there can be mentioned, for example, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, or $CH_2CH_2C_4F_9$. Of these, $CF_3$ is preferred.

L represents a single bond or a bivalent connecting group. As the bivalent connecting group, there can be mentioned, for example, —COO—, —OCO—, —CONH—, —CO—, —O—, —S—, —SO—, —SO$_2$—, an alkylene group, a cycloalkylene group or an alkenylene group. Of these, —COO—, —OCO—, —CONH—, —CO—, —O— and —SO$_2$— are preferred. —COO—, —OCO— —CONH—, and —SO$_2$— are more preferred.

Cy represents a group with a cyclic structure. As the group with a cyclic structure, there can be mentioned, for example, a group with an alicyclic group, a group with an aryl group or a group with a heterocyclic structure.

The alicyclic group may be monocyclic or polycyclic. As the alicyclic group that is monocyclic, there can be mentioned, for example, a cycloalkyl group of a single ring, such as a cyclopenthyl group, a cyclohexyl group or a cyclooctyl group. As the alicyclic group that is polycyclic, there can be mentioned, for example, a cycloalkyl group of multiple rings, such as a norbornyl group, a tricyclodecanyl group, a tetracyclodecanyl group, a tetracyclododecanyl group or a adamantyl group. Of the mentioned groups, alicyclic groups with a bulky structure having at least 7 carbon atoms, such as a norbornyl group, a tricyclodecanyl group, a tetracyclodecanyl group, a tetracyclododecanyl group and an adamantyl group, are preferred from the view point of inhibition of in-film diffusion in the PEB (post-exposure bake) step and enhancement of MEEF (Mask Error Enhancement Factor).

The aryl group may be monocyclic or polycyclic. As the aryl group, there can be mentioned, for example, a phenyl group, a naphthyl group, a phenanthryl group or an anthryl group. Of these, a naphthyl group exhibiting relatively low light absorbance at 193 nm is preferred.

The group with a heterocyclic structure may be monocyclic or polycyclic. However, the polycyclic structure is preferred from the view point of inhibiting any acid diffusion. It is optional for the group with a heterocyclic structure to have aromaticity. As the heterocyclic structure having aromaticity, there can be mentioned, for example, a furan ring, a thiophene ring, a benzofuran ring, a benzothiophene ring, a dibenzofuran ring, a dibenzothiophene ring or a pyridine ring. As the heterocyclic structure having no aromaticity, there can be mentioned, for example, a tetrahydropyran ring, a lactone ring or a decahydroisoquinoline ring. It is especially preferred for the heterocyclic of the group with a heterocyclic structure to be a furan ring, a thiophene ring, a pyridine ring or a decahydroisoquinoline ring.

The above group with a cyclic structure may have a substituent. As the substituent, there can be mentioned, for example, an alkyl group, a cycloalkyl group, an aryl group, a hydroxyl group, an alkoxy group, an ester group, an amido group, a urethane group, a ureido group, a thioether group, a sulfonamide group or a sulfonic ester group. The alkyl group may be linear or branched. It is preferred for the alkyl group to have 1 to 12 carbon atoms. The cycloalkyl group may be monocyclic or polycyclic. It is preferred for the cycloalkyl group to have 3 to 12 carbon atoms. The aryl group preferably has 6 to 14 carbon atoms.

In the formula, x is preferably 1 to 8, more preferably 1 to 4 and most preferably 1; y is preferably 0 to 4, more preferably 0; and z is preferably 0 to 8, more preferably 0 to 4.

X$^+$ represents an organic counter ion. As such, there can be mentioned the same organic counter ions as mentioned for the X$^+$ of general formula (V).

As the acid generators, there can be further mentioned the compounds of general formulae (ZIV), (ZV) and (ZVI) below.

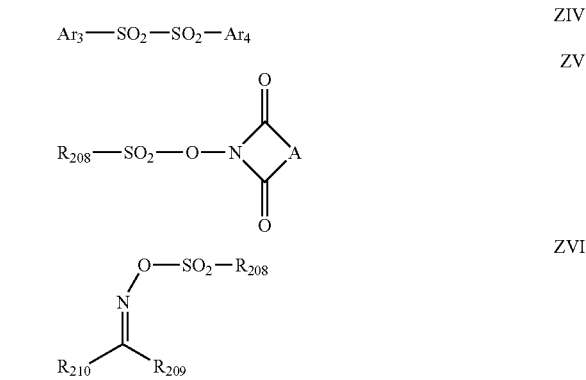

In general formulae (ZIV) to (ZVI),
each of Ar$_3$ and Ar$_4$ independently represents an aryl group.
Each of R$_{208}$, R$_{209}$ and R$_{210}$ independently represents an alkyl group, a cycloalkyl group or an aryl group.
A represents an alkylene group, an alkenylene group or an arylene group.

Among the acid generators, the compounds of general formulae (ZI) to (ZIII) are more preferred.

As a preferred acid generator, there can be mentioned a compound that generates an acid having one sulfonate group or imido group. As a more preferred acid generator, there can be mentioned a compound that generates a monovalent perfluoroalkanesulfonic acid, a compound that generates a monovalent aromatic sulfonic acid substituted with a fluorine atom or fluorine-atom-containing group, or a compound that generates a monovalent imidic acid substituted with a fluorine atom or fluorine-atom-containing group. As a still more preferred acid generator, there can be mentioned any of sulfonium salts of a fluorinated alkanesulfonic acid, fluorinated benzenesulfonic acid, fluorinated imidic acid and fluorinated methide acid. With respect to practicable acid generators, it is especially preferred for the generated acid to be a fluorinated alkanesulfonic acid, fluorinated benzenesulfonic acid or fluorinated imidic acid of –1 or below pKa. By the use thereof, an enhancement of sensitivity can be attained.

Especially preferred examples of the acid generators are as follows.

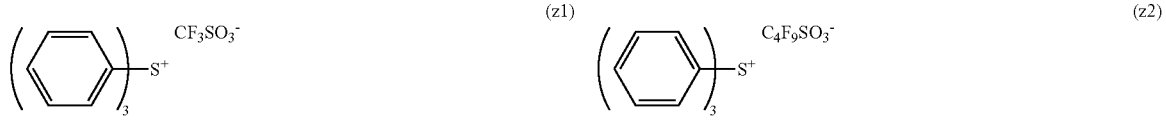

-continued
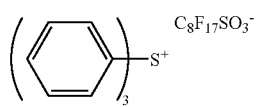 (z3)
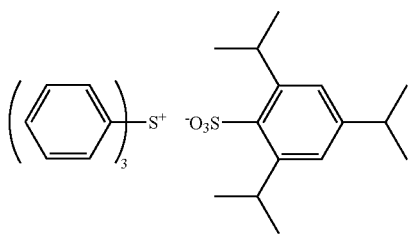 (z4)
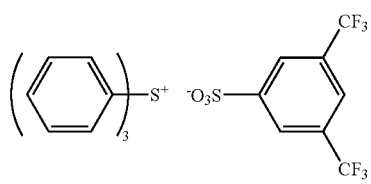 (z5)
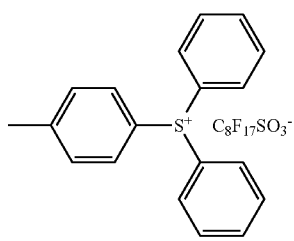 (z6)
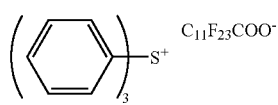 (z7)
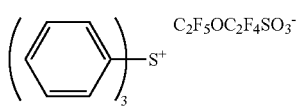 (z8)
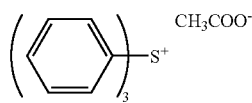 (z9)
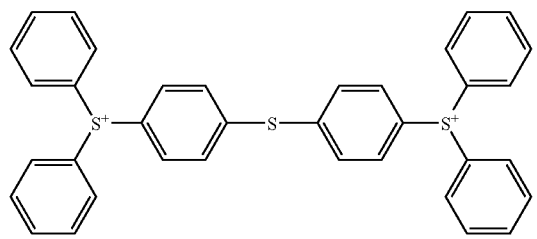 (z10)
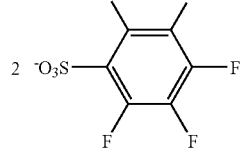
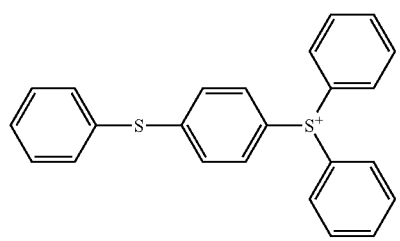 (z11)
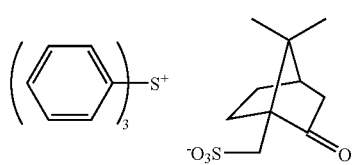 (z12)
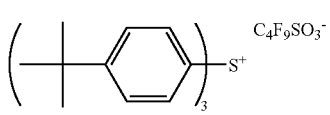 (z13)
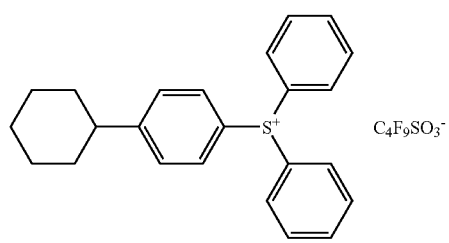 (z14)
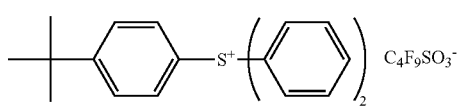 (z15)

-continued
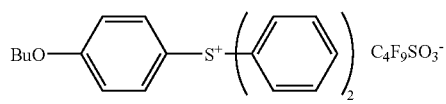 (z16)
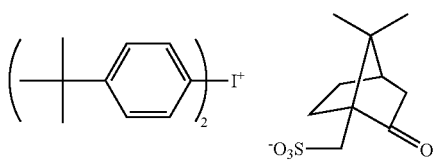 (z17)
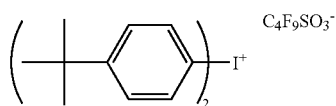 (z18)
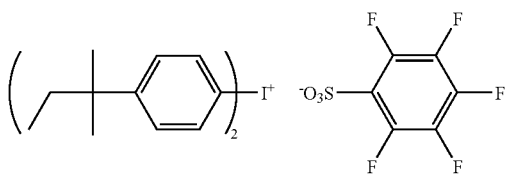 (z19)
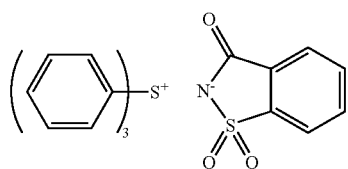 (z20)
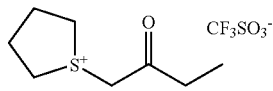 (z21)
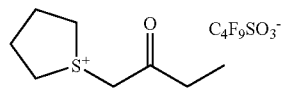 (z22)
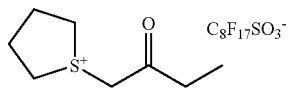 (z23)
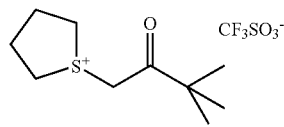 (z24)
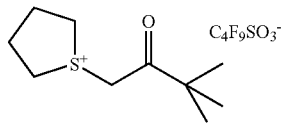 (z25)
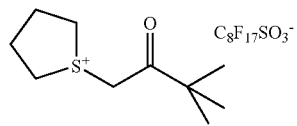 (z26)
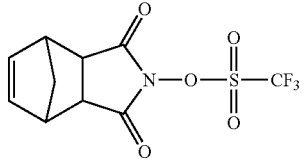 (z27)
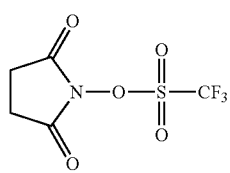 (z28)
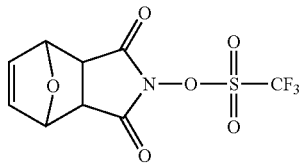 (z29)
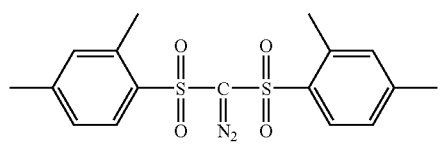 (z30)
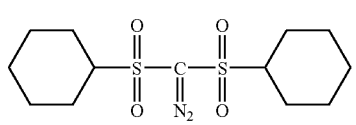 (z31)
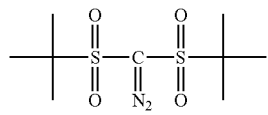 (z32)
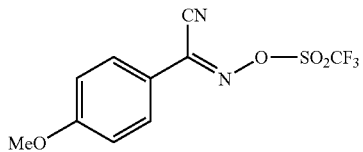 (z33)
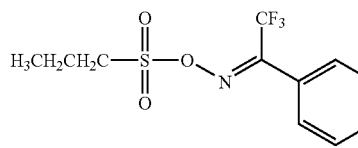
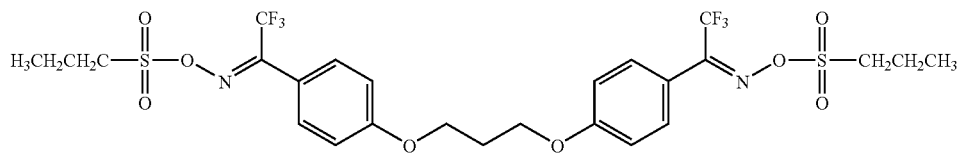 (z34)

-continued
(z35) 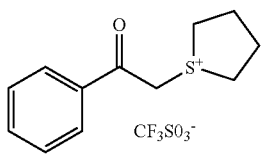
(z36) 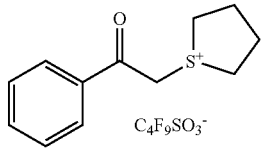
(z37) 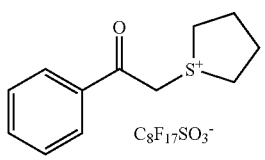
(z38) 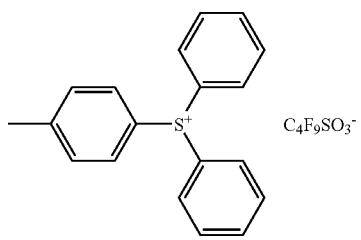
(z39) 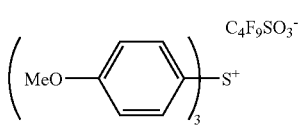
(z40) 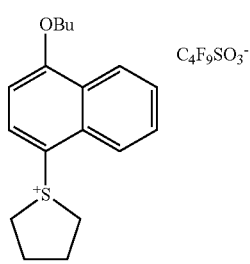
(z41) 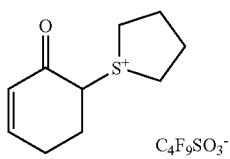
(z42) 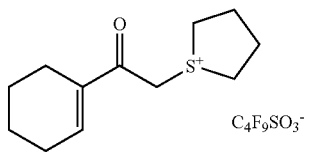
(z43) 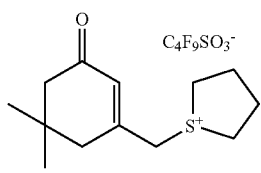
(z44) 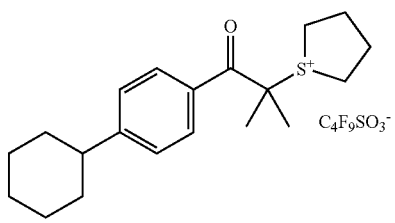
(z45) 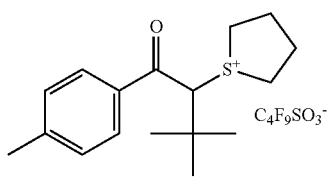
(z46) 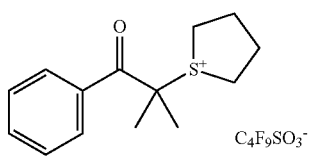
(z47) 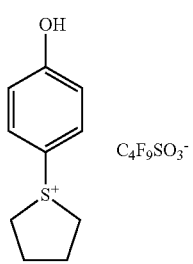
(z48) 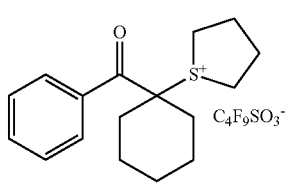

-continued
(z49) 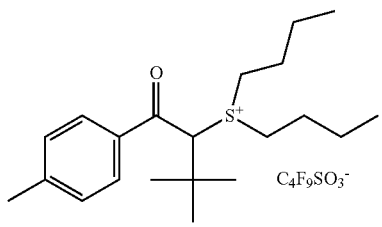
(z50) 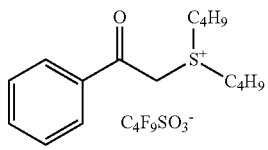
(z51) 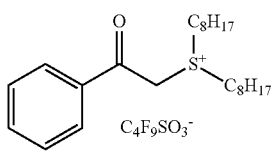
(z52) 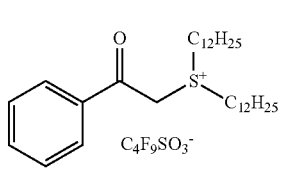
(z53) 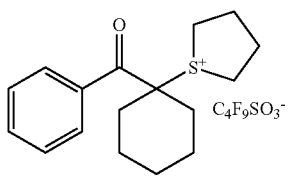
(z54) 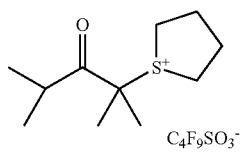
(z55) 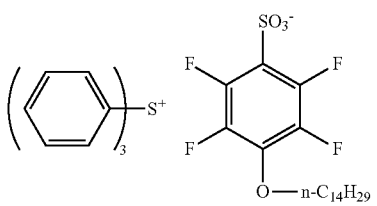
(z56) 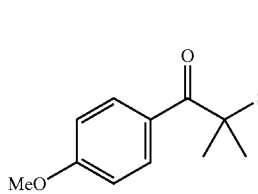
(z57) 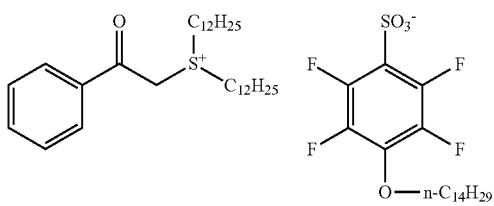
(z58) 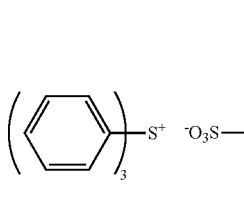
(z59) 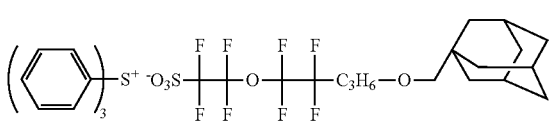
(z60) 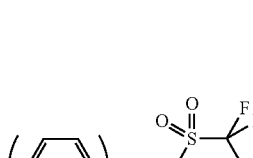
(z61) 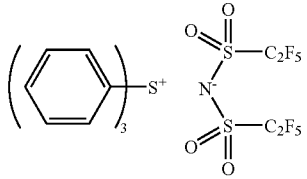
(z62) 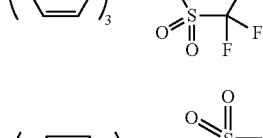
(z63) 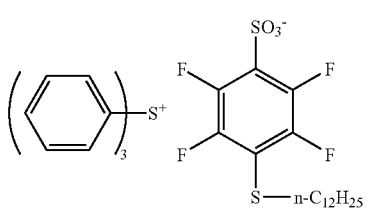
(z64) 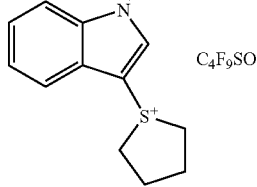

-continued
(z65) 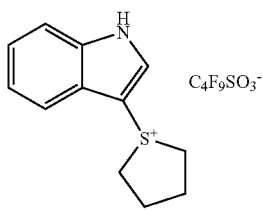
(z66) 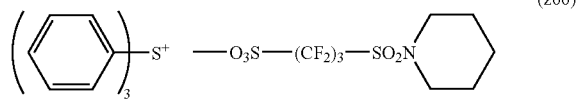
(z67) 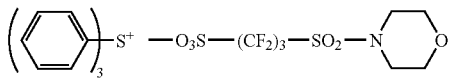
(z68) 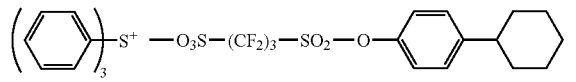
(z69) 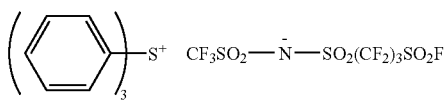
(z70) 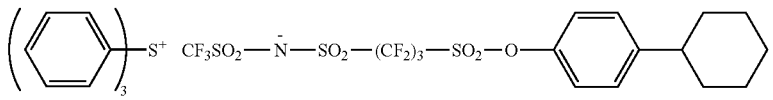
(z71) 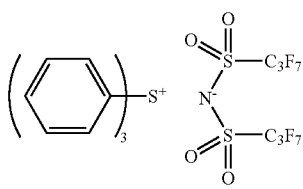
(z72) 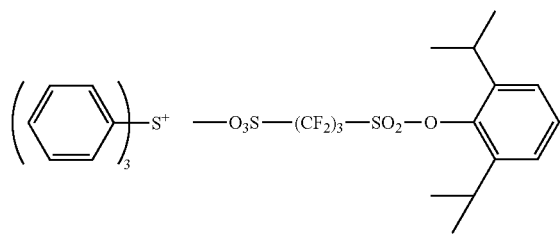
(z73) 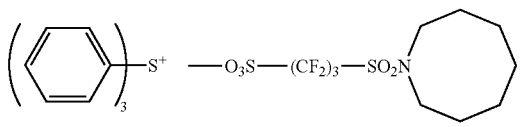
(z74) 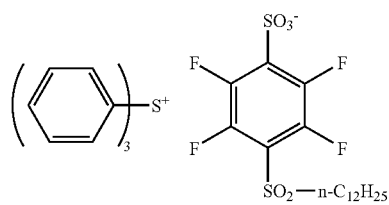
(z75) 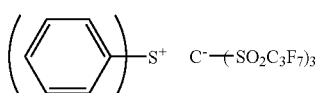
(z76) 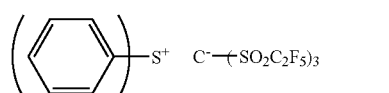
(z76) 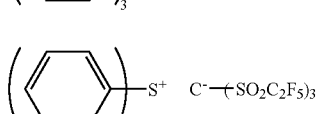
(z77) 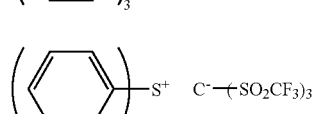
(z78) 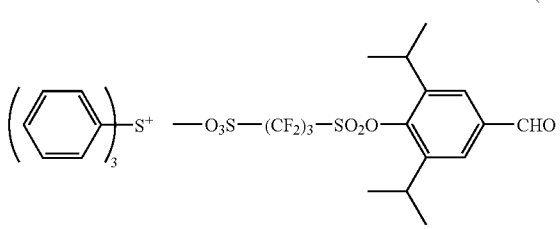
(z79) 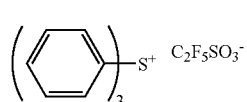
(z80) 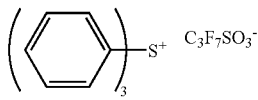
(z81) 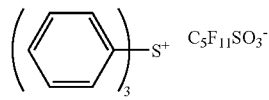

-continued
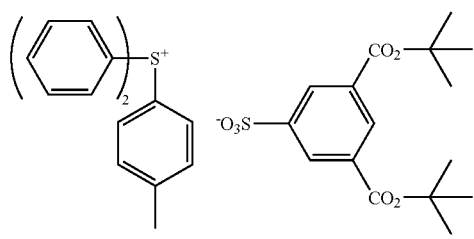
(z82)
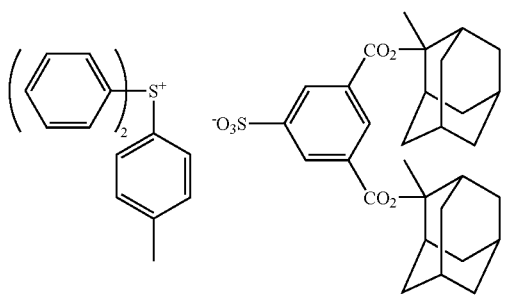
(z83)
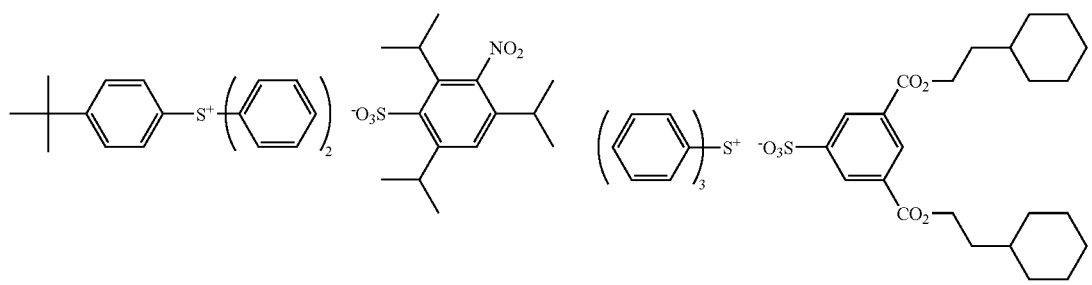
(z84)
(z85)
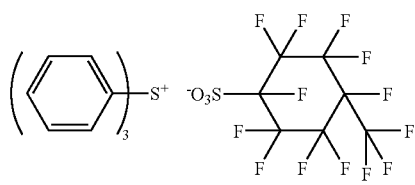
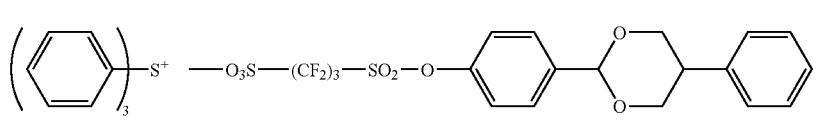
(z86)
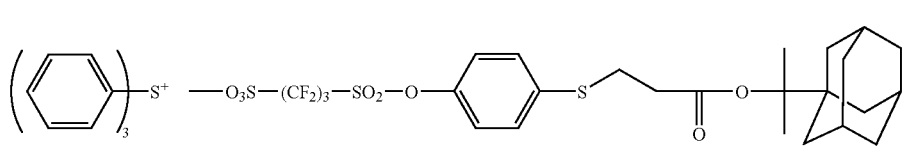
(z87)
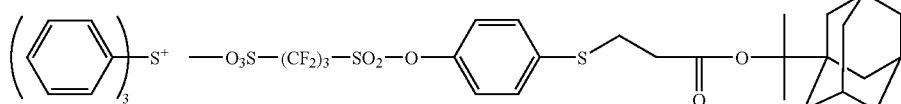
(z88)
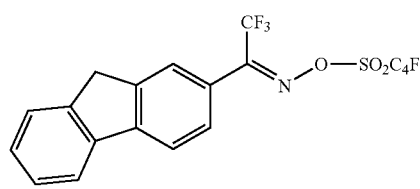
(z89)
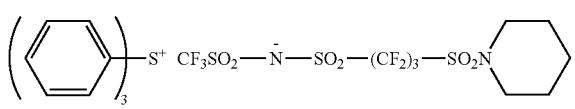
(z90)
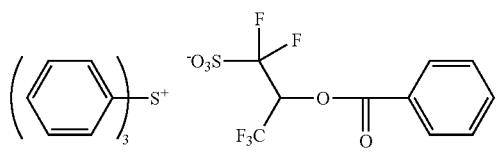
(z91)

Specific examples of the compounds of general formula (V) are shown below.
(Y-1)
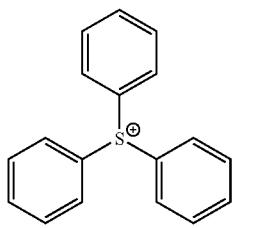
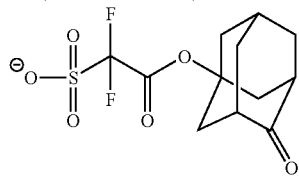
(Y-2)
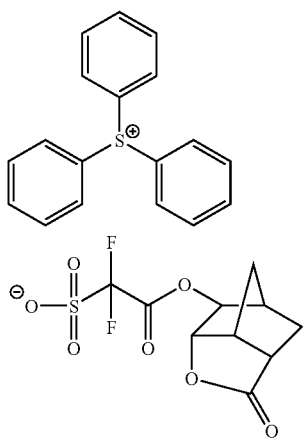
(Y-3)
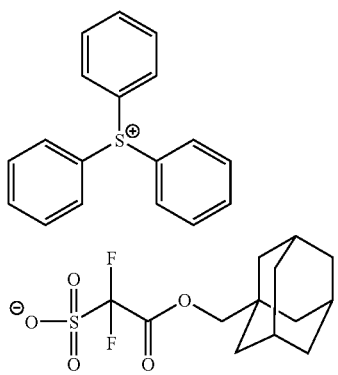
(Y-4)
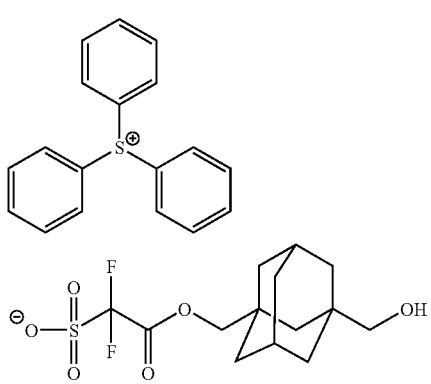
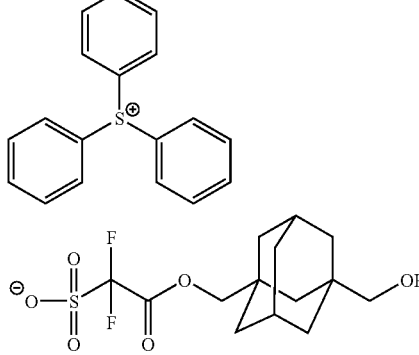
-continued
(Y-5)
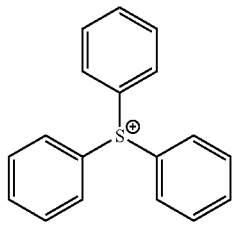
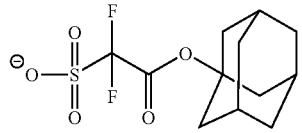
(Y-6)
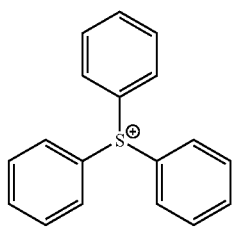
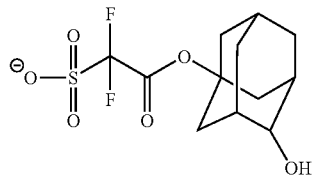
(Y-7)
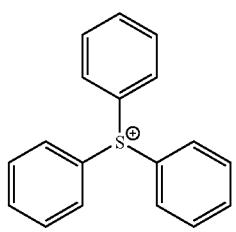
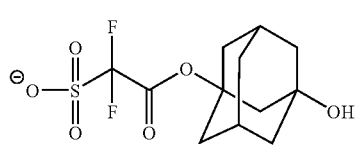
(Y-8)
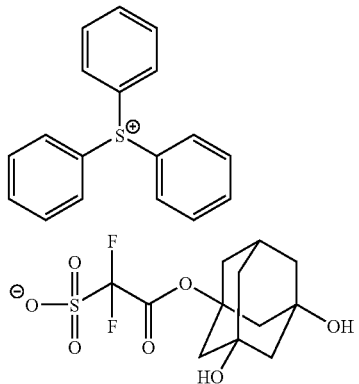

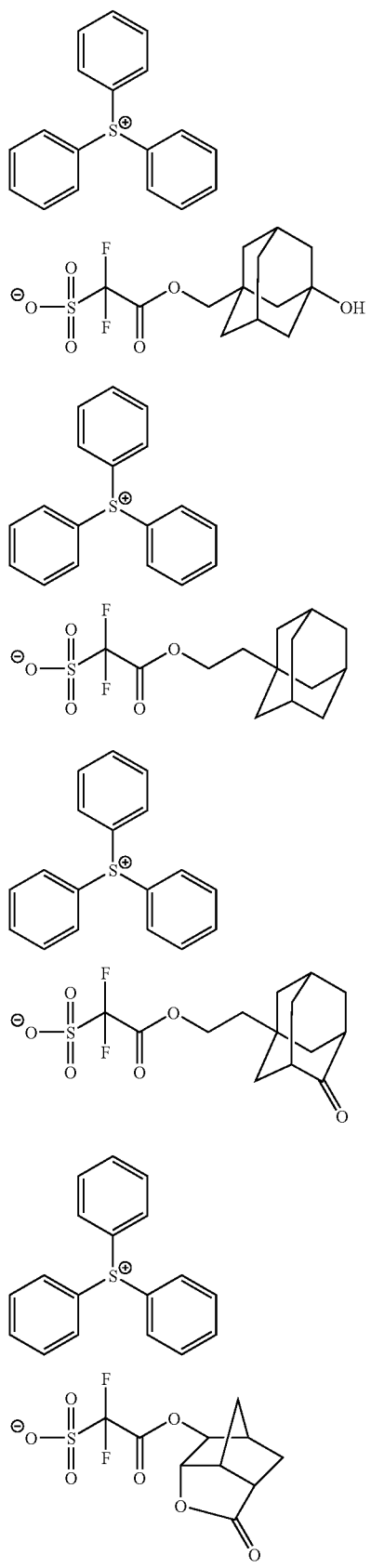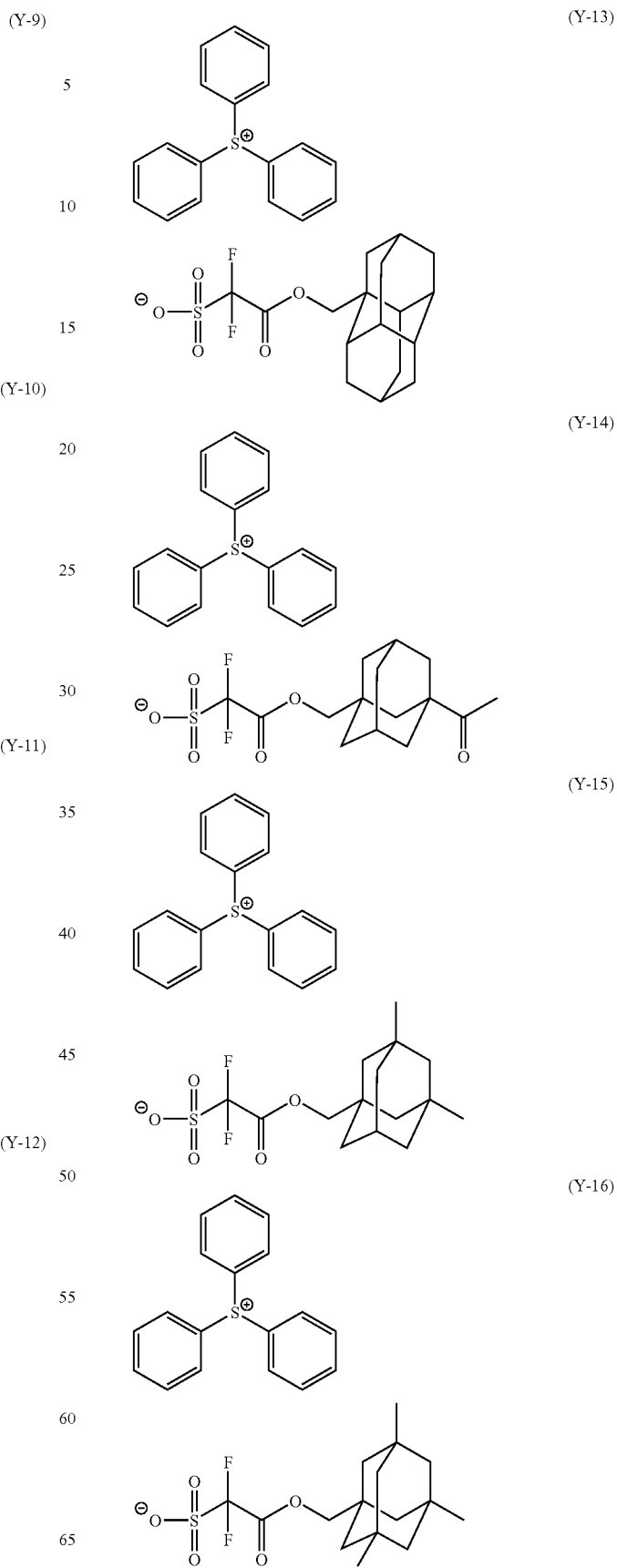

(Y-17)
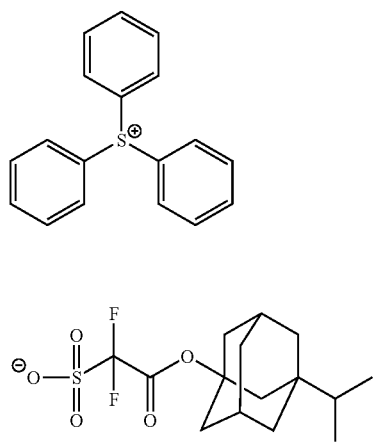
(Y-18)
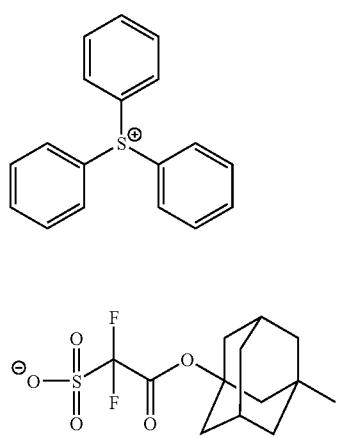
(Y-19)
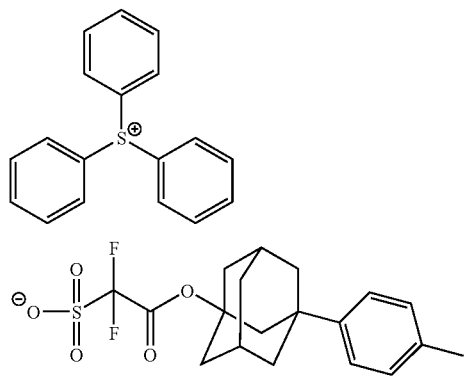
(Y-20)
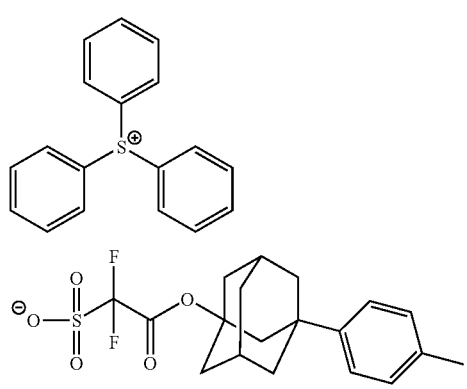
(Y-21)
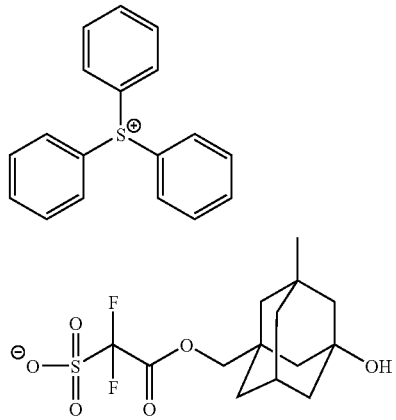
(Y-22)
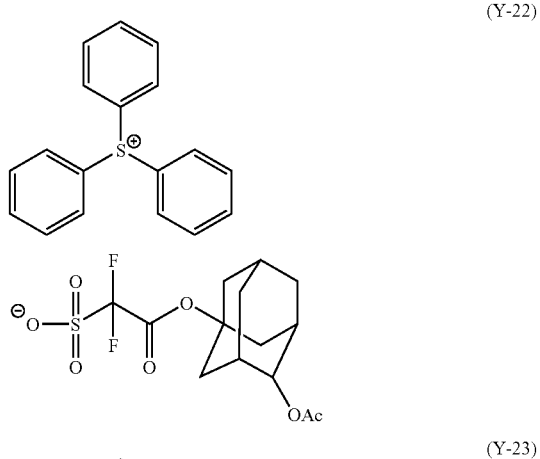
(Y-23)
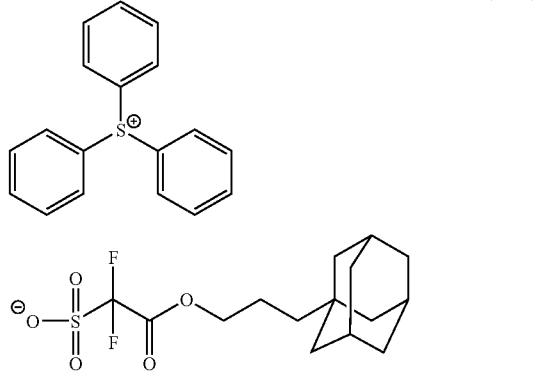
(Y-24)
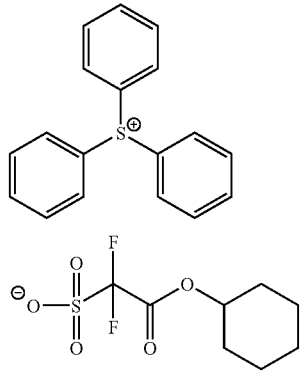

(Y-25) 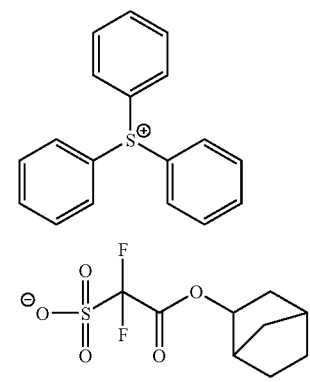
(Y-26) 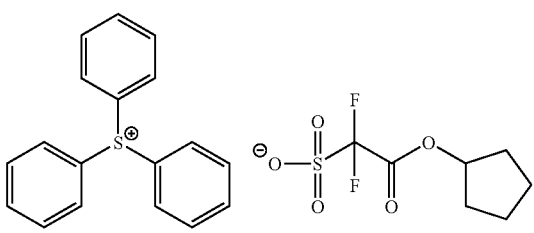
(Y-27) 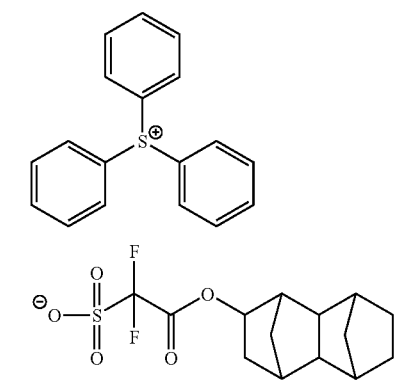
(Y-28) 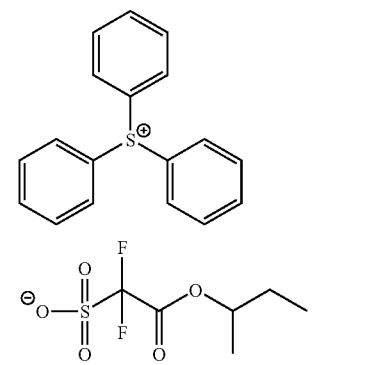
(Y-29) 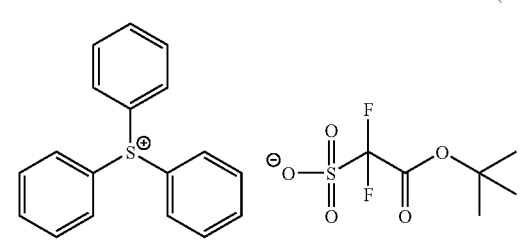
(Y-30) 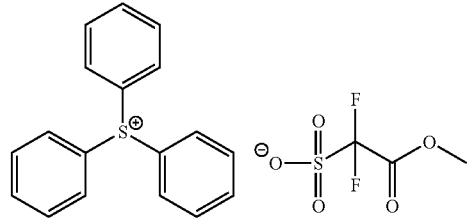
(Y-31) 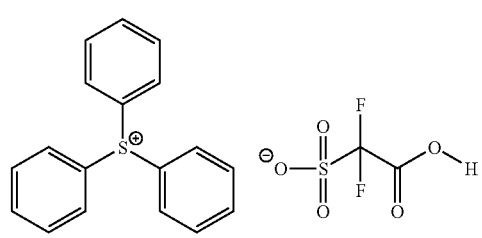
(Y-32) 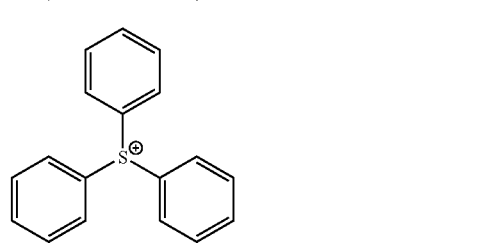
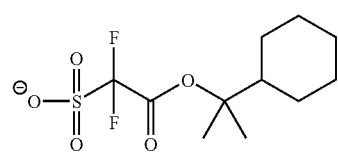
(Y-33) 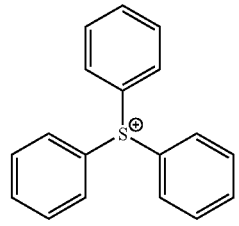
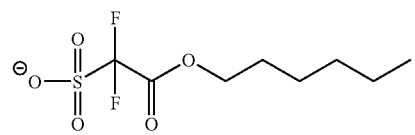
(Y-34) 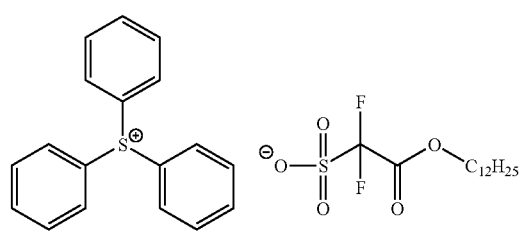

-continued
(Y-35)
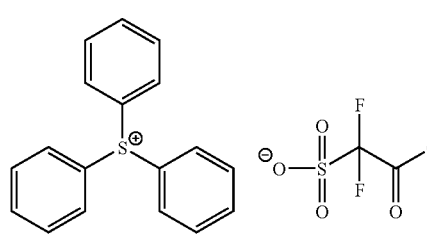
(Y-36)
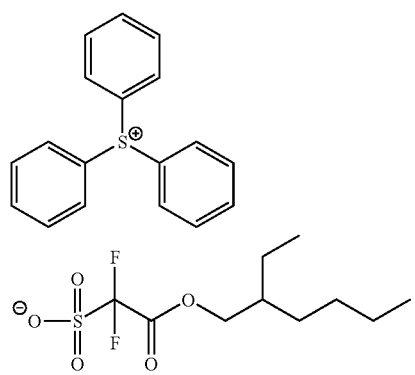
(Y-37)
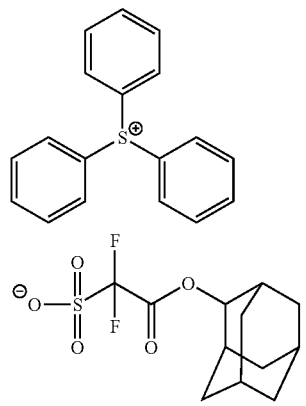
(Y-38)
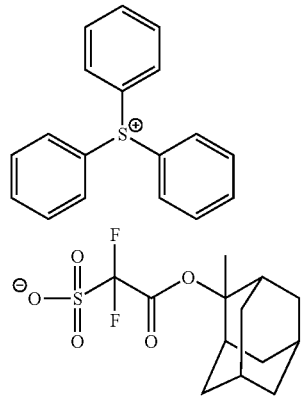
(Y-39)
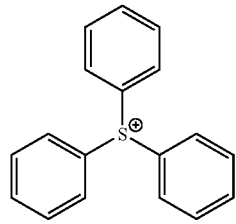
-continued
(Y-40)
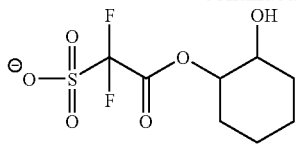
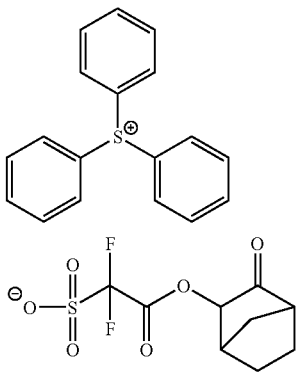
(Y-41)
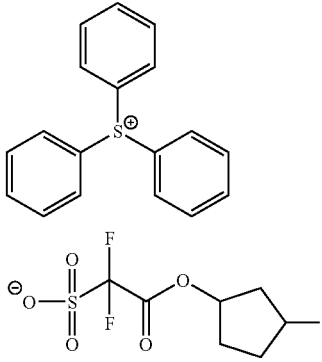
(Y-42)
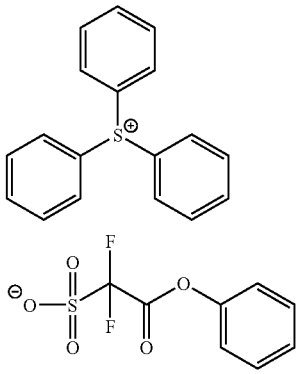
(Y-43)
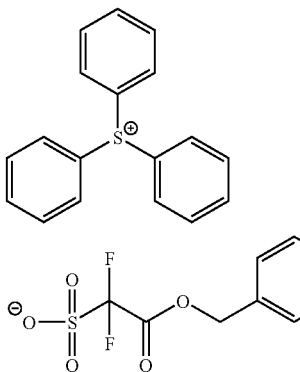

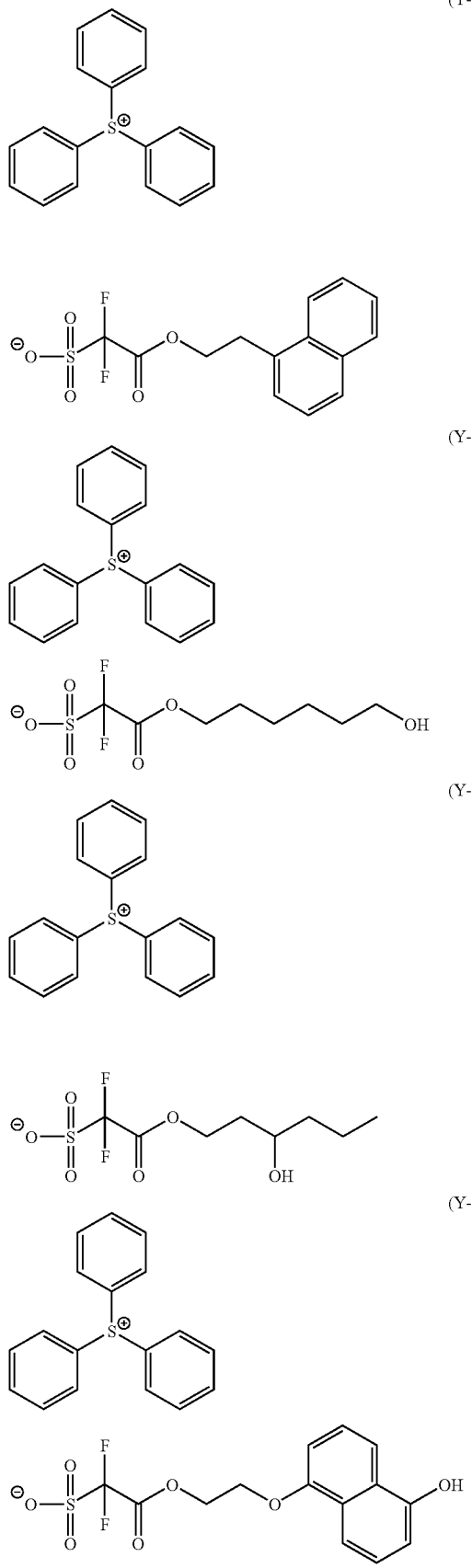

155
-continued
(Y-52)
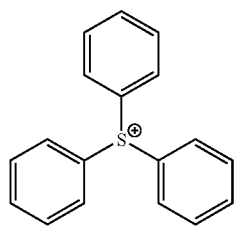
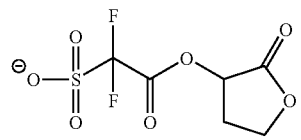
(Y-53)
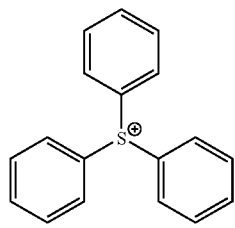
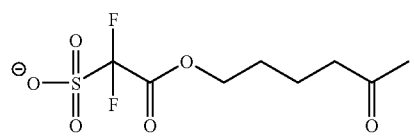
(Y-54)
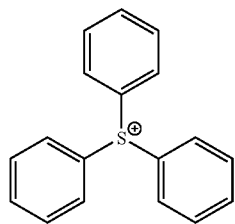
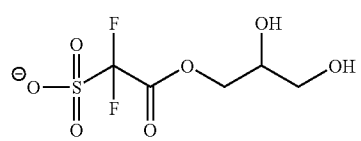
(Y-55)
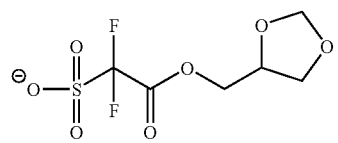
156
-continued
(Y-56)
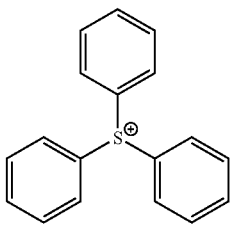
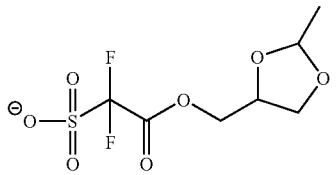
(Y-57)
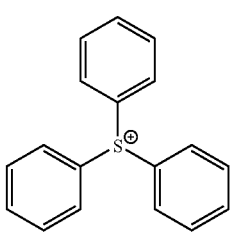
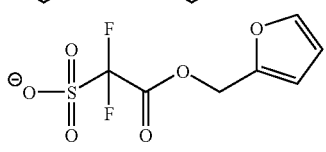
(Y-58)
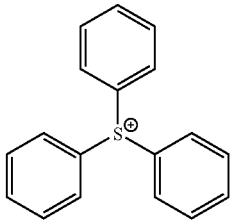
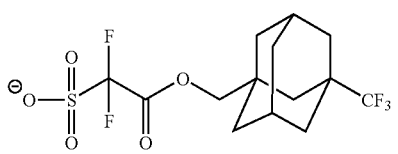
(Y-59)
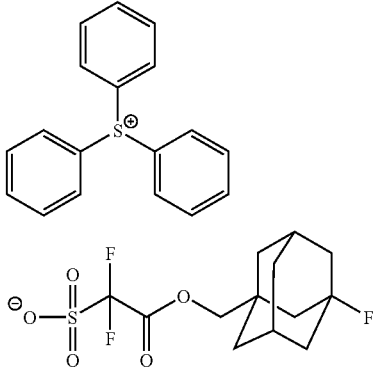

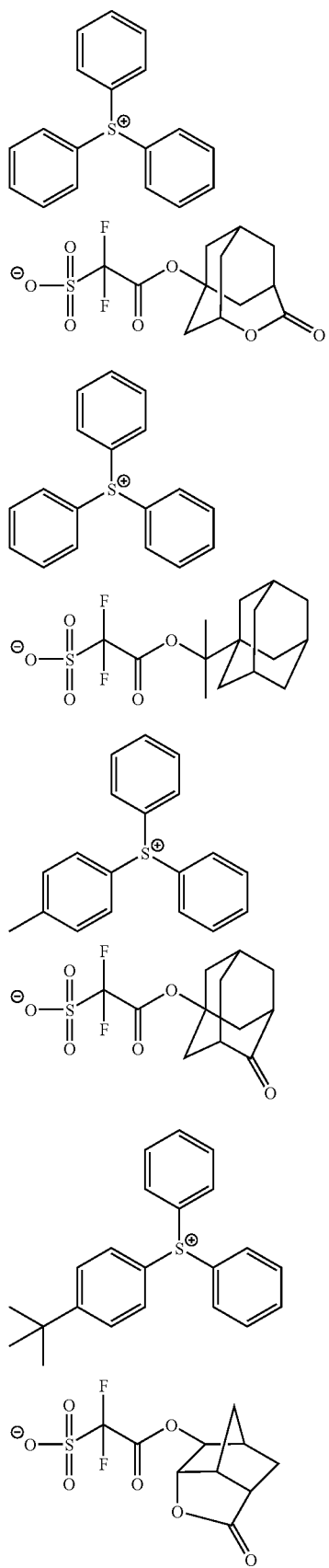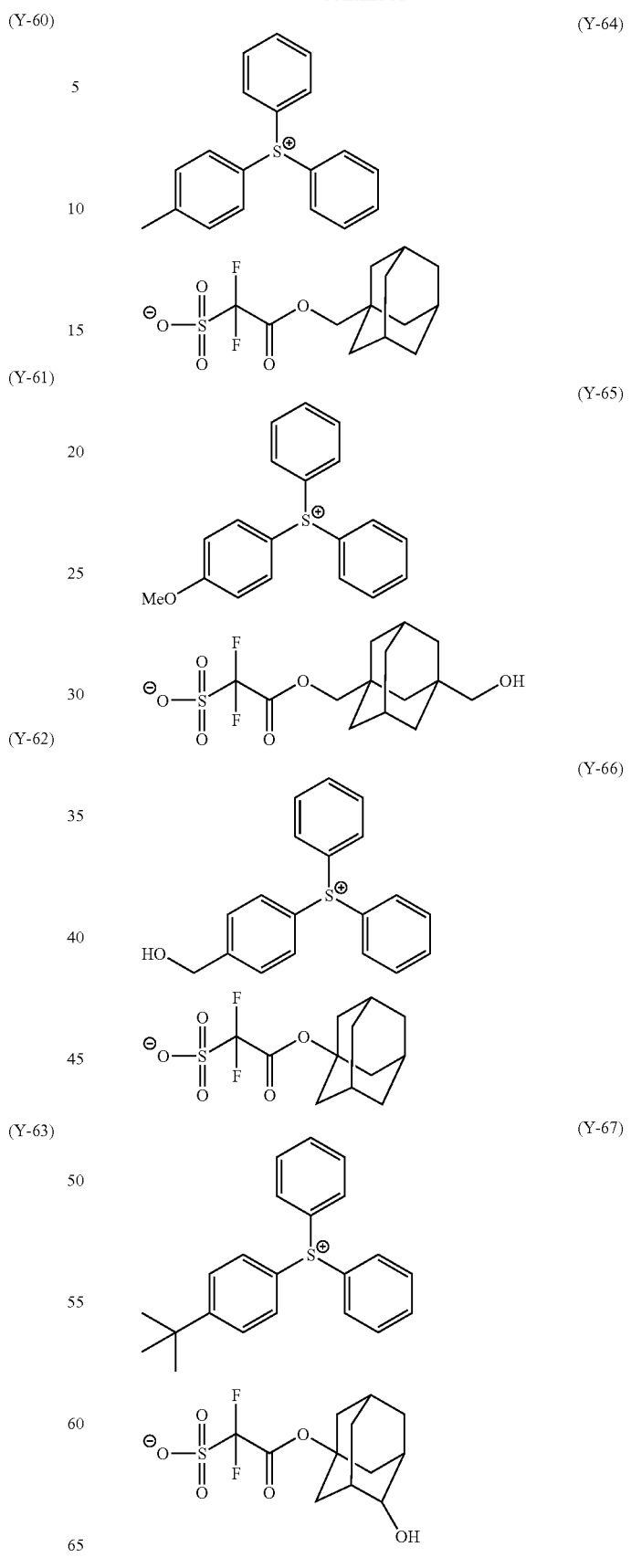

-continued (Y-68)
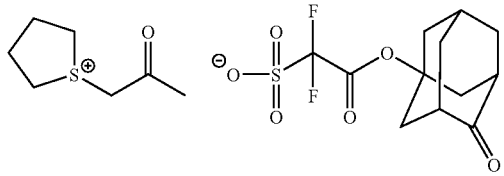

(Y-69)
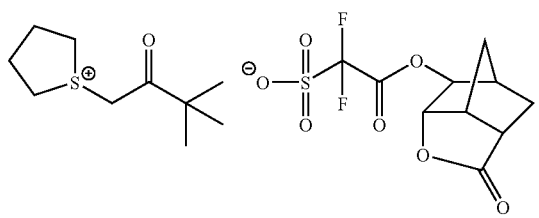

(Y-70)
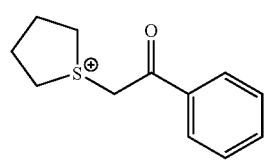

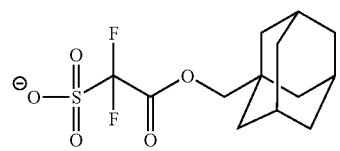

(Y-71)
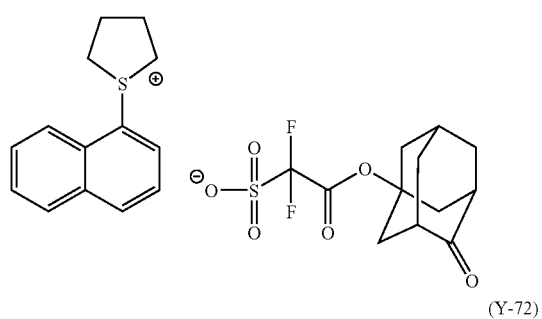

(Y-72)
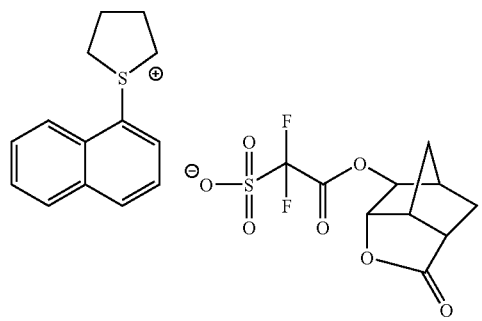

-continued (Y-73)
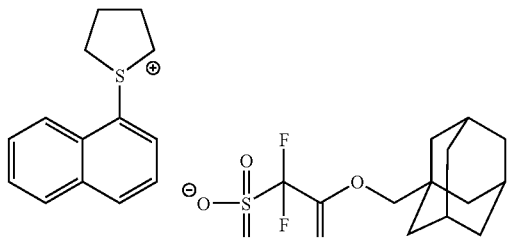

(Y-74)
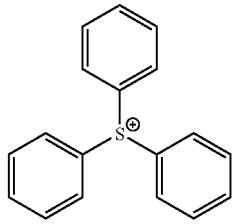

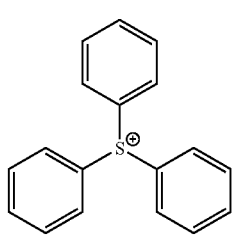

(Y-75)
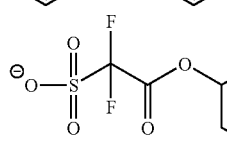

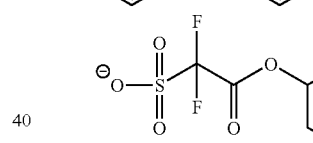

The acid generators can be used either individually or in combination.

The content ratio of the acid generators is preferably in the range of 0.1 to 30 mass %, more preferably 1 to 20 mass % and still more preferably 3 to 20 mass % based on the total solids of the composition of the present invention.

[4] Solvent

The composition of the present invention may contain a solvent. The solvent is not limited as long as it can be used in the preparation of a positive resist composition through dissolution of the above-mentioned components. As the solvent, there can be mentioned, for example, an organic solvent, such as an alkylene glycol monoalkyl ether carboxylate, an alkylene glycol monoalkyl ether, an alkyl lactate, an alkyl alkoxypropionate, a cyclolactone (preferably having 4 to 10 carbon atoms), an optionally cyclized monoketone compound (preferably having 4 to 10 carbon atoms), an alkylene carbonate, an alkyl alkoxyacetate or an alkyl pyruvate.

As preferred alkylene glycol monoalkyl ether carboxylates, there can be mentioned, for example, propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

As preferred alkylene glycol monoalkyl ethers, there can be mentioned, for example, propylene glycol monomethyl ether, propylene glycol monoethyl ether, propylene glycol monopropyl ether, propylene glycol monobutyl ether, ethylene glycol monomethyl ether and ethylene glycol monoethyl ether.

As preferred alkyl lactates, there can be mentioned, for example, methyl lactate, ethyl lactate, propyl lactate and butyl lactate.

As preferred alkyl alkoxypropionates, there can be mentioned, for example, ethyl 3-ethoxypropionate, methyl 3-methoxypropionate, methyl 3-ethoxypropionate and ethyl 3-methoxypropionate.

As preferred cyclolactones, there can be mentioned, for example, β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

As preferred optionally cyclized monoketone compounds, there can be mentioned, for example, 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

As preferred alkylene carbonates, there can be mentioned, for example, propylene carbonate, vinylene carbonate, ethylene carbonate and butylene carbonate.

As preferred alkyl alkoxyacetates, there can be mentioned, for example, acetic acid 2-methoxyethyl ester, acetic acid 2-ethoxyethyl ester, acetic acid 2-(2-ethoxyethoxy)ethyl ester, acetic acid 3-methoxy-3-methylbutyl ester and acetic acid 1-methoxy-2-propyl ester.

As preferred alkyl pyruvates, there can be mentioned, for example, methyl pyruvate, ethyl pyruvate and propyl pyruvate.

As a preferably employable solvent, there can be mentioned a solvent having a boiling point of 130° C. or above measured at ordinary temperature under ordinary pressure. For example, there can be mentioned cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, acetic acid 2-ethoxyethyl ester, acetic acid 2-(2-ethoxyethoxy)ethyl ester or propylene carbonate.

In the present invention, these solvents may be used either individually or in combination.

In the present invention, a mixed solvent consisting of a mixture of a solvent having a hydroxyl group in its structure and a solvent having no hydroxyl group may be used as the organic solvent.

The solvent having a hydroxyl group and the solvent having no hydroxyl group can appropriately be selected from among the compounds mentioned above, as examples. The solvent having a hydroxyl group is preferably an alkylene glycol monoalkyl ether, an alkyl lactate or the like, more preferably propylene glycol monomethyl ether or ethyl lactate. The solvent having no hydroxyl group is preferably an alkylene glycol monoalkyl ether acetate, an alkyl alkoxypropionate, an optionally cyclized monoketone compound, a cyclolactone, an alkyl acetate or the like. Among these, propylene glycol monomethyl ether acetate, ethyl ethoxypropionate, 2-heptanone, γ-butyrolactone, cyclohexanone and butyl acetate are especially preferred. Propylene glycol monomethyl ether acetate, ethyl ethoxypropionate and 2-heptanone are most preferred.

The mixing ratio (mass) of a solvent having a hydroxyl group and a solvent having no hydroxyl group is in the range of 1/99 to 99/1, preferably 10/90 to 90/10 and more preferably 20/80 to 60/40. The mixed solvent containing 50 mass % or more of a solvent having no hydroxyl group is especially preferred from the viewpoint of uniform applicability.

It is preferred for the solvent to be a mixed solvent consisting of two or more solvents containing propylene glycol monomethyl ether acetate.

[5] Basic Compound

The photosensitive composition of the present invention preferably contains a basic compound so as to decrease any performance alteration over time from exposure to heating.

As preferred basic compounds, there can be mentioned the compounds having the structures of the following formulae (A) to (E).

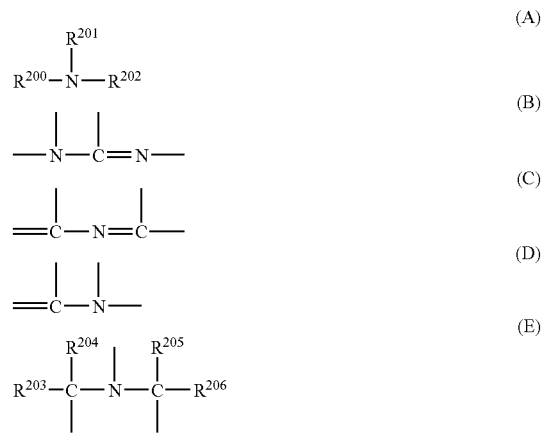

In the general formulae (A) and (E), $R^{200}$, $R^{201}$ and $R^{202}$ may be identical to or different from each other and each represent a hydrogen atom, an alkyl group (preferably having 1 to 20 carbon atoms), a cycloalkyl group (preferably having 3 to 20 carbon atoms) or an aryl group (having 6 to 20 carbon atoms). $R^{201}$ and $R^{202}$ may be bonded with each other to thereby form a ring.

$R^{203}$, $R^{204}$, $R^{205}$ and $R^{206}$ may be identical to or different from each other and each represent an alkyl group having 1 to 20 carbon atoms.

With respect to the above alkyl group, as a preferred substituted alkyl group, there can be mentioned an aminoalkyl group having 1 to 20 carbon atoms, a hydroxyalkyl group having 1 to 20 carbon atoms or a cyanoalkyl group having 1 to 20 carbon atoms.

More preferably, in these general formulae (A) and (E) the alkyl group is unsubstituted.

As preferred compounds, there can be mentioned guanidine, aminopyrrolidine, pyrazole, pyrazoline, piperazine, aminomorpholine, aminoalkylmorpholine, piperidine and the like. Further, as preferred compounds, there can be mentioned compounds with an imidazole structure, a diazabicyclo structure, an onium hydroxide structure, an onium carboxylate structure, a trialkylamine structure, an aniline structure or a pyridine structure, alkylamine derivatives having a hydroxyl group and/or an ether bond, aniline derivatives having a hydroxyl group and/or an ether bond and the like.

As the compounds with an imidazole structure, there can be mentioned imidazole, 2,4,5-triphenylimidazole, benzimidazole, 2-phenylbenzoimidazole and the like. As the compounds with a diazabicyclo structure, there can be mentioned 1,4-diazabicyclo[2,2,2]octane, 1,5-diazabicyclo[4,3,0]non-5-ene, 1,8-diazabicyclo[5,4,0]undec-7-ene and the like. As the compounds with an onium hydroxide structure, there can be mentioned tetrabutylammonium hydroxide, triarylsulfonium hydroxide, phenacylsulfonium hydroxide, and sulfonium hydroxides having a 2-oxoalkyl group such as triphenylsulfonium hydroxide, tris(t-butylphenyl)sulfonium hydroxide, bis(t-butylphenyl)iodonium hydroxide, phenacylthiophenium hydroxide, 2-oxopropylthiophenium hydroxide and the like. As the compounds with an onium carboxylate structure, there can be mentioned those having a carboxylate at the anion moiety of the compounds with an onium hydroxide structure, for example, acetate, adamantane-1-carboxylate, perfluoroalkyl carboxylate and the like. As the compounds with a trialkylamine structure, there can be mentioned tri(n-butyl)amine, tri(n-octyl)amine and the like. As the aniline compounds, there can be mentioned 2,6-diisopropylaniline, N,N-dimethylaniline, N,N-dibutylaniline, N,N-dihexylaniline and the like. As the alkylamine derivatives having a hydroxyl group and/or an ether bond, there can be mentioned ethanolamine, diethanolamine, triethanolamine, N-phenyldiethanolamine, tris(methoxyethoxyethyl) amine and the like. As the aniline derivatives having a hydroxyl group and/or an ether bond, there can be mentioned N,N-bis(hydroxyethyl)aniline and the like.

As preferred basic compounds, there can be further mentioned an amine compound having a phenoxy group, an ammonium salt compound having a phenoxy group, an amine compound having a sulfonic ester group and an ammonium salt compound having a sulfonic ester group.

Each of the above amine compound having a phenoxy group, ammonium salt compound having a phenoxy group, amine compound having a sulfonic ester group and ammonium salt compound having a sulfonic ester group preferably has at least one alkyl group bonded to the nitrogen atom thereof. Further preferably, the alkyl chain contains an oxygen atom, thereby forming an oxyalkylene group. The number of oxyalkylene groups in each molecule is one or more, preferably 3 to 9 and more preferably 4 to 6. Oxyalkylene groups having the structure of —$CH_2CH_2O$—, —$CH(CH_3)CH_2O$— or —$CH_2CH_2CH_2O$— are preferred.

As specific examples of the above amine compound having a phenoxy group, ammonium salt compound having a phenoxy group, amine compound having a sulfonic ester group and ammonium salt compound having a sulfonic ester group, there can be mentioned the compounds (C1-1) to (C3-3) in Section [0066] of US 2007/0224539 A, as examples, which are however nonlimiting.

These basic compounds can be used alone or in combination.

The amount of basic compound used is generally in the range of 0.001 to 10 mass %, preferably 0.01 to 5 mass % based on the total solid contents of the composition of the invention.

With respect to the ratio of the acid generator to basic compound used in the composition, preferably, the acid generator/basic compound (molar ratio)=2.5 to 300. The reason for this is that the molar ratio is preferred to be 2.5 or higher from the viewpoint of sensitivity and resolving power. The molar ratio is preferred to be 300 or below from the viewpoint of the inhibition of any resolving power deterioration due to thickening of resist pattern over time from exposure to heating treatment. The acid generator/basic compound (molar ratio) is more preferably in the range of 5.0 to 200, still more preferably 7.0 to 150.

[6] Surfactant

The composition of the present invention may further contain a surfactant. The composition of the present invention may contain any one, or two or more members, of fluorinated and/or siliconized surfactants (fluorinated surfactant, siliconized surfactant and surfactant containing both fluorine and silicon atoms).

As useful commercially available surfactants, there can be mentioned, for example, fluorinated surfactants/siliconized surfactants, such as Eftop EF301 and EF303 (produced by Shin-Akita Kasei Co., Ltd.), Florad FC 430, 431 and 4430 (produced by Sumitomo 3M Ltd.), Megafac F171, F173, F176, F189, F173, F110, F177, F120 and R08 (produced by Dainippon Ink & Chemicals, Inc.), Surflon S-382, SC101, 102, 103, 104, 105 and 106 (produced by Asahi Glass Co., Ltd.), Troy Sol S-366 (produced by Troy Chemical Co., Ltd.), GF-300 and GF-150 (produced by TOAGOSEI CO., LTD.), Sarfron S-393 (produced by SEIMI CHEMICAL CO., LTD.), Eftop EF121, EF122A, EF122B, RF122C, EF125M, EF135M, EF351, EF352, EF801, EF802 and EF601 (produced by JEMCO INC.), PF636, PF656, PF6320 and PF6520 (produced by OMNOVA), and FTX-204G, 208G, 218G, 230G, 204D, 208D, 212D, 218D and 222D (produced by NEOS). Further, polysiloxane polymer KP-341 (produced by Shin-Etsu Chemical Co., Ltd.) can be employed as the siliconized surfactant.

As the surfactant, besides the above publicly known surfactants, use can be made of a surfactant based on a polymer having a fluoroaliphatic group derived from a fluoroaliphatic compound, produced by a telomerization technique (also called a telomer process) or an oligomerization technique (also called an oligomer process). These fluoroaliphatic compounds can be synthesized by the process described around Sections [0015] to [0018] of JP-A-2002-90991. The polymers having a fluoroaliphatic group may be a copolymer from a monomer having a fluoroaliphatic group and a poly(oxyalkylene) acrylate and/or poly(oxyalkylene) methacrylate or the like.

For example, as a commercially available surfactant, there can be mentioned Megafac F178, F-470, F-473, F-475, F-476 or F-472 (produced by Dainippon Ink & Chemicals, Inc.). Further, there can be mentioned a copolymer from an acrylate (or methacrylate) having a $C_6F_{13}$ group and a poly(oxyalkylene) acrylate (or methacrylate), a copolymer from an acrylate (or methacrylate) having a $C_3F_7$ group, polyoxyethylene) acrylate (or methacrylate) and poly(oxypropylene) acrylate (or methacrylate), or the like.

In the present invention, surfactants other than the fluorinated and/or siliconized surfactants can also be employed. In particular, there can be mentioned, for example, nonionic surfactants including a polyoxyethylene alkyl ether such as polyoxyethylene lauryl ether or polyoxyethylene stearyl ether, a polyoxyethylene alkylaryl ether such as polyoxyethylene octylphenol ether or polyoxyethylene nonylphenol ether, a polyoxyethylene-polyoxypropylene block copolymer, a sorbitan fatty acid ester such as sorbitan monolaurate, sorbitan monopalmitate, sorbitan monostearate or sorbitan tristearate, a polyoxyethylene sorbitan fatty acid ester such as polyoxyethylene sorbitan monolaurate, polyoxyethylene sorbitan monopalmitate, polyoxyethylene sorbitan monostearate, polyoxyethylene sorbitan trioleate or polyoxyethylene sorbitan tristearate, or the like.

These surfactants may be used either individually or in combination.

The amount of each surfactant used is preferably in the range of 0.0001 to 2 mass %, more preferably 0.001 to 1 mass % based on the total mass of the composition of the present invention (excluding the solvent).

[7] Carboxylic Acid Onium Salt

The composition of the present invention may contain a carboxylic acid onium salt. The preferred carboxylic acid onium salts are the iodonium salt and the sulfonium salt. The preferred anion moiety thereof is a linear, branched, monocyclic or polycyclic alkylcarboxylate anion having 1 to 30 carbon atoms. A more preferred anion moiety is an anion of carboxylic acid wherein the alkyl group is partially or wholly fluorinated. The alkyl chain may contain an oxygen atom. Accordingly, there would be achieved securement of the transparency in 220 nm or shorter light, enhancement of the sensitivity and resolving power and improvement of the iso-dense bias and exposure margin.

As the fluorinated carboxylic acid anion, there can be mentioned any of the anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid and 2,2-bistrifluoromethylpropionic acid, or the like.

The content ratio of each carboxylic acid onium salt in the composition of the present invention is generally in the range of 0.1 to 20 mass %, preferably 0.5 to 10 mass % and still more preferably 1 to 7 mass % based on the total solids of the composition.

[8] Dissolution Inhibiting Compound

The composition of the present invention may contain a dissolution inhibiting compound of 3000 or less molecular weight that is decomposed by the action of an acid to thereby increase the solubility in an alkali developer (hereinafter referred to as "dissolution inhibiting compound").

From the viewpoint of preventing any lowering of 220 nm or shorter transmission, the dissolution inhibiting compound is preferably an alicyclic or aliphatic compound having an acid-decomposable group, such as any of cholic acid derivatives having an acid-decomposable group described in Proceeding of SPIE, 2724, 355 (1996). The acid-decomposable group and alicyclic structure are the same as described with respect to the resin (A).

When the composition of the present invention is exposed to a KrF excimer laser or irradiated with electron beams, preferred use is made of one having a structure resulting from substitution of the phenolic hydroxyl group of a phenol compound with an acid-decomposable group. The phenol compound preferably contains 1 to 9 phenol skeletons, more preferably 2 to 6 phenol skeletons.

The amount of dissolution inhibiting compound added is preferably in the range of 3 to 50 mass %, more preferably 5 to 40 mass % based on the total solids of the composition of the present invention.

Specific examples of the dissolution inhibiting compounds will be shown below, which however in no way limit the scope of the present invention.

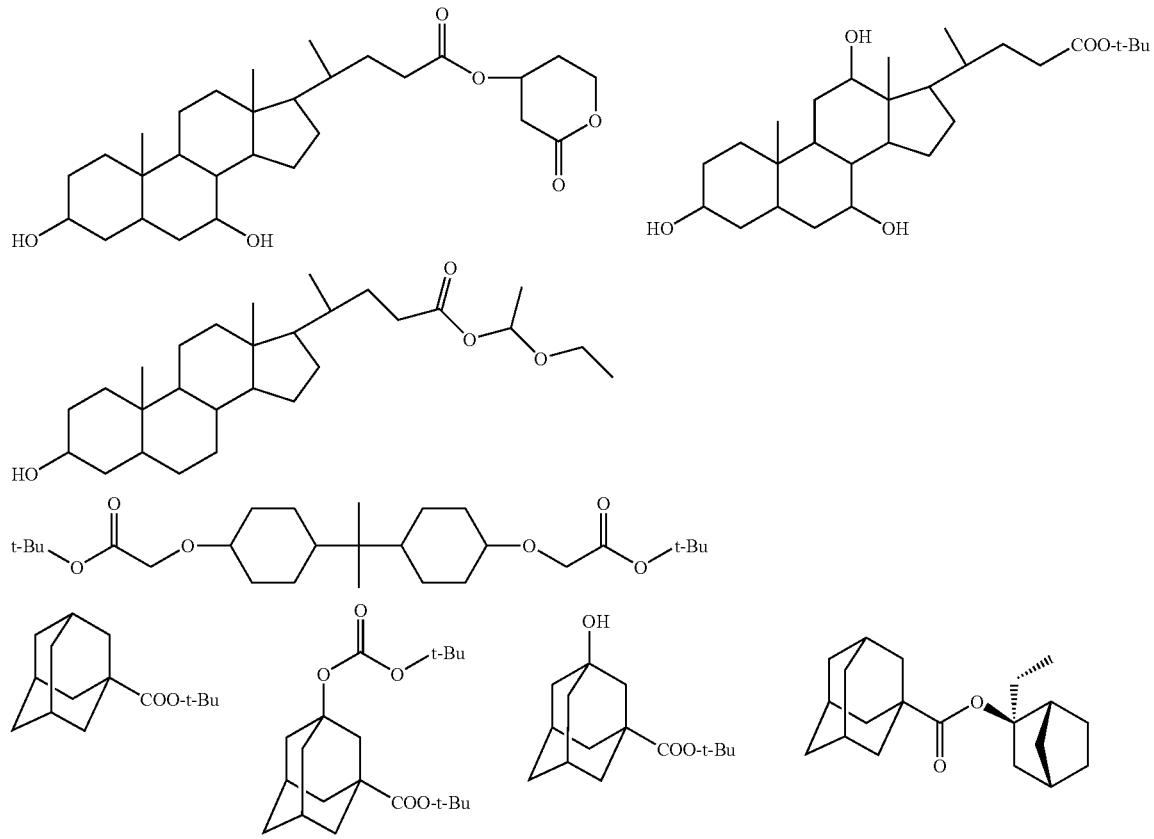

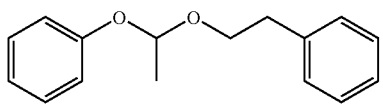

-continued

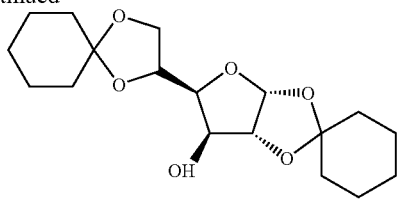

[9] Antioxidant

The composition of the present invention may contain an antioxidant.

A phenolic antioxidant and an antioxidant of organic acid derivative is preferably used as the antioxidant.

In particular, compounds disclosed in, for example, Sections [0130] to [0133] of JP-A-2006-276688 can appropriately be used as the antioxidant.

The amount of antioxidant added is preferably in the range of 0.0001 to 2 mass %, more preferably 0.0001 to 0.1 mass %, based on the total solids of the composition of the present invention.

[10] Other Additives

The photosensitive composition of the present invention may further according to necessity contain a dye, a plasticizer, a photosensitizer, a light absorber, a compound capable of increasing the solubility in a developer (for example, a phenolic compound of 1000 or less molecular weight or a carboxylated alicyclic or aliphatic compound), etc.

The above phenolic compound of 1000 or less molecular weight can be easily synthesized by persons of ordinary skill in the art to which the present invention pertains while consulting the processes described in, for example, JP-As 4-122938 and 2-28531, U.S. Pat. No. 4,916,210 and EP 219294.

As the carboxylated alicyclic or aliphatic compound, there can be mentioned, for example, a carboxylic acid derivative of steroid structure such as cholic acid, deoxycholic acid or lithocholic acid, an adamantanecarboxylic acid derivative, adamantanedicarboxylic acid, cyclohexanecarboxylic acid, cyclohexanedicarboxylic acid or the like. These are however nonlimiting.

Method of Forming Pattern

From the viewpoint of enhancement of resolving power, it is preferred for the photosensitive composition of the present invention to be used with a coating thickness of 30 to 250 nm. More preferably, the photosensitive composition is used with a coating thickness of 30 to 200 nm. This coating thickness can be attained by setting the solid content of the photosensitive composition within an appropriate range so as to cause the composition to have an appropriate viscosity, thereby improving the applicability and film forming property.

The total solids content ratio of the composition of the present invention is generally in the range of 1 to 10 mass %, preferably 1 to 8.0 mass % and more preferably 1 to 6.0 mass %.

The photosensitive composition of the present invention is used in such a manner that the above components are dissolved in a given organic solvent, preferably the above mixed solvent, and filtered and applied onto a given support in the following manner. The filter medium for the filtration preferably consists of a polytetrafluoroethylene, polyethylene or nylon having a pore size of 0.1 μm or less, especially 0.05 μm or less and more especially 0.03 μm or less.

For example, the actinic-ray- or radiation-sensitive resin composition is applied onto a substrate, such as one for use in the production of precision integrated circuit elements (e.g., silicon/silicon dioxide coating), by appropriate application means, such as a spinner or coater, and dried to thereby form a film.

This film is exposed through a given mask to actinic rays or radiation, preferably baked (heated), and developed and rinsed. Accordingly, a desirable pattern can be obtained.

As the actinic rays or radiation, there can be mentioned infrared rays, visible light, ultraviolet rays, far ultraviolet rays, extreme ultraviolet rays, X-rays, electron beams or the like. Among them, preferred use is made of far ultraviolet rays of especially 250 nm or less, more especially 220 nm or less and still more especially 1 to 200 nm wavelength, such as a KrF excimer laser (248 nm), an ArF excimer laser (193 nm) and an $F_2$ excimer laser (157 nm), as well as X-rays, electron beams and the like. More preferred use is made of an ArF excimer laser, an $F_2$ excimer laser, EUV (13 nm) and electron beams.

Prior to the formation of a film, the substrate may be coated with an antireflection film.

As the antireflection film, use can be made of not only an inorganic film of titanium, titanium oxide, titanium nitride, chromium oxide, carbon, amorphous silicon or the like but also an organic film composed of a light absorber and a polymer material. Also, as the organic antireflection film, use can be made of commercially available organic antireflection films, such as the DUV30 Series and DUV40 Series produced by Brewer Science Inc. and AR-2, AR-3 and AR-5 produced by Shipley Co., Ltd.

In the development step, an alkali developer is used as follows. As the alkali developer for a positive resist composition, use can be made of any of alkaline aqueous solutions of an inorganic alkali such as sodium hydroxide, potassium hydroxide, sodium carbonate, sodium silicate, sodium metasilicate or aqueous ammonia, a primary amine such as ethylamine or n-propylamine, a secondary amine such as diethylamine or di-n-butylamine, a tertiary amine such as triethylamine or methyldiethylamine, an alcoholamine such as dimethylethanolamine or triethanolamine, a quaternary ammonium salt such as tetramethylammonium hydroxide or tetraethylammonium hydroxide, a cycloamine such as pyrrole or piperidine, or the like.

Before the use of the above alkali developer, appropriate amounts of an alcohol and a surfactant may be added thereto.

The alkali concentration of the alkali developer is generally in the range of 0.1 to 20 mass %.

The pH value of the alkali developer is generally in the range of 10.0 to 15.0.

Before the use of the above alkaline aqueous solution, appropriate amounts of an alcohol and a surfactant may be added thereto.

Pure water can be used as the rinse liquid. Before the use, an appropriate amount of surfactant may be added thereto.

The development operation or rinse operation may be followed by the operation for removing any developer or rinse liquid adhering onto the pattern by the use of a supercritical fluid.

EXAMPLE

The present invention will be described in greater detail below with reference to the following Examples, which however in no way limit the scope of the present invention.

<Synthesis of Resin (A)>

Synthetic Example 1

Synthesis of Resin (1)

In a nitrogen stream, 8.6 g of cyclohexanone was placed in a three-necked flask and heated at 80° C. A solution obtained by dissolving 9.8 g of 2-adamantylisopropyl methacrylate, 4.4 g of dihydroxyadamantyl methacrylate, 8.9 g of norbornane lactone methacrylate and further, 8 mol %, based on the monomers, of polymerization initiator V601 (produced by Wako Pure Chemical Industries, Ltd.) in 79 g of cyclohexanone was dropped thereinto over a period of 6 hours. After the completion of the dropping, reaction was continued at 80° C. for 2 hours. The thus obtained reaction mixture was allowed to stand still to cool and was dropped into a mixed liquid consisting of 800 ml/200 ml hexane/ethyl acetate over a period of 20 min. The thus precipitated powder was collected by filtration and dried, thereby obtaining 19 g of a desired resin (1). The weight average molecular weight of the obtained resin in terms of standard polystyrene molecular weight was 8800 and the dispersity (Mw/Mn) thereof was 1.9.

In the same manner as in Synthetic Example 1, the following other resins (2) to (18) were synthesized.

The structures of the acid-decomposable resins (A) employed in the Examples are shown below. The following Table 1 indicates the molar ratios of individual repeating units (in order from the left in each structural formula), the weight average molecular weight (Mw) and the dispersity (Mw/Mn) with respect to each of the resins.

(1)

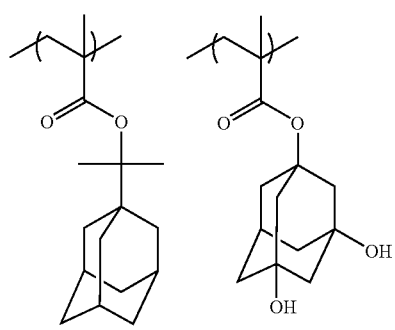
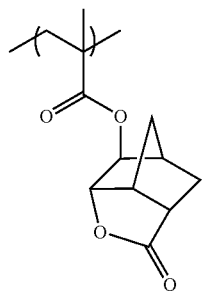

(2)

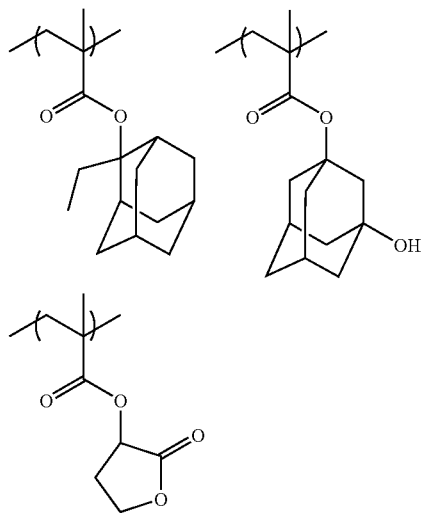

(3)

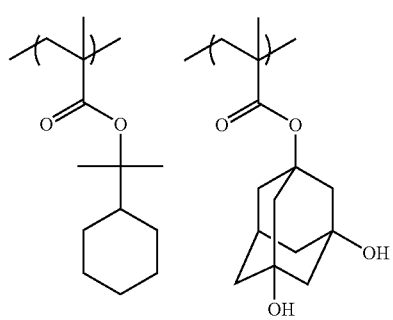

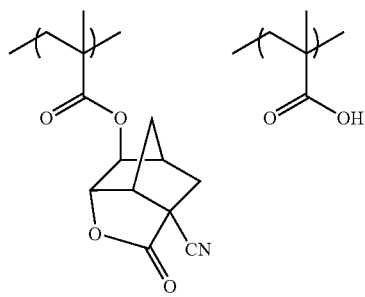

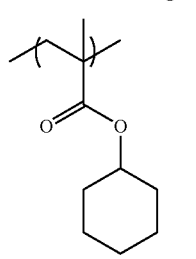

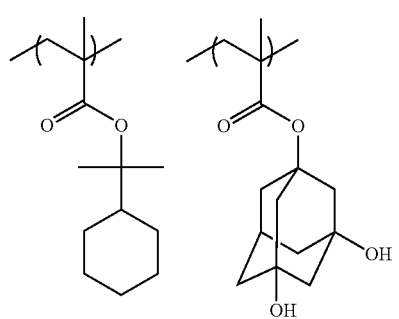
(4)
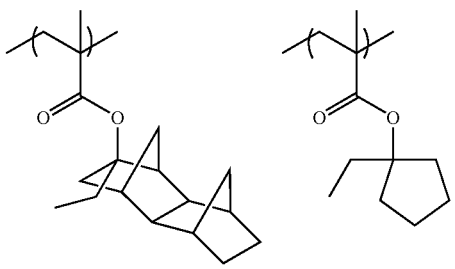
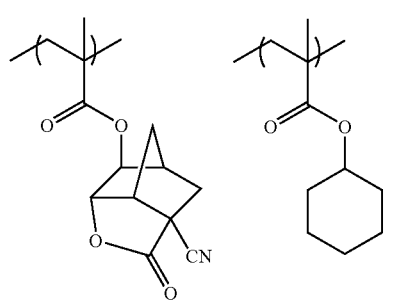
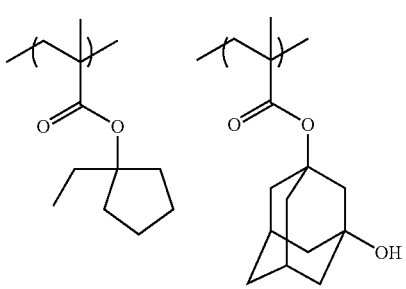
(7)
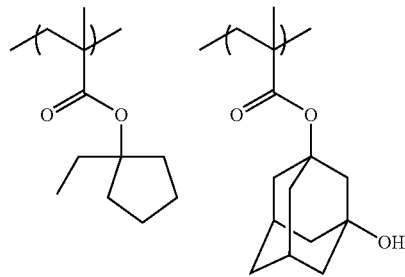
(5)
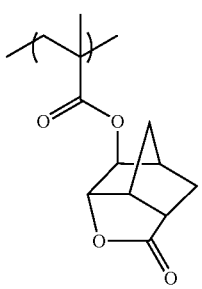
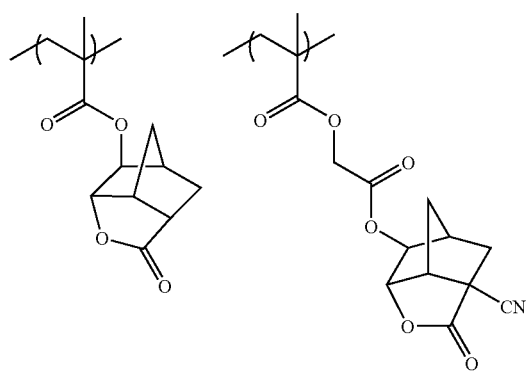
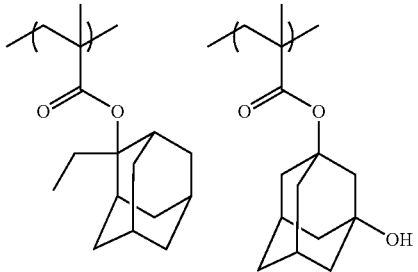
(8)
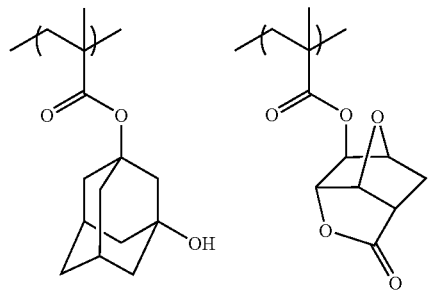
(6)
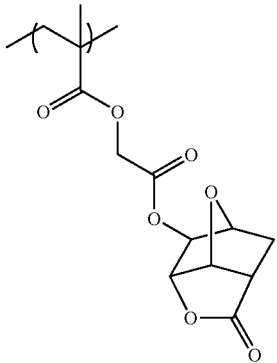

(9)
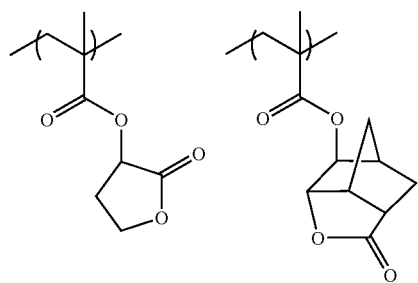
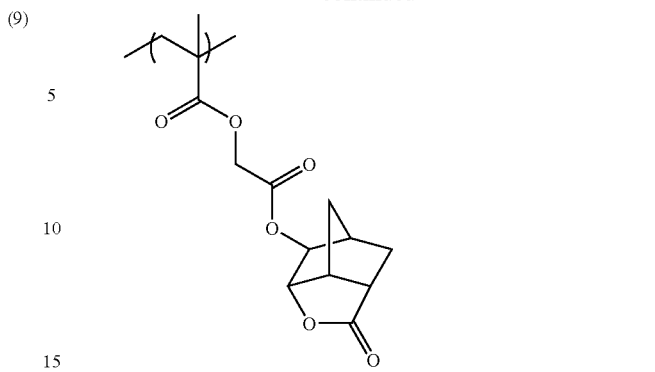
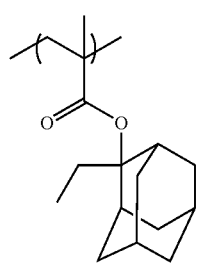
(10)
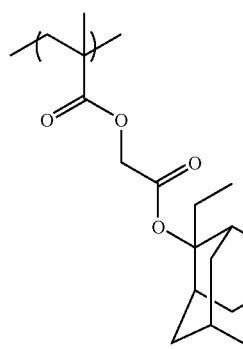
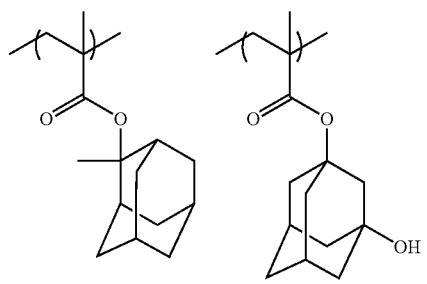
(12)
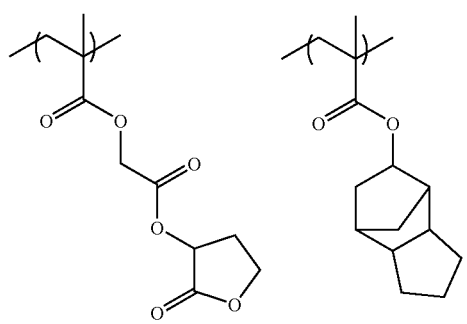
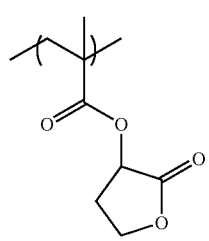
(11)
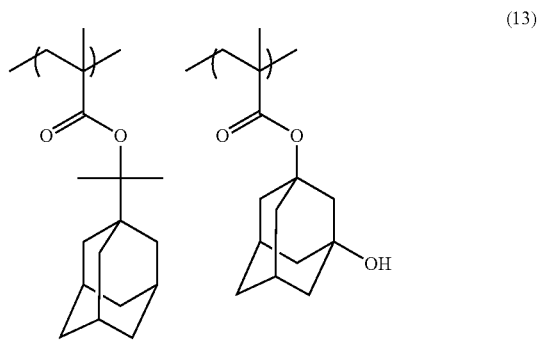
(13)
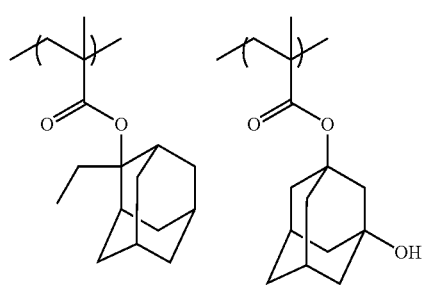
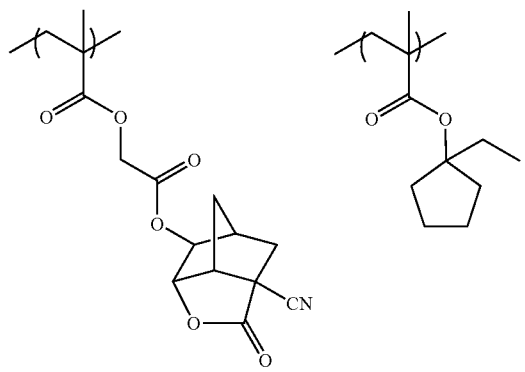

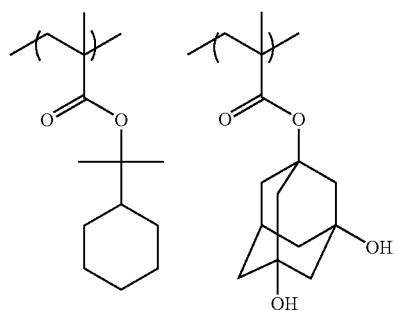
(14)
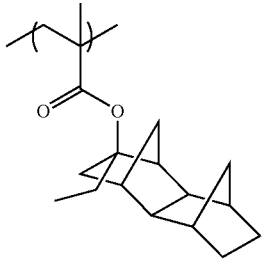
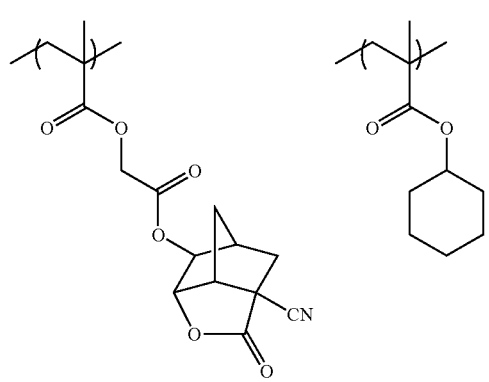
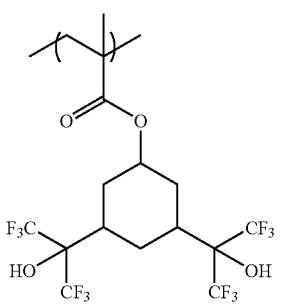
(15)
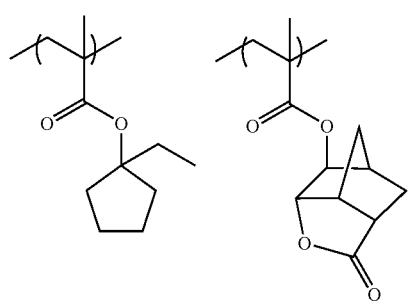
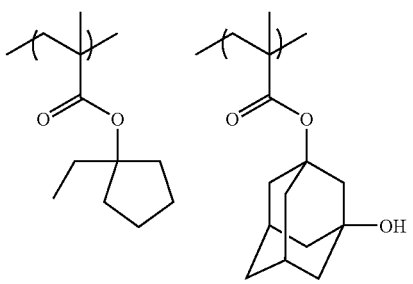
(17)
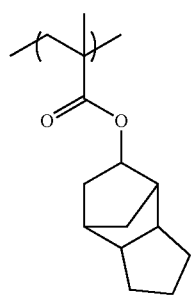
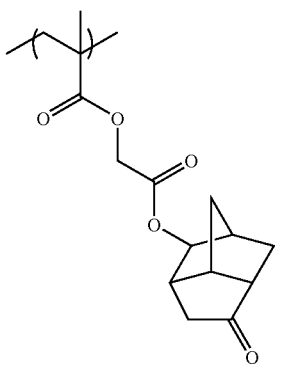
(16)
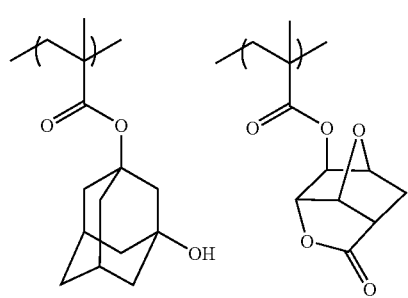
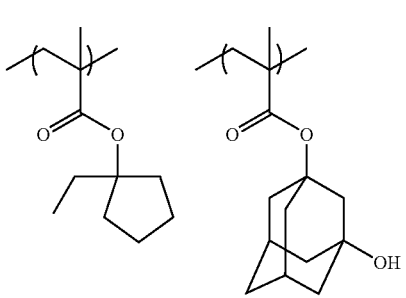
(18)

-continued

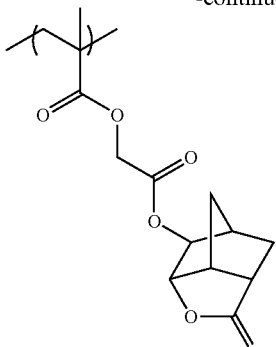

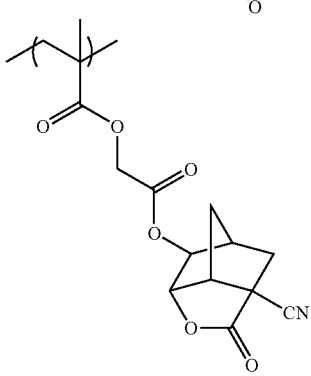

TABLE 1

| Resin (A) | Composition | Mw | Mw/Mn |
|---|---|---|---|
| 1 | 50/10/40 | 8800 | 1.9 |
| 2 | 40/20/40 | 7000 | 1.6 |
| 3 | 40/10/35/5/10 | 10000 | 1.7 |
| 4 | 40/10/40/10 | 11000 | 1.8 |
| 5 | 40/15/20/25 | 8500 | 1.6 |
| 6 | 10/40/25/25 | 12000 | 1.8 |
| 7 | 50/20/30 | 6500 | 1.6 |
| 8 | 40/10/50 | 8000 | 1.7 |
| 9 | 25/25/50 | 9000 | 1.8 |
| 10 | 50/10/40 | 11000 | 1.8 |
| 11 | 50/10/40 | 8000 | 1.7 |
| 12 | 40/10/40/10 | 7000 | 1.7 |
| 13 | 20/15/35/30 | 10000 | 1.7 |
| 14 | 45/10/35/10 | 8500 | 1.7 |
| 15 | 50/40/10 | 10000 | 1.6 |
| 16 | 10/40/40/10 | 9000 | 1.8 |
| 17 | 55/10/35 | 12000 | 1.8 |
| 18 | 40/15/20/25 | 9000 | 1.7 |

<Synthesis of Hydrophobic Resin (HR)>

Synthetic Example 1

Synthesis of Resin (HR-1)

Monomer A and monomer B were mixed together in a ratio of 50/50 (molar ratio) and dissolved in propylene glycol monomethyl ether acetate, thereby obtaining 450 g of a solution of 22 mass % solid content. Polymerization initiator V601 produced by Wako Pure Chemical Industries, Ltd. was added in an amount of 5 mol % to this solution. The mixture was dropped into 50 ml of propylene glycol monomethyl ether acetate heated at 80° C. in a nitrogen atmosphere over a period of 2 hours. After the completion of the dropping, agitation was conducted for 2 hours, thereby obtaining a reaction mixture. After the completion of the reaction, the reaction mixture was cooled to room temperature and crystallized from a 10-fold volume of mixed solvent consisting of 90:10 hexane and ethyl acetate. The thus obtained white powder was collected by filtration, thereby recovering a desired resin (HR-1).

The component ratio (molar ratio) of the resin (HR-1) determined by $^{13}$CNMR was 50/50. The weight average molecular weight of the resin in terms of standard polystyrene molecular weight determined by GPC measurement was 6500 and the dispersity (Mw/Mn) thereof was 1.25.

Other resins (HR-2) to (HR-21) were synthesized in the same manner as in Synthetic Example 1 except that the type of monomer, the amount of monomer charged, the solid content, etc. were appropriately changed.

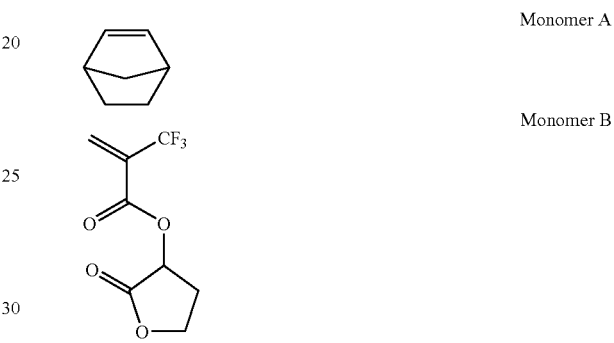

These hydrophobic resins (HR-1) to (HR-21) prepared by the above synthetic method and employed in Examples correspond to the hydrophobic resins (HR-1) to (HR-21) shown hereinbefore by way of examples. Resins HR-CP1 to HR-CP4 employed in Comparative Examples are as shown below. Table 2 indicates the molar ratios of individual repeating units (in order from the left in each structural formula), the weight average molecular weight (Mw) and the dispersity (Mw/Mn) with respect to each of the resins.

HR-CP1

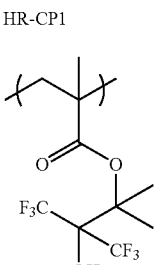

41

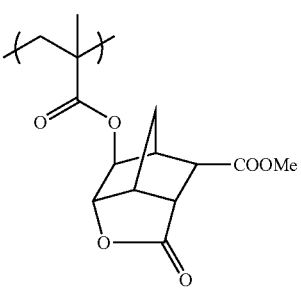

59

HR-CP2

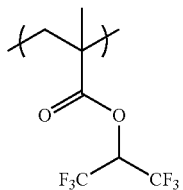

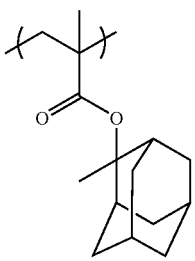

HR-CP3

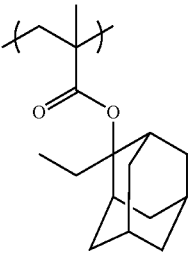

HR-CP4

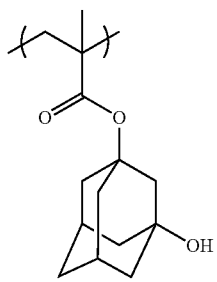

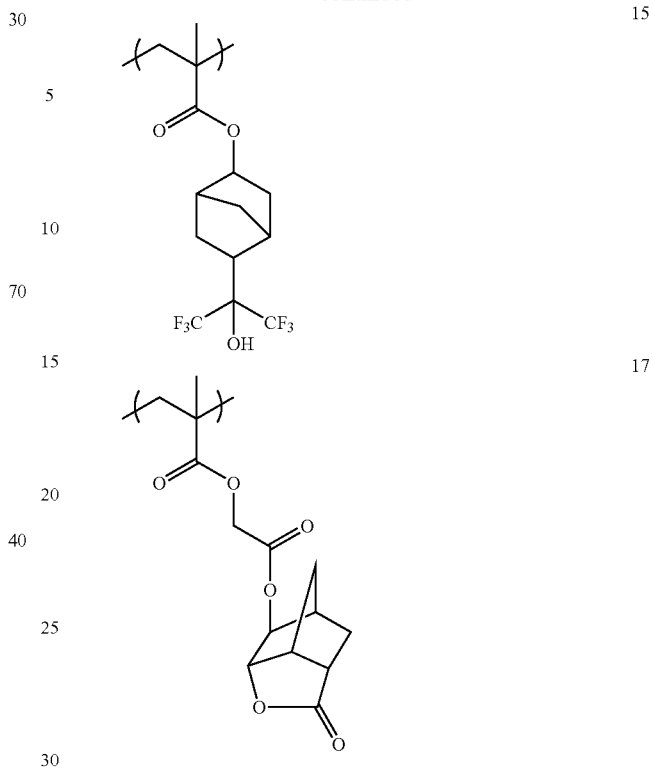

TABLE 2

| Resin | Composition | Mw | Mw/Mn |
|---|---|---|---|
| HR-1 | 50/50 | 6500 | 1.25 |
| HR-2 | 50/50 | 11000 | 1.29 |
| HR-3 | 50/50 | 4500 | 1.39 |
| HR-4 | 40/60 | 5000 | 1.19 |
| HR-5 | 50/50 | 8000 | 1.26 |
| HR-6 | 60/40 | 6300 | 1.26 |
| HR-7 | 50/50 | 10500 | 1.27 |
| HR-8 | 50/50 | 5800 | 1.21 |
| HR-9 | 50/25/25 | 6200 | 1.34 |
| HR-10 | 50/50 | 3900 | 1.31 |
| HR-11 | 50/50 | 6400 | 1.32 |
| HR-12 | 50/50 | 3500 | 1.21 |
| HR-13 | 50/50 | 4200 | 1.26 |
| HR-14 | 60/40 | 5000 | 1.31 |
| HR-15 | 50/50 | 5300 | 1.25 |
| HR-16 | 50/50 | 3300 | 1.22 |
| HR-17 | 40/60 | 7000 | 1.26 |
| HR-18 | 50/50 | 4600 | 1.25 |
| HR-19 | 50/50 | 4800 | 1.30 |
| HR-20 | 50/50 | 12000 | 1.35 |
| HR-21 | 25/25/50 | 8000 | 1.40 |
| HR-CP1 | 41/59 | 5500 | 1.30 |
| HR-CP2 | 30/70 | 6500 | 1.25 |
| HR-CP3 | 40/60 | 4500 | 1.30 |
| HR-CP4 | 60/8/15/17 | 6000 | 1.25 |

Examples 1 to 46 and Comparative Examples 1 to 4

<Preparation of Resist>

Referring to the following Table, the components were dissolved in solvents so as to obtain solutions of 3 mass % solid content. The solutions were passed through a polyethylene filter of 0.03 μm pore size, thereby obtaining positive resist compositions. The thus obtained positive resist compositions were evaluated by the following methods. The results are given in Table 4.

TABLE 3

| | Hydrophobic resin (HR) [mass(g)] | Resin (A) [3.0 g] | PAG [mass(g)] | Basic compound [mass(g)] | Surfactant [0.003 g] | Solvent [mass ratio] |
|---|---|---|---|---|---|---|
| Ex. 1 | HR-1 [0.07] | 18 | z60/Y2 [0.20/0.20] | N-1/N-3 [0.01/0.02] | W-5 | SL-2/SL-4 [60/40] |
| Ex. 2 | HR-2 [0.05] | 5 | z55 [0.30] | N-1/N-3 [0.01/0.02] | W-5 | SL-2/SL-4 [60/40] |
| Ex. 3 | HR-3 [0.08] | 6 | z89/Y37 [0.05/0.25] | N-1/N-3 [0.01/0.02] | W-3 | SL-2/SL-4 [60/40] |
| Ex. 4 | HR-4 [0.06] | 8 | Y37 [0.30] | N-3 [0.03] | W-4 | SL-2/SL-4 [60/40] |
| Ex. 5 | HR-5 [0.02] | 13 | z35/z60 [0.20/0.20] | N-6 [0.03] | W-5 | SL-2 [100] |
| Ex. 6 | HR-6 [0.08] | 16 | Y2 [0.40] | N-1/N-3 [0.01/0.02] | W-6 | SL-3/SL-5 [85/15] |
| Ex. 7 | HR-7 [0.07] | 18 | z66/z60 [0.20/0.20] | N-1/N-3 [0.01/0.02] | W-2 | SL-2/SL-4 [80/20] |
| Ex. 8 | HR-8 [0.08] | 16 | z89 [0.30] | N-1/N-3 [0.01/0.02] | W-5 | SL-3/SL-4 [70/30] |
| Ex. 9 | HR-9 [0.04] | 13 | z90 [0.25] | N-5 [0.03] | W-5 | SL-2/SL-3 [60/40] |
| Ex. 10 | HR-10 [0.11] | 13 | z35/z60 [0.20/0.20] | N-3 [0.03] | W-5 | SL-2/SL-6 [90/10] |
| Ex. 11 | HR-11 [0.09] | 18 | z60 [0.30] | N-1/N-4 [0.01/0.02] | W-3 | SL-2/SL-4 [60/40] |
| Ex. 12 | HR-12 [0.12] | 16 | z35 [0.35] | N-4/N-7 [0.02/0.01] | W-1 | SL-2/SL-4 [60/40] |
| Ex. 13 | HR-13 [0.10] | 2 | z55/z91 [0.25/0.20] | N-1/N-3 [0.02/0.01] | W-2 | SL-3/SL-6 [90/10] |
| Ex. 14 | HR-14 [0.12] | 5 | z90 [0.25] | N-4/N-7 [0.01/0.02] | W-5 | SL-3 [100] |
| Ex. 15 | HR-15 [0.07] | 5 | z80 [0.40] | N-4/N-7 [0.02/0.01] | W-5 | SL-3/SL-5 [85/15] |
| Ex. 16 | HR-16 [0.07] | 2 | z80/Y8 [0.35/0.05] | N-1/N-3 [0.01/0.02] | W-5 | SL-2/SL-1 [90/10] |
| Ex. 17 | HR-17 [0.06] | 16 | z91 [0.40] | N-1/N-3 [0.01/0.02] | W-6 | SL-2/SL-4 [60/40] |
| Ex. 18 | HR-18 [0.11] | 6 | z66/z60 [0.20/0.20] | N-8 [0.03] | W-6 | SL-2/SL-4 [60/40] |
| Ex. 19 | HR-19 [0.09] | 8 | z66 [0.35] | N-4 [0.03] | W-1 | SL-2/SL-4 [60/40] |
| Ex. 20 | HR-20 [0.05] | 18 | z89/Y37 [0.05/0.25] | N-1/N-3 [0.01/0.02] | W-2 | SL-2/SL-4 [60/40] |
| Ex. 21 | HR-21 [0.07] | 5 | Y8 [0.35] | N-1/N-4 [0.02/0.01] | W-3 | SL-3/SL-4 [70/30] |
| Ex. 22 | HR-3 [0.08] | 13 | z16 [0.40] | N-4 [0.03] | W-4 | SL-3/SL-4 [70/30] |
| Ex. 23 | HR-3 [0.08] | 16 | z55/z91 [0.25/0.20] | N-1/N-4 [0.02/0.01] | W-6 | SL-3/SL-6 [90/10] |
| Ex. 24 | HR-4 [0.06] | 5 | z66/z31 [0.15/0.20] | N-1/N-3 [0.01/0.02] | W-5 | SL-2/SL-4 [60/40] |
| Ex. 25 | HR-4 [0.06] | 18 | z5 [0.20] | N-2 [0.03] | W-3 | SL-2/SL-4 [60/40] |
| Ex. 26 | HR-12 [0.12] | 16 | z89/Y37 [0.05/0.25] | N-1/N-3 [0.01/0.02] | W-5 | SL-2/SL-4 [60/40] |
| Ex. 27 | HR-12 [0.12] | 5 | Y25 [0.25] | N-1/N-3 [0.02/0.01] | W-4 | SL-2/SL-3 [80/20] |
| Ex. 28 | HR-12 [0.12] | 6 | z16/z2 [0.25/0.10] | N-5 [0.03] | W-6 | SL-3/SL-4 [70/30] |
| Ex. 29 | HR-12 [0.12] | 8 | z55 [0.30] | N-1/N-3 [0.01/0.02] | W-6 | SL-2/SL-4 [70/30] |
| Ex. 30 | HR-14 [0.12] | 6 | z16/z34 [0.20/0.20] | N-1/N-3 [0.01/0.02] | W-5 | SL-2/SL-4 [70/30] |
| Ex. 31 | HR-14 [0.12] | 8 | z80/Y8 [0.35/0.05] | N-1/N-3 [0.01/0.02] | W-3 | SL-2/SL-4 [50/50] |
| Ex. 32 | HR-14 [0.12] | 13 | z66/z60 [0.20/0.20] | N-7 [0.03] | W-4 | SL-2/SL-4 [60/40] |
| Ex. 33 | HR-14 [0.12] | 16 | z89/Y37 [0.05/0.25] | N-1/N-3 [0.01/0.02] | W-5 | SL-2/SL-4 [60/40] |
| Ex. 34 | HR-14 [0.12] | 18 | z2/z4 [0.20/0.20] | N-1 [0.03] | W-6 | SL-2/SL-4 [60/40] |
| Ex. 35 | HR-18 [0.11] | 13 | z2 [0.35] | N-2 [0.03] | W-4 | SL-2/SL-4 [60/40] |
| Ex. 36 | HR-18 [0.11] | 2 | z55/z91 [0.25/0.20] | N-1/N-3 [0.02/0.01] | W-1 | SL-2/SL-6 [90/10] |
| Ex. 37 | HR-18 [0.11] | 18 | z55/z91 [0.25/0.20] | N-1 [0.03] | W-2 | SL-2/SL-5 [90/10] |
| Ex. 38 | HR-19 [0.09] | 5 | z16/z2 [0.25/0.10] | N-1/N-3 [0.02/0.01] | W-5 | SL-3/SL-4 [70/30] |

TABLE 3-continued

| | Hydrophobic resin (HR) [mass(g)] | Resin (A) [3.0 g] | PAG [mass(g)] | Basic compound [mass(g)] | Surfactant [0.003 g] | Solvent [mass ratio] |
|---|---|---|---|---|---|---|
| Ex. 39 | HR-19 [0.09] | 6 | Y65 [0.40] | N-1/N-3 [0.02/0.01] | W-4 | SL-2/SL-4 [80/20] |
| Ex. 40 | HR-19 [0.09] | 16 | z80/Y8 [0.35/0.05] | N-4/N-7 [0.01/0.02] | W-6 | SL-2/SL-4 [80/20] |
| Ex. 41 | HR-14 [0.12] | 18 | PAG-1 [0.40] | N-1 [0.03] | W-6 | SL-2/SL-4 [60/40] |
| Ex. 42 | HR-14 [0.12] | 18 | PAG-2 [0.40] | N-1 [0.03] | W-6 | SL-2/SL-4 [60/40] |
| Ex. 43 | HR-14 [0.12] | 18 | PAG-3 [0.40] | N-1 [0.03] | W-6 | SL-2/SL-4 [60/40] |
| Ex. 44 | HR-14 [0.12] | 18 | PAG-4 [0.40] | N-1 [0.03] | W-6 | SL-2/SL-4 [60/40] |
| Ex. 45 | HR-14 [0.12] | 18 | PAG-5/z2 [0.20/0.20] | N-1 [0.03] | W-6 | SL-2/SL-4 [60/40] |
| Ex. 46 | HR-14 [0.12] | 18 | PAG-6 [0.40] | N-1 [0.03] | W-6 | SL-2/SL-4 [60/40] |
| Comp. 1 | HR-CP1 [0.12] | 2 | z2 [0.35] | N-4 [0.03] | W-1 | SL-3/SL-4 [70/30] |
| Comp. 2 | HR-CP2 [0.60] | 6 | z5 [0.20] | N-4 [0.03] | W-1 | SL-3/SL-4 [70/30] |
| Comp. 3 | HR-CP3 [0.12] | 16 | z89/Y37 [0.05/0.25] | N-1/N-3 [0.01/0.02] | W-5 | SL-2/SL-4 [60/40] |
| Comp. 4 | HR-CP4 [0.12] | 16 | z55/z91 [0.25/0.20] | N-1/N-4 [0.02/0.01] | W-6 | SL-3/SL-6 [90/10] |

<Image Performance Test>

[Exposure Condition: ArF Liquid Immersion Exposure]

An organic antireflection film ARC29A (produced by Nissan Chemical Industries, Ltd.) was applied onto a silicon wafer and baked at 205° C. for 60 seconds, thereby forming a 98 nm-thick antireflection film. Each of the prepared positive resist compositions was applied thereonto and baked at 100° C. for 60 seconds, thereby forming a 100 nm-thick resist film. The resultant wafer was exposed through a 6% half-tone mask of 55 nm 1:1 line and space pattern with the use of an ArF excimer laser liquid immersion scanner (manufactured by ASML, XT1700i, NA 1.20, C-Quad, outer sigma 0.981, inner sigma 0.895, XY deflection). Ultrapure water was used as the liquid for liquid immersion. Thereafter, the exposed wafer was heated at 100° C. for 60 seconds, developed with an aqueous solution of tetramethylammonium hydroxide (2.38 mass %) for 30 seconds, rinsed with pure water and spin dried, thereby obtaining a resist pattern.

[Line Edge Roughness (LER)]

With respect to a 5 μm region of each longitudinal edge of the obtained 55 nm 1:1 line and space pattern, the distance from a reference line on which edges were to be present was measured at 50 points using a critical dimension SEM (model S9380II manufactured by Hitachi, Ltd.). The standard deviation of measurements was determined, and the value of $3\sigma$ was calculated. The evaluation marks of ∘*, ∘, Δ and × were given when the calculated value (nm) was less than 3.5, 3.5 to less than 4.0, 4.0 to less than 5.0 and 5.0 or greater, respectively. The smaller the value, the higher the performance exhibited.

[Coverage Dependence]

Using two types of 6% half-tone masks, the one with 30% coverage and the other with 70% coverage, the pattern formations were carried out in the same manner as described above. The optimum exposure intensity was defined as the exposure intensity at which 55 nm was realized by the 55 nm 1:1 line and space pattern with 30% coverage. Using the same optimum exposure intensity, the 55 nm 1:1 line and space pattern with 70% coverage was measured. The coverage Δ line width was defined as any difference in line width measured. The evaluation marks of ∘*, ∘, Δ and × were given when the value (nm) of the coverage Δ line width was less than 2.0, 2.0 to less than 3.0, 3.0 to less than 5.0 and 5.0 or greater, respectively. The smaller the value, the higher the performance exhibited.

Coverage Δ CD=(line width at 70% coverage)−(line width at 30% coverage=55 nm)

[Evaluation of Development Defect]

Random-mode measurement was carried out by means of a defect inspection apparatus KLA-2360 (trade name) manufactured by KLA-Tencor Corporation. In the defect inspection apparatus, the pixel size was set at 0.16 μm and the threshold value at 20. Any development defects extracted from differences generated by superimposition between a comparative image and the pixel unit were detected.

[Evaluation of Development Defect—Watermark Defect]

With respect to the above development defects, the defect distribution on each wafer was detected, and the configuration of defects was observed by means of SEMVision (manufactured by AMAT).

Circular defects of about 1 to 5 μm diameter as shown in FIG. 1 were regarded as watermark defects. The number of watermark defects on each 300 mm wafer was counted, and the number of development defects per area (1 $cm^2$) was calculated. The evaluation marks of ∘*, ∘, Δ and × were given when the calculated value (no./$cm^2$) was 0, 0 to less than 0.01, 0.01 to less than 0.10 and 0.10 or greater, respectively. The smaller the value, the higher the performance exhibited.

[Evaluation of Development Defect—Bubble Defect]

Figure 2:
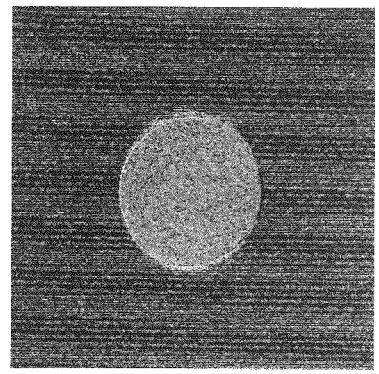
FIG. 2 is an SEM micrograph showing a bubble defect.

Similarly, circular defects of about 1 to 20 μm diameter as shown in FIG. 2 were regarded as bubble defects. The number of bubble defects on each 300 mm wafer was counted, and the number of development defects per area (1 $cm^2$) was calculated. The evaluation marks of ∘*, ∘, Δ and × were given when the calculated value (no./$cm^2$) was 0, 0 to less than 0.01, 0.01 to less than 0.10 and 0.10 or greater, respectively. The smaller the value, the higher the performance exhibited.

[Evaluation of Development Defect—Development Residue Defect]

Figure 3:
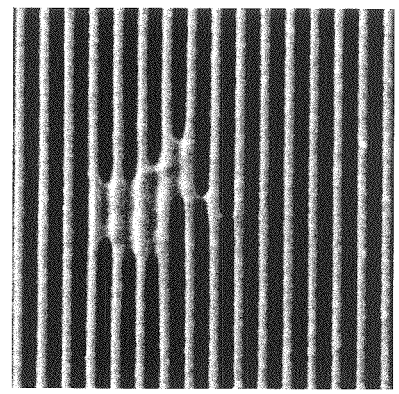
FIG. 3 is an SEM micrograph showing a development residue defect.

Similarly, amorphous defects of about 0.1 to 2 μm diameter as shown in FIG. 3 were regarded as development residue defects. The number of development residue defects on each 300 mm wafer was counted, and the number of development defects per area (1 cm$^2$) was calculated. The evaluation marks ○*, ○, Δ and × were given when the calculated value (no./cm$^2$) was less than 1.0, 1.0 to less than 3.0, 3.0 to less than 10.0 and 10.0 or greater, respectively. The smaller the value, the higher the performance exhibited.

The brevity codes appearing in Table 3 have the following meanings.

[Acid Generator (PAG)]

PAGs correspond to those shown hereinbefore by way of examples or the following PAG-1 to PAG-6.

[Basic Compound]
N-1: N,N-dibutylaniline,
N-2: N,N-dihexylaniline,
N-3: 2,6-diisopropylaniline,
N-4: tri-n-octylamine,
N-5: N,N-dihydroxyethylaniline,
N-6: 2,4,5-triphenylimidazole,
N-7: tris(methoxyethoxyethyl)amine, and
N-8: 2-[2-{2-(2,2-dimethoxy-phenoxyethoxy)ethyl}-bis(2-methoxyethyl)]-amine.

[Surfactant]
W-1: Megafac F176 (produced by Dainippon Ink & Chemicals, Inc., fluorinated),
W-2: Megafac R08 (produced by Dainippon Ink & Chemicals, Inc., fluorinated and siliconized),
W-3: polysiloxane polymer KP-341 (produced by Shin-Etsu Chemical Co., Ltd., siliconized),
W-4: Troy Sol S-366 (produced by Troy Chemical Co., Ltd.),
W-5: PF656 (produced by OMNOVA, fluorinated), and
W-6: PF6320 (produced by OMNOVA, fluorinated).

[Solvent]
SL-1: cyclohexanone,
SL-2: propylene glycol monomethyl ether acetate (PGMEA), SL-3: ethyl lactate,
SL-4: propylene glycol monomethyl ether (PGME),
SL-5: γ-butyrolactone, and
SL-6: propylene carbonate.

TABLE 4

| | LER | Coverage dependence | Watermark defect | Bubble defect | Development residue defect |
|---|---|---|---|---|---|
| Ex. 1 | ○ | ○ | Δ | Δ | ○ |
| Ex. 2 | Δ | Δ | Δ | Δ | Δ |
| Ex. 3 | Δ | Δ | Δ | Δ | Δ |
| Ex. 4 | Δ | Δ | Δ | Δ | Δ |
| Ex. 5 | Δ | ○ | ○ | ○ | ○ |
| Ex. 6 | ○ | ○ | ○ | ○ | ○ |
| Ex. 7 | ○* | ○ | ○ | ○ | ○ |
| Ex. 8 | Δ | ○ | ○ | ○ | ○ |
| Ex. 9 | ○ | ○ | Δ | Δ | ○ |
| Ex. 10 | ○ | ○ | ○ | ○ | ○* |
| Ex. 11 | ○ | ○* | ○ | ○ | ○* |
| Ex. 12 | Δ | ○ | ○* | ○ | ○ |
| Ex. 13 | Δ | Δ | Δ | Δ | Δ |
| Ex. 14 | ○* | ○* | ○* | ○ | ○* |
| Ex. 15 | ○ | ○* | ○* | ○* | ○* |
| Ex. 16 | Δ | Δ | Δ | Δ | Δ |
| Ex. 17 | Δ | Δ | Δ | Δ | Δ |
| Ex. 18 | ○ | ○ | ○* | ○ | ○ |
| Ex. 19 | ○* | ○ | ○* | ○ | ○ |
| Ex. 20 | ○ | ○ | Δ | Δ | ○ |
| Ex. 21 | ○ | ○ | ○ | ○ | ○ |
| Ex. 22 | Δ | ○ | ○ | ○ | ○ |
| Ex. 23 | ○ | Δ | Δ | Δ | Δ |
| Ex. 24 | ○ | ○ | Δ | Δ | ○ |
| Ex. 25 | Δ | ○ | ○ | ○ | ○ |
| Ex. 26 | Δ | ○ | ○ | ○ | ○ |
| Ex. 27 | ○* | ○* | ○* | ○* | * |
| Ex. 28 | Δ | ○ | ○ | ○ | ○ |
| Ex. 29 | ○ | ○ | ○* | ○ | ○ |
| Ex. 30 | Δ | ○ | ○ | ○ | ○ |
| Ex. 31 | ○ | ○ | ○ | ○ | ○ |
| Ex. 32 | ○* | ○* | ○* | ○ | ○* |
| Ex. 33 | ○ | ○ | ○ | ○ | ○ |
| Ex. 34 | ○ | ○* | ○* | ○ | ○* |
| Ex. 35 | ○ | ○* | ○* | ○* | ○* |
| Ex. 36 | ○ | ○ | ○* | ○ | ○ |
| Ex. 37 | ○* | ○* | ○* | ○* | ○* |
| Ex. 38 | ○ | ○* | ○* | ○* | ○* |
| Ex. 39 | ○ | ○ | ○ | ○ | ○ |
| Ex. 40 | ○ | ○ | ○* | ○ | ○ |
| Ex. 41 | ○ | ○* | ○* | ○ | ○ |
| Ex. 42 | ○* | ○ | ○* | ○* | ○* |
| Ex. 43 | ○ | ○ | ○ | ○* | ○* |
| Ex. 44 | ○* | ○* | ○ | ○ | ○* |
| Ex. 45 | ○ | ○ | ○* | ○* | ○* |
| Ex. 46 | ○ | ○ | ○* | ○ | ○* |
| Comp. 1 | x | x | x | ○ | Δ |
| Comp. 2 | x | Δ | Δ | x | x |
| Comp. 3 | Δ | Δ | ○ | x | Δ |
| Comp. 4 | ○ | ○ | x | Δ | Δ |

From the foregoing results, it is apparent that the pattern formed by liquid immersion exposure using the actinic-ray- or radiation-sensitive resin composition of the present invention excels in coverage dependence, being reduced in the occurrence of watermark defects, bubble defects and development residue defects and further excels in LER.

What is claimed is:

1. An actinic-ray- or radiation-sensitive resin composition comprising a hydrophobic resin (HR) containing a fluorine atom, wherein the hydrophobic resin (HR) comprises any of repeating units (a) of general formula (I) or (II) below:

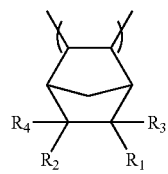

(I)

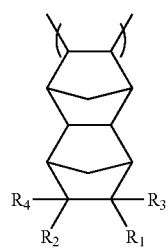

(II)

in which each of $R_1$, $R_2$, $R_3$ and $R_4$ independently represents a hydrogen atom, a fluorine atom, a chlorine atom, a carboxyl group, an alkyl group, a cycloalkyl group, an alkyloxy group, an alkylcarbonyl group, an arylcarbonyl group, an alkylcarbonyloxy group, an arylcarbonyloxy group, an alkyloxycarbonyl group, an aryloxycarbonyl group, an alkyl ether group, an aryl ether group, a hydroxyl group, an alkyl amido group, an aryl amido group, an aryl group, a cyano group, an acid decomposable group or an alkali decomposable group, provided that the hydrogen atoms of the alkyl group, cycloalkyl group, alkyloxy group, alkylcarbonyl group, arylcarbonyl group, alkylcarbonyloxy group, arylcarbonyloxy group, alkyloxycarbonyl group, aryloxycarbonyl group, alkyl ether group, aryl ether group, alkyl amido group, aryl amido group, aryl group, acid decomposable group and alkali decomposable group may be partially or wholly replaced by fluorine atoms, and provided that any two of the $R_1$, $R_2$, $R_3$ and $R_4$ may be bonded to each other to thereby form a ring, wherein the content of hydrophobic resin (HR) is in the range of 0.01 to 10 mass % based on the total solids of the actinic-ray- or radiation-sensitive resin composition, and the hydrophobic resin (HR) further comprises a repeating unit with a lactone structure, wherein the actinic-ray- or radiation-sensitive resin composition further comprises:

(A) a resin that when acted on by an acid is decomposed to thereby exhibit an increased solubility in an alkali developer, (B) a compound that when exposed to actinic rays or radiation, generates an acid, and (C) a solvent, and wherein the resin (A) comprises at least one of the repeating units of general formula (1) and at least one of the repeating units of general formula (2):

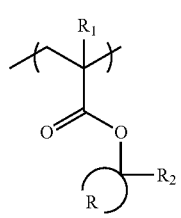

(1)

-continued

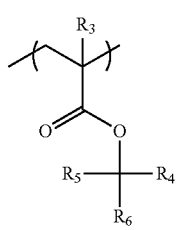

(2)

in the general formulae (1) and (2),
each of $R_1$ and $R_3$ independently represents a hydrogen atom, an optionally substituted methyl group or any of the groups of the formula —$CH_2$—$R_9$ in which $R_9$ represents a hydroxyl group or a monovalent organic group,
each of $R_2$, $R_4$, $R_5$ and $R_6$ independently represents an alkyl group or a cycloalkyl group, and
R represents an atomic group required for forming an alicyclic structure in cooperation with a carbon atom.

2. The actinic-ray- or radiation-sensitive resin composition according to claim 1, wherein the repeating unit with a lactone structure introduced in the hydrophobic resin (HR) is any of those of general formula (HI) below:

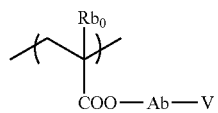

(HI)

in which
$Rb_0$ represents a hydrogen atom, a halogen atom, an optionally substituted alkyl group or a cyano group,
Ab represents a single bond, an alkylene group, a bivalent connecting group with an alicyclic hydrocarbon structure of a single ring or multiple rings, an ether group, an ester group, a carbonyl group, or a bivalent connecting group resulting from a combination thereof, and
V represents a monovalent organic group with a lactone structure.

3. A method of forming a pattern, comprising forming the actinic-ray- or radiation-sensitive resin composition according to claim 1 into a film, exposing the film and developing the exposed film.

4. The method of forming a pattern according to claim 3, wherein the film is exposed through a liquid for liquid immersion.

5. The actinic-ray- or radiation-sensitive resin composition according to claim 1, wherein the resin (A) is a resin in which all the repeating units consist of (meth)acrylate repeating units.

6. The actinic-ray- or radiation-sensitive resin composition according to claim 1, wherein the resin (A) does not contain either a fluorine atom or a silicon atom.

7. The actinic-ray- or radiation-sensitive resin composition according to claim 1, wherein the resin (A) does not contain an aromatic group.

8. The actinic-ray- or radiation-sensitive resin composition according to claim 1, wherein the hydrophobic resin (HR) contains a group (z) that is decomposed by the action of an acid.

9. The actinic-ray- or radiation-sensitive resin composition according to claim 1, wherein the repeating unit with a lactone structure introduced in the hydrophobic resin (HR) contains a fluorine atom.

10. The actinic-ray- or radiation-sensitive resin composition according to claim 1, wherein the resin (A) comprises a repeating unit with a lactone structure.

11. An actinic-ray- or radiation-sensitive resin composition comprising a hydrophobic resin (HR) containing a fluorine atom, wherein the hydrophobic resin (HR) comprises any of repeating units (a) of general formula (I) or (II) below:

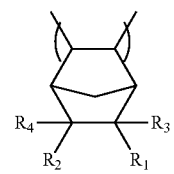

(I)

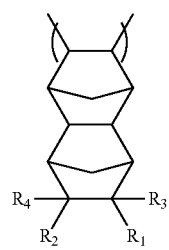

(II)

in which each of $R_1$, $R_2$, $R_3$ and $R_4$ independently represents a hydrogen atom, a fluorine atom, a chlorine atom, a carboxyl group, an alkyl group, a cycloalkyl group, an alkyloxy group, an alkylcarbonyl group, an arylcarbonyl group, an alkylcarbonyloxy group, an arylcarbonyloxy group, an alkyloxycarbonyl group, an aryloxycarbonyl group, an alkyl ether group, an aryl ether group, a hydroxyl group, an alkyl amido group, an aryl amido group, an aryl group, a cyano group, an acid decomposable group or an alkali decomposable group, provided that the hydrogen atoms of the alkyl group, cycloalkyl group, alkyloxy group, alkylcarbonyl group, arylcarbonyl group, alkylcarbonyloxy group, arylcarbonyloxy group, alkyloxycarbonyl group, aryloxycarbonyl group, alkyl ether group, aryl ether group, alkyl amido group, aryl amido group, aryl group, acid decomposable group and alkali decomposable group may be partially or wholly replaced by fluorine atoms, and provided that any two of the $R_1$, $R_2$, $R_3$ and $R_4$ may be bonded to each other to thereby form a ring, wherein the content of hydrophobic resin (HR) is in the range of 0.01 to 10 mass % based on the total solids of the actinic-ray- or radiation-sensitive resin composition, and the hydrophobic resin (HR) further comprises a repeating unit with a lactone structure, wherein the actinic-ray- or radiation-sensitive resin composition further comprises:

(A) a resin that when acted on by an acid is decomposed to thereby exhibit an increased solubility in an alkali developer, (B) a compound that when exposed to actinic rays or radiation, generates an acid, and (C) a solvent, and wherein the compound (B) is represented by general formula (V)

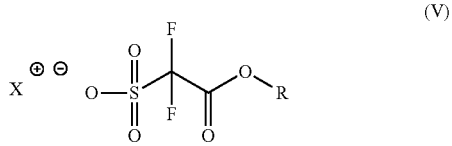

(V)

wherein in general formula (V),

X+ represents an organic counter ion that consist of S, C, H and O atoms, and R represents a hydrogen atom or an organic group.

12. An actinic-ray- or radiation-sensitive resin composition comprising a hydrophobic resin (HR) containing a fluorine atom, wherein the hydrophobic resin (HR) comprises any of repeating units (a) of general formula (I) or (II) below:

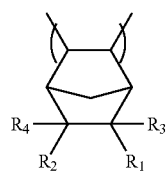

(I)

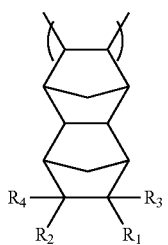

(II)

in which each of $R_1$, $R_2$, $R_3$ and $R_4$ independently represents a hydrogen atom, a fluorine atom, a chlorine atom, a carboxyl group, an alkyl group, a cycloalkyl group, an alkyloxy group, an alkylcarbonyl group, an arylcarbonyl group, an alkylcarbonyloxy group, an arylcarbonyloxy group, an alkyloxycarbonyl group, an aryloxycarbonyl group, an alkyl ether group, an aryl ether group, a hydroxyl group, an alkyl amido group, an aryl amido group, an aryl group, a cyano group, an acid decomposable group or an alkali decomposable group, provided that the hydrogen atoms of the alkyl group, cycloalkyl group, alkyloxy group, alkylcarbonyl group, arylcarbonyl group, alkylcarbonyloxy group, arylcarbonyloxy group, alkyloxycarbonyl group, aryloxycarbonyl group, alkyl ether group, aryl ether group, alkyl amido group, aryl amido group, aryl group, acid decomposable group and alkali decomposable group may be partially or wholly replaced by fluorine atoms, and provided that any two of the $R_1$, $R_2$, $R_3$ and $R_4$ may be bonded to each other to thereby form a ring, wherein the content of hydrophobic resin (HR) is in the range of 0.01 to 10 mass % based on the total solids of the actinic-ray- or radiation-sensitive resin composition, and the hydrophobic resin (HR) further comprises a repeating unit with a lactone structure, of general formula (HIII) below:

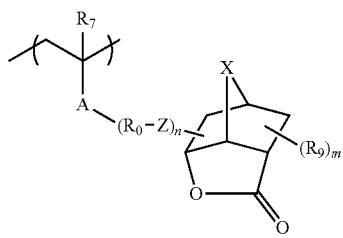

(HIII)

in which $R_7$ represents a hydrogen atom, a halogen atom, an optionally substituted alkyl group or a cyano group, A represents an ester bond (—COO—) or an amido bond (—CONH—), $R_0$ or each of $R_0$s independently represents an alkylene group, a cycloalkylene group or a combination thereof, Z or each of Zs independently represents an ether bond, an ester bond, an amido bond, a urethane bond or a urea bond, n is an integer of 1 to 5, $R_9$, each independently in the presence of two or more groups, represents an alkyl group, a cycloalkyl group, an alkoxycarbonyl group, a cyano group, a hydroxyl group or an alkoxy group, provided that in the presence of two or more groups, two R9s may be bonded with each other to thereby form a ring, X represents an alkylene group, an oxygen atom or a sulfur atom, and m is the number of substituents and is an integer of 0 to 5.

* * * * *